United States Patent
Ajioka

(10) Patent No.: US 7,664,220 B2
(45) Date of Patent: Feb. 16, 2010

(54) VISUAL DEVICE, INTERLOCKING COUNTER, AND IMAGE SENSOR

(75) Inventor: Yoshiaki Ajioka, Gamagori (JP)

(73) Assignee: Ecchandes Inc., Aichi (JP)

( * ) Notice: Subject to any disclaimer, the term of this patent is extended or adjusted under 35 U.S.C. 154(b) by 377 days.

(21) Appl. No.: 11/779,002

(22) Filed: Jul. 17, 2007

(65) Prior Publication Data

US 2008/0024639 A1   Jan. 31, 2008

Related U.S. Application Data

(63) Continuation of application No. 10/475,555, filed on Sep. 12, 2003, now abandoned.

(30) Foreign Application Priority Data

| Mar. 13, 2001 | (JP) | 2001-69886 |
| May 2, 2001 | (JP) | 2001-134921 |
| May 29, 2001 | (JP) | 2001-160172 |
| Jun. 12, 2001 | (JP) | 2001-176755 |
| Jul. 30, 2001 | (JP) | 2001-229174 |
| Oct. 19, 2001 | (JP) | 2001-321614 |
| Dec. 21, 2001 | (JP) | 2001-388967 |

(51) Int. Cl.
   *H03K 21/38* (2006.01)
(52) U.S. Cl. .................. 377/107; 377/28; 377/118
(58) Field of Classification Search .......... None See application file for complete search history.

(56) References Cited

U.S. PATENT DOCUMENTS

| 3,671,875 A | * | 6/1972 | Pento | 327/261 |
| 4,707,744 A | | 11/1987 | Kimata et al. | |
| 4,805,026 A | | 2/1989 | Oda | |
| 5,274,476 A | | 12/1993 | Lee | |

(Continued)

FOREIGN PATENT DOCUMENTS

DE    42 25 388    2/1994

(Continued)

OTHER PUBLICATIONS

M. Koyanagi et al., "Future System-On-Silicon LSI Chips", IEEE Micro, 18:4, pp. 17-22, 1998.

(Continued)

*Primary Examiner*—Tuan Lam
(74) *Attorney, Agent, or Firm*—Antonelli, Terry, Stout & Kraus, LLP.

(57) ABSTRACT

An interlocked counter including a synchronous counter, a logic gate for judging end-value, a logic gate for amplifying an interlocking signal, at least one latch circuit for the interlocking signal, a logic gate for the interlocking signal, and a logic gate for an enable signal, wherein behavior of the synchronous counter is stopped when a count number arrived at an end value, by that the synchronous counter counts a number of pulses of a clock signal when the synchronous counter inputted an enable signal, the logic gate for judging end-value generates an interlocking signal when the count number outputted by a synchronous counter coincided with the end value, the logic gate for amplifying interlocking signal amplifies the interlocking signal in order to output to an external part, and the logic gate for enable signal generates the enable signal when the interlocking signal is not generated.

5 Claims, 141 Drawing Sheets

U.S. PATENT DOCUMENTS

| | | | |
|---|---|---|---|
| 5,444,484 | A | 8/1995 | Yutani et al. |
| 5,454,018 | A * | 9/1995 | Hopkins .................. 377/28 |
| 5,577,262 | A | 11/1996 | Pechanek et al. |
| 5,740,463 | A | 4/1998 | Oshima et al. |
| 6,040,810 | A | 3/2000 | Nishimura |
| 6,985,182 | B1 | 1/2006 | Morinaka et al. |
| 2001/0017566 | A1* | 8/2001 | Nakahara .................. 327/536 |
| 2003/0080790 | A1* | 5/2003 | Tam et al. .................. 327/115 |

FOREIGN PATENT DOCUMENTS

| | | |
|---|---|---|
| EP | 1 014 683 | 6/2000 |
| EP | 1 113 388 | 7/2001 |
| GB | 1 258 595 | 12/1971 |
| GB | 1 454 781 | 11/1976 |
| JP | 63-174356 | 7/1998 |
| JP | 5-324954 | 10/1998 |
| WO | WO 99/00743 | 1/1999 |
| WO | WO 00/16259 | 3/2000 |

OTHER PUBLICATIONS

A. Tojo, "Pattern Description with a Highly Parallel Information Processing System I", Denkishikenjo Ihou, 31:8, pp. 18-34, 1967.

M.J.B. Duff, "CLIP-4: A Large Scale Integrated Circuit Array Parallel Processor", Proc. $3^{rd}$ IJCPR, pp. 728-733, 1976.

T. Komuro et al., "Vision Chip Architecture Using General-Purpose Processing Elements for 1ms Vision System", Proc. $4^{th}$ IEEE Int'l Workshop On Computer Architecture for Machine Perception (CAMP '97), pp. 276-279, 1987.

Y. Nakabo et al., "1ms Target Tracking System Using Massively Parallel Processing Vision", J. Robot Soc. of Japan, 15:3, pp. 105-109, 1997.

K. Kyuma et al., "Artificial Retinas—Fast, Versatile Image Processing", Nature, 372:6502, pp. 197 and 198, Nov. 1994.

Wunsch et al., "Real-Time Visual Tracking of 3-D Objects with Dynamic Handling of Occlusion", vol. 4, Apr. 20, 1997, pp. 2868-2873.

Forsyth, et al., "Invariant Descriptors for 3-D Object Recognition and Pose", vol. 13, No. 10, Oct. 1, 1991, pp. 971-991.

Du, et al., "Passive Component Inspection Using Machine Vision", IEEE, Apr. 15, 1998, pp. 74-79.

* cited by examiner

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| | | | | | | FRONT INPUT STATUS | RESULT STATUS | SEND STATUS (UPPER) | RECEIVE STATUS (LOWER) | SEND STATUS (LOWER) | RECEIVE STATUS (UPPER) | SEND STATUS (LEFT) | RECEIVE STATUS (RIGHT) | SEND STATUS (RIGHT) | RECEIVE STATUS (LEFT) |

804

401

401

VISUAL DEVICE, INTERLOCKING COUNTER, AND IMAGE SENSOR

CROSS REFERENCE TO RELATED APPLICATION

This is a continuation of U.S. application Ser. No. 10/471,555, filed Sep. 12, 2003 now abandoned. This application relates to and claims priority from Japanese Patent Application No. 2001/69886, filed Mar. 13, 2001, No. 2001/134921, filed May 2, 2001, No. 2001/160172, filed May 29, 2001, No. 2001/176755, filed Jun. 12, 2001, No. 2001/229174, filed Jul. 30, 2001, No. 2001/321614, filed Oct. 19, 2001 and No. 2001/388967, filed Dec. 21, 2001. The entirety of the contents and subject matter of all of the above is incorporated herein by reference.

FIELD OF THE INVENTION

The present invention relates to a visual device searching and recognizing an object, whose array operation units and virtual array operation units carry out local and parallel image processing like a geometrical analysis means and so on, wherein an image sensor comprises a data processing device which consists of these array operation units and virtual array operation units, an interlocked device which drives these array operation units and virtual array operation units, and sensor modules.

BACKGROUND OF THE INVENTION

In the present invention, a visual device has been developed as a device controlling a moving camera and carrying out image processing (for example, refer to Published Unexamined Japanese Patent Application No. 2001-43385, Published Unexamined Japanese Patent Application No. 2001-101403, Published Unexamined Japanese Patent Application No. 2001-148006, Published Unexamined Japanese Patent Application No. 2001-148022, Published Unexamined Japanese Patent Application No. 2001-148024 and PCT Publication Number WO 00/16259). The visual device searches an object and carries out image processing of the object, by controlling a mechanism of pan, tilt and zoom. Image processing which the visual device carries out is mostly local processing, and the local processing can be carried out in parallel by array operation units arranged in the shape of a lattice. The visual device, however, has mainly four problems. First, a figure/ground separation means needs huge computational complexity, in order for nonlinear oscillators to separate at least one object area and a background area. Second, a pattern matching means needs many template images, in order to recognize correctly a normalized image, in which colors and patterns of the object are mixed. Third, a geometrical analysis means must carry out global processing like Fourier transform, Affine transform and Hough transform, in order to detect rough form of the object in an image. Fourth, an area normalization means needs a processor comprising a divider for carrying out division by a natural number, or a look-up table for memorizing a reciprocal number of the natural number, in order to complement between pixels of a normalized image. Therefore, these means heavily hindered from manufacturing of a high-performance image sensor comprising the visual device.

First, in a past figure/ground separation means, each nonlinear oscillator used a random number as an external noise, or formed edge information constructing a pixel of a formed edge-information image inputted. Thus, there is no correlation between the nonlinear oscillator within an object area or a background area segmented by the formed edge-information image and the external noise. As a result, each nonlinear oscillator can not shift its phase from phases of nonlinear oscillators at its neighbors until the phases of these nonlinear oscillators reach suitable combination. This is a factor that computational complexity of the figure/ground separation means increases. By using a position/size detection means, however, the visual device can generate a redundant-information image representing an approximate position of a center of gravity and size of an object area segmented by the formed edge-information image. Since each nonlinear oscillator inputs redundant information constructing a corresponding pixel in the redundant-information image as the random number, each nonlinear oscillator within the object area shifts its phase in order, from the approximate position of a center of gravity toward its circumference.

Considering these facts, a figure/ground separation means comes to separate an object area and a background area more quickly than the past one because a position/size detection means detects an approximate position of a center of gravity and size of the object area segmented by a formed edge-information image.

Next, in a past visual device, a pattern matching means needs a great number of template images, in order to carry out pattern matching of a normalized image, in which a segmented object area in a digital image corresponding to an object area is normalized. The reason is that the normalized image is generally a multi-band image with noise, and also that the pattern matching means compared the normalized image with many template images, without distinguishing colors and patterns of an object represented by the normalized image. In short, at least the same number of the template images as the number of combinations of the colors and the patterns of the object are desired. Consider here two cases of carrying out pattern matching of the colors and the patterns of the object represented by the normalized image, respectively. Suppose first that a color of the object is a color represented by the most of pixels in the normalized image. The pattern matching means can detect the color of the object represented by the normalized image, by preparing only the same number of template images as the number of colors to detect, where the template images are filled by a color different from each other, among the colors to detect. In addition, even though position and size of the object in the digital image are changed, the pattern matching means can detect a color of the object, by comparing a color of each pixel within the segmented object area with colors of the template images. Therefore, it is not necessary for the segmented object area to be normalized. On the other hand, as concern the pattern of the object, suppose that an edge-information formation means once generates a formed edge-information image from the segmented object area, instead of the normalized image corresponding to the segmented object area, followed by that a geometrical analysis means uses the normalized image corresponding to an image generated from the formed edge-information image. Since at least one pixel in the normalized image denotes form and size representing a part of pattern of an object at its circumference, the pattern matching means can easily select the most similar template image with the normalized image, in spite of position and size of an object area.

Considering these facts, plurality of pattern matching means for colors and patterns come to reduce the number of template images very much, respectively, because a visual device individually processes a color and a pattern of an object represented by an object area, using plurality of the pattern matching means.

Next, when the number of template images increased, a past geometrical analysis means used a suitable combination of extracting only contour from edge information of an object in an animation image by using Fourier transform, normalizing size of the contour of the object in the animation image by using Affine transform, and specifying form of the object in the animation image by using Hough transform. However, since these transform methods not only process an image exactly but also carry out global processing, implementation of a visual device by hardware is not suitable. Pay attention here that the geometrical analysis means detects approximate form of the object. If the geometrical analysis means can derive position and inclination from some parts of the contour of the object hashed, and if it can collect the inclination at the center of gravity of the contour of the object, the geometrical analysis means can detect the approximate form of the object.

Considering these facts, a geometrical analysis means comes to detect position and form of an object suitable for image processing, because a means for detecting inclination calculates length and inclination angle of some line segments representing contour of the object from a formed edge-information image, followed by calculation distance of transfer of the line segments during moving the length and the inclination angle of the line segments toward the direction of the center of gravity of the contour of the object every inclination angle. In addition, a contour line of the object has been already divided into some independent line segments. Therefore, if pixels in the line segments are moved independently, satisfying with an appointed limitation condition between them and their neighbors, the geometrical analysis means comes to detect the position and the form of the object, with a little of hardware complexity and computational complexity.

Finally, after an area normalization means once moved each pixel within a segmented object area in a digital image corresponding to an object area to a whole of the digital image as distance of the pixels is approximated equal each other, the area normalization means generates a normalized image whose size is equal to size of the digital image, by complementing pixels between these pixels with an average of pixels at their neighbors. In order to complement between the pixels, therefore, the area normalization means must carry out division by a natural number or multiplication by a reciprocal number of the natural number. The reasons why the area normalization means complements in such a way are as follows: First reason is that, in a case that some segmented object areas whose size and position are different from each other denote the same object, a pattern matching means which is a destination of the normalized image must have many template images of the same object if a pattern of the segmented object area is not restructured with each pixel of the segmented object area which was once resolved. Second reason is that the similarity between the normalized image and a template image representing the same kind of object as one in the normalized image increases, by complementing between the pixels of the segmented object area which was once resolved because the digital image is generally a multi-band image with noise. As the above, however, in a case that an edge-information formation means once generates a formed edge-information image from the segmented object area, instead of the normalized image corresponding to the segmented object area, followed by that the pattern matching means uses a normalized image corresponding to an image generated by a geometrical analysis means from the formed edge-information image, at least one pixel in the normalized image denotes form and size representing a part of pattern of the object at its circumference. Therefore, even though the area normalization means does not complement, the pattern matching means can select the most similar template image with the normalized image, among some template images.

Considering these facts, a pattern matching means comes to select a pattern of an object represented by an object area even though an area normalization means does not complement.

Now, this visual device searches an object and carries out image processing of the object, by controlling a mechanism of pan, tilt and zoom in a moving camera. Image processing carried out by the visual device is mostly local processing, and the local processing can be carried out in parallel by array operation units arranged in the shape of a two-dimensional lattice. In a case that the array operation units are implemented on an LSI, each array operation unit is designed as it can communicate with its adjoining array operation units asynchronously, by using signals named SEND and RECEIVE. Therefore, since a wiring pattern becomes extremely simple, and wire length becomes short, the LSI can reduce its power consumption, increasing an implementation surface of transistors. In addition, all of the array operation units do not always have to synchronize with each other.

By the way, there are four problems on a past array operation unit. First, in a controller which sent a SEND, a time from sending a SEND to receiving a RECEIVE became long. This cause is that a controller which received the SEND does not reply the RECEIVE until it inputs a calculation datum, type, transmission times in a horizontal direction and transmission times in a vertical direction. In the past array operation unit, therefore, a processor must wait until upper, lower, left and right RECEIVE STATUS signals in the controller which sent the SEND are updated certainly. In this way, however, even though the controller communicates asynchronously, the processor must waste time in vain. Second, it is difficult to distinguish a calculation datum before transmitting and a calculation datum after transmitting because order of transmitting the calculation data is irregular. This cause is that all array operation units work independently. In the past array operation unit, therefore, a memory stored a received calculation datum with a SEND FLAG to be transmitted, while the processor had updated the SEND FLAG related with a calculation datum transmitted, after it transmitted the calculation datum, always checking all of SEND FLAGs memorized in the memory. In this way, however, the processor must check repeatedly the SEND FLAG of the calculation datum which has been already transmitted. Third, in a case that a calculation datum is transmitted toward three directions simultaneously, a processor does not always succeed in writing the calculation datum to its controller. This causes is that the controller can send a calculation datum at a time to only array operation units at four neighbors. In the past array operation unit, therefore, the more the number of array operation units designated by SEND FLAGs becomes, the longer time the processor must wait for until it can write a next calculation datum to the controller. Fourth, in a case that a calculation datum is transmitted toward three directions simultaneously, it is difficult for an array operation unit received the calculation datum to distinguish two array operation units which are designated by transmission times in a horizontal direction and transmission times in a vertical direction of the calculation datum, where the transmission times in each direction designating the array operation units are equal to each other. This cause is that a controller communicates the transmission times in the horizontal direction and the transmission times in the vertical direction, only by using a non-negative integer. In the past array operation unit, therefore, a priority was assigned to two array operation units which are senders of calculation data, and the array operation unit had always transmitted in order, from a calculation datum of an array operation unit whose priority is high. In this way, however, transmission efficiency is bad because a calculation datum of an array operation unit whose priority is low has not been transmitted until the calculation datum of the array operation unit whose priority is high is inputted. The most effective method solving these problems is to design a high-performance controller. For example, in order to solve the first problem, frequency of a clock signal of the controller has better become higher than frequency of a clock signal of the processor. In order to solve the second problem, the controller has better comprise an electronic circuit like a FIFO (First In First Out). In order to solve the third problem, the controller has better be able to send some calculation data to the array operation units at its four neighbors simultaneously. In order to solve the fourth problem, the controller has better be added two circuits representing one bit for the transmission times in the horizontal direction and the transmission times in the vertical direction, respectively. Suppose, however, that a designer tries to design such an array operation circuit in practice, hardware complexity of the array operation unit becomes huge.

Thus, in order to solve the first problem, the controller has better input the calculation datum, the type, the transmission times in the horizontal direction and the transmission times in the vertical direction after it received the SEND, followed by memorizing the SEND and replying the RECEIVE immediately. In order to solve the second problem, a substitute for the FIFO has better be implemented in the memory and the processor. In order to solve the third and fourth problems, the calculation datum have better be transmitted only in at most two directions simultaneously.

Considering these facts, an array operation unit whose transmission efficiency is high comes to be designed by implementing stacks and cyclic buffers in the memory and the processor, and by transmitting the calculation datum counter-clockwisely and clockwisely.

Now, LSIs which are fast and have much transistors have been recently developed by rapid progress of LSI technology. As concerns the degree of accumulation of LSIs, not only technology detailing the design rule but also three-dimensional LSI technology (e.g., refer to Published Unexamined Japanese Patent Application No. S63-174356, Published Unexamined Japanese Patent Application No. H2-35425, Published Unexamined Japanese Patent Application No. H7-135293), especially technology for putting together some wafers (e.g., refer to Koyanagi, M., Kurino, H., Lee, K-W., Sakuma, K., Miyakawa, N., Itani, H., "Future System-on-Silicon LSI Chips", IEEE MICRO, Vol. 18, No. 4, pp. 17-22, 1998) have been developed. Moreover, a lot of technologies stacking many chips (e.g., refer to Nikkei Microdevices, June 2000, pp. 62-79, Nikkei Microdevices June 2000, pp. 157-164, Nikkei Microdevices June 2000, pp. 176) have been recently developed. In short, since the LSIs have more and more transistors, some digital circuits implemented in some separated LSIs in past come to be implemented in an LSI easily. On the other hand, as concerns processing speed of the LSI, the more the frequency of a clock signal becomes, the serious the problems on clock skew and propagation delay time of signals becomes.

In order to solve these problems, then, many PLLs (Phase Locked Loops) has been used in the LSI. Note that these PLLs input a reference signal whose phase is fixed. In addition, comparing the difference between a phase of the reference signal and a phase of a comparison signal generated by each PLL, they change phases of their comparison signals as the difference becomes zero radian. In a case that there are many PLLs in the LSI, however, it is impossible to coincide phases of all PLLs because of propagation delay time of the reference signal. In addition, two PLLs can not communicate their comparison signals with each other. The reason is that neither PLL can generate its comparison signal whose phase is fixed, because of propagation delay time of these comparison signals. That is, if the phase difference of the comparison signal in either PLL becomes zero radian, the phase difference of the comparison signal in another PLL becomes twice of its propagation delay time. Therefore, both PLLs generate a big jitter of their comparison signals. Of course, a clock signal generated by the PLL generates a fatal jitter.

Let us aim here that each array operation unit can communicate with its adjoining array operation units asynchronously. In this case, all array operation units have better input not a clock signal whose phase is fixed but a clock signal whose period is fixed. Therefore, it is enough for a visual device to comprise such counters as all of their count numbers coincide within an appointed time, where the counters comprise independent oscillator circuits, respectively, and they communicate their count numbers with each other. In addition, suppose that each counter adjusts a phase of the oscillator circuit, according to the count numbers of all adjoining counters. As a result, a time for which all of the count numbers coincide becomes long.

Considering these facts, a counter comes to always coincide its count number with others and to supply a whole of an LSI with a high-frequency clock signal if the counter has a mechanism for memorizing all signals inputted from an external part individually, and if an oscillator circuit has a mechanism for synchronizing with a signal generated by the counter.

Now, many image sensors have been developed, using CCD (Charge Coupled Device) and CMOS (Complementary Metal Oxide Semiconductor) technology. Since many of these image sensors are used to generate a video signal they are a row-parallel type of image sensors. In addition, some image sensors stacking photo-receptor elements, charge amplifiers, A/D converters and digital circuits have been developed, using three-dimensional LSI (Large Scale Integrated Circuit) technology (e.g., refer to Published Unexamined Japanese Patent Application No. S63-174356, Published Unexamined Japanese Patent Application No. H2-35425, Published Unexamined Japanese Patent Application No. H7-135293). Many of these image sensors are a pixel-parallel type of image sensors using some vertical signal lines effectively, where a photo-receptor element, a charge amplifier, an A/D converter and a digital circuit are arranged vertically. Especially, technology for putting together some wafers (e.g., refer to Published Unexamined Japanese Patent Application No. H5-160340, Published Unexamined Japanese Patent Application No. H6-268154, Koyanagi, M., Kurino, H., Lee, K-W., Sakuma, K., Miyakawa, N., Itani, H., "Future System-on-Silicon LSI Chips", IEEE MICRO, Vol. 18, No. 4, pp. 17-22, 1998) have been recently developed. Therefore, after a manufacturer of the image sensors individually makes an LSI implementing on some photo-receptor elements, an LSI implementing on some charge amplifiers, an LSI implementing on some A/D converters and an LSI implementing on some digital circuits, he can stack these LSIs as one of the photo-receptor elements, one of the charge amplifiers, one of the A/D converters and one of the digital circuits are arranged vertically. Thus, since even LSIs manufactured in some difference processes, which had already been checked, are stacked easily, a yield of the LSIs increases. Moreover, since technology stacking many chips (e.g., refer to Nikkei Microdevices, June 2000, pp. 62-79, Nikkei Microdevices June 2000, pp. 157-164, Nikkei Microdevices June 2000, pp. 176) have been recently developed, the manufacturer of the image sensors has been able to make a high-performance image sensor easily.

By the way, there is a problem that it is difficult for three-dimensional LSI technology to increase the number of vertical signal lines, while the three-dimensional LSI technology can increase the number of transistors. The reason is that line width of the vertical signal lines is much wider than line width of signals on an implementation surface of an LSI. Moreover, the transistors can not be arranged at a place where the vertical lines are arranged. Therefore, even though a designer of an image sensor uses the three-dimensional LSI technology, some transistors in a specific circuit finally must be implemented on a specific LSI. In short, the designer of the image sensor can not increase the number of pixels of the image sensor easily.

On the other hand, this inventor has developed a visual device as a device controlling a moving camera and carrying out image processing (e.g., refer to PCT Publication Number WO 00/16259). The visual device searches an object and carries out image processing of the object, by controlling a mechanism of pan, tilt and zoom. Image processing carried out by the visual device is mostly local processing, and the local processing can be carried out in parallel by array operation units arranged in the shape of a two-dimensional lattice. In a case that the visual device is embedded in an image sensor, each of the array operation units carries out some local processings, using some pixel data generated from some photo-receptor elements. Therefore, for some applications of the image sensor, the image sensor has better adopt such a type as some adjoining pixel data are inputted by a digital circuit, rather than a pixel-parallel type of image sensors. In this case, furthermore, only one A/D converter is desired for plurality of photo-receptor elements. Therefore, even though the number of pixels of the image sensor increases, a designer of the image sensor does not always have to increase the number of the A/D converters and the digital circuits. Of course, since all of the A/D converters and all of the digital circuits can work in parallel, performance of the image sensor seldom drops.

Considering these facts, an image sensor whose resolution and performance are high comes to be manufactured because some sensor modules are arranged in the shape of a two-dimensional lattice in the image sensor, some photo-receptor elements are arranged in the shape of a two-dimensional lattice in each of the sensor modules, and moreover, each of the sensor modules generates a pixel signal from the photo-receptor elements, in order.

Now, for a past image sensor, its specification had to be decided in designing. Of course, some electronic circuits can be changed after manufacturing the image sensor, by using an FPGA (Field Programmable Gate Array) and a CPLD (Complex Programmable Logic Device). However, the image sensor needs electronic circuits for the FPGA and the CPLD, a set of large memories and many signal lines from an external part. On the other hand, when each of sensor modules comprises many photo-receptor elements in the above image sensor, an implementation area of each of digital circuits also increases in proportion to the number of photo-receptor elements. Therefore, each of the digital circuits can comprise a processor and a set of large memories. Since the memories can store all pixel signals generated by the sensor module, the processor can refer the enormous number of pixel patterns consisting of all pixel signals. Suppose, thus, that combinations of a memory datum, a memory address and a write clock signal are assigned to these patterns. The processor can write a suitable memory datum at any memory address, according to the write clock signal. In addition, if at least one part of the set of memories is non-volatile, the part of the memories can remain storing the memory datum. Therefore, the processor can change even a program stored in the part of the memories. Thus, after a manufacturer of image sensors once made an image sensor, he can change a program if desired. Moreover, he can omit signal lines supplying all sets of memories with the program.

Considering these facts, an image sensor comes to change a program in all sets of memories simultaneously because light with a specific pattern is applied to all photo-receptor elements in the image sensor.

In the present invention described in claims, a visual device analyzes geometry of an object in a digital image, by repeating local processing for each pixel of the digital image, while it separates an object area and a background area quickly by using a formed edge-information image. In addition, in the present invention described in claims, an array operation unit and a virtual array operation unit transmit a calculation datum effectively, by designing a controller possible to reply a RECEIVE immediately after receiving a SEND, followed by transmitting the calculation datum counter-clockwisely and clockwisely. In addition, the present invention described in claims realizes an interlocked counter always possible to adjust its count number, according to some interlocking signals outputted by other interlocked counters, even though some of the interlocked counters do not communicate their interlocking signals with others. Finally, in the present invention described in claims an image sensor, whose resolution is high and which is fast, is manufactured, by outputting some pixel signals from each of sensor modules comprising photo-receptor elements arranged in the shape of a two-dimensional lattice.

SUMMARY OF THE INVENTION

The invention described in claim 1 is a visual device, for at least one object in an animation image comprising plurality of digital images, comprising: a first image memorizing means memorizing said plurality of digital images in order; an edge-information generation means generating a rough edge-information image from said plurality of digital images; an edge-information formation means forming said rough edge-information image into a formed edge-information image by using said digital images; and a geometrical analysis means generating a form-size-information image by detecting position, size and form of at least one said object in said digital image from said formed edge-information image, wherein said geometrical analysis means comprises: a position/size/inclination detection means generating an inclination-size-information image from said formed edge-information image; and a position/size/form detection means generating said form-size-information image from said formed edge-information image and said inclination-size-information image. In the present invention, a data processing device consisting of plurality of array operation units arranged in the shape of a two-dimensional lattice may realize one or more different means of all means, or all said means. Said position/size/inclination detection means suitably divides contour of said object represented by formed edge information constructing each pixel of said formed edge-information image into some contours, by carrying out eight-neighbor processing for said formed edge-information image, Moreover, it generates inclination-size information constructing each pixel of said inclination-size-information image, by calculating inclination for each of said contours divided. A position/size/form detection means collects said inclination-size information at a pixel every said object, according to collecting said formed edge information at a pixel every said object, and generates form-size information representing form of said object. Therefore, said geometrical analysis means can generate said form-size-information image representing position, size and said form of at least one said object in said digital image. Since said array operation units can always detect said position, said size and said form of said object in said animation image, only by carrying out local processing repeatedly, in the present invention, many problems on recognition of said object are solved very well.

The invention described in claim 2 is a visual device, for at least one object in an animation image comprising plurality of digital images, comprising: a first image memorizing means memorizing said plurality of digital images in order; an edge-information generation means generating a rough edge-information image from said plurality of digital images; a first edge-information formation means forming said rough edge-information image into a first formed edge-information image by using said digital image; a position/size detection means generating first redundant-information image, by detecting position and size of at least one said object segmented by first formed edge information constructing said first formed edge-information image; a figure/ground separation means generating an object-area image representing at least one object area of at least one said object segmented by said first formed edge information, by using plurality of nonlinear oscillators; and a second image memorizing means memorizing said object-area image in an appointed period, wherein said figure/ground separation means separates at least one said object area from a background area in said digital image, by inputting all of first redundant information constructing said first redundant-information image to corresponding said nonlinear oscillators as external noise, respectively. In the present invention, a data processing device consisting of plurality of array operation units arranged in the shape of a two-dimensional lattice may realize one or more different means of all means, or all said means. Said first redundant information constructing each pixel of said first redundant-information image represents the number of said first formed edge-information collected at a pixel. Moreover, said pixel represents approximate position of a center of gravity of a corresponding said object. On the other hand, in said figure/ground separation means, said nonlinear oscillator is implemented at each of said array operation units arranged in the shape of a two-dimensional lattice. Moreover, each of said nonlinear oscillators is connected with plurality of nonlinear oscillators at its neighbors by positive connection value, and with plurality of nonlinear oscillators around said neighbors by negative connection value. Suppose that the difference of phases of a set of said nonlinear oscillators becomes large. Note that said first formed edge information constructing said first formed edge-information image is put between said nonlinear oscillators. Suppose, moreover, that the difference of other sets of said nonlinear oscillators becomes small. Said figure/ground separation means can separate at least one said object area of said objects from said background area. Since each said first redundant information is inputted by a corresponding said nonlinear oscillator as said external noise, phase of said nonlinear oscillator inputting said first redundant information which is not zero is shifting from phase of other said nonlinear oscillators. In this case, said nonlinear oscillators at neighbors of said nonlinear oscillator inputting said first redundant information which is not zero also attract said nonlinear oscillators at their neighbors. As a result, phase of plurality of said nonlinear oscillators within at least one said object area shifts fast from phase of other said nonlinear oscillators. Since said figure/ground separation means can quickly separate at least one said object area from said background area in the present invention, many problems on separation of said object and said background are solved very well.

The invention described in claim 3 is a visual device comprising at least one data processing device consisting of plurality of array operation units arranged in a shape of a two-dimensional lattice, comprising: a position/size/inclination detection means generating an inclination-size-information image from a binary image; and a position/size/form detection means generating a form-size-information image from said binary image and said inclination-size-information image, wherein said form-size-information image represents position, size and form of at least one object in said binary image, by that form-size information constructing each pixel of said form-size-information image represents said form and said size of said object. The present invention uses an edge-information image and a color-information image and so on as said binary image. Note that they are formed as almost all of their line width is two or three pixels. In the present invention, moreover, said position/size/inclination detection means and said position/size/form detection means may be realized by two said data processing devices, respectively, or one said data processing device. In a case that said binary image represents contour of said object, said position/size/inclination detection means makes neighbor size of local processing carried out in each of said array operation units small. In particular, by setting said neighbor size to eight neighbors, it can hash said contour and generate inclination-size information constructing each pixel of said inclination-size-information image from some said contours hashed. Here, inclination-size information consists of redundant information and an inclination angle for said contour, and said inclination angle is represented within zero or more degrees and less than 180 degrees from a horizontal axis. Said position/size/form detection means can detect said position, said size and said form every said object, by collecting said inclination-size information at each pixel. Note that it collects information of each pixel of said binary image together. Since the present invention can detect said position, said size and said form of said objects, in spite of the number of said objects in said binary image, many problems on recognition of said objects are solved very well.

The invention described in claim 4 is a visual device comprising at least one data processing device consisting of plurality of array operation units arranged in a shape of a two-dimensional lattice, comprising: a position/size/inclination detection means generating an inclination-size-information image from a binary image; and a position/size/form detection means generating a form-size-information image from said binary image and said inclination-size-information image, wherein said form-size-information image represents texture of at least one object in said binary image, by that form-size information constructing each pixel of said form-size-information image represents form and size of said object. The present invention uses an edge-information image and a color-information image and so on as said binary image. Note that they are formed as almost all of their line width is two or three pixels. In the present invention, moreover, said position/size/inclination detection means and said position/size/form detection means may be realized by two said data processing devices, respectively, or one said data processing device. In a case that said binary image represents said texture of said object, said position/size/inclination detection means makes neighbor size of local processing carried out in each of said array operation units small. In particular, by setting said neighbor size to eight neighbors, it can divide said texture into some line segments and generate inclination-size information constructing each pixel of said inclination-size-information image from some said line segments. Here, inclination-size information consists of redundant information and an inclination angle for said line segment. Moreover, said inclination angle is represented within zero or more degrees and less than 180 degrees from a horizontal axis. Said position/size/form detection means can detect said texture every said line segment covering said object, by collecting said inclination-size information at each pixel. Note that it collects information of each pixel of said binary image together. Since the present invention can detect said texture of said objects, in spite of the number of said objects in said binary image, many problems on recognition of said objects are solved very well.

The invention described in claim 5 is a visual device comprising a data processing device consisting of plurality of array operation units arranged in a shape of a two-dimensional lattice, wherein each of said array operation units comprises: a means for initializing said array operation unit; a means for finishing processing if there is no binary information or inclination-size information to be inputted; a means for inputting said binary information and inclination-size information; a means for separating said binary information and inclination-size information; a means for transforming said binary information into redundant information; a means for transforming said inclination-size information into transfer-source inclination-redundant information; a means for calculating a center of gravity from neighbors of a band-pixel value in a redundant-information image representing said redundant information, and converting imagery of a transfer value derived from said center of gravity to a band-pixel value of a transfer-value image; a means for transferring each of band-pixel values in a transfer-source inclination-redundant-information image representing transfer-source inclination-redundant information to a transfer position, according to said transfer value, for each inclination and each transfer source; a means for transferring said band-pixel value in said redundant-information image to said transfer position, according to said transfer value; a means for updating each of said band-pixel values in said transfer-source inclination-redundant-information image to a summation of a summation of all of said band-pixel values in said transfer-source inclination-redundant-information image which have already been transferred and a value corresponding to said inclination-size information among said band-pixel values in said transfer-source inclination-redundant-information image which have already been transferred, for each inclination and each of said transfer-sources; a means for updating said band-pixel value in said redundant-information image to a summation of all of said band-pixel values in said redundant-information image which have already been transferred; and a means for outputting each of said band-pixel values in said transfer-source inclination-redundant-information image. In short, this is the enforcement form of an algorithm for realizing a function offered by said array operation units by using digital technology. Said array operation units were arranged in a shape of a two-dimensional lattice, followed by connecting said array operation units and their neighbors each to each. After initializing each parameter in said array operation units, the present invention inputs a binary image consisting of said binary information and an inclination-redundant-information image consisting of said inclination-size information every pixel if desired. Moreover, it carries out a sequence of processes from calculating said center of gravity to outputting each band-pixel value of said redundant-information image and said transfer-source inclination-redundant-information image one by one. The present invention repeats a sequence of these processes until said binary image or said inclination-size-information image comes not to be inputted. Since the present invention can work said array operation units in parallel, many problems on detection of position, size and form of objects are solved very well.

The invention described in claim 6 is a visual device comprising a data processing device consisting of plurality of array operation units arranged in a shape of a two-dimensional lattice, wherein each of said plurality of array operation units comprises: a means for initializing said array operation unit; a means for finishing processing if there is no binary information or inclination-size information to be inputted; a means for inputting said binary information and inclination-size information; a means for separating said binary information and inclination-size information; a means for transforming said binary information into redundant information; a means for transforming said inclination-size information into transfer-source inclination-redundant information; a means for calculating a center of gravity from neighbors of a band-pixel value in a redundant-information image representing said redundant information, and converting imagery of a transfer value derived from said center of gravity to a band-pixel value of a transfer-value image; a means for transferring each of band-pixel values in a transfer-source inclination-redundant-information image representing transfer-source inclination-redundant information to a transfer position, according to said transfer value, for each inclination and each transfer source; a means for transferring said band-pixel value in said redundant-information image to said transfer position, according to said transfer value; a means for updating each of said band-pixel values in said transfer-source inclination-redundant-information image to a summation of a summation of all of said band-pixel values in said transfer-source inclination-redundant-information image which have already been transferred and a value corresponding to said inclination-size information among said band-pixel values in said transfer-source inclination-redundant-information image which have already been transferred, for each inclination and each of said transfer-sources; a means for updating said band-pixel value in said redundant-information image to a summation of all of said band-pixel values in said redundant-information image which have already been transferred; a means for discriminating form from all of said band-pixel values in said transfer-source inclination-redundant-information image; a means for generating each of band-pixel values in a form-size-information image representing form-size information from said band-pixel values in said redundant-information image and a discrimination result of said form; and a means for outputting each of said band-pixel values in said form-size-information image. In short, this is the enforcement form of an algorithm for realizing a function offered by said array operation units by using digital technology. Said array operation units were arranged in a shape of a two-dimensional lattice, followed by connecting said array operation units and their neighbors each to each. After initializing each parameter in said array operation units, the present invention inputs a binary image consisting of said binary information and an inclination-redundant-information image consisting of said inclination-size information every pixel if desired. Moreover, it carries out a sequence of processes from calculating said center of gravity to outputting each band-pixel value of said form-size-information image one by one. The present invention repeats a sequence of these processes until said binary image or said inclination-size-information image comes not to be inputted. Since the present invention can work said array operation units in parallel, many problems on detection of position, size and said form of objects are solved very well.

The invention described in claim 7 is a visual device comprising a data processing device consisting of plurality of array operation units arranged in a shape of a two-dimensional lattice, wherein each of said array operation units comprises: a means for inputting a corresponding pixel in a binary image; a means for inputting a corresponding pixel in a gray-scale image; a means for calculating plurality of parameters in a nonlinear oscillator; and a means for outputting a calculation result of said nonlinear oscillator, wherein said nonlinear oscillator separates at least one object area segmented by said binary image from a background area, by dealing with said corresponding pixel in said gray-scale image as an external noise. In the present invention, a formed edge-information image is mainly used as said binary image, and a redundant-information image corresponding to said binary image is used as said gray-scale image. Therefore, redundant information corresponding to approximate position of a center of gravity of at least one said object area segmented by said binary image becomes a positive number, and others of said redundant-information become zero. In addition, the bigger said object becomes, the larger said redundant information becomes. Since all of said nonlinear oscillators input said corresponding redundant information as said external noise, respectively, phase of at least one said nonlinear oscillator inputting said redundant information which is not zero gains or loses against phase of remaining said nonlinear oscillators. Moreover, this said nonlinear oscillator inputting said redundant information which is not zero attracts phase of plurality of said nonlinear oscillators at its neighbors toward its said phase. As a result, phase of plurality of said nonlinear oscillators within at least one said object area segmented by said binary image and phase of plurality of said nonlinear oscillators within a background area shift quickly each other. Since the present invention separates at least one said object area and said background area fast, many problems on separation of objects and background are solved very well.

The invention described in claim 8 is a visual device comprising plurality of array operation units arranged in a shape of a two-dimensional lattice, wherein each of said calculation data in each of said array operation units is transmitted counter-clockwisely between plurality of said array operation units arranged in a shape of a two-dimensional lattice, by that each of said array operation units comprises: a means for sending said calculation datum calculated in said array operation unit to said array operation units at said four neighbors; a means for transmitting said calculation datum received from said array operation unit on a left side among said four neighbors to at least one of said array operation unit on a right side and said array operation unit on an upper side; a means for transmitting said calculation datum received from said array operation unit on a lower side among said four neighbors to at least one of said array operation unit on an upper side and said array operation unit on a left side; a means for transmitting said calculation datum received from said array operation unit on a right side among said four neighbors to at least one of said array operation unit on a left side and said array operation unit on a lower side; and a means for transmitting said calculation datum received from said array operation unit on an upper side among said four neighbors to at least one of said array operation unit on a lower side and said array operation unit on a right side. The present invention can transmit said calculation datum to voluntary said array operation units within a square area decided by max transmission times. Of course, the present invention can transmit said calculation datum only to a voluntary rectangular area and a circular area, by arranging horizontal transmission times and vertical transmission times. In a case that said array operation unit received said calculation datum from said array operation unit on a left side, said array operation unit can transmit said calculation datum to said array operation unit on a right hand if said horizontal transmission times is less than max transmission times. Here, if said vertical transmission times is zero and less than max transmission times, said array operation unit can transmit said calculation datum to said array operation unit on an upper side. In a case that said array operation unit received said calculation datum from said array operation unit on a lower side, said array operation unit can transmit said calculation datum to said array operation unit on an upper hand if said vertical transmission times is less than max transmission times. Here, if said horizontal transmission times is zero and less than max transmission times, said array operation unit can transmit said calculation datum to said array operation unit on a left side. In a case that said array operation unit received said calculation datum from said array operation unit on a right side, said array operation unit can transmit said calculation datum to said array operation unit on a left hand if said horizontal transmission times is less than max transmission times. Here, if said vertical transmission times is zero and less than max transmission times, said array operation unit can transmit said calculation datum to said array operation unit on a lower side. In a case that said array operation unit received said calculation datum from said array operation unit on an upper side, said array operation unit can transmit said calculation datum to said array operation unit on a lower hand if said vertical transmission times is less than max transmission times. Here, if said horizontal transmission times is zero and less than max transmission times, said array operation unit can transmit said calculation datum to said array operation unit on a right side. Since the present invention transmits said calculation datum counter-clockwisely in a shape of a spiral, it can distribute communication load of said array operation units. Therefore, many problems on sharing said calculation datum between said array operation units are solved very well.

The invention described in claim 9 is a visual device comprising plurality of array operation units arranged in a shape of a two-dimensional lattice, wherein each of said calculation data in each of said array operation units is transmitted clockwisely between plurality of said array operation units arranged in a shape of a two-dimensional lattice, by that each of said array operation units comprises: a means for sending said calculation datum calculated in said array operation unit to said array operation units at said four neighbors; a means for transmitting said calculation datum received from said array operation unit on a left side among said four neighbors to at least one of said array operation unit on a right side and said array operation unit on a lower side; a means for transmitting said calculation datum received from said array operation unit on a lower side among said four neighbors to at least one of said array operation unit on an upper side and said array operation unit on a right side; a means for transmitting said calculation datum received from said array operation unit on a right side among said four neighbors to at least one of said array operation unit on a left side and said array operation unit on an upper side; and a means for transmitting said calculation datum received from said array operation unit on an upper side among said four neighbors to at least one of said array operation unit on a lower side and said array operation unit on a left side. The present invention can transmit said calculation datum to voluntary said array operation units within a square area decided by max transmission times. Of course, the present invention can transmit said calculation datum only to a voluntary rectangular area and a circular area, by arranging horizontal transmission times and vertical transmission times. In a case that said array operation unit received said calculation datum from said array operation unit on a left side, said array operation unit can transmit said calculation datum to said array operation unit on a right hand if said horizontal transmission times is less than max transmission times. Here, if said vertical transmission times is zero and less than max transmission times, said array operation unit can transmit said calculation datum to said array operation unit on a lower side. In a case that said array operation unit received said calculation datum from said array operation unit on a lower side, said array operation unit can transmit said calculation datum to said array operation unit on an upper hand if said vertical transmission times is less than max transmission times. Here, if said horizontal transmission times is zero and less than max transmission times, said array operation unit can transmit said calculation datum to said array operation unit on a right side. In a case that said array operation unit received said calculation datum from said array operation unit on a right side, said array operation unit can transmit said calculation datum to said array operation unit on a left hand if said horizontal transmission times is less than max transmission times. Here, if said vertical transmission times is zero and less than max transmission times, said array operation unit can transmit said calculation datum to said array operation unit on an upper side. In a case that said array operation unit received said calculation datum from said array operation unit on an upper side, said array operation unit can transmit said calculation datum to said array operation unit on a lower hand if said vertical transmission times is less than max transmission times. Here, if said horizontal transmission times is zero and less than max transmission times, said array operation unit can transmit said calculation datum to said array operation unit on a left side. Since the present invention transmits said calculation datum clockwisely in a shape of a spiral, it can distribute communication load of said array operation units. Therefore, many problems on sharing said calculation datum between said array operation units are solved very well.

The invention described in claim 10 is a visual device comprising plurality of virtual array operation units arranged in a shape of a two-dimensional lattice, wherein each of said calculation data in each of said virtual array operation units is transmitted counter-clockwisely between plurality of said virtual array operation units arranged in a shape of a two-dimensional lattice, by that each of said virtual array operation units comprises: a means for sending said calculation datum calculated in said virtual array operation unit to said virtual array operation units at said four neighbors; a means for transmitting said calculation datum received from said virtual array operation unit on a left side among said four neighbors to at least one of said virtual array operation unit on a right side and said virtual array operation unit on an upper side; a means for transmitting said calculation datum received from said virtual array operation unit on a lower side among said four neighbors to at least one of said virtual array operation unit on an upper side and said virtual array operation unit on a left side; a means for transmitting said calculation datum received from said virtual array operation unit on a right side among said four neighbors to at least one of said virtual array operation unit on a left side and said virtual array operation unit on a lower side; and a means for transmitting said calculation datum received from said virtual array operation unit on an upper side among said four neighbors to at least one of said virtual array operation unit on a lower side and said virtual array operation unit on a right side. The present invention can transmit said calculation datum to voluntary said virtual array operation units within a square area decided by max transmission times. Of course, the present invention can transmit said calculation datum only to a voluntary rectangular area and a circular area, by arranging horizontal transmission times and vertical transmission times. In a case that said virtual array operation unit received said calculation datum from said virtual array operation unit on a left side, said virtual array operation unit can transmit said calculation datum to said virtual array operation unit on a right hand if said horizontal transmission times is less than max transmission times. Here, if said vertical transmission times is zero and less than max transmission times, said virtual array operation unit can transmit said calculation datum to said virtual array operation unit on an upper side. In a case that said virtual array operation unit received said calculation datum from said virtual array operation unit on a lower side, said virtual array operation unit can transmit said calculation datum to said virtual array operation unit on an upper hand if said vertical transmission times is less than max transmission times. Here, if said horizontal transmission times is zero and less than max transmission times, said virtual array operation unit can transmit said calculation datum to said virtual array operation unit on a left side. In a case that said virtual array operation unit received said calculation datum from said virtual array operation unit on a right side, said virtual array operation unit can transmit said calculation datum to said virtual array operation unit on a left hand if said horizontal transmission times is less than max transmission times. Here, if said vertical transmission times is zero and less than max transmission times, said virtual array operation unit can transmit said calculation datum to said virtual array operation unit on a lower side. In a case that said virtual array operation unit received said calculation datum from said virtual array operation unit on an upper side, said virtual array operation unit can transmit said calculation datum to said virtual array operation unit on a lower hand if said vertical transmission times is less than max transmission times. Here, if said horizontal transmission times is zero and less than max transmission times, said virtual array operation unit can transmit said calculation datum to said virtual array operation unit on a right side. Since the present invention transmits said calculation datum counter-clockwisely in a shape of a spiral, it can distribute communication load of said virtual array operation units. Therefore, many problems on sharing said calculation datum between said virtual array operation units are solved very well.

The invention described in claim 11 is a visual device comprising plurality of virtual array operation units arranged in a shape of a two-dimensional lattice, wherein each of said calculation data in each of said virtual array operation units is transmitted clockwisely between plurality of said virtual array operation units arranged in a shape of a two-dimensional lattice, by that each of said virtual array operation units comprises: a means for sending said calculation datum calculated in said virtual array operation unit to said virtual array operation units at said four neighbors; a means for transmitting said calculation datum received from said virtual array operation unit on a left side among said four neighbors to at least one of said virtual array operation unit on a right side and said virtual array operation unit on a lower side; a means for transmitting said calculation datum received from said virtual array operation unit on a lower side among said four neighbors to at least one of said virtual array operation unit on an upper side and said virtual array operation unit on a right side; a means for transmitting said calculation datum received from said virtual array operation unit on a right side among said four neighbors to at least one of said virtual array operation unit on a left side and said virtual array operation unit on an upper side; and a means for transmitting said calculation datum received from said virtual array operation unit on an upper side among said four neighbors to at least one of said virtual array operation unit on a lower side and said virtual array operation unit on a left side. The present invention can transmit said calculation datum to voluntary said virtual array operation units within a square area decided by max transmission times. Of course, the present invention can transmit said calculation datum only to a voluntary rectangular area and a circular area, by arranging horizontal transmission times and vertical transmission times. In a case that said virtual array operation unit received said calculation datum from said virtual array operation unit on a left side, said virtual array operation unit can transmit said calculation datum to said virtual array operation unit on a right hand if said horizontal transmission times is less than max transmission times. Here, if said vertical transmission times is zero and less than max transmission times, said virtual array operation unit can transmit said calculation datum to said virtual array operation unit on a lower side. In a case that said virtual array operation unit received said calculation datum from said virtual array operation unit on a lower side, said virtual array operation unit can transmit said calculation datum to said virtual array operation unit on an upper hand if said vertical transmission times is less than max transmission times. Here, if said horizontal transmission times is zero and less than max transmission times, said virtual array operation unit can transmit said calculation datum to said virtual array operation unit on a right side. In a case that said virtual array operation unit received said calculation datum from said virtual array operation unit on a right side, said virtual array operation unit can transmit said calculation datum to said virtual array operation unit on a left hand if said horizontal transmission times is less than max transmission times. Here, if said vertical transmission times is zero and less than max transmission times, said virtual array operation unit can transmit said calculation datum to said virtual array operation unit on an upper side. In a case that said virtual array operation unit received said calculation datum from said virtual array operation unit on an upper side, said virtual array operation unit can transmit said calculation datum to said virtual array operation unit on a lower hand if said vertical transmission times is less than max transmission times. Here, if said horizontal transmission times is zero and less than max transmission times, said virtual array operation unit can transmit said calculation datum to said virtual array operation unit on a left side. Since the present invention transmits said calculation datum clockwisely in a shape of a spiral, it can distribute communication load of said virtual array operation units. Therefore, many problems on sharing said calculation datum between said virtual array operation units are solved very well.

The invention described in claim 12 is a visual device comprising plurality of array operation units or plurality of virtual array operation units arranged in a shape of a two-dimensional lattice, wherein each of all of said array operation units and all of said virtual array operation units comprises a processor, a set of memories and plurality of controllers, wherein at least one said controller transmits a calculation datum only at most a number of times related to a number of said controller, to which said processor wrote said calculation data, by that a number is assigned to at least two said controllers at intervals of an appointed number, and each of all of said controllers, to which said number is assigned, communicates with at least one of said controllers, whose number shifts only said appointed number from said number of said controller, in each of adjoining said array operation units and adjoining said virtual array operation units, for each of all of said array operation units and all of said virtual array operation units. In the present invention, whenever said calculation datum is transmitted by said controller, said number of said controller becomes large or small. Moreover, if said calculation datum is transmitted to said controller, whose number is the largest or the smallest, said calculation datum is destroyed. Therefore, said calculation datum is transmitted to a specific direction only desired times, only by that said processor writes said calculation datum to a specific said controller. Moreover, said processor does not have to judge end of transmitting said calculation datum. In addition, said processor can also calculate transmission times, by reading said calculation datum from a specific said controller. Therefore, many problems on transmitting said calculation datum are solved very well.

The invention described in claim 13 is an interlocked counter comprising a synchronous counter, a logic gate for judging end-value, a logic gate for amplifying interlocking signal, at least one latch circuit for interlocking signal, a logic gate for interlocking signal, and a logic gate for enable signal, wherein behavior of said synchronous counter is stopped when a count number arrived at an end value, by that said synchronous counter counts a number of pulses of a clock signal when said synchronous counter inputted an enable signal, said logic gate for judging end-value generates an interlocking signal when said count number outputted by a synchronous counter coincided with said end value, said logic gate for amplifying interlocking signal amplifies said interlocking signal in order to output to an external part, and said logic gate for enable signal generates said enable signal when said interlocking signal is not generated, and said behavior of said synchronous counter is restarted, by that each of said latch circuits for interlocking signal memorizes one of said interlocking signals inputted from an external part when said interlocking signal outputted by said logic gate for judging end-value is not generated, said logic gate for interlocking signal judges whether all of said latch circuits for interlocking signal memorize said interlocking signals, and said logic gate for enable signal generates said enable signal when all of said latch circuits for interlocking signal memorize said interlocking signals. Said synchronous counter is an up-counter or a down-counter which has one or more bits, and can count said pulses of said clock signal only when said enable signal is active. A clock terminal of said synchronous counter can be for either rising edge or falling edge. If said count number is a maximum value or a minimum value, said logic gate for judging end-value makes said interlocking signal active. Otherwise, said interlocking signal is inactive. Since said interlocking signal is sent to said external part, a logic gate whose drive performance is high is used as said logic gate for amplifying interlocking signal. When said interlocking signal is inactive, said logic gate for enable signal makes said enable signal active. Therefore, after said synchronous counter counted said pulses of said clock signal until said count-number arrives at said maximum value or said minimum value, said interlocking signal becomes active, followed by that said synchronous counter stops. When said interlocking signal is active, each of said latch circuits of interlocking signal becomes possible to memorize that one of at least one said interlocking signal inputted from said external part is active. Otherwise, each of said latch circuits for interlocking signal is resetted. When all of said latch circuits for interlocking signal memorized said interlocking signals, output of said logic gate for interlocking signal becomes active. When output of a logic gate for interlocking signal is active, said logic gate for enable signal makes said enable signal active, in spite of said interlocking signal outputted by said logic gate for judging end-value. Therefore, even though said behavior of said synchronous counter is stopping, said behavior of said synchronous counter is restarted if all of said interlocking signals inputted from said external part are active. Since the present invention can control said behavior of said synchronous counter by at least one said interlocking signal inputted from said external part, many problems on said behavior of said synchronous counter are solved very well.

The invention described in claim 14 is an interlocked counter comprising a synchronous counter which comprises at least one of a synchronous clear means and a synchronous load means, a logic gate for judging end-value, a logic gate for amplifying interlocking signal, at least one latch circuit for interlocking signal, a logic gate for interlocking signal, a logic gate for enable signal, and a logic gate for initialization, wherein behavior of said synchronous counter is stopped when a count number arrived at an end value, by that said synchronous counter counts a number of pulses of a clock signal when said synchronous counter inputted an enable signal, said logic gate for judging end-value generates an interlocking signal when said count number outputted by a synchronous counter coincided with said end value, said logic gate for amplifying interlocking signal amplifies said interlocking signal in order to output to an external part, and said logic gate for enable signal generates said enable signal when said interlocking signal is not generated, said behavior of said synchronous counter is restarted, by that each of said latch circuits for interlocking signal memorizes one of said interlocking signals inputted from an external part when said interlocking signal outputted by said logic gate for judging end-value is not generated, said logic gate for interlocking signal judges whether all of said latch circuits for interlocking signal memorize said interlocking signals, and said logic gate for enable signal generates said enable signal when all of said latch circuits for interlocking signal memorize said interlocking signals, and said synchronous clear means and said synchronous load means set an initial value to said synchronous counter by using an initialization signal, by that said logic gate for initialization signal inputs said interlocking signal outputted by said logic gate for judging end-value and said enable signal, and generates said initialization signal. Said synchronous counter is an up-counter or a down-counter which has one or more bits. Moreover, it can count said pulses of said clock signal only when said enable signal is active. A clock terminal of said synchronous counter can be for either rising edge or falling edge. If said count number is a maximum value or a minimum value, said logic gate for judging end-value makes said interlocking signal active. Otherwise, said interlocking signal is inactive. Since said interlocking signal is sent to said external part, a logic gate whose drive performance is high is used as said logic gate for amplifying interlocking signal. When said interlocking signal is inactive, said logic gate for enable signal makes said enable signal active. Therefore, after said synchronous counter counted said pulses of said clock signal until said count number arrives at said maximum value or said minimum value, said interlocking signal becomes active, followed by that said synchronous counter stops. When said interlocking signal is active, each of said latch circuits of interlocking signal becomes possible to memorize that one of at least one said interlocking signal inputted from said external part is active. Otherwise, each of said latch circuits for interlocking signal is resetted. When all of said latch circuits for interlocking signal memorized said interlocking signals, output of said logic gate for interlocking signal becomes active. When output of a logic gate for interlocking signal is active, said logic gate for enable signal makes said enable signal active, in spite of said interlocking signal outputted by said logic gate for judging end-value. Therefore, even though said behavior of said synchronous counter is stopping, said behavior of said synchronous counter is restarted if all of said interlocking signals inputted from said external part are active. In addition, when both of said interlocking signal and said enable signal are active, said logic gate for initialization signal makes said initialization signal active. In a case that a clear terminal of said synchronous counter inputs said initialization signal, said synchronous clear means sets said count number to said maximum value or said minimum value. In a case that a load terminal of said synchronous counter inputs said initialization signal, said synchronous load means sets said count number to a suitable said initial value. Therefore, said synchronous counter can limit said count number within said initial value and said end value. Since the present invention can control said behavior of said synchronous counter by at least one said interlocking signal inputted from said external part, many problems on said behavior of said synchronous counter are solved very well.

The invention described in claim 15 is an interlocked counter according to claim 13 or 14, which comprises a synchronous oscillator comprising a self-oscillation circuit generating said clock signal, which comprises a latch circuit for synchronous signal, and at least one logic gate for amplifying clock signal, wherein said latch circuit for synchronous signal inputs said enable signal, an output of said latch circuit for synchronous signal changes phase of said clock signal, and at least one said logic gate for clock signal amplifies said clock signal. The present invention uses a D-latch as said latch circuit for synchronous signal, and said enable signal is inputted at a gate terminal of said D-latch. Therefore, said latch circuit for synchronous signal works as a buffer and a NOT gate if said enable signal is active. Otherwise, said latch circuit for synchronous signal memorizes an input signal. In a case that an oscillator comprising one or more logic gates like a ring oscillator, an astable multi-vibrator and so on is used as said self-oscillation circuit, said latch circuit for synchronous signal is used instead of one of said logic gates. Therefore, if said enable signal is active, said self-oscillation circuit self-oscillates. Otherwise, said self-oscillation circuit is stabilized at a current state said self-oscillation circuit, thus, can lose said phase of said clock signal until said enable signal becomes active. A NOT gate is used as said logic gate for amplifying clock signal. Said logic gate for amplifying clock signal amplifies said clock signal generated by said self-oscillation circuit, if desired. Moreover, said synchronous counter and other electronic circuits are supplied with it. In the present invention, said synchronous oscillator does not change voltage of said clock signal while said synchronous counter is stopping. Therefore, said synchronous counter can count all of said pulses of said clock signal. Thus, many problems on said pulses of said clock signal are solved very well.

The invention described in claim 16 is an interlocked counter according to claim 13 or 14, which comprises a synchronous oscillator comprising: a flip-flop circuit for synchronous signal, a synchronous signal amplifier, a loop filter, a voltage controlled oscillator, and at least one logic gate for amplifying clock signal, wherein said latch circuit for synchronous signal memorizes said enable signal, said synchronous signal amplifier amplifies an output of said latch circuit for synchronous signal, said loop filter reduces a noise included in an output of said synchronous signal amplifier, said voltage controlled oscillator generates said clock signal, said voltage controlled oscillator changes phase of said clock signal according to voltage outputted by said loop filter, and at least one said logic gate for clock signal amplifies said clock signal. The present invention uses a D-flip-flop as said flip-flop circuit for synchronous signal, and said enable signal is inputted at a D terminal of said D-flip-flop. Note that said clock signal is inputted at a clock terminal of said D-flip flop. Therefore, said D-flip-flop circuit for synchronous signal memorizes the same signal as said enable signal. An amplifier possible to generate voltage necessary to control said voltage controlled oscillator is used as said synchronous signal amplifier. If this voltage is within a gate level, a NOT gate and a buffer is used as said synchronous signal amplifier. Otherwise, a general amplifier is used as said synchronous signal amplifier. A lag filter, a lag lead filter and their variations are used as said loop filter. Said loop filter reduces a high-frequency noise included in said output of said synchronous signal amplifier in order to inhibit jitter of said clock signal outputted by said voltage controlled oscillator. A Colpitz oscillator, a Pias oscillator and so on using a piezoelectric element like a crystal oscillator are used as said voltage controlled oscillator, and frequency of said clock signal outputted by said voltage controlled oscillator is varied by a variable capacitance diode which changes capacitance according to voltage. Therefore, said voltage controlled oscillator can gain said phase of said clock signal while said flip-flop circuit for synchronous signal is memorizing an active said enable signal. A NOT gate is used as said logic gate for amplifying clock signal. Said logic gate for amplifying clock signal amplifies said clock signal generated by said self-oscillation circuit, if desired. Moreover, said synchronous counter and other electronic circuits are supplied with it. In the present invention, said synchronous oscillator changes a period of said clock signal only a little while said synchronous counter is stopping. Therefore, said synchronous oscillator can make the difference of phases between said interlocking signal outputted by said logic gate for judging end-value and at least one said interlocking signal inputted from said external part as small as possible, seldom affecting behavior of said other electronic circuits. Thus, many problems on said period of said clock signal are solved very well.

The invention described in claim 17 is an interlocked device comprising plurality of interlocked counters according to at least one of claim 13 to 16, wherein said count numbers of said synchronous counters in said interlocked counters are even, by that said plurality of interlocked counters are arranged on a plane; all distance between adjoining said interlocked counters is equal; adjoining said interlocked counters communicate said interlocking signals each other; each of said interlocked counters memorizes all said interlocking signals outputted by at least one adjoining said interlocked counter; and said synchronous counter in each of said interlocked counters stops said behavior until each of said interlocked counters memorizes all said interlocking signals. Since plurality of said interlocked counters are arranged in a shape of said square lattice, said hexagonal lattice and so on, all said distance between adjoining said interlocked counters becomes equal. Thus, in a case that a signal line of said interlocking signal between adjoining said interlocked counters takes the shortest route, all propagation delay time of said interlocking signal outputted by each said interlocked counter to all adjoining said interlocked counters is equal. Therefore, all phase of said interlocking signals inputted by all adjoining said interlocked counters is also equal. Said interlocked counter restarts said behavior of said synchronous counter if said interlocking signals of all adjoining said interlocked counters are active. In addition, since said latch circuit for interlocking signal in said interlocked counter memorizes said interlocking signal inputted from one of adjoining said interlocked counters, said interlocked counter restarts said behavior of said synchronous counter according to one whose phase is the latest in said interlocking signals of adjoining said interlocked counters, in spite of current said interlocking signals of adjoining said interlocked counters. Therefore, if all said interlocked counters input a clock signal whose phase is even, and if a period of said clock signal is much longer than said propagation delay time of said interlocking signals, all phases of said interlocking signals coincide. Moreover, said latch circuit for interlocking signal in said interlocked counter memorizes said interlocking signal inputted from one of adjoining said interlocked counters. Here, said phase of said clock signal inputted by one of adjoining said interlocked counters is gaining. Even though said interlocking signal becomes active again, an output of said latch circuit for interlocking signal inputting this said interlocking signal also remains active after this said interlocking signal outputted by this said interlocked counter became active. Therefore, even though said phase of said clock signal inputted by all of said interlocked counters is not equal, adjoining said interlocked counters can receive said interlocking signals each other. The present invention can make said count numbers outputted by said interlocked counters coincide, by connecting said interlocked counters each other. Generally speaking, in distributing said clock signal to a whole of an LSI (Large Scale Integrated Circuit), the higher frequency of said clock signal becomes, the more propagation delay time of said clock signal causes trouble. By arranging said interlocked counters on said LSI distributedly, however, a divided signal of said clock signal can be distributed to digital circuits in a whole of LSI. Thus, many problems on synchronization of said digital circuits are solved very well.

The invention described in claim 18 is an image sensor comprising plurality of sensor modules, each of at least one of which comprises: plurality of pixel cells arranged in a shape of a two-dimensional lattice; charge coupled device arranged along an array of said pixel cells; a drive device for charge transfer; and an output amplifier, wherein each of at least one said pixel cell comprises: a photo-receptor element converting light to charges; and a charge transfer gate, and each of at least one said sensor module outputs said charges of said photo-receptor elements in all said pixel cells as a pixel signal in order, according to a pixel synchronous signal outputted by said drive device for charge transfer, by that an output of said drive device for charge transfer make said charge transfer gate in at least one said pixel cell conduct; said charge coupled device stores said charges of said photo-receptor element via at least one said charge transfer gate; an output of said drive device for charge transfer transmits said charges stored in said charge coupled device toward said output amplifier in order; and said output amplifier amplifies said charges stored in said charge coupled device in order, in each of at least one said sensor module. In many of said image sensors, all of said sensor modules are arranged in a shape of a lattice or a hexagonal lattice. Of course, however, these said sensor modules may be arranged in a shape of a line or a circle. In addition, all said pixel cells are arranged in a shape of a lattice or a hexagonal lattice. Each of said pixel cells comprises said photo-receptor element and said charge transfer gate. A photodiode, a phototransistor and a HARP (High-gain Avalanche Rushing amorphous Photoconductor) film, and so on are used as said photo-receptor element. When said photo-receptor element received said light, said photo-receptor element generates said charges in terms of electro-optic effect. Note that an electronic circuit is appended to said photo-receptor element, in order to store said charges, if desired. Said charge coupled device is arranged with one stroke, along an array of said pixel cells comprising said photo-receptor element. In a case that said drive device for charge transfer makes at least one said charge transfer gate conduct, said charges can move to said charge coupled device. If said drive device for charge transfer applies an appointed voltage to said charge coupled device, said charges move from said photo-receptor element to said charge coupled device. When said drive device for charge transfer applied said voltage to said charge coupled device according to an appointed pattern, said charges stored in said charge coupled device move in said charge coupled device, in a form of a bucket relay. Therefore, at least one said charge can move to either one of two terminals of said charge coupled device, according to an order of places where said charges are stored. Said output amplifier can receive said charges generated by at least one said photo-receptor element one by one from said charge coupled device, and convert to said pixel signal in order. In addition, it can be discriminated that said output amplifier outputs said pixel signal because said drive device for charge transfer outputs said charge synchronous signal after moving said charges stored in said charge coupled device. Since each of said sensor modules comprises said drive device for charge transfer, in the present invention, said image sensor can output said pixel signals simultaneously from at least one said sensor module. In order to make an area sensor, in the present invention, said sensor modules which are just same are arranged in said shape of a lattice, and many said pixel signals are outputted via a small number of signal lines. Therefore, many problems on design of said area sensor are solved very well.

The invention described in claim 19 is an image sensor comprising plurality of sensor modules, each of at least one of which comprises: plurality of pixel cells arranged in a shape of a two-dimensional lattice; a vertical shift register; a horizontal shift register; plurality of row selection gates; plurality of noise cancellers; and an output amplifier, wherein each of said pixel cells comprises: a photo-receptor element converting light to charges; a charge amplifier converting said charges to voltage; and a column selection gate, and each of said sensor modules outputs said charges of said photo-receptor elements in at least one said pixel cell as a pixel signal in order, according to a pixel synchronous signal outputted by said horizontal shift register, by that an output of said vertical shift register make said column selection gate in at least one said pixel cell conduct; each aid noise canceller reduces noise of said voltage outputted via at least one said column selection gate, an output of said horizontal shift register make at least one said row selection gate conduct; and said output amplifier amplifies an output of said noise cancellor outputted via at least one said row selection gate, in each of said sensor modules. In many of said image sensors, all of said sensor modules are arranged in a shape of a lattice or a hexagonal lattice. Of course, however, these said sensor modules may be arranged in a shape of a line or a circle. In addition, all said pixel cells are arranged in a shape of a lattice or a hexagonal lattice, and arrangement of these said pixel cells is represented by at least one column and at least one row. At least one said noise canceller and at least one said row selection gate are arranged one by one at every row, respectively. Each of said pixel cells comprises said photo-receptor element, said charge amplifier and said column selection gate. A photodiode, a phototransistor and a HARP (High-gain Avalanche Rushing amorphous Photoconductor) film, and so on are used as said photo-receptor element. When said photo-receptor element received said light, said photo-receptor element generates said charges in terms of electro-optic effect. Note that an electronic circuit is appended to said photo-receptor element, in order to store said charges, if desired. Said charge amplifier converts said voltage according to amount of said charges. When said vertical shift register selected one of said columns, said column selection gate in at least one said pixel cell included in said column selected is conductive. Said charge amplifiers in at least one said pixel cell included in said column selected are inputted by said noise cancellers, respectively, every said row. At least one said noise canceller reduces said noise included in said voltage outputted by said charge amplifier in at least one said pixel cell arranged in corresponding said row, respectively. When said horizontal shift register selected one of said rows, said row selection gate in said row selected is conductive. Said voltage reduced said noise by said noise canceller in said row selected is inputted by said output amplifier. Since said vertical shift register and said horizontal shift register select one of all said pixel cells in an appointed order, said output amplifier can output charges of said photo-receptor element in at least one said pixel cell as said pixel signal. In addition, it can be discriminated that said output amplifier outputs said pixel signal because said horizontal shift register outputs said charge synchronous signal after selecting one of said rows. Since each of said sensor modules comprises said vertical shift register and said horizontal shift register, in the present invention, said image sensor can output said pixel signals simultaneously from at least one said sensor module. In order to make an area sensor, in the present invention, said sensor modules which are just same are arranged in said shape of a lattice, and many said pixel signals are outputted via a small number of signal lines. Therefore, many problems on design of said area sensor are solved very well.

The invention described in claim 20 is an image sensor according to claim 18 or 19, wherein a layer in which at least one said sensor module is arranged in said shape of a lattice; a layer in which plurality of A/D converters are arranged in said shape of a lattice; and a layer in which plurality of digital circuits are arranged in a shape of said lattice are stacked, and said charges generated by at least one said photo-receptor element are inputted by a corresponding said digital circuit as said pixel datum, according to said pixel synchronous signal, in each of at least one said sensor module, by that said pixel signal outputted by each of said sensor modules is inputted by a different said sensor module of said sensor modules; each of said A/D converters converts said pixel signal to a pixel datum; and said pixel datum outputted by each of said A/D converters is inputted by at least one different said digital circuit of said digital circuits. In the present invention, at least one said sensor module, at least one said A/D converter and at least one said digital circuit are arranged in a shape of a lattice and a hexagonal lattice as arrangement of said sensor module, arrangement of a corresponding said A/D converter, and arrangement of a corresponding said digital circuit are stacked vertically. When each of at least one said digital circuit comprises a buffer like a shift register, a serial/parallel converter and so on, it remains all of said pixel data outputted by a corresponding said A/D converter, according to said pixel synchronous signal. Moreover, it can pick up either one of these said pixel data selectively. Therefore, these said digital circuits can replace an order of all said pixel data inputted with another, respectively. By using three-dimensional LSI (Large Scale Integrated Circuit) technology, in the present invention, a signal line for said pixel signal is wired between said sensor module and a corresponding said A/D converter, at least one signal line for said pixel datum is wired between said A/D converter and a corresponding said digital circuit. Moreover, a signal line for said pixel synchronous signal is wired between said sensor module and a corresponding said digital circuit. Each of at least one said digital circuit inputs said pixel signal as said pixel datum only from a corresponding said sensor module. Therefore, even though a number of pixels in said image sensor increases, each of at least one said digital circuit can input all said pixel signals outputted by at least one corresponding said sensor module as said pixel data in a short time. In the present invention, said signal line for said pixel signal from said sensor module to a corresponding said A/D converter, at least one said signal line for said pixel datum from this A/D converter to a corresponding said digital circuit. Moreover, said signal line for said pixel synchronous signal from this said sensor module to a corresponding said digital circuit can be arranged as they do not cross with any other said signals. Therefore, many problems on arrangement of said signal lines in said image sensor are solved very well.

BRIEF DESCRIPTION OF THE DRAWINGS

FIG. 45 is an explanation view for outputting a form-size-information image after inputting a formed edge-information image representing a triangle.

FIG. 85 is an explanation view for assignment of each bit in a communication status buffer.

FIG. 120 is a circuit diagram of an interlocked signal distribution circuit generating an output signal, using third and fifth outputs of a decoder for signal distribution, in a case that a latch circuit for signal distribution is reset by an output of the decoder for signal distribution.

FIG. 121 is an explanation view for outputting pixel signals in parallel by sensor modules arranged in the shape of a lattice.

FIG. 122 is an explanation view for outputting pixel signals in parallel by sensor modules arranged in the shape of a hexagonal lattice.

FIG. 123 is an explanation view for a pixel cell consisting of a photo-receptor element and a charge transfer gate.

FIG. 124 is an explanation view for a case that a sensor module picks up a pixel signal in order from pixel cells arranged in the shape of a lattice, by using a charge coupled device arranged sigmoidly and a drive device for charge transfer.

FIG. 125 is an explanation view for a case that a sensor module picks up a pixel signal in order from pixel cells arranged in the shape of a lattice, by using a charge coupled device arranged in the shape of a spiral and a drive device for charge transfer.

FIG. 126 is an explanation view for a case that a sensor module picks up a pixel signal in order from pixel cells arranged in the shape of a hexagonal lattice, by using a charge coupled device arranged in the shape of a spiral.

FIG. 127 is an explanation view for a pixel cell consisting of a photo-receptor element, a charge amplifier and a column selection gate.

FIG. 128 is an explanation view for a case that a sensor module picks up a pixel signal in order from pixel cells arranged in the shape of a lattice, by using a vertical shift register and a horizontal shift register.

FIG. 129 is an explanation view for a case that each of sensor modules arranged in the shape of a lattice receives light from an upper side and outputs a pixel signal toward a lower side.

FIG. 130 is an explanation view for a case that each of sensor modules arranged in the shape of a hexagonal lattice receives light from an upper side and outputs a pixel signal toward a lower side.

FIG. 131 is an explanation view for stacking a layer where photo-receptor elements are implemented, a layer where a drive device for charge transfer, charge transfer gates and an output amplifier are implemented, and a layer where a charge coupled device is implemented.

Figure 132:
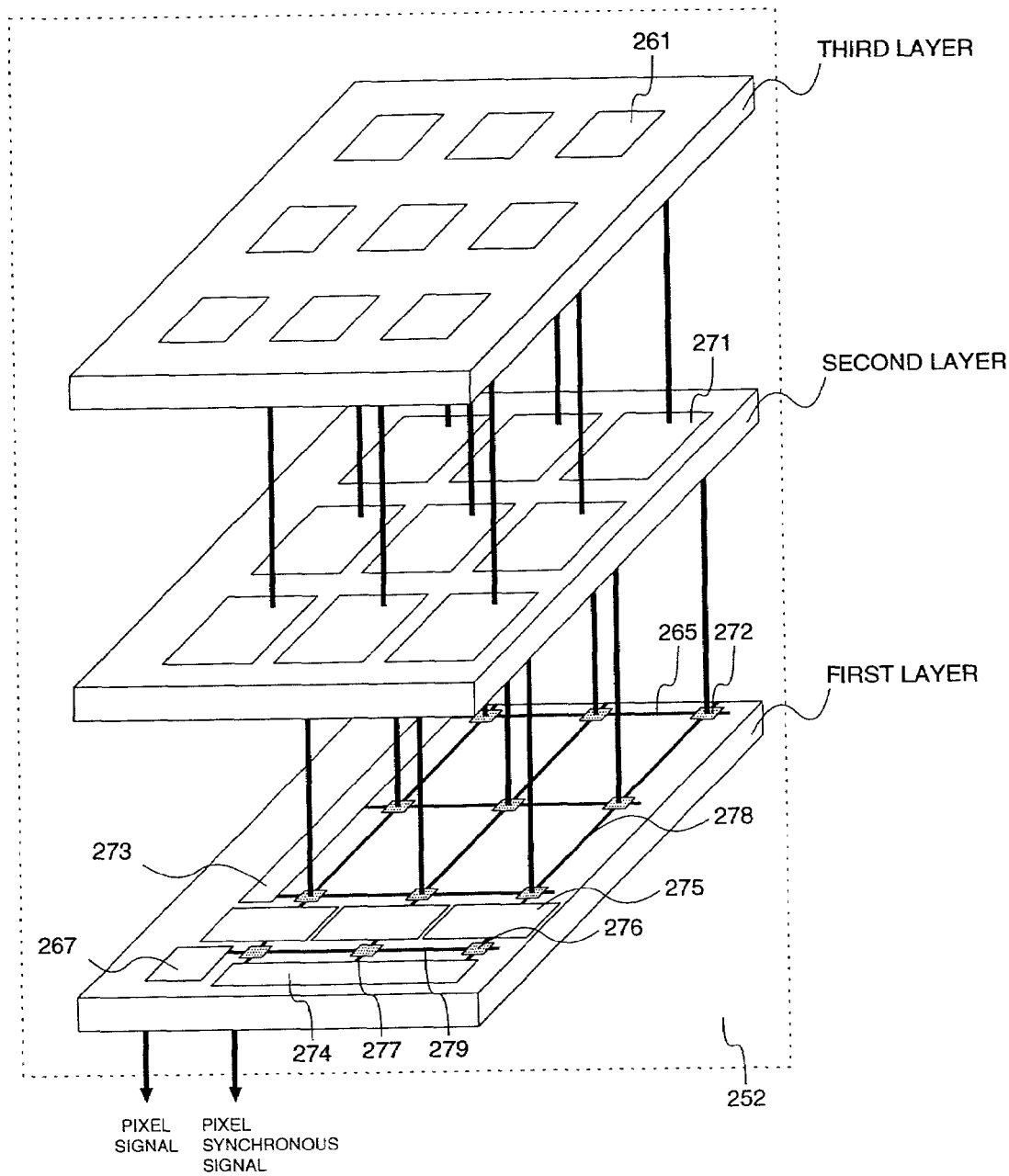

FIG. 132 is an explanation view for stacking a layer where photo-receptor elements are implemented, a layer where charge amplifiers are implemented, and a layer where a vertical shift register, a horizontal shift register, column selection gates, noise cancellers, row selection gates and an output amplifier are implemented.

Figure 133:
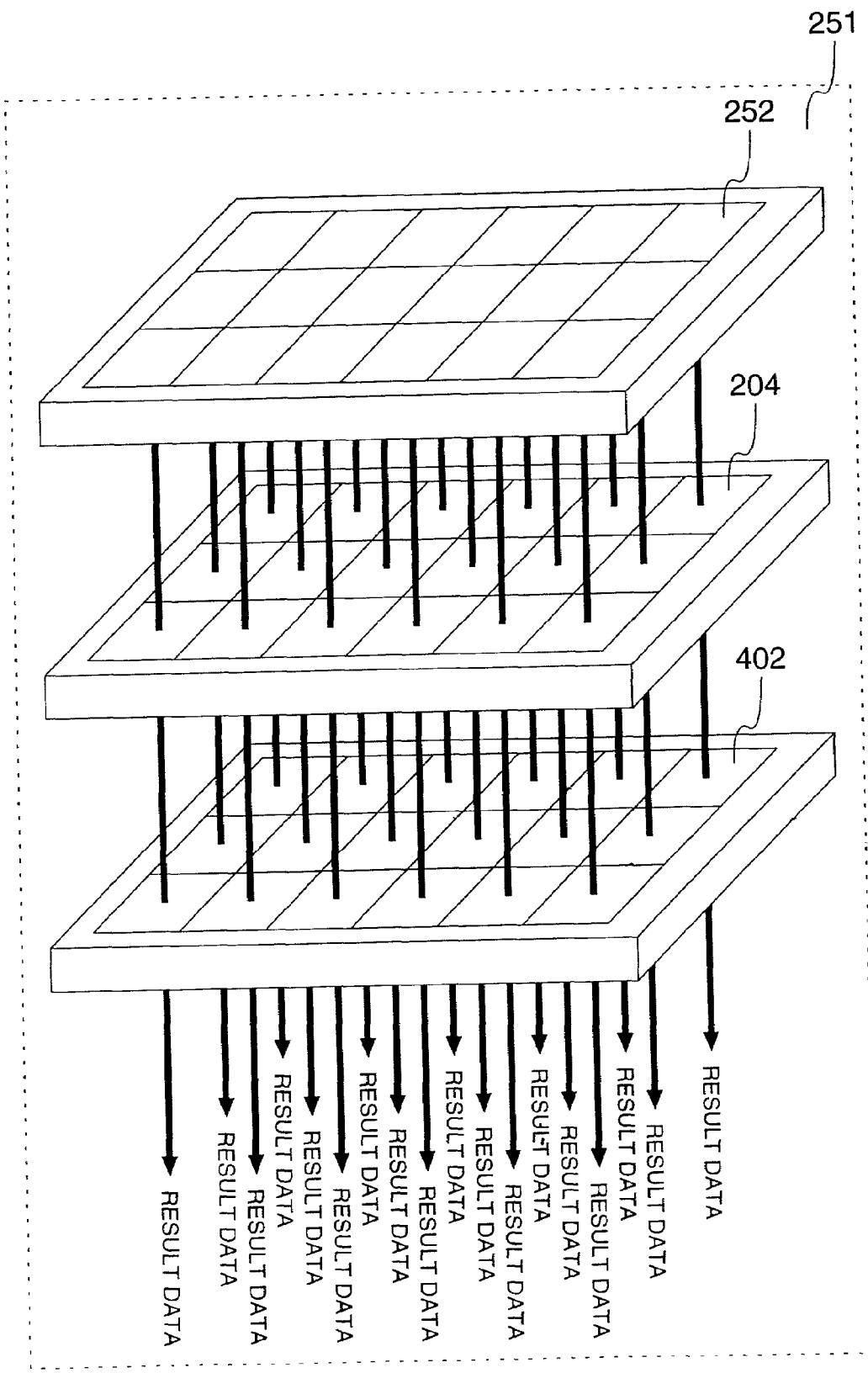

FIG. 133 is an explanation view for stacking a layer where sensor modules are implemented, a layer where A/D converters are implemented, and a layer where digital circuits are implemented.

Figure 134:
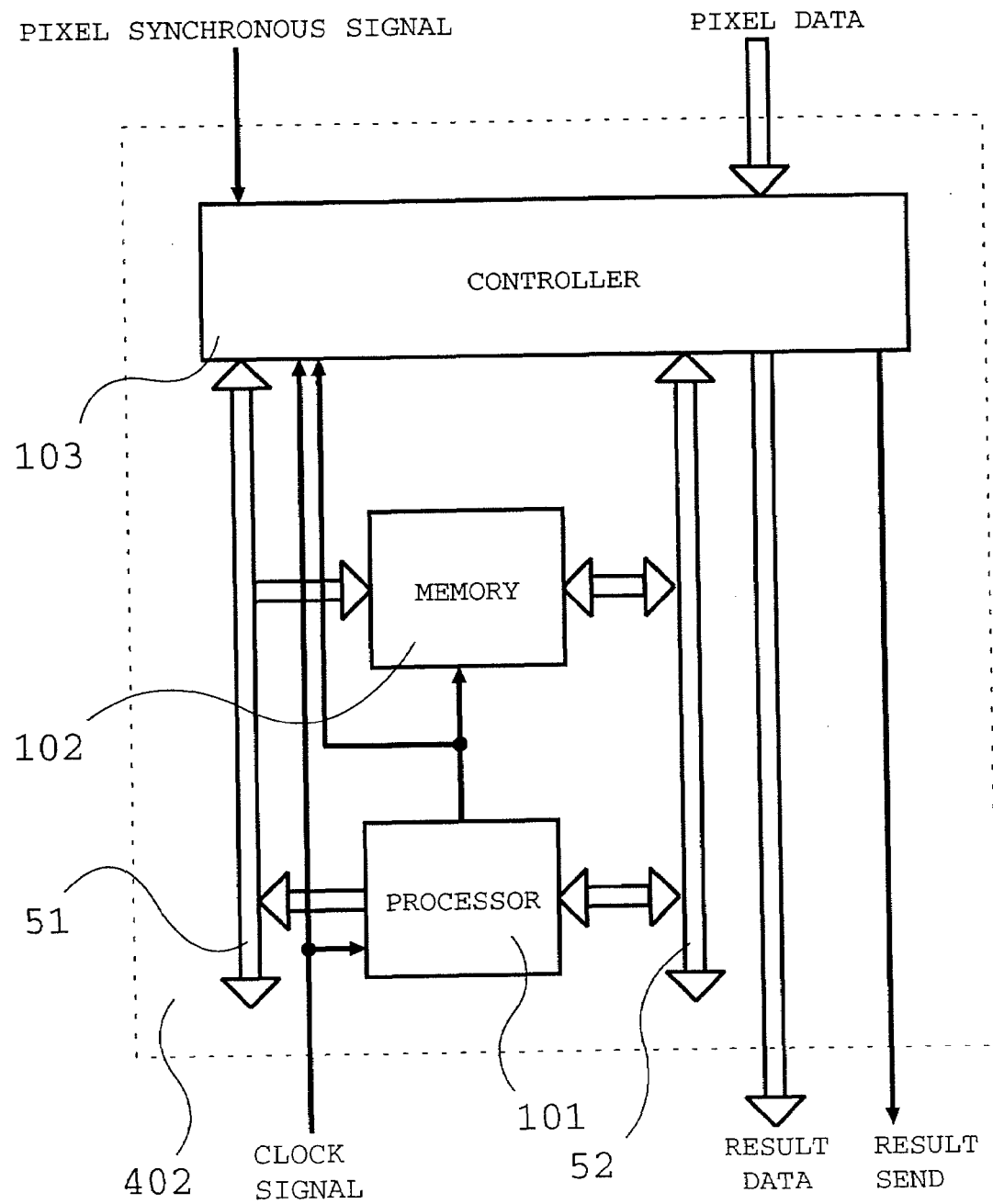

FIG. 134 is a block diagram of a digital circuit comprising a processor, a set of memories and a controller.

Figure 135:
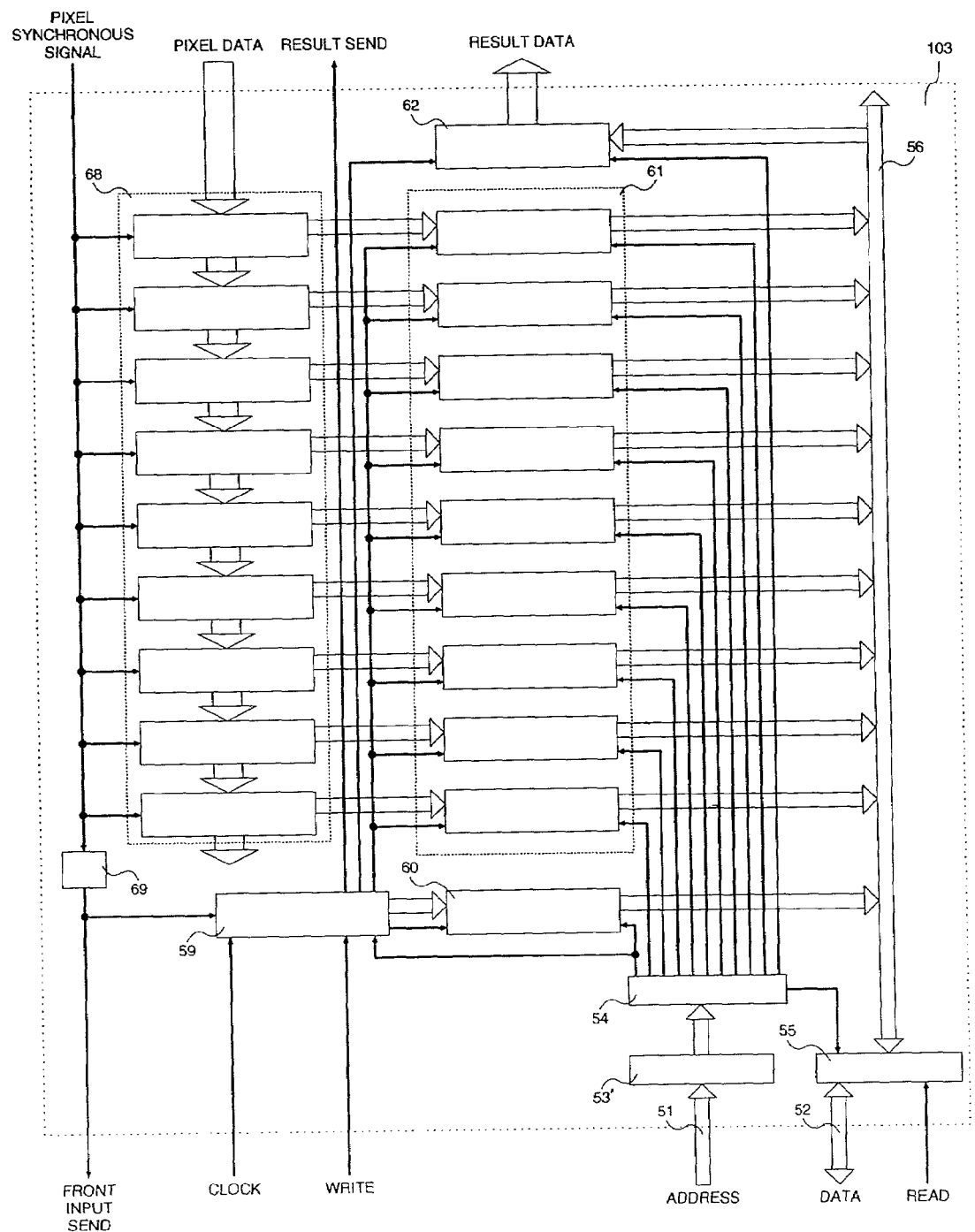

FIG. 135 is a block diagram of a controller, in which a front input shift register inputs pixel data in order, a front input data register remains the pixel data, and an address decoder selects the pixel data.

Figure 136:
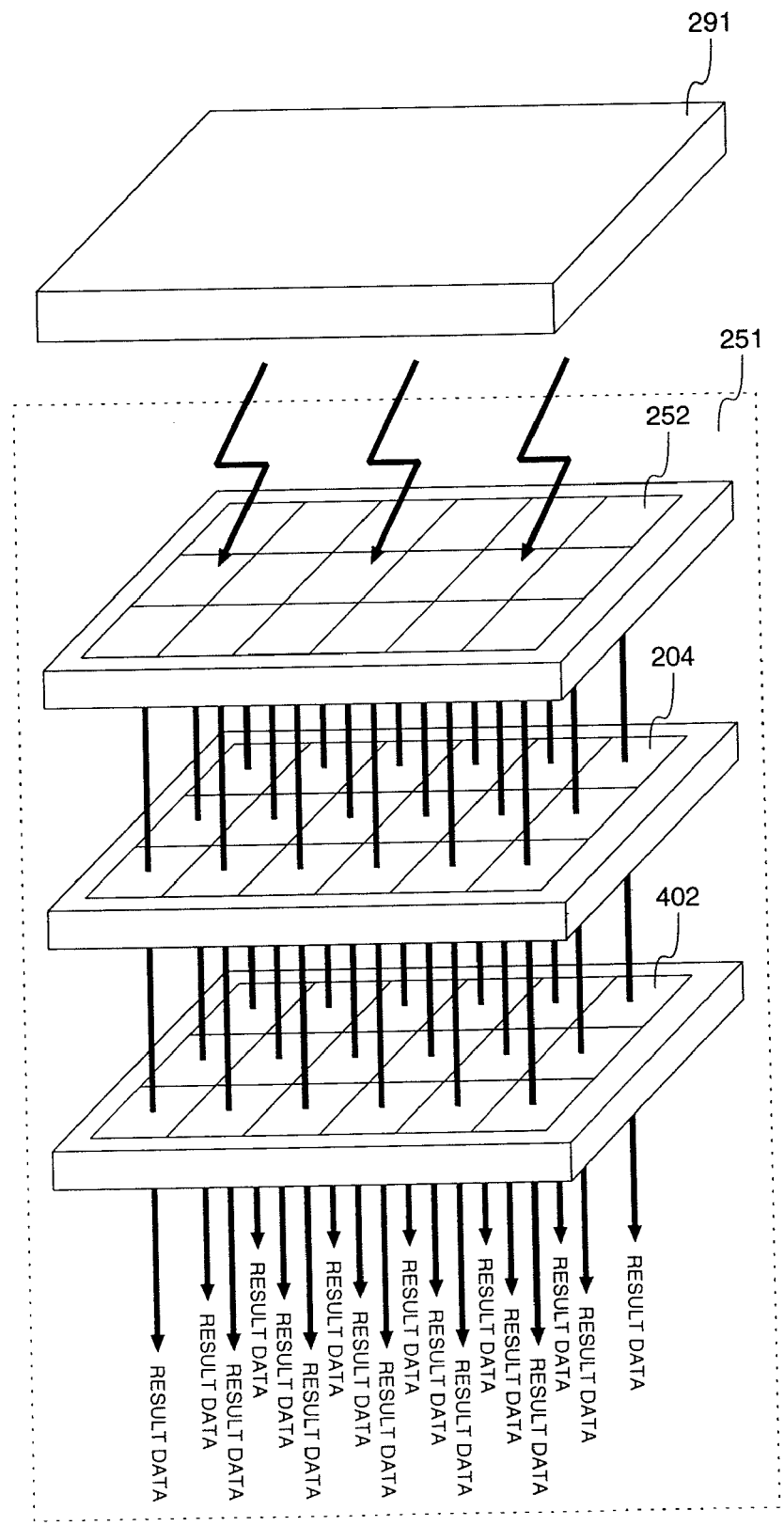

FIG. 136 is an explanation view for a case that light is applied to an image sensor comprising a digital circuit from a light source.

Figure 137:
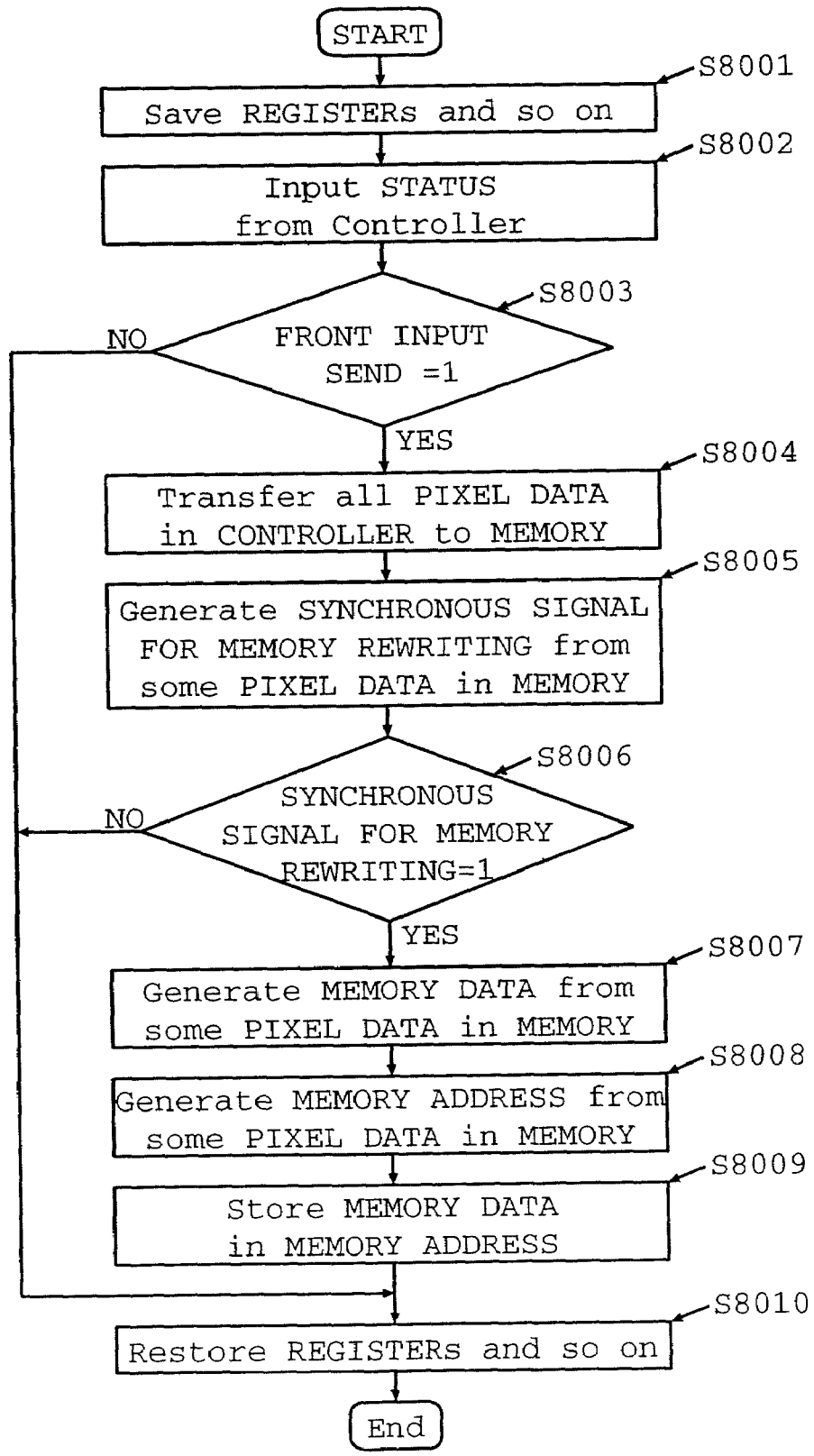

FIG. 137 is a flow chart of a memory rewriting routine in order to rewriting a memory datum in a set of memories, during a processor observes a controller.

Figure 138:
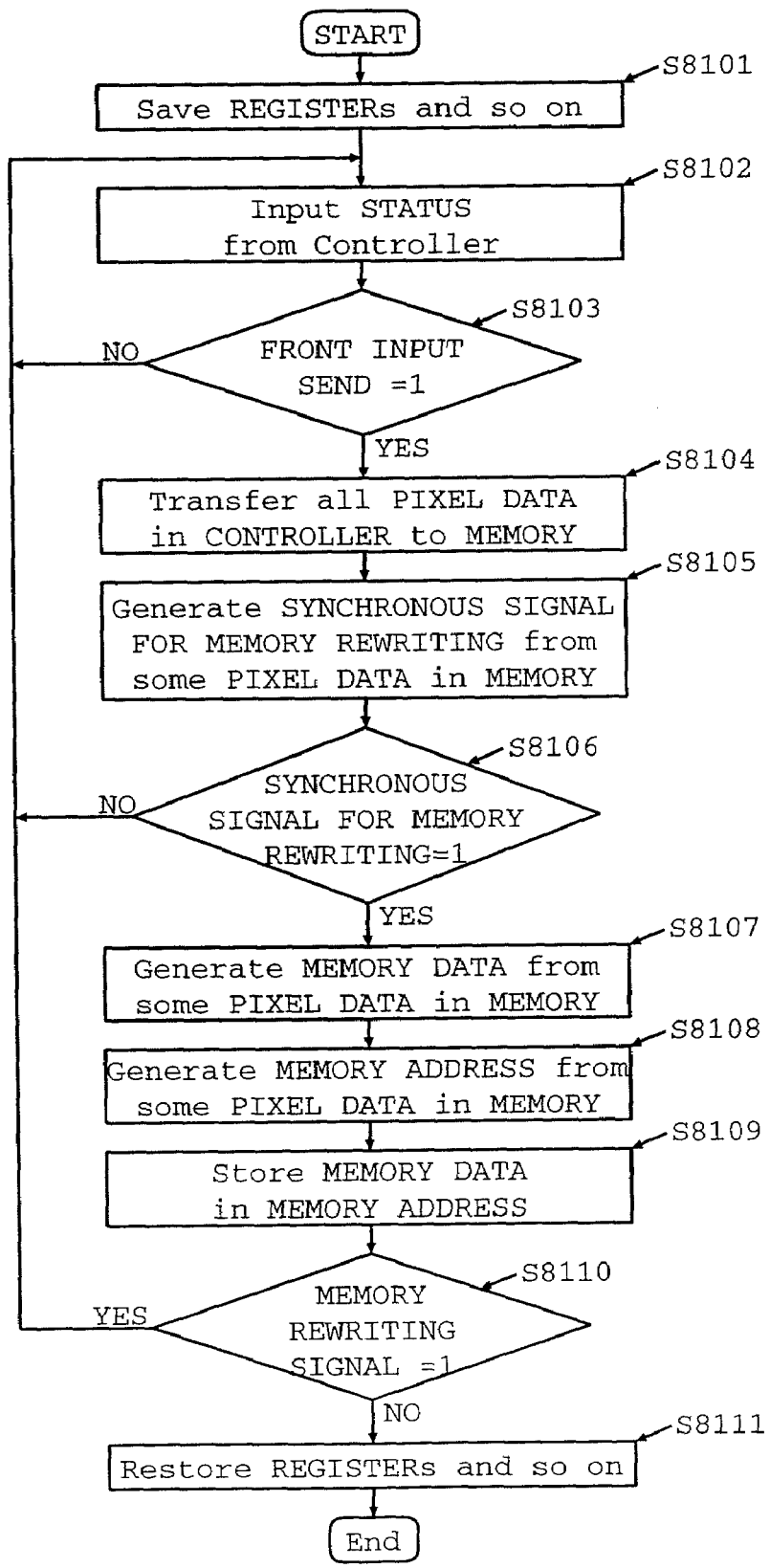

FIG. 138 is a flow chart of a memory rewriting routine in order to rewriting a memory datum in a set of memories, when a processor inputted a memory rewriting signal.

Figure 139:
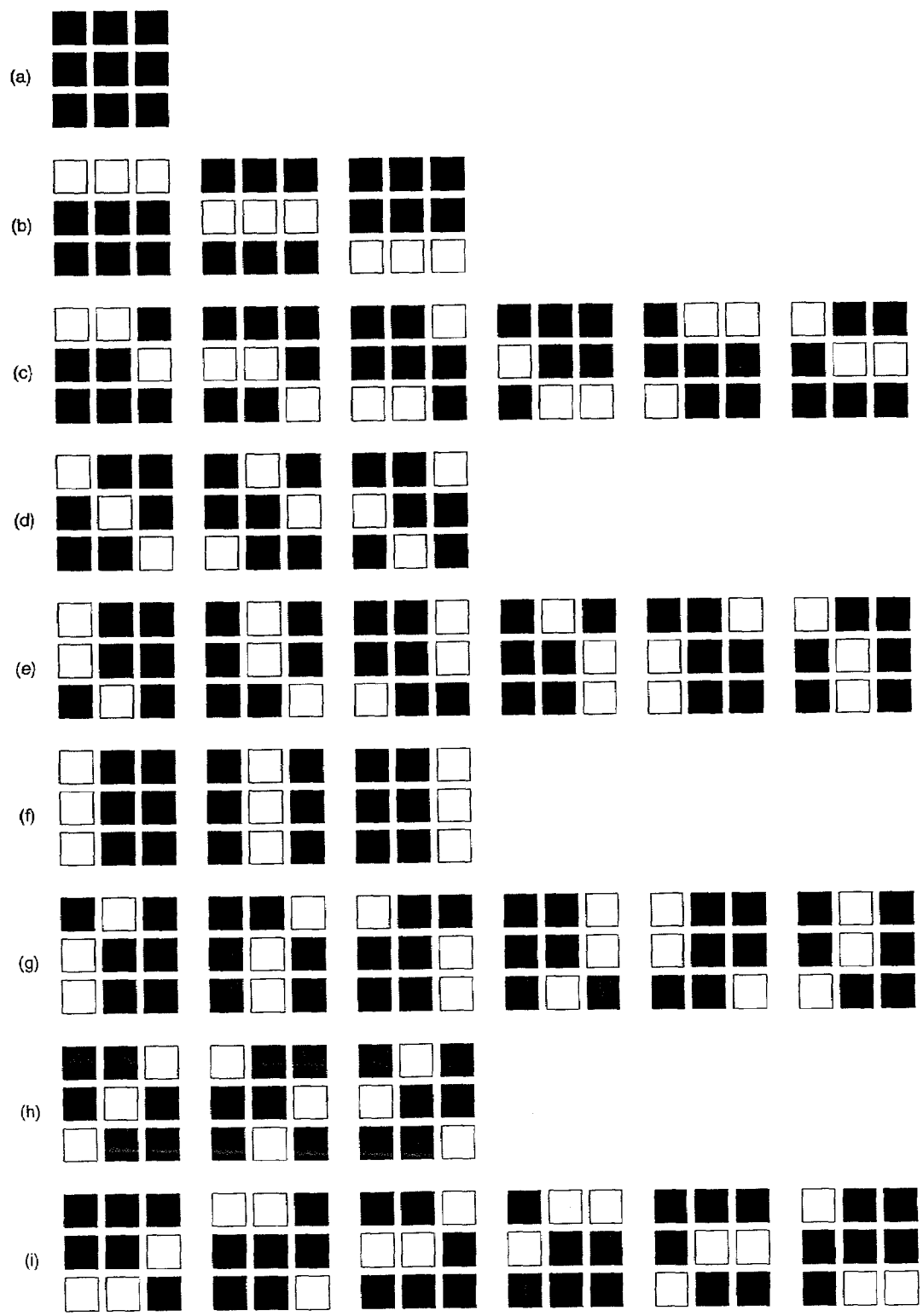

FIG. 139 is an explanation view for nine pixel data stored in a set of memories, in a case that zero or three among 3×3 photo-receptor elements receive light.

Figure 140:
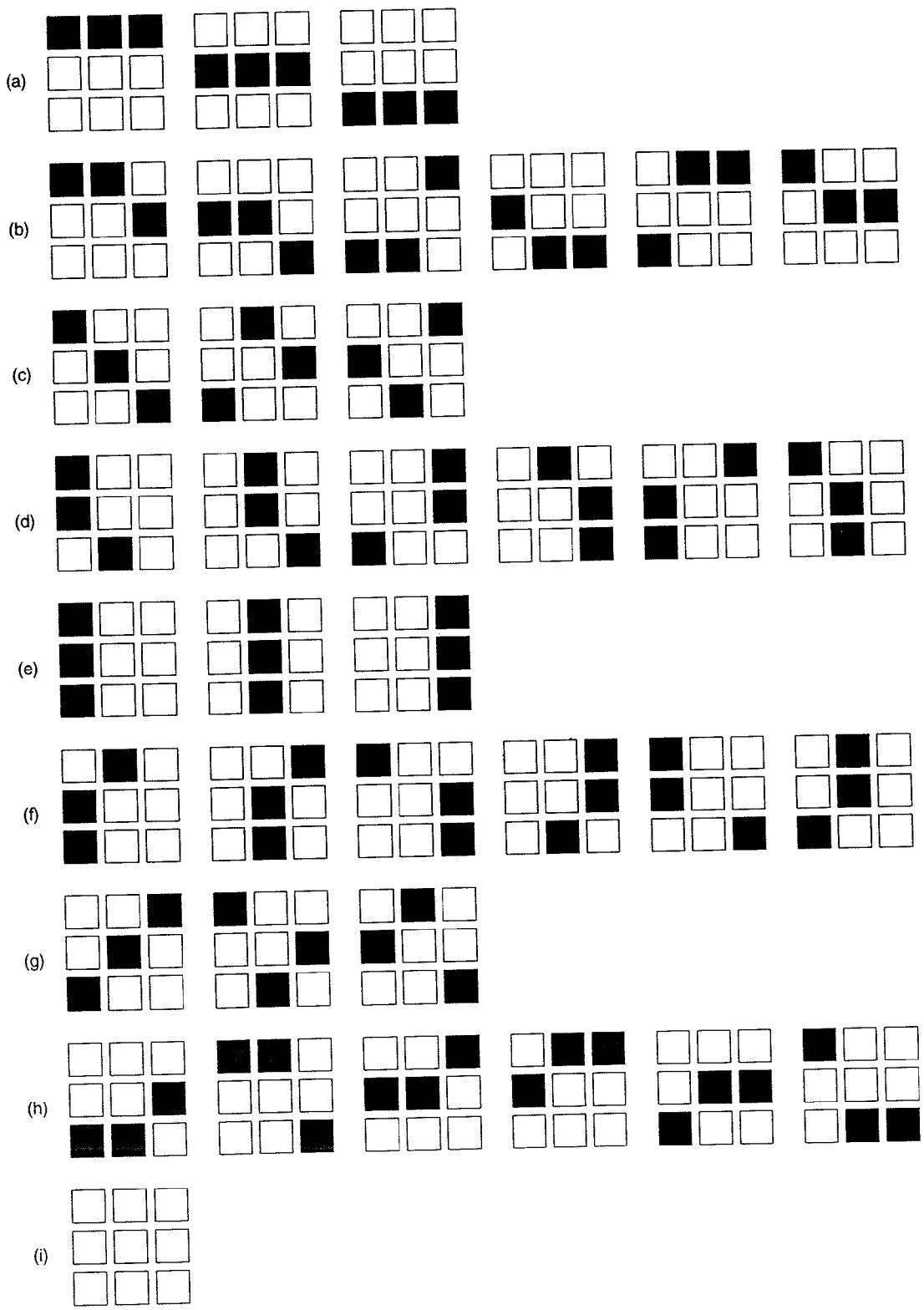

FIG. 140 is an explanation view for nine pixel data stored in a set of memories, in a case that six or nine among 3×3 photo-receptor elements receive light.

Figure 141:
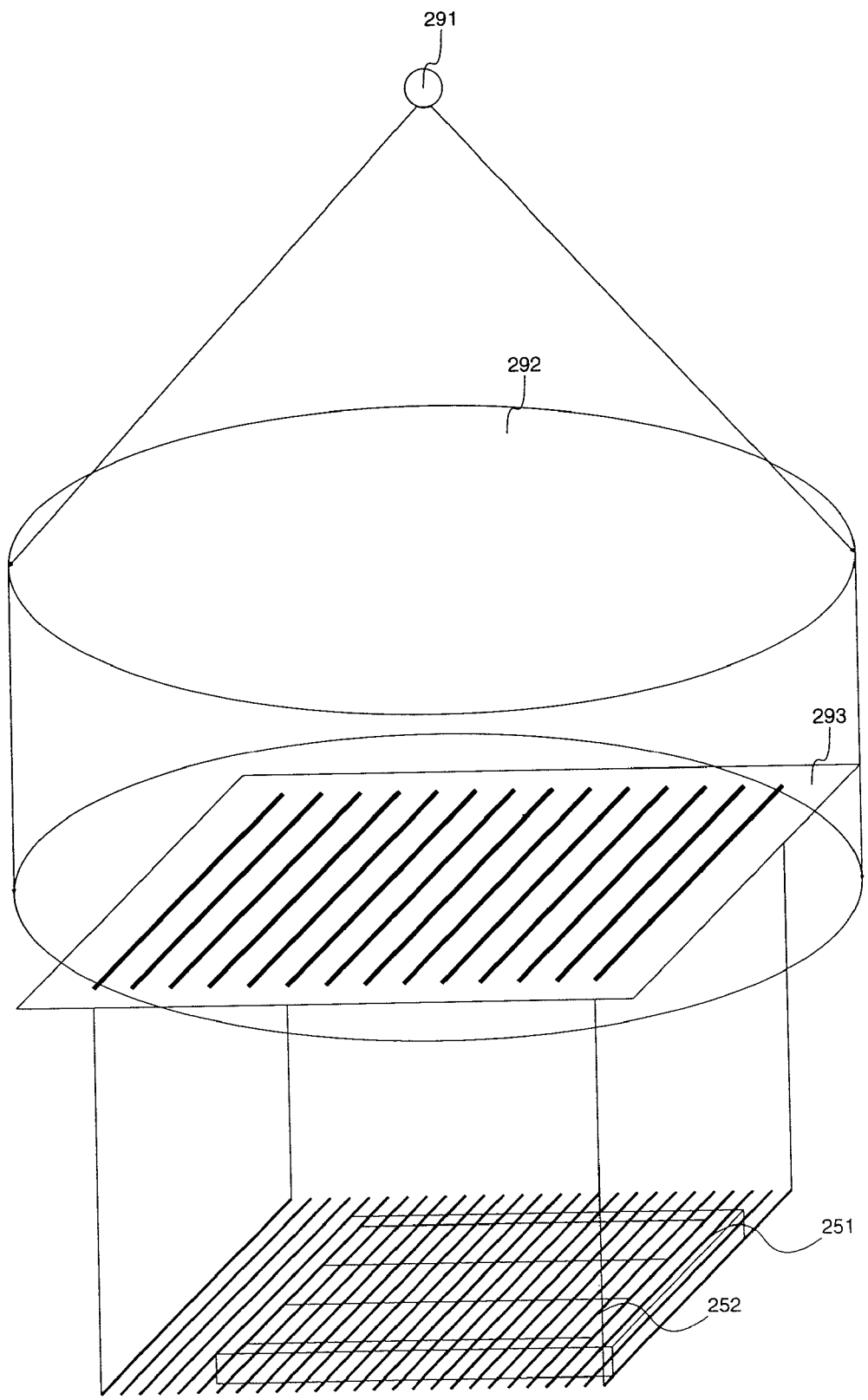

FIG. 141 is an explanation view for applying interference fringes to an image sensor, by using a transparent grating.

Figure 142:
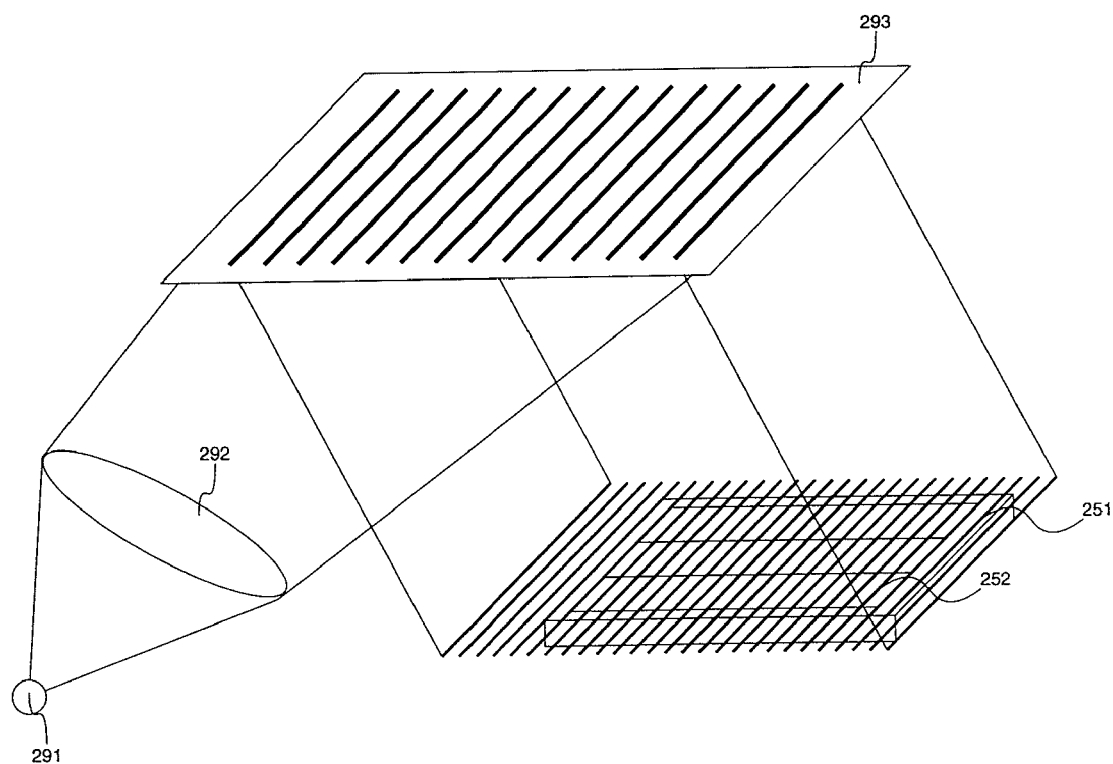

FIG. 142 is an explanation view for applying interference fringes to an image sensor, by using a reflecting grating.

Figure 143:
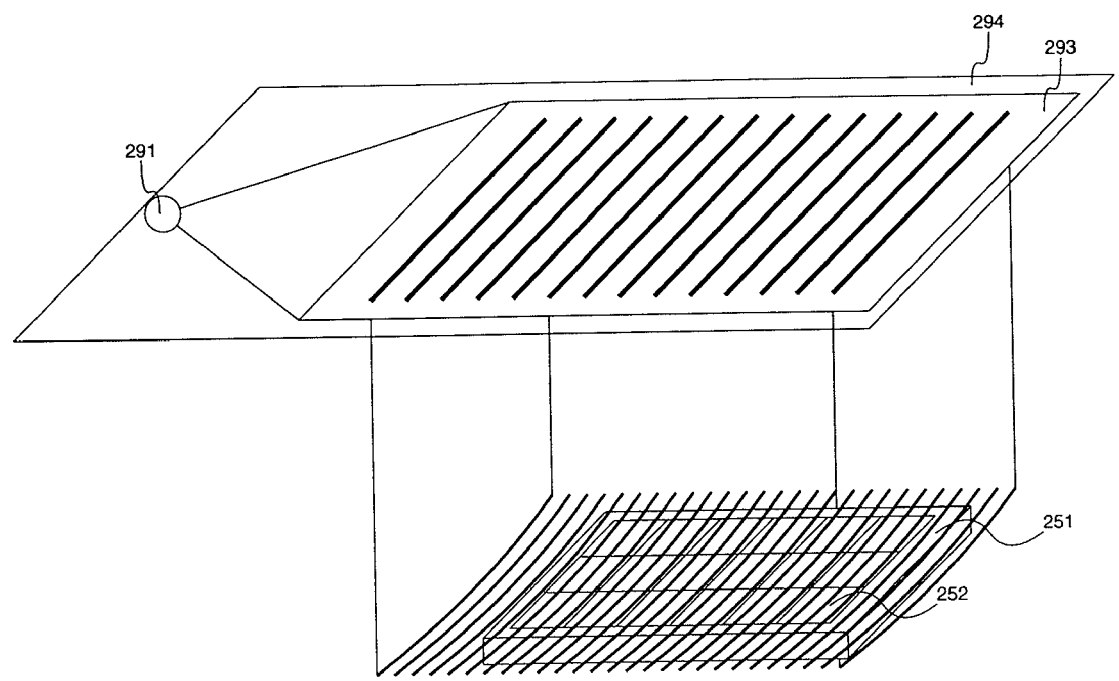

FIG. 143 is an explanation view for applying interference fringes to an image sensor, by using a grating formed in an optical waveguide.

DETAILED DESCRIPTION

Some enforcement forms of a visual device 2 are shown below. With reference to the drawings, then, it is explained about the enforcement forms.

Figure 1:
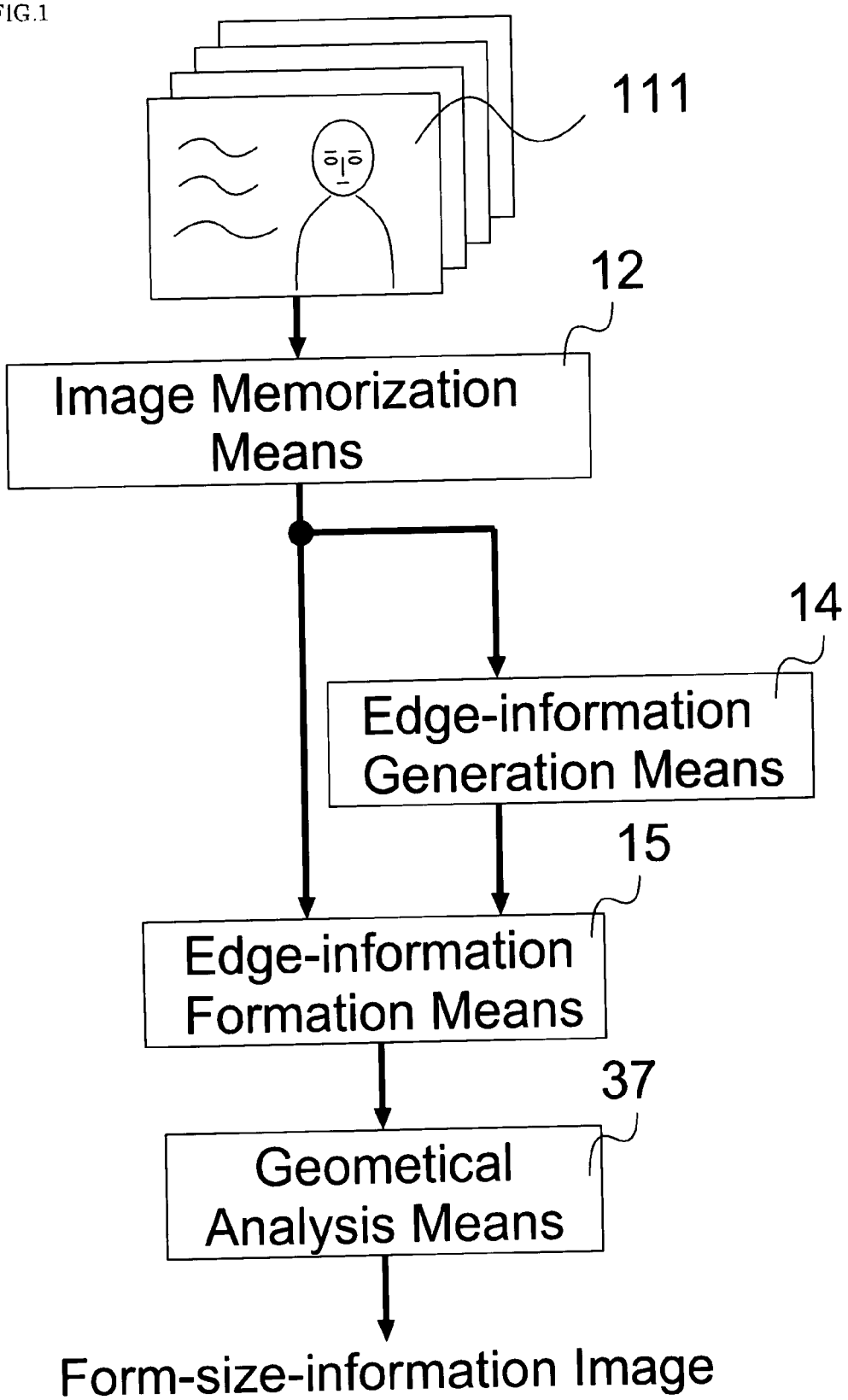
FIG. 1 is a block diagram of a visual device recognizing position, size and form of approximate contours of at least one object in a digital image.

First, as shown in FIG. 1, an enforcement form of a visual device 2 corresponding to the invention described in claim 1 detects position, size and form of at least one object from the object moving in digital images 111, by using an image memorization means 12, an edge-information generation means 14, an edge-information formation means 15 and a geometrical analysis means 37. The image memorization means 12 memorizes the digital images 111 in order. The edge-information generation means 14 generates a rough edge-information image 113 including rough edge information 112 of at least one object moving in the digital images 111, by using two digital images 111. The edge-information formation means 15 forms the rough edge-information image 113 into a formed edge-information image 115, by using one of two digital images 111. The geometrical analysis means 37 consists of a position/size/inclination detection means 44 and a position/size/form detection means 45 (refer to FIG. 45), and generates a form-size-information image 190 from the formed edge-information image 115. For all objects, even though the present invention does not know any information like position, size, inclination, form and color of the objects in the digital images 111 beforehand, the present invention can detect the position, the size and the form of the objects in the digital images 111. Therefore, even though a user of the present invention does not know any information on an object, which is a target of detection, beforehand, the user can use the present invention easily.

Figure 2:
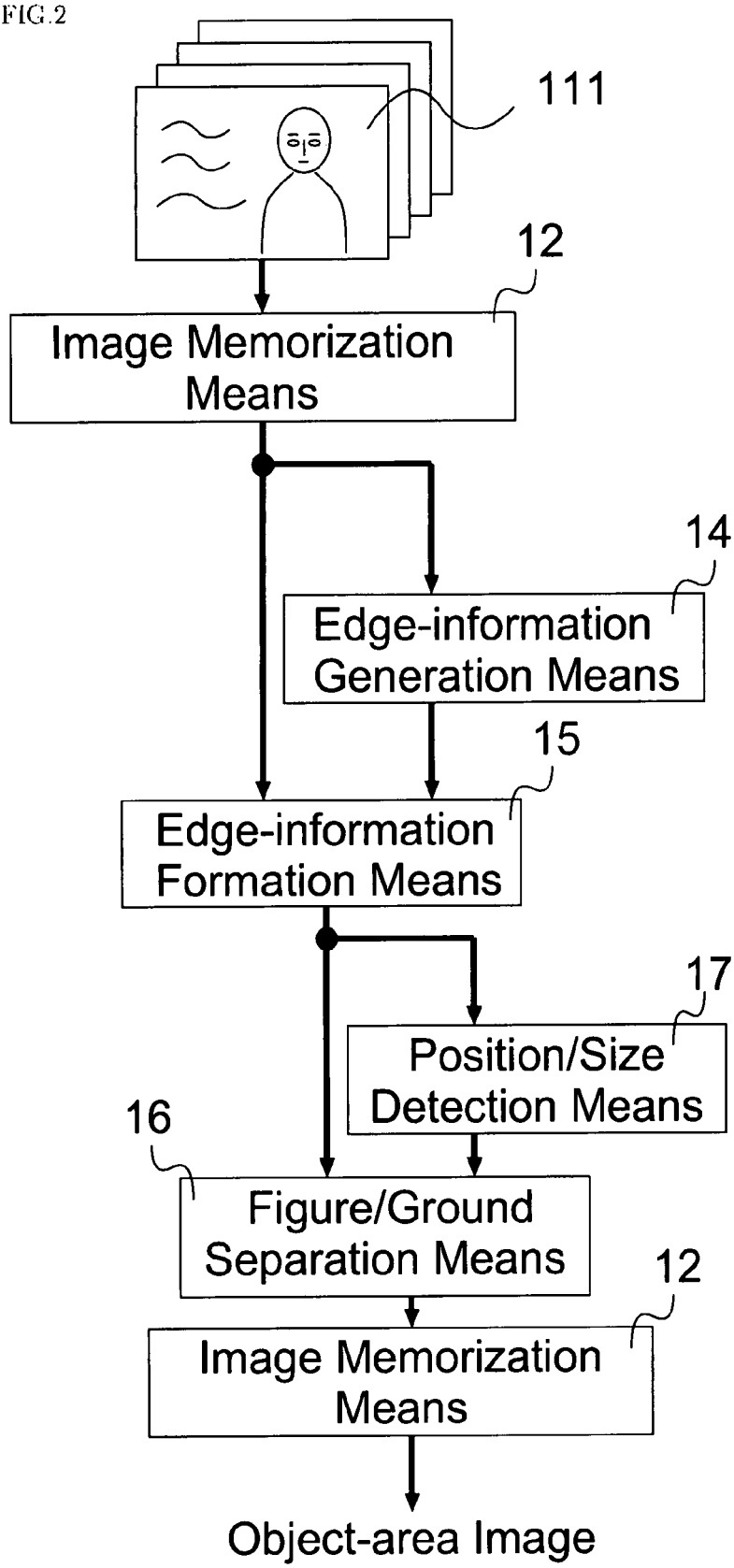
FIG. 2 is a block diagram of a visual device separating an object area of an object in a digital image from background.

As shown in FIG. 2, an enforcement form of a visual device 2 corresponding to the invention described in claim 2 separates at least one object area 141 representing at least one object moving in digital images 111 from a background area, by using two image memorization means 12, an edge-information generation means 14, an edge-information formation means 15, a position/size detection means 17 and a figure/ground separation means 16. One image memorization means 12 memorizes the digital images 111 in order. The edge-information generation means 14 generates a rough edge-information image 113 including rough edge information 112 of at least one object moving in the digital images 111, by using two digital images 111. The edge-information formation means 15 forms the rough edge-information image 113 into a formed edge-information image 115, by using one of two digital images 111. The position/size detection means 17 generates a redundant-information image 132 representing an approximate position of a center of gravity and size of at least one object area 141 segmented by the formed edge-information image 115. The figure/ground separation means 16 separates at least one object area 141 segmented by the formed edge-information image 115, by using the redundant-information image 132, and generates an object-area image 142. Another image memorization means 12 memorizes the object-area image 142. For all objects, even though the present invention does not know any information like position, size, inclination, form and color of the objects in the digital images 111 beforehand, the present invention can separate at least one object area 141 from a background area. Therefore, even though a user of the present invention does not know any information on an object, which is a target of detection, beforehand, the user can use the present invention easily.

Figure 3:
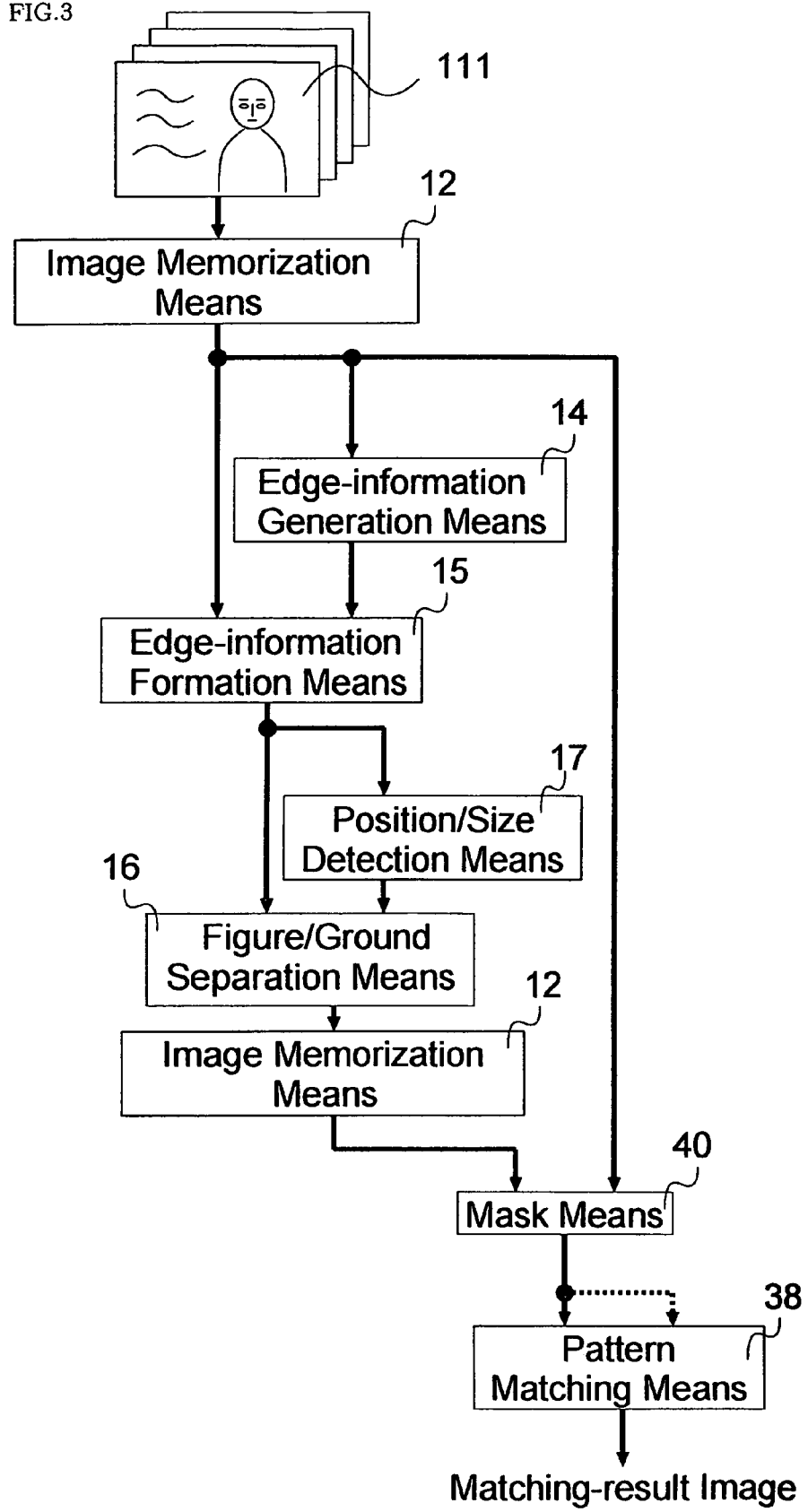
FIG. 3 is a block diagram of a visual device recognizing color of an object in a digital image.

As shown in FIG. 3, a visual device 2 for recognizing color of an object carries out pattern matching for an object area 141 representing at least one object moving in digital images 111, by adding a mask means 40 and a pattern matching means 38 to the enforcement form of the visual device 2 corresponding to the invention described in claim 2. Since the mask means 40 carries out filtering only a segmented object area 143 in the digital image 111 memorized by one image memorization means 12, which corresponds to the object area 141 in the object-area image 142 memorized by another image memorization means 12, the mask means 40 generates a masked image 148. After the pattern matching means 38 selects the most similar template image 146 with the masked image 148 every pixel, by comparing the masked image 148 with template images 146, it outputs matching results of all pixels as a matching-result image 147. The template images 146 are filled by a single color which is different from each other. As a result, the pattern matching means 38 selects a color of a whole of the segmented object area 143. Note that the pattern matching means 38 essentially must memorize the necessary number of template images 146 beforehand, according to a purpose. As a dash line toward the pattern matching means 38 from the mask means 40 is shown in FIG. 3, however, the pattern matching means 38 can also increase the number of the template images 146, by inputting a masked image 148 outputted from the mask means 40 as a template image 146. For all objects, even though the present invention does not know any information like position, size, inclination, form and color of the objects in the digital images 111 beforehand, the present invention can select a color of an object represented by at least one segmented object area 143 in the digital images 111 from colors represented by the template images 111. Therefore, even though a user of the present invention does not know any information on an object, which is a target of detection, beforehand, the user can use the present invention easily.

Figure 4:
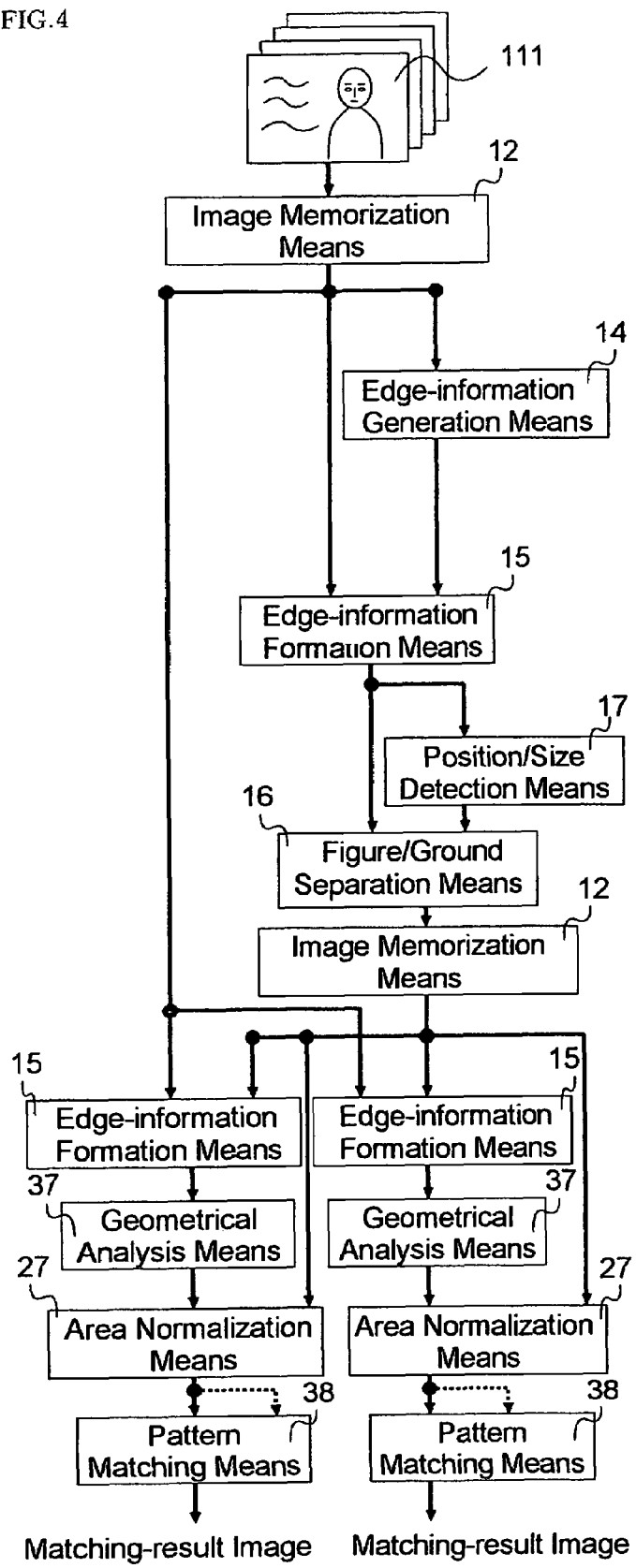
FIG. 4 is a block diagram of a visual device recognizing a pattern of an object in a digital image.

As shown in FIG. 4, a visual device 2 for recognizing a pattern carries out pattern matching for an object area 141 representing at least one object moving in digital images 111, by adding at least one combination of an edge-information formation means 15, a geometrical analysis means 37, an area normalization means 27 and a pattern matching means 38 to the enforcement form of the visual device 2 corresponding to the invention described in claim 2. In each of all combinations, the object area image 142 and the digital images 111 are processed as follow: First, the edge-information formation means 15 regards the object area image 142 memorized by one image memorization means 15 as a rough edge-information image 113, and forms the rough edge-information image 113 into a formed edge-information image 115, by using a segmented object image 143 corresponding to the object area 141 in the digital image 111 memorized by another image memorization means 12. Here, edge information 114 constructing each pixel of the formed edge-information image 115 represents an approximate pattern or a fine texture of the segmented object area 143, by size and image quality of the segmented object area 143. Next, the geometrical analysis means 37 analyzes the pattern or the texture of the segmented object area 143 by the formed edge-information image 115, and generates a form-size-information image 190. Next, the area normalization means 27 normalizes the form-size-information image 190 by the object area image 142, and generates a normalized image 145. Here, since the area normalization means 27 does not have to complement between pixels of the normalized image 145, division by a natural number is omitted. Finally, after the pattern matching means 38 selected the most similar template image 146 with the normalized image 145 every pixel, by comparing the normalized image 145 with the template images 146, it outputs matching results of all pixels as a matching-result image 147. Since the template images 146 are generated from different objects, respectively, the pattern matching means 38 selects an object representing the segmented object area 143. However, template images 146 generated from some similar objects are also similar each other. As a result, the pattern matching means 38 selects type of object common with some objects represented by the segmented object areas 143. Note that the pattern matching means 38 essentially must memorize the necessary number of template images 146 beforehand, according to a purpose. As a dash line toward the pattern matching means 38 from the mask means 40 is shown in FIG. 3, however, the pattern matching means 38 can also increase the number of the template images 146, by inputting a masked image 148 outputted from the mask means 40 as a template image 146. For all objects, even though the present invention does not know any information like position, size, inclination, form and color of the objects in the digital images 111 beforehand, the present invention can select type of an object represented by at least one segmented object area 143 in the digital images 111 from objects represented by the template images 111. Therefore, even though a user of the present invention does not know any information on an object, which is a target of detection, beforehand, the user can use the present invention easily.

Note that any combinations of some means shown in FIG. 3 and FIG. 4 are also a variation of the visual device 2.

Figure 5:
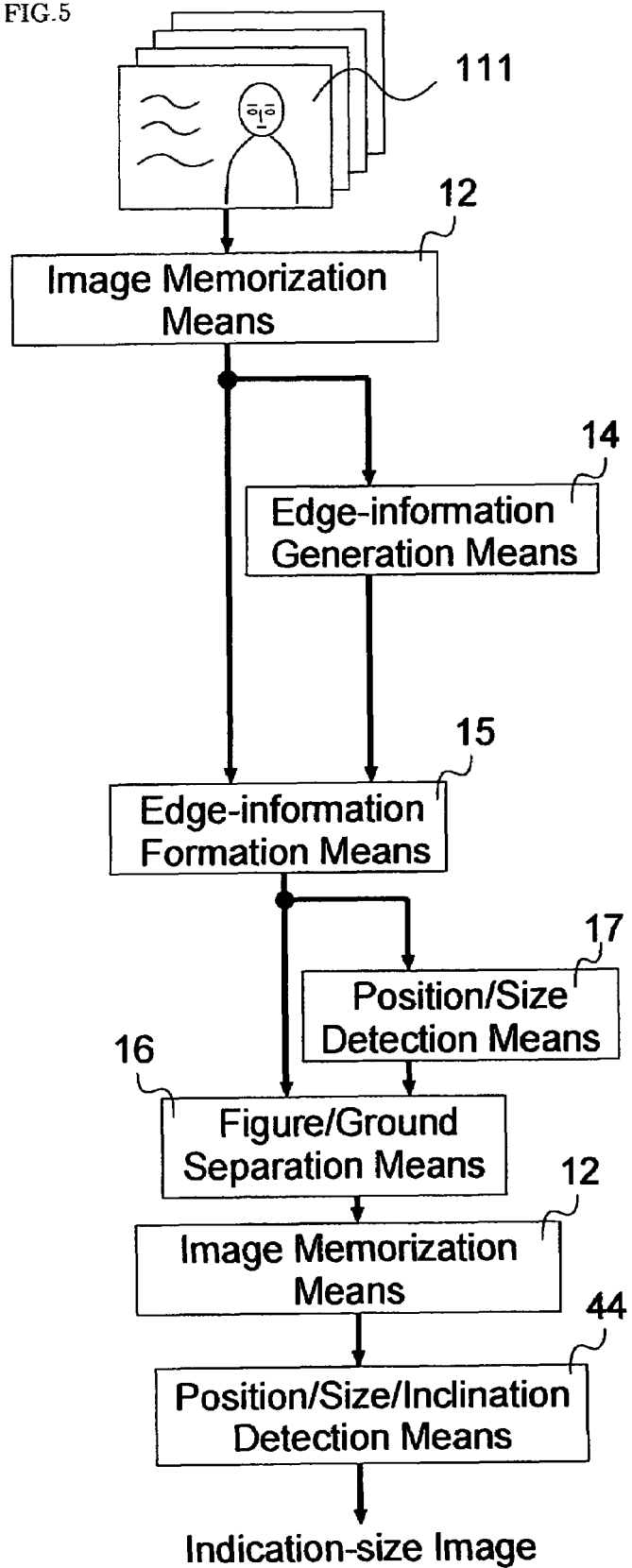
FIG. 5 is a block diagram of a visual device detecting position, size and inclination of an object in a digital image.

Besides this, as shown in FIG. 5, a visual device 2 can detect position, size and inclination of an object area 141 by generating an inclination-size-information image 186 from at least one object area 141 memorized by an image memorization means 12, using a position/size/inclination detection means 44.

Figure 6:
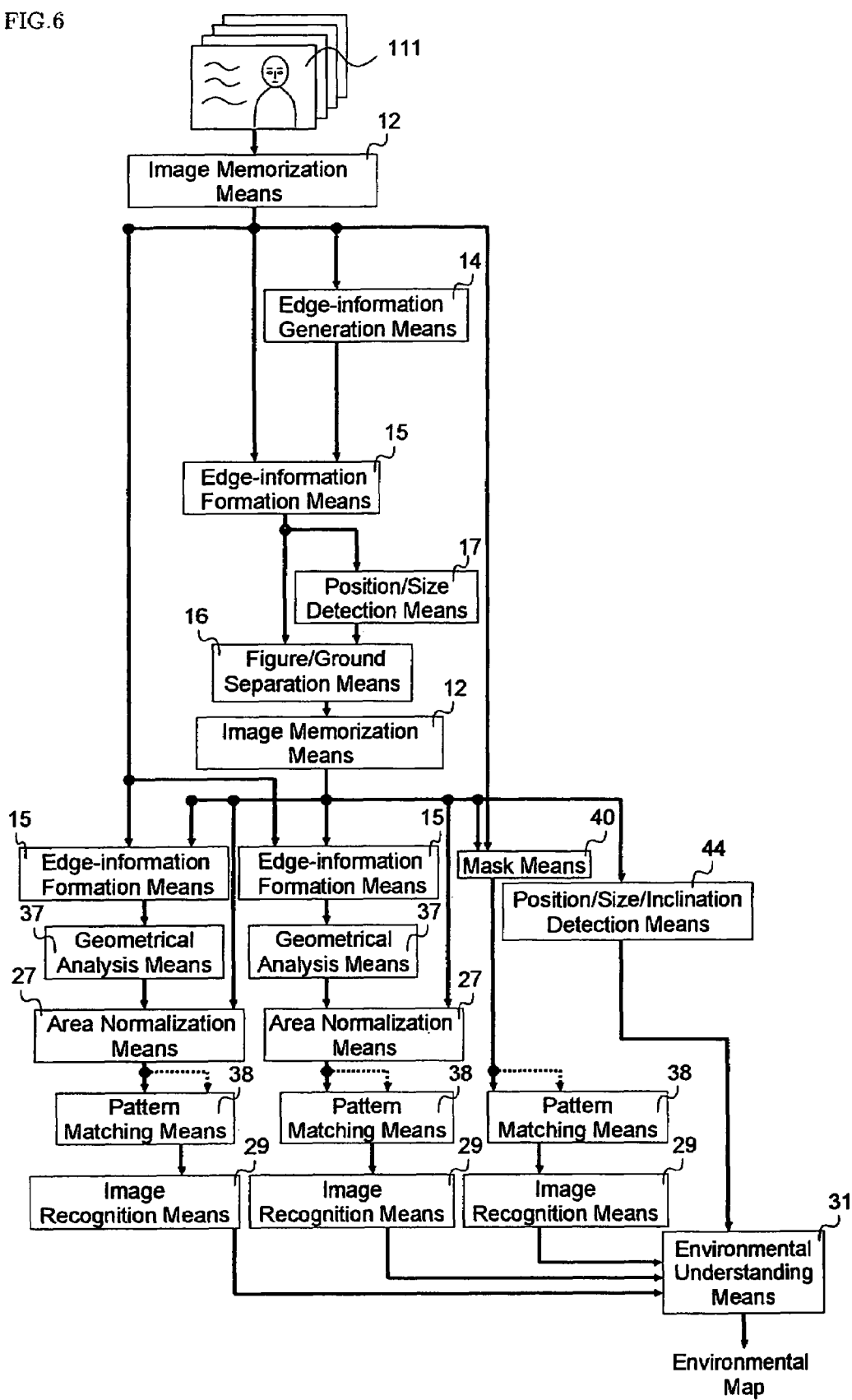
FIG. 6 is a block diagram of a visual device recognizing an object in a digital image.

As shown in FIG. 6, then, a visual device 2 for recognizing an object area 141 is a combination of the visual device 2 for recognizing a pattern, the position/size/inclination detection means 44 shown in FIG. 5, some image recognition means 29 and an environmental understanding means 31, where the visual device 2 for recognizing the pattern is a combination of some means shown in FIG. 3 and FIG. 4. Each of the image recognition means 29 derives a recognition result for an image inputted by a pattern matching means 38 from unifying the matching results matched with template images 146, which are represented by each pixel of a matching-result image 147 inputted from the corresponding pattern matching means 38. Note that a neural network like a Perceptron learning by a back propagation method and so on can be also used as a method unifying the matching results, but it is generally enough for the method to select merely the most matching result in the matching-result image 147, like a majority rule. The environmental understanding means 31 decides position, size, form, texture, color and inclination of an object area 141, by using these matching results and an inclination-size-information image 186 inputted from the position/size/inclination detection means 44, followed by generating an environmental datum consisting of these information. Moreover, the environmental understanding means 31 outputs an environmental map which is a list of these environmental data, by memorizing the environmental data of all objects in the digital images 111. For all objects, even though the present invention does not know any information like position, size, inclination, form, color of the objects in the digital images 111 beforehand, the present invention can make an environmental map for an object represented by at least one segmented object area 143 in the digital images 111. Therefore, even though a user of the present invention does not know any information on an object, which is a target of detection, beforehand, the user can use the present invention easily.

Figure 7:
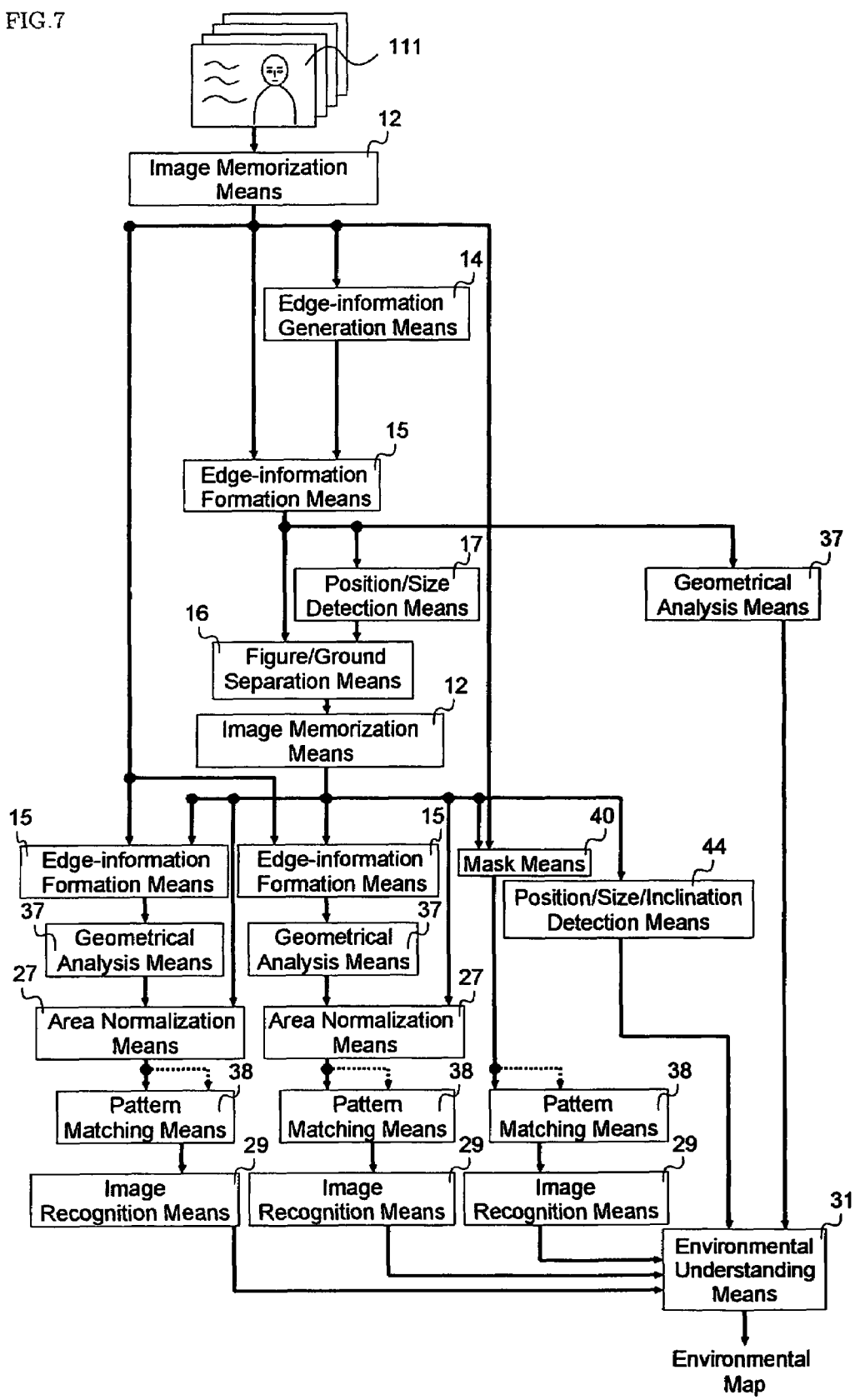
FIG. 7 is a block diagram of a visual device understanding a digital image representing at least one object.

As shown in FIG. 7, a visual device 2 for understanding an image comprises the geometrical analysis means 37 shown in the enforcement form of the visual device 2 corresponding to the invention described in claim 1, in addition to all means shown in the visual device 2 for recognizing an object area 141. Since the geometrical analysis means 37 is added, the environmental understanding means 31 can discriminate some objects easily even though there are the objects in the digital image 111. In addition, even though the figure/ground separation means 16 separates an object area 141 and a background area incompletely, the environmental understanding means 31 can generate a suitable environmental datum for an object detected by the geometrical analysis means 37 because it compares position and size of the object with position and size of an object area 141 detected by the position/size/inclination detection means 44, and moreover, it compares contours of the object detected by the geometrical analysis means 37 with type and color of objects represented by object areas 141 decided by some image recognition means 29. For all objects, even though the present invention does not know any information like position, size, inclination, form, color of the objects in the digital images 111 beforehand, the present invention can make an environmental map for all objects in the digital images 111. Therefore, even though a user of the present invention does not know any information on an object, which is a target of detection, beforehand, the user can use the present invention easily.

Figure 8:
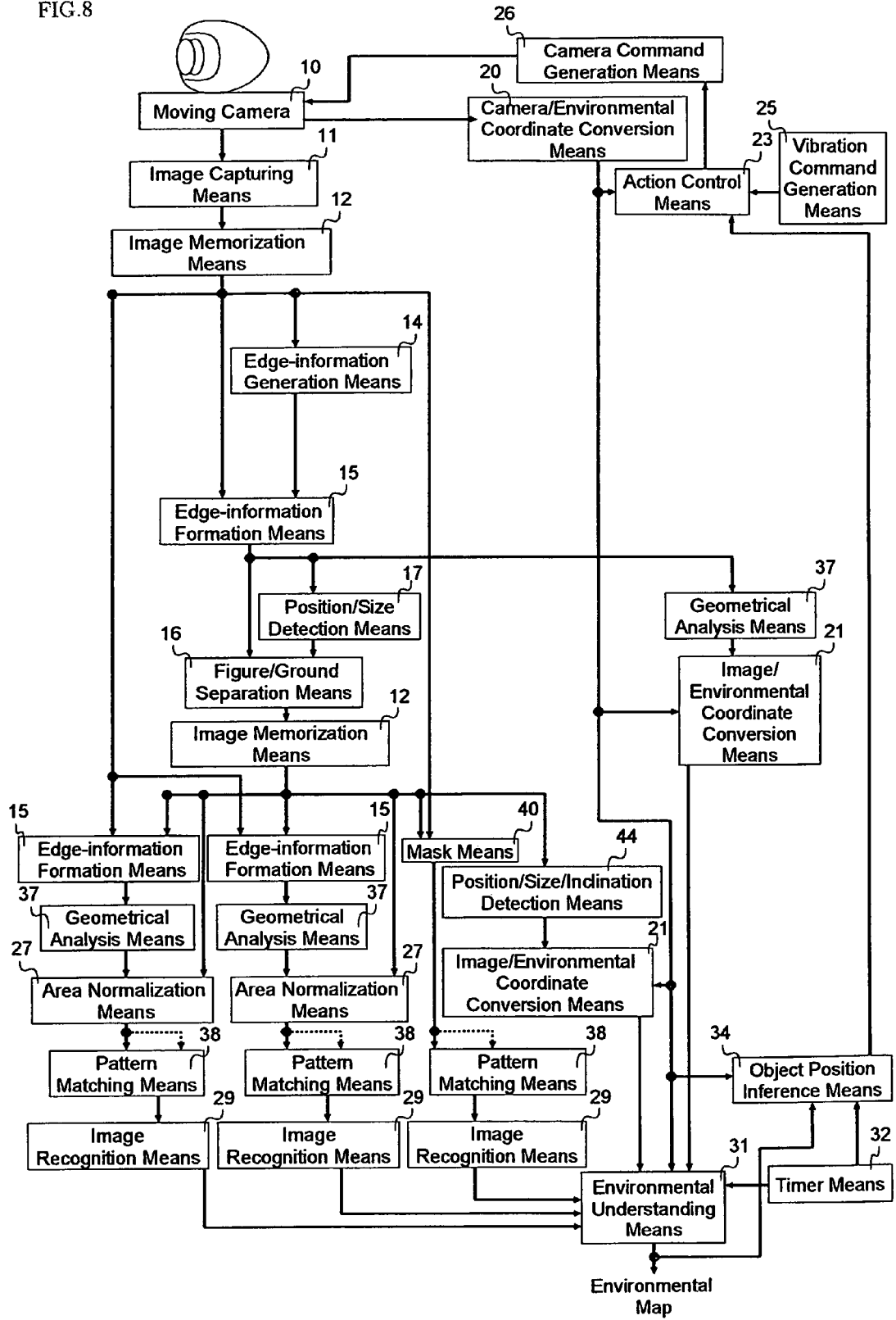
FIG. 8 is a block diagram of a visual device which controls a moving camera and finds out some objects.

As shown in FIG. 8, a visual device 2 for searching an object comprises an image capturing means 11, a camera/environmental coordinate conversion means 20, two image/environmental coordinate conversion means 21, a timer means 32, an object position inference means 34, a vibration command generation means 25, an action control means 23 and a camera command generation means 26, in addition to all means shown in the visual device 2 for recognizing an object area 141. The image capturing means 11 converts each of frame images constructing an animation image taken by a moving camera 10 into a digital image 111 in order. If the frame image consists of analog signals, the image capturing means 11 converts the frame image into digital signals, and generates the digital image 111. On the other hand, in a case that the frame image consists of digital signals, the image capturing means 11 expands the frame image and generates the digital image 111 if the digital signals are compressed. Otherwise, the image capturing means 11 converts the frame image into the digital image 111 directly.

By the way, in a case that a moving camera 10 carries out at least one of pan, tilt, roll and zoom, digital images 111 do not always appear the same place with the same magnification and the same inclination because direction, inclination and magnification of the moving camera 10 are also changed. Therefore, position, size and inclination of an object detected by the geometrical analysis means 37 and the position/size/inclination detection means 44 may be changed every digital image 111. In order for the moving camera 10 to take the image of the object, whose size in the image is always suitable, the visual device 2 uses three coordinate systems; a camera coordinate system, an image coordinate system and an environmental coordinate system, corresponding to its functions. First, the camera coordinate system is a three-dimensional spherical coordinate system used by the moving camera 10, in order for the moving camera 10 to control pan, tilt and zoom in a minimum control unit, respectively. In general, the origin of the camera coordinate system is a primitive position of the moving camera 10, called a home position. The camera coordinate system is only a coordinate system possible to appear physical positions of the objects, but the camera coordinate system can not be used for general purpose because each model of the moving camera 10 has its own camera coordinate system. Therefore, the visual system 2 has to keep the camera coordinate system secret against other means. Second, the image coordinate system is a two-dimensional coordinate system whose unit is a pixel, and whose origin is the center of a frame image taken by the moving camera 10, that is, a light axis of lens. This system is used to appear some pixels of the frame image, at which the objects are. The image coordinate system is suitable for distinguishing positions of some objects in the frame image finely, but the physical positions of the objects can not be appeared by only the image coordinate system. Third, the environmental coordinate system is a three-dimensional spherical coordinate system used in order for the visual device 2 to appear consistently internal positions of the objects. The angle for horizontal and vertical directions is represented by radian. Distance in the environmental coordinate system is represented by real numbers, whose unit is 1.0, in order to appear the product of the size of objects and the distance to them. Since the size of the objects do not change extremely for a short time, in general, we can assume that the distance to the objects is proportional to the magnification of the moving camera 10. The origin of the environmental coordinate system can be defined freely. In short, the environmental coordinate system is used to appear the relative coordinate of any two points on the environmental system itself. The visual device 2 can distinguish some objects in environment, by projecting them possible to be taken by the moving camera 10 to the environmental coordinate system.

Here, the camera coordinate system and the image coordinate system must be converted themselves each other. Means playing such a role are a camera/environmental coordinate conversion means 20, an image/environmental coordinate conversion means 21 and an action control means 23. These means derive two units of the camera coordinate system and the image coordinate system, corresponding to the specification of the moving camera 10 and the image capturing means 11, and then compute a matrix for converting from them to the environmental coordinate system. A convert matrix from the environmental coordinate system to the camera coordinate system is also derived by computing an invert matrix of the convert matrix from the camera coordinate system to the environmental coordinate system. Note that a position of the environmental coordinate system converted from the camera coordinate system is equal to a relative position from the home position of the moving camera 10, which is on the environmental coordinate system because the origin of the camera coordinate system is the home position of the moving camera 10. On the other hand, the position of the camera coordinate system converted from the environmental coordinate system is equal to a relative position from the present position of the moving camera 10, which is on the camera coordinate system. In addition, the position is not converted to the environmental coordinate system by using only the image coordinate system because the image coordinate system is the two-dimensional coordinate system. The position of the image coordinate system can be converted to the environmental coordinate system, when the image/environmental coordinate conversion means 21 computes the convert matrix frequently, using the direction and the magnification of the moving camera 10 represented by the environmental coordinate system and the size of areas of the objects in the frame image. Note that a position of the environmental coordinate system converted from the image coordinate system is equal to a relative position from the center of the image.

Figure 9:
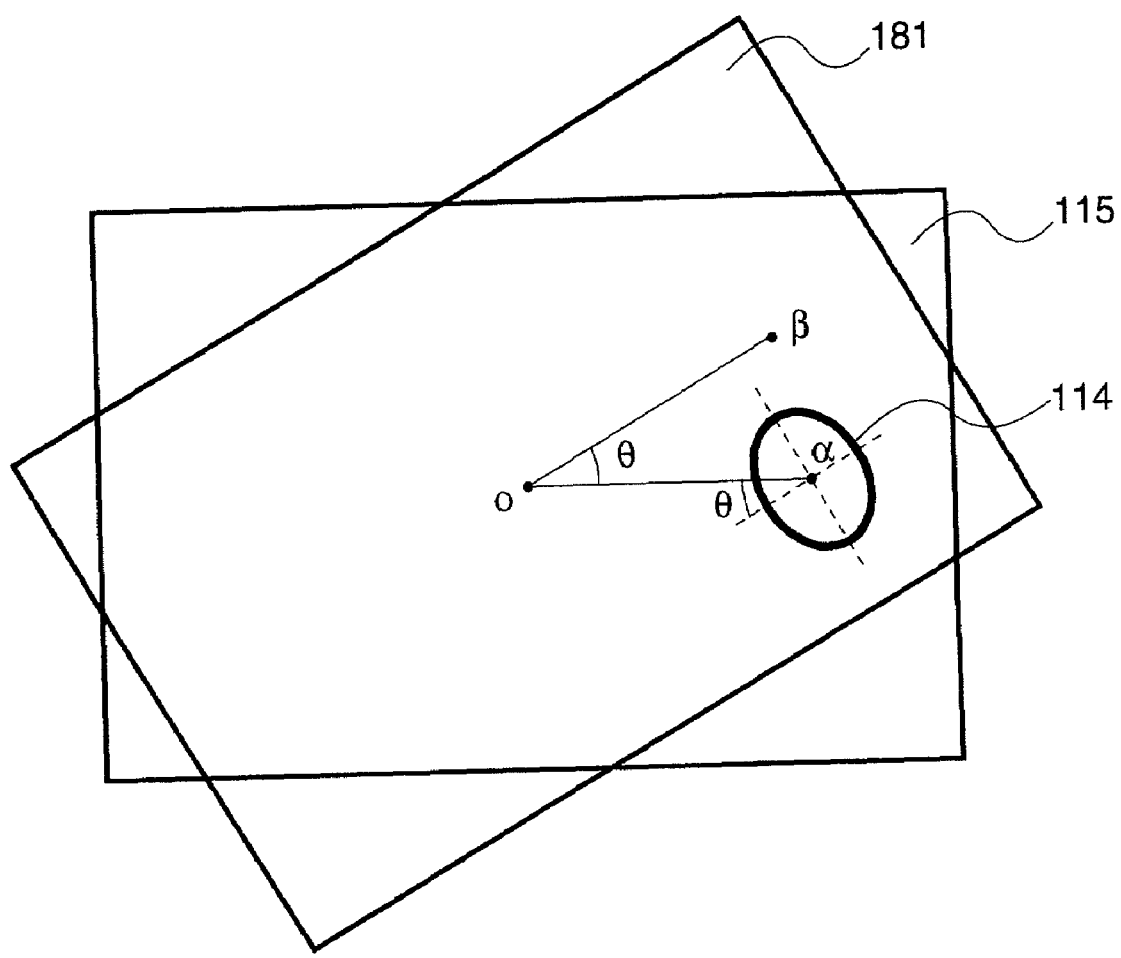
FIG. 9 is an explanation view for an image coordinate, in a case that a moving camera rotated as the light axis of its lens is a center of rotation.

By the way, in a case that the moving camera 10 leaned, the visual device 2 can not derive a position on the environmental coordinate system as described above. For example, as shown in FIG. 9, suppose that there is formed edge information 114 of an object which leaned at an angle θ counter-clockwisely, at a position α in a formed edge-information image 115. If the moving camera 10 is rotated at the angle θ counter-clockwisely, centering on a center o of the formed edge-information image 115, an edge-information formation means 15 can output a post-rotation formed edge-information image 181. In short, since the object stands straight at the point α in the post-rotation formed edge-information image 181, recognition of type of the object comes to be easy. However, a coordinate in the image coordinate system derived from the position α in the post-rotation formed edge-information image 181 is a position rotating clockwisely at the angle θ to a coordinate in the image coordinate system which is derived from the position α in the formed edge-information image 115. Therefore, the bigger the angle θ is, or the longer the distance oα is, the bigger a gap between both coordinates comes to be. Thus, in order to derive the coordinate in the image coordinate system before rotating from the position α in the post-rotation formed edge-information image 181, we only have better derive a position, to which the position α in the post-rotation formed edge-information image 181 is rotated counter-clockwisely at the angle θ. Note that a unit of inclination of the moving camera 10 and the angle θ are radian.

In the post-rotation formed edge-information image 181, now, let an image coordinate of the position α be ($\alpha_x, \alpha_y$), and let an image coordinate of the position β be ($\beta_x, \beta_y$). ($\alpha_x, \alpha_y$) and ($\beta_x, \beta_y$) can be derived according to EQ.1.

$$\begin{bmatrix} \beta_x \\ \beta_y \end{bmatrix} = \begin{bmatrix} \cos\theta & -\sin\theta \\ \sin\theta & \cos\theta \end{bmatrix} \begin{bmatrix} \alpha_x \\ \alpha_y \end{bmatrix} \quad (1)$$

By this equation, the position β in the post-rotation formed edge-information image 181, that is, the position α in the formed edge-information image 115 can be derived from the position α in the post-rotation formed edge-information image 181. As a result, the image/environmental coordinate conversion means 21 can derive an environmental coordinate exactly from the position α in the post-rotation formed edge-information image 181.

Considering the above, in the visual device 2 for searching an object, a camera/environmental coordinate conversion means 20 converts direction and magnification of the moving camera 10 into a position of the environmental coordinate system which is not related with physical measure. Note that inclination of the moving camera 10 is converted into an angle represented by a unit of radian. In addition, two image/environmental conversion means 21 project each pixel in an inclination-size-information image 186 and each pixel in a form-size-information image 190 to positions of the environmental coordinate system, respectively. Therefore, the environmental understanding means 31 can generate an environmental map which is a list of environmental data represented by the environmental coordinate system. Moreover, the environmental understanding means 31 inputs a current time from a timer means 32, where a unit of the current time is less than or equal to one second, generally one millisecond. Therefore, since the environmental understanding means 31 can add a time stamp to each of the environmental data included in the environmental map, the environmental understanding means 31 can represent an orbit of an object and remove old environmental data. Note that the environmental understanding means 31 can convert current direction, magnification and inclination of a moving camera 10 into an environmental datum, by inputting the current direction, the magnification and the inclination of the moving camera 10 from the camera/environmental coordinate conversion means 20. The environmental datum is useful when an external system uses the environmental map. The object position inference means 34 selects one of at least one object represented by the environmental map, and presumes a current position and inclination of the object from the orbit of the object. The current position is also represented by the environmental coordinate system. The vibration command generation means 25 generates a command for vibrating the moving camera 10. Therefore, since digital images 111 also vibrate in order, the edge-information generation means 14 can regard an object which is still in an animation image as it is moving. In short, the edge-information generation means 14 can generate rough edge information 112 for the object. Note that, in a case that the object vibrates within about two or three pixels in the digital images 111, the edge-information generation means 14 can generate the rough edge information 112 from only the object effectively. In a case that the action control means 23 inputs a current position and inclination of an object from the object position inference means 34 or a command for vibrating the moving camera 10 from the vibration command generation means 25, the action control means 23 decides destination of the moving camera 10 and converts it into the camera coordinate system. The camera command generation means 26 generates a command for controlling at least one of pan, tilt, roll and zoom of the moving camera 10 after inputting the destination. For all objects, even though the present invention does not know any information like position, size, inclination, form and color of the objects in the digital images 111 beforehand, the present invention can search all objects in the digital images 111. Therefore, even though a user of the present invention does not know any information on an object, which is a target of detection, beforehand, the user can use the present invention easily.

Figure 10:
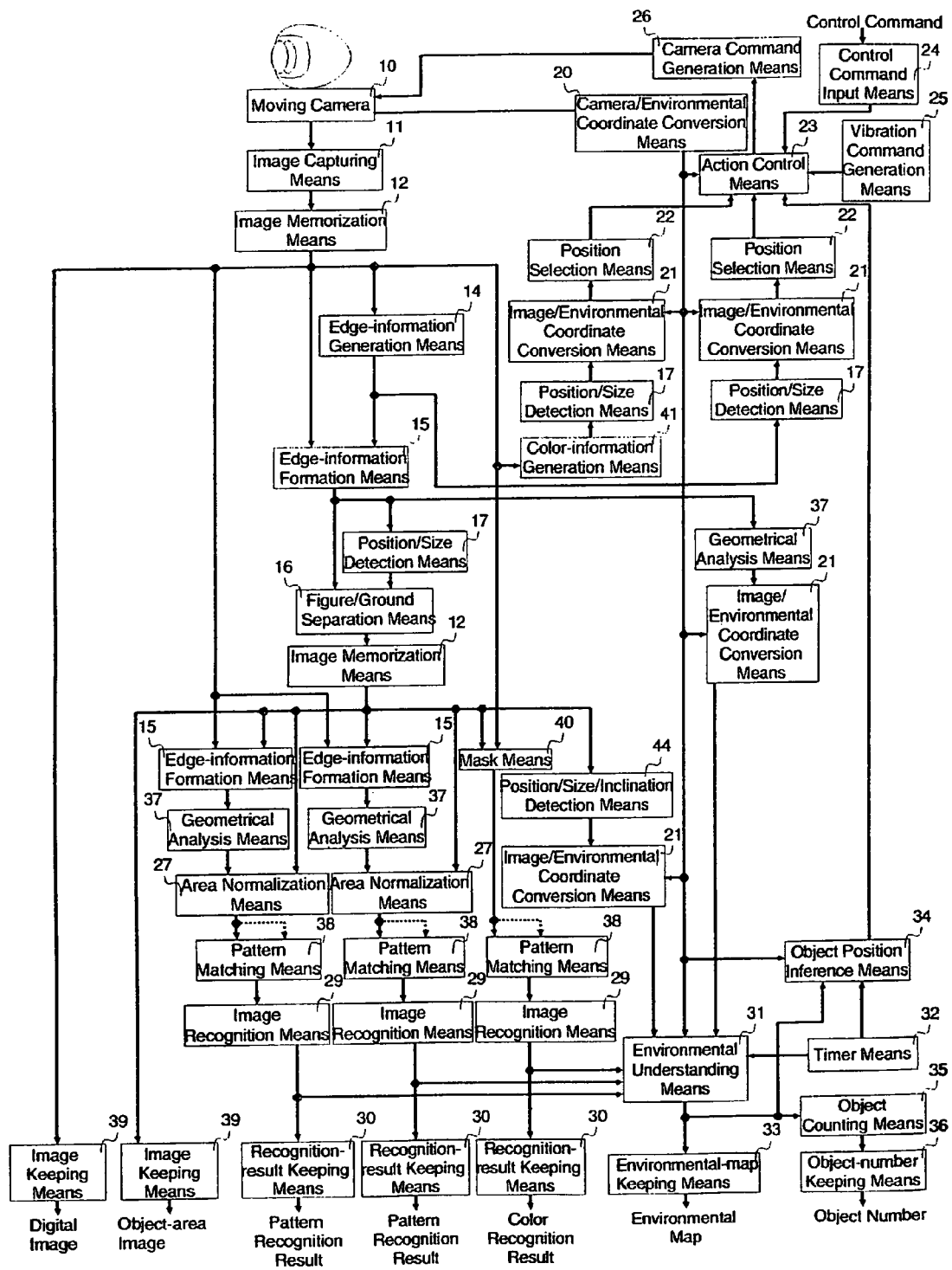
FIG. 10 is a block diagram of a visual device which controls a moving camera, finds out some objects and counts the number of the objects.

Besides this, for example, as shown in FIG. 10, a visual device 2 for counting the number of objects also comprises two image keeping means 39, two or more recognition-result keeping means 30, an environmental-map keeping means 33, an object counting means 35 and an object number keeping means 36, which are for outputting information generated by the visual device 2, a color-information generation means 41, two position/size detection means 17, two image/environmental coordinate conversion means 21 and two position selection means 22, which are for searching the objects efficiently, and a control command input means 24 for controlling the visual device 2 from an external part, in addition to all means shown in the visual device 2 for searching the objects.

First, until a system in the external part finishes inputting a digital image 111 memorized by one image memorization means 12, one image keeping means 39 keeps the digital image 111 for a specific period. Until the system in the external part finishes inputting an object area image 142 memorized by another image memorization means 12, another image keeping means 39 keeps the object area image 142 for a specific period. By combining these two images, the system in the external part can cut off an area corresponding to an object area 141 from the digital image 111. Until the system in the external part finishes inputting recognition results of pattern, texture and color for a segmented object area 143 decided by two or more image recognition means 29, the corresponding recognition-result keeping means 30 keeps the recognition results for a specific period, respectively. Note that at least one recognition-result keeping means 30 may output a recognition result of pattern and a recognition result of texture, mixing them. Until the system in the external part finishes inputting an environmental map generated by the environmental understanding means 31, the environmental-map keeping means 33 keeps the environmental map for a specific period. The object counting means 35 counts the number of objects detected from the environmental map within a specific period, and outputs the number of the objects. Until the system in the external part finishes inputting the number of the objects, the object number keeping means 36 keeps the number of the objects for a specific period.

Next, the color-information generation means 41 selects pixels representing a specific color like red, yellow and white from each pixel of the digital image 111, and generates a color-information image 172. The color-information image 172 is seldom useful for a case of recognizing objects in a real world, in which brightness always changes and innumerable colors overflow, but it is much useful for a case of searching quickly an object, to which an attention must be paid or which may give danger, like blood, fire, a signal, a road sign, light of a headlight and so on. One position/size detection means 17 detects position and size of at least one object, to which an attention must be paid, from the color-information image 172, and generates a redundant-information image 132. One image/environmental coordinate conversion means 21 projects redundant information 131 constructing each pixel of the redundant-information image 132 to the environmental coordinate system. One position selection means 22 selects one from all redundant information 131. On the other hand, another position/size detection means 17 detects position and size of at least one moving object from a rough edge-information image 113, and generates a redundant-information image 132. Another image/environmental coordinate conversion means 21 projects redundant information 131 constructing each pixel of the redundant-information image 132 to the environmental coordinate system. Another position selection means 22 selects one from all redundant information 131. In addition, the control command input means 24 inputs a control command directed by a user or a suitable system from an external part. Then, the action control means 23 selects one from objects around the moving camera 10 and objects directed by the user and the system, besides objects represented by the environmental map, followed by sending an environmental coordinate of a selected object to the camera command generation means 26.

For all objects, therefore, even though the present invention does not know any information like position, size, inclination, form and color of the objects in the digital images 111 beforehand, the present invention can search all objects in the digital images 111, and count the number of the objects. Thus, even though a user of the present invention does not know any information on an object, which is a target of detection, beforehand, the user can use the present invention easily. Note that the user can select only desired means from FIG. 10, in using the present invention really. Moreover, he can append other means to the present invention.

Now, the image memorization means 12, the color-information generation means 41, the edge-information generation means 14, the edge-information formation means 15, the position/size detection means 17, the position/size/inclination detection means 44, the geometrical analysis means 37, the figure/ground separation means 16, the area normalization means 27, the mask means 40, the image keeping means 39 and the pattern matching means 38 used in the visual devices 2 can be implemented by using a data processing device 110 consisting of some array operation units 100. Some enforcement forms of the data processing device 110 consisting of the array operation units 100 are shown below. With reference to the drawings, then, it is explained about the visual device 2.

Figure 11:
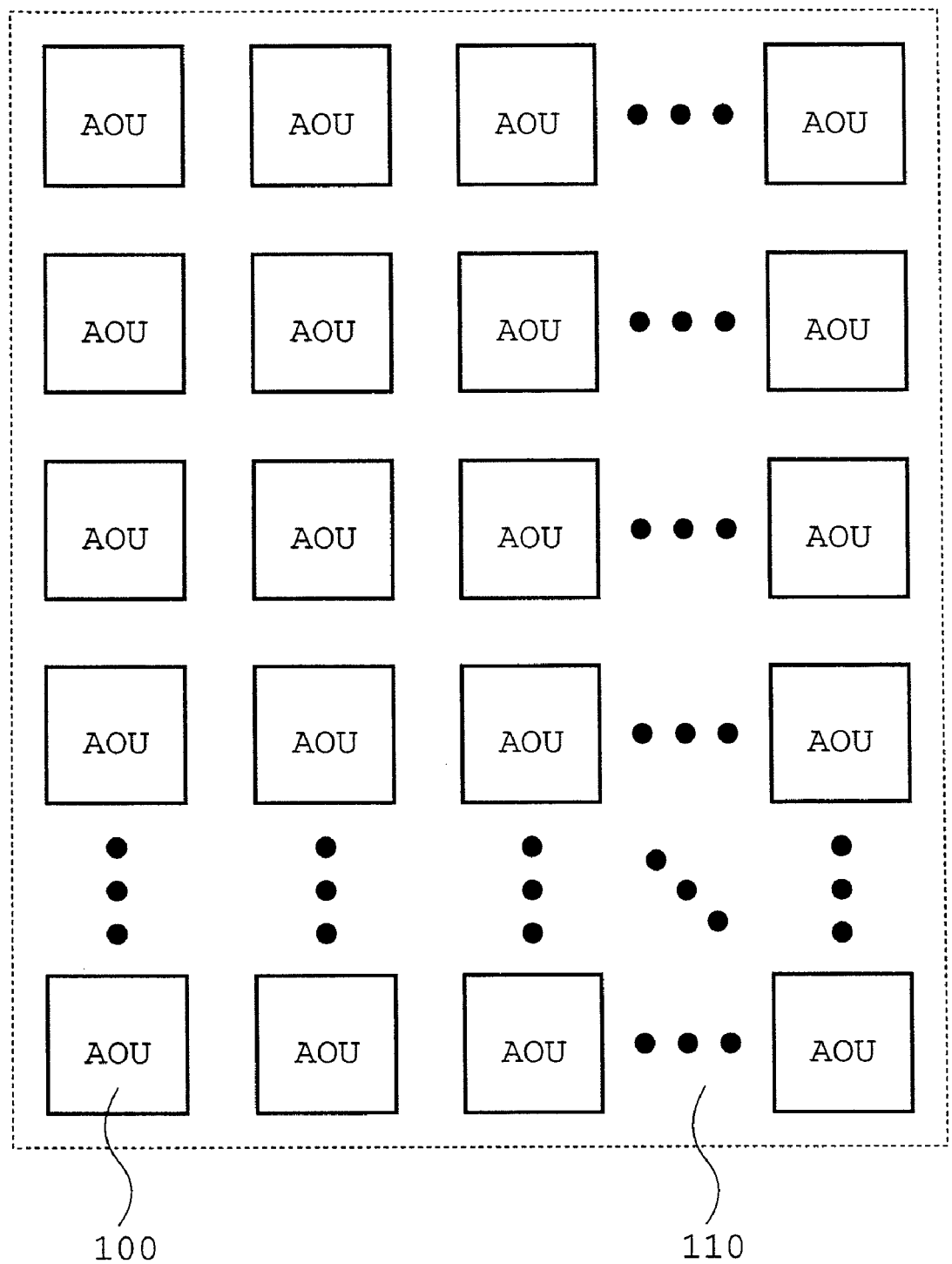
FIG. 11 is a block diagram of some array operation units arranged in the shape of a lattice.

First, an array operation unit 100 generates a pixel in an output image, by using a pixel and its neighbor pixels in an input image. As shown in FIG. 11, a data processing device 110 can generate the output image from the input image, when some array operation units 100 are arranged in the shape of a lattice in the data processing device 110, according to size of the input image. Note that the array operation unit 100 is denoted as AOU in FIG. 11. In addition, the array operation units 100 are arranged in the shape of a square lattice in FIG. 11. Of course, however, they may be arranged in the shape of a hexagonal lattice, that is, hexagonal closest packing, in order to make an implementation surface smallest. In this case, a part of signal lines between the array operation units 100 are wired zigzag. Next, the array operation unit 100 may be implemented by a specialized hardware. Otherwise, it can be also implemented by a software on a general computer. That is, if the data processing device 110 can generate the output image from the input image, the implementation way of the array operation unit 100 is not limited. Image processing of the data processing device 110 can be appeared by describing some algorithms of the array operation unit 100. In order to describe the algorithms of the array operation unit 100, it is explained here about some equations used in the image memorization means 12, the color-information generation means 41, the edge-information generation means 14, the edge-information formation means 15, the position/size detection means 17, the position/size/inclination detection means 44, the geometrical analysis means 37, the area normalization means 27, the mask means 40, the image keeping means 39 and the pattern matching means 38 shown in FIG. 10.

Suppose that any three $2^n$-tone images are denoted as x, y and w, where their width is w, their height is h, their band number is b. The x, y and w are represented as EQ.2, EQ.3 and EQ.4, using three band-pixel values $x_{ijk}$, $y_{ijk}$ and $w_{ijk}$ at a position p(i,j,k), respectively. Note that bold letters means vectors, n is the non-negative number, and w, h, b, i, j and k are the natural number.

$$x = \{x_{ijk} | x_{ijk} \text{ is value at } p(i,j,k), 1 \leq i \leq w, 1 \leq j \leq h, 1 \leq k \leq b\} \quad (2)$$

$$y = \{y_{ijk} | y_{ijk} \text{ is value at } p(i,j,k), 1 \leq i \leq w, 1 \leq j \leq h, 1 \leq k \leq b\} \quad (3)$$

$$w = \{w_{ijk} | w_{ijk} \text{ is value at } p(i,j,k), 1 \leq i \leq w, 1 \leq j \leq h, 1 \leq k \leq b\} \quad (4)$$

First, it is described here about functions on point processing for each band-pixel value in the above images.

When an image x is converted to a binary image, EQ.5 makes a band-pixel value of x binary.

$$\Phi_{ijk}(x) = \begin{cases} 1 & \text{if } x_{ijk} > 0, \\ 0 & \text{otherwise.} \end{cases} \quad (5)$$

When an image x is converted to a band maximum-value image, EQ.6 selects a maximum value of all band values of pixel at column i and row j. Note that the number of bands of the above band maximum-value image is dealt with one, for convenience' sake, because the above band maximum-value image becomes a one-band image. The third index of function $B_{ijl}(x)$ is then equal to one.

$$B_{ij1}(x) = \max_k \{x_{ijk}\} \quad (6)$$

Suppose that an image x is a binary image. When the image x is inverted, EQ.7 calculates inversion.

$$I_{ijk}(x) = 1 - x_{ijk} \quad (7)$$

EQ.8 converts a value at a position p(i,j,k) of an image x to a logarithm of the value. Note that e is an offset value, and there is no problem for e=1 in general because this value is used in order for a value outputted by a natural logarithmic function to be within a valid range. Subtraction between two band-pixel values can supersede division between them by this conversion. Suppose also that the image x is a $2^n$-tone digital image 111. If a memory 102 has a look-up table including $2^n$ elements in spite of the number of bands, a natural logarithm function does not have to be calculated every time, and the memory 102 also does not have to memorize a standard table of logarithms.

$$L_{ijk}(x) = ln(x_{ijk} + e) \quad (8)$$

Now, a set $P_{ijk}(q)$ of neighbor positions around a position p(i,j,k) in an image is represented by EQ.9, where q is a progression of 4, 8, 24, 48, 80, 120, $(2r+1)^2 - 1$, and r is a natural number. When a position outside of the image is included in the set $P_{ijk}(q)$, it is superseded by the position p(i,j,k) as long as there is especially no specification. Otherwise, the position is superseded by a fictitious position, a pixel value at which is equivalent to zero, and which is not included by the image. Processing around borders is automatically carried out by this replacement. Then, the number of elements, $N_{ijk}$, of the set $P_{ijk}(q)$ is always q.

$$P_{ijk}(q) = \begin{cases} \left\{ \begin{array}{l} p(i+1, j, k), p(i, j+1, k), \\ p(i-1, j, k), p(i, j-1, k) \end{array} \right\} & \text{if } q = 4, \\ \left\{ \begin{array}{l} p(l, m, k) \mid i - r \leq l \leq i + r, j - r \leq \\ m \leq j + r, p(l, m, k) \neq p(i, j, k) \end{array} \right\} & \text{if } q = (2r+1)^2 - 1. \end{cases} \quad (9)$$

Next, it is explained here about some functions and an operator for each band-pixel value on neighbor processing, whose neighbors are included in eight neighbors 182.

Smoothing at a position p(i,j,k) of an image x is carried out according to EQ.10, where int(v) represents omission below decimal point for any real number v. Let us consider a case that this equation is implemented by a hardware. If a band-pixel value of the image x is an integer, a division circuit is reduced by changing a general arithmetic circuit as to perform a right-shift command two times in calculating summation of $x_{lmk}$ if $N_{ijk}=4$, or three times in calculating summation of $x_{lmk}$ if $N_{ijk}=8$.

$$S_{ijk}(x) = \text{int}\left(\frac{1}{N_{ijk}} \sum_{p(l,m,k) \in P_{ijk}(q)} x_{lmk}\right) \quad (10)$$

As shown in EQ.11, a Laplacian operator is just a second differential operator. Since a Laplacian operator for eight neighbors can catch a delicate change of noise, it makes many zero-points and zero-crossing. Therefore, the Laplacian operator for eight neighbors 182 is suitable for the present invention. Let us consider a case that this equation is implemented by a hardware. Since $N_{ijk}$ is either four or eight, a multiple circuit is reduced by changing a general arithmetic circuit as to perform a left-shift command two times in calculating summation of $x_{lmk}$ if $N_{ijk}=4$, or three times in calculating summation of $x_{lmk}$ if $N_{ijk}=8$.

$$\nabla^2_{ijk} x = \sum_{p(l,m,k) \in P_{ijk}(q)} x_{lmk} - N_{ijk} x_{ijk} \quad (11)$$

The way deriving a zero-point from a value calculated by a Laplacian operator has found a pixel value varying from positive to negative. According to EQ.12, however, the present invention finds a pixel value which shows zero-crossing from negative to positive, which goes via zero such as from negative to zero and from zero to positive, or which remains zero. In the present invention, a zero-point found by EQ.12 does not suggest a place where edge exists, but represents a place where noise happens, that is, where edge does not exist. EQ.12 also makes real number binary.

$$Z_{ijk}(x) = \begin{cases} 1 & \text{if } x_{ijk} \leq 0 \text{ and } x_{lmk} \geq 0 \text{ for } {}^3p(l,m,k) \in P_{ijk}(q), \\ 0 & \text{otherwise.} \end{cases} \quad (12)$$

Suppose that an image x is any binary image. To fill a pixel with a hole in the image x is carried out according to EQ.13, where a parameter f represents size of the hole to fill, and there is no problem for f=1 in general. Since this equation for four neighbors can not detect a diagonal line in nature, the equation has to use eight neighbors 182 as much as possible.

$$F_{ijk}(x) = \begin{cases} 1 & \text{if } \sum_{p(l,m,k) \in P_{ijk}(q)} x_{lmk} + f \geq N_{ijk}, \\ x_{ijk} & \text{otherwise.} \end{cases} \quad (13)$$

Suppose that an image x is any binary image. To delete a pixel which is an alone point or an alone hole in the image x is carried out according to EQ.14. Since this equation for four neighbors can not detect a diagonal line by nature, the equation has to use eight neighbors 182 as much as possible.

$$A_{ijk}(x) = \begin{cases} 0 & \text{if } x_{ijk} = 1 \text{ and } \sum_{p(l,m,k) \in P_{ijk}(q)} x_{lmk} = 0, \\ 1 & \text{if } x_{ijk} = 0 \text{ and } \sum_{p(l,m,k) \in P_{ijk}(q)} x_{lmk} = N_{ijk}, \\ x_{ijk} & \text{otherwise.} \end{cases} \quad (14)$$

Suppose that an image x is any binary image. In order to detect some lines whose width is equal to one in the image x, EQ.15 finds a pixel making the lines, using its four neighbors.

$$J_{ijk}(x) = \begin{cases} x_{ijk} & \text{if } x_{i-1jk} + x_{i+1jk} = 0 \text{ or } x_{ij-1k} + x_{ij+1k} = 0, \\ 0 & \text{otherwise.} \end{cases} \quad (15)$$

Suppose that two images, x and y, are binary images, where the image y consists of pixels representing a line whose width is equal to one in the image x. In order to expand the lines whose width is equal to one in the image x, EQ.16 change a pixel, using its four neighbors.

$$K_{ijk}(x,y) = \begin{cases} 1 & \text{if } y_{i-1jk} + y_{i+1jk} + y_{ij-1k} + y_{ij+1k} > 0, \\ x_{ijk} & \text{otherwise.} \end{cases} \quad (16)$$

Complement of line width in a binary image can be simply described by EQ.17, using the detection of line width, EQ.15, and the expansion of line width, EQ.16.

$$C_{ijk}(x) = K_{ijk}(x, J(x)) \quad (17)$$

Next, it is explained here about some functions and operators on neighbor processing for each band-pixel value of an image.

Suppose that there are two images, x and y. A maximum-value image between them is derived by EQ.18.

$$M_{ijk}(x,y) = \begin{cases} x_{ijk} & \text{if } x_{ijk} \geq y_{ijk}, \\ y_{ijk} & \text{otherwise.} \end{cases} \quad (18)$$

Suppose that there are two images, x and y. A difference between them is calculated by EQ.19.

$$D_{ijk}(x,y) = x_{ijk} - y_{ijk} \quad (19)$$

Enhancement of a binary image can be simply described by EQ.20, using the Laplacian operator, EQ.11, and the difference, EQ.19.

$$E_{ijk}(x) = D_{ijk}(x, \nabla_{ijk}^2 x) \quad (20)$$

Suppose that there are two images, x and y, where the image y is a one-band binary image. EQ.21 can mask each band-pixel value of the image x by a band-pixel value of the image y.

$$O_{ijk}(x,y) = x_{ijk} y_{ij1} \quad (21)$$

Suppose that there are two images, x and y, where they are both binary. The image y can be operated orthopedically according to EQ.22, based on the image x.

$$Q_{ijk}(x, y) = \begin{cases} x_{ijk} & \text{if } y_{ijk} + \sum_{p(l,m,k) \in P_{ijk}(q)} y_{lmk} > 0, \\ 0 & \text{otherwise.} \end{cases} \quad (22)$$

Suppose that there are two images, x and y, where the image y is binary. A band-pixel value of the image x not directed by the image y is complemented by an average of some band-pixel values, which are directed by the image y, among neighbors of the band-pixel value of the image x, according to EQ.23, where int(v) represents omission below decimal point for any real number v. Note that a denominator of division in EQ.23 is a positive integer because the image y is binary. Thus, the division of two integers can be replaced with multiplication of two real numbers, in terms of memorizing the reciprocals from one to q in a memory 102.

$$V_{ijk}(x, y) = \quad (23)$$

$$\begin{cases} \text{int}\left(\dfrac{\sum_{p(l,m,1) \in P_{ij1}(q)} x_{imk} y_{lm1}}{\sum_{p(l,m,1) \in P_{ij1}(q)} y_{lm1}}\right) & \text{if } y_{ij1} = 0 \text{ and } \sum_{p(l,m,1) \in P_{ij1}(q)} y_{lm1} > 0, \\ x_{ijk} & \text{otherwise.} \end{cases}$$

In the present invention, now, processing is carried out more simply by regarding positions of an image and transfer values as image data. This is called imagery of positions. It is described here about some functions and operators on imagery of positions.

Suppose first that an operator converting all values, l, m, o of a position p(l, m, o) to a band-pixel value for an image datum is denoted as #. Moreover, suppose that the converted band-pixel value is denoted as #p(l, m, o). Let us consider a case that a band-pixel value is transferred from the position p(i,j,k) to the position p(i+l, j+m, k+o). A transfer value of the band-pixel value is represented by the position p(l, m, o). In short, a transfer value is regarded as a vector from some position. An operator taking out a position from a band-pixel value is denoted as $\#^{-1}$, where $\#^{-1}\#p(l, m, o) = p(l, m, o)$.

EQ.24 can change the direction of a transfer value p(i,j,k) to the opposite direction, that is, 180 degrees in a plane represented by width and height.

$$Y(p(i,j,k)) = p(-i,-j,k) \quad (24)$$

Suppose that there is an image x, where the image x is binary. A transfer value toward a center of gravity at a position p(i, j, 1) of the image x is calculated by EQ.25. By nature, division has to be carried out in calculating the center of gravity. However, the division is omitted in EQ.25 because the division is offset in converting the transfer value to one of eight neighbors 182.

$$G_{ij1}(x) = p\left(\sum_{p(l,m,1) \in P_{ij1}(q)} (l - i)x_{lm1}, \sum_{p(l,m,1) \in P_{ij1}(q)} (m - j)x_{lm1}, 0\right) \quad (25)$$

A pixel value of a transfer-value image can be made from a transfer value p(i,j,k), by converting the p(i,j,k) to one of eight neighbors 182, according to EQ.26, EQ.27 and EQ.28, where EQ.27 and EQ.28 is used only when an discrete image makes a trouble in EQ.26.

$$\Theta(p(i, j, k)) = \begin{cases} \#p(1, 0, k) & \text{if } i > 0, |j| < |i|/2, \\ \#p(1, -1, k) & \text{if } i > 0, j < 0, |i|/2 \le |j| \le 2|i|, \\ \#p(0, -1, k) & \text{if } j < 0, 2|i| < |j|, \\ \#p(-1, -1, k) & \text{if } i < 0, j < 0, |i|/2 \le |j| \le 2|i|, \\ \#p(-1, 0, k) & \text{if } i < 0, |j| < |i|/2, \\ \#p(-1, 1, k) & \text{if } i < 0, j > 0, |i|/2 \le |j| \le 2|i|, \\ \#p(0, 1, k) & \text{if } j > 0, 2|i| < |j|, \\ \#p(1, 1, k) & \text{if } i > 0, j > 0, |i|/2 \le |j| \le 2|i|, \\ \#p(0, 0, k) & \text{otherwise.} \end{cases} \quad (26)$$

$$\Theta'(p(i, j, k)) = \begin{cases} \#p(1, 0, k) & \text{if } i > 0, |j| < |i|/2, \\ \#p(1, 0, k) & \text{if } i > 0, j < 0, |i|/2 \le |j| \le 2|i|, \\ \#p(0, 1, k) & \text{if } i < 0, j > 0, |i|/2 \le |j| \le 2|i|, \\ \#p(0, 1, k) & \text{if } j > 0, 2|i| < |j|, \\ \#p(1, 1, k) & \text{if } i > 0, j > 0, |i|/2 \le |j| \le 2|i|, \\ \#p(0, 0, k) & \text{otherwise.} \end{cases} \quad (27)$$

$$\Theta''(p(i, j, k)) = \begin{cases} \#p(0, -1, k) & \text{if } i > 0, j < 0, |i|/2 \le |j| \le 2|i|, \\ \#p(0, -1, k) & \text{if } j < 0, 2|i| < |j|, \\ \#p(-1, -1, k) & \text{if } i < 0, j < 0, |i|/2 \le |j| \le 2|i|, \\ \#p(-1, 0, k) & \text{if } i < 0, |j| < |i|/2, \\ \#p(-1, 0, k) & \text{if } i < 0, j > 0, |i|/2 \le |j| \le 2|i|, \\ \#p(0, 0, k) & \text{otherwise.} \end{cases} \quad (28)$$

By using EQ.25, EQ.26, EQ.27 and EQ.28, thus, the band-pixel value of the transfer-value image toward the center of gravity of the one-band binary image x can be simply described by EQ.29, EQ.30 and EQ.31. Note that the number of bands of the transfer-value image is equal to one.

$$\Delta_{ij1}(x) = \Theta(G_{ij1}(x)) \quad (29)$$

$$\Delta_{ij1}'(x) = \Theta'(G_{ij1}(x)) \quad (30)$$

$$\Delta_{ij1}''(x) = \Theta''(G_{ij1}(x)) \quad (31)$$

On the other hand, since the opposite position against the center of gravity is derived by EQ.24, the band-pixel value of the transfer-value image against the center of gravity of the one-band binary image x can be simply described by EQ.32. Note that the number of bands of the transfer-value image is equal to one.

$$R_{ij1}(x) = \Theta(Y(G_{ij1}(x))) \quad (32)$$

Suppose that there are two images, x and y, where the image y is a transfer-value image. After a band-pixel value of the image x is transferred to a transfer position directed by the image y, according to EQ.33, a grayscale image can be made from summation of some band-pixel values which have been transferred to the same band-pixel.

$$\Gamma_{ijk}(x,y) = \Sigma x_{lmk} \text{ for } p(l, m, 1) \in P_{ij1}(q) \text{ and } \#^{-1}y_{lm1} = p(i-l, j-m, 0). \quad (33)$$

In a case that each pixel of the one-band grayscale image x is transferred to one of neighbors toward the center of gravity, followed by calculating the summation of the band-pixel values transferred to the same band-pixel, this process can be simply described by EQ.34 EQ.35 and EQ.36, using EQ.5, EQ.29, EQ.30, EQ.31 and EQ.33.

$$\Lambda_{ij1}(x) = \Gamma_{ij1}(x, \Delta(\Phi(x))) \quad (34)$$

$$\Lambda_{ij1}'(x) = \Gamma_{ij1}(x, \Delta'(\Phi(x))) \quad (35)$$

$$\Lambda_{ij1}''(x) = \Gamma_{ij1}(x, \Delta''(\Phi(x))) \quad (36)$$

Figure 12:
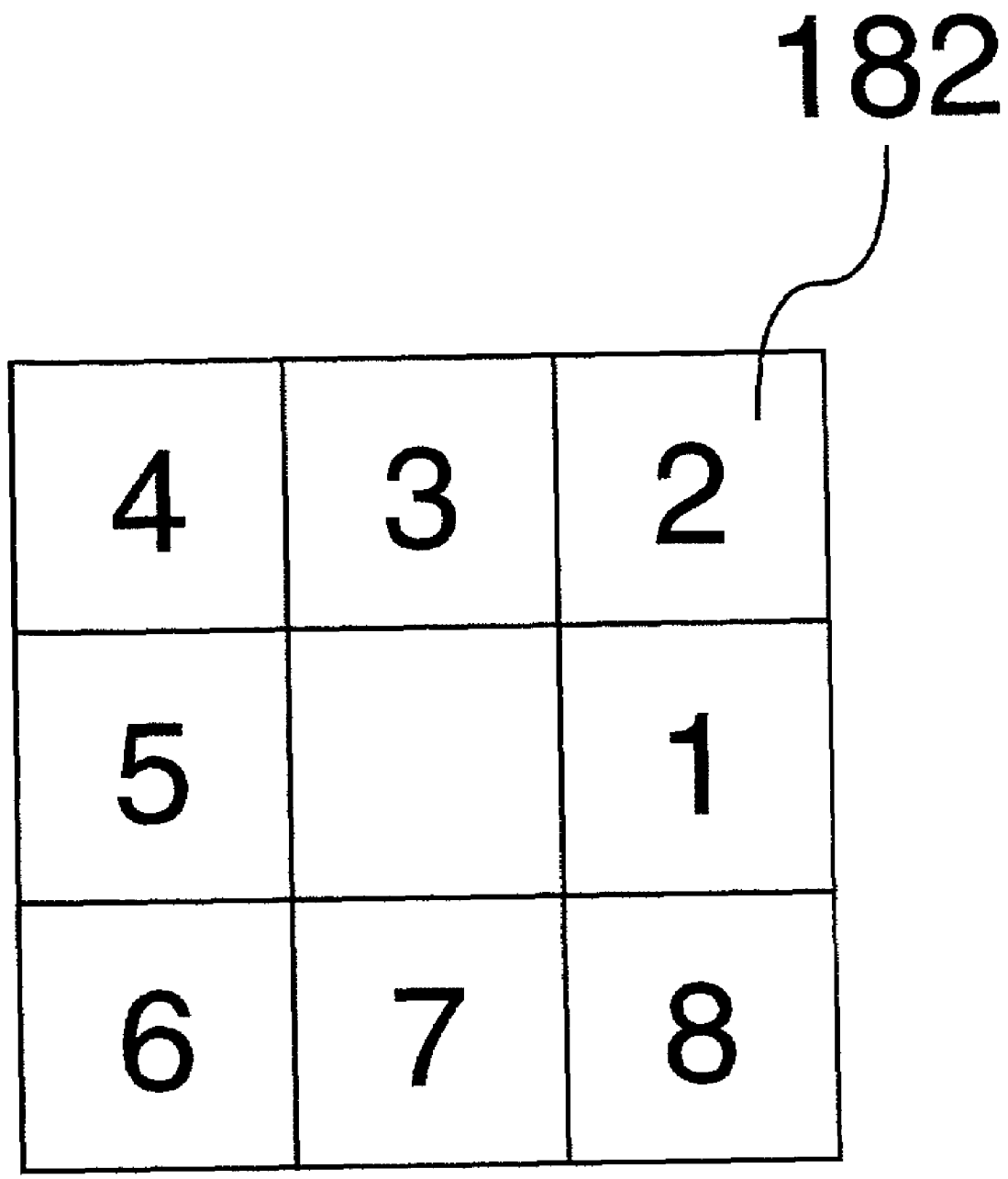
FIG. 12 is an explanation view for eight numbers of eight neighbors ordered counter-clockwisely.
Figure 13:
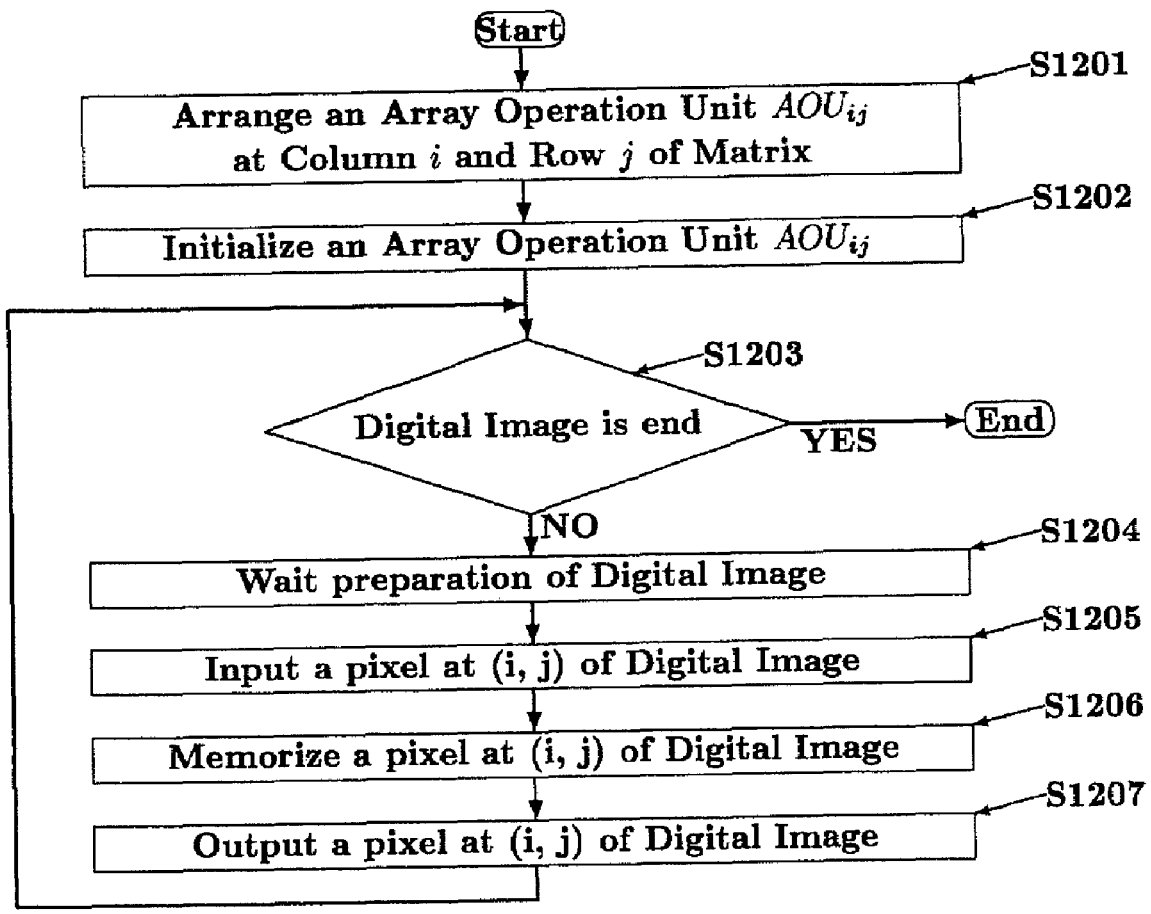
FIG. 13 is a flow chart appearing an algorithm of an image memorization means in this enforcement form.

By the way, when the number of neighbors, q, in EQ.33 is limited to eight, the transfer-value image y can specify a transfer source among eight neighbors 182 every pixel. In a case that the image x is a redundant-information image 132 and eight numbers from one to eight were arranged counter-clockwisely for eight neighbors 182 of each pixel in x, as shown in FIG. 12, eight equations from EQ.37 to EQ.44 can judge whether there is redundant information 131 possible to transfer, for each of eight transfer sources, respectively.

$$\Gamma^*_{ij1}(x,y) = \begin{cases} x_{i+1,j,1} & \text{if } \#^{-1}y_{i+1,j,1} = p(-1,0,0), \\ 0 & \text{otherwise.} \end{cases} \quad (37)$$

$$\Gamma^*_{ij2}(x,y) = \begin{cases} x_{i+1,j-1,1} & \text{if } \#^{-1}y_{i+1,j-1,1} = p(-1,1,0), \\ 0 & \text{otherwise.} \end{cases} \quad (38)$$

$$\Gamma^*_{ij3}(x,y) = \begin{cases} x_{i,j-1,1} & \text{if } \#^{-1}y_{i,j-1,1} = p(0,1,0), \\ 0 & \text{otherwise.} \end{cases} \quad (39)$$

$$\Gamma^*_{ij4}(x,y) = \begin{cases} x_{i-1,j-1,1} & \text{if } \#^{-1}y_{i-1,j-1,1} = p(1,1,0), \\ 0 & \text{otherwise.} \end{cases} \quad (40)$$

$$\Gamma^*_{ij5}(x,y) = \begin{cases} x_{i-1,j,1} & \text{if } \#^{-1}y_{i-1,j,1} = p(1,0,0), \\ 0 & \text{otherwise.} \end{cases} \quad (41)$$

$$\Gamma^*_{ij6}(x,y) = \begin{cases} x_{i-1,j+1,1} & \text{if } \#^{-1}y_{i-1,j+1,1} = p(1,-1,0), \\ 0 & \text{otherwise.} \end{cases} \quad (42)$$

$$\Gamma^*_{ij7}(x,y) = \begin{cases} x_{i,j+1,1} & \text{if } \#^{-1}y_{i,j+1,1} = p(0,-1,0), \\ 0 & \text{otherwise.} \end{cases} \quad (43)$$

$$\Gamma^*_{ij8}(x,y) = \begin{cases} x_{i+1,j+1,1} & \text{if } \#^{-1}y_{i+1,j+1,1} = p(-1,-1,0), \\ 0 & \text{otherwise.} \end{cases} \quad (44)$$

By using EQ.45, EQ.46 and EQ.47 instead of EQ.34, EQ.35 and EQ.36, thus, transfer-source redundant information 183 of each of eight transfer sources is generated from an eight-band grayscale image x consisting of eight transfer-source redundant information 183 and a one-band grayscale image y consisting of redundant information 131.

$$\Lambda^*_{ijk}(x,y) = \Gamma_{ijk}(x, \Delta(\Phi(y))) + \Gamma^*_{ijk}(\Phi(y), \Delta(y))) \quad (45)$$

$$\Lambda'^*_{ijk}(x,y) = \Gamma_{ijk}(x, \Delta'(\Phi(y))) + \Gamma^*_{ijk}(\Phi(y), \Delta'(\Phi(y)))) \quad (46)$$

$$\Lambda''^*_{ijk}(x,y) = \Gamma_{ijk}(x, \Delta''(\Phi(y))) + \Gamma^*_{ijk}(\Phi(y), \Delta''(\Phi(y)))) \quad (47)$$

Note that $\Gamma^*_{ijk}(y, \Delta(\Phi(y)))$ can be also used instead of $\Gamma^*_{ijk}(\Phi(y), \Delta(\Phi(y))))$, according to situation.

Suppose that there are two images, x and y, where the image x is a binary image and the image y is a transfer-value image. Since a transfer position of each band-pixel value of the image x can be derived, some band-pixel values whose transfer position is redundant can also be found. EQ.48 generates a band-pixel value of a transferability image appearing that a transfer position of each band-pixel value of the image x is not redundant, and that the band-pixel value can also be transferred to another position. Note that the number of bands of the transferability image is equal to one.

$$H_{ij1}(x,j) = \begin{cases} 1 & \text{if } x_{ij1} = 0 \text{ and } \#^{-1}y_{lm1} = p(i-l, j-m, 0) \\ & \text{for only one } p(l,m,1) \in P_{ij1}(q), \\ 0 & \text{otherwise.} \end{cases} \quad (48)$$

Suppose that there are three images, x, y and w, the image y is a transferability image, and the image w is a transfer-value image. EQ.49 can transfer a band-pixel value of the image x.

$$T_{ijk}(x,y,w) = \begin{cases} x_{lmk} & \text{if } y_{ij1} = 1 \text{ and } \#^{-1}w_{lm1} = p(i-l, j-m, 0) \\ & \text{for } {}^3p(l,m,1) \in P_{ij1}(q), \\ 0 & \text{if } y_{lm1} = 1 \text{ and } \#^{-1}w_{ij1} = p(l-i, m-j, 0) \\ & \text{for } {}^3p(l,m,1) \in P_{ij1}(q), \\ x_{ijk} & \text{otherwise.} \end{cases} \quad (49)$$

By using EQ.32, EQ.48 and EQ.49, the band-pixel value of an image which can be derived by transferring a band-pixel value of the image x to the direction against the center of gravity derived from the binary image y can be simply described by EQ.50.

$$U_{ijk}(x,y) = T_{ijk}(x, H(y, R(y)), R(y)) \quad (50)$$

Algorithm of all array operation units 100 in a data processing device 110, which can realize the image memorization means 12, the color-information generation means 41, the edge-information generation means 14, the edge-information formation means 15, the position/size detection means 17, the position/size/inclination detection means 44, the area normalization means 27, the mask means 40 and the image keeping means 39 shown in FIG. 10, can be described by EQ.2 to EQ.50. It is explained here about the image memorization means 12, the color-information generation means 41, the edge-information generation means 14, the edge-information formation means 15, the position/size detection means 17, the position/size/inclination detection means 44, the area normalization means 27, the mask means 40, and the image keeping means 39, respectively, by representing the algorithm of any array operation unit 100 in the data processing device 110.

At step 1201, $\text{AOU}_{ij}$ is arranged at the column i and the row j of the matrix. This is desired to decide neighbors of $\text{AOU}_{ij}$ even though the $\text{AOU}_{ij}$ is either logical or physical.

At step 1202, neighbors of $\text{AOU}_{ij}$ are set and its parameters are initialized.

At step 1203, $\text{AOU}_{ij}$ judges whether there is a digital image 111 inputted one by one or not. If there is not the digital image 111 any more (step 1203: YES), this algorithm ends. If there is the digital image 111 (step 1203: NO), this algorithm goes to step 1204. Note that this algorithm can be an infinite loop when array operation units 100 are realized for a specific size of the image.

At step 1204, $\text{AOU}_{ij}$ waits while the input digital image 111 is under preparation.

At step 1205, $\text{AOU}_{ij}$ inputs the whole pixel on the column i and the row j of the digital image 111. Therefore, $\text{AOU}_{ij}$ needs a memory 102 memorizing at least the number of bands of image data.

At step 1206, $\text{AOU}_{ij}$ memorizes the pixel on the column i and the row j of the digital image 111, as outputting the pixel during waiting the input data.

At step 1207, $\text{AOU}_{ij}$ outputs all band-pixel values of the digital image 111. This algorithm then returns to step 1203.

The image memorization means 12 can memorize the digital image 111, by using the data processing device 110 consisting of array operation units 100.

Figure 14:
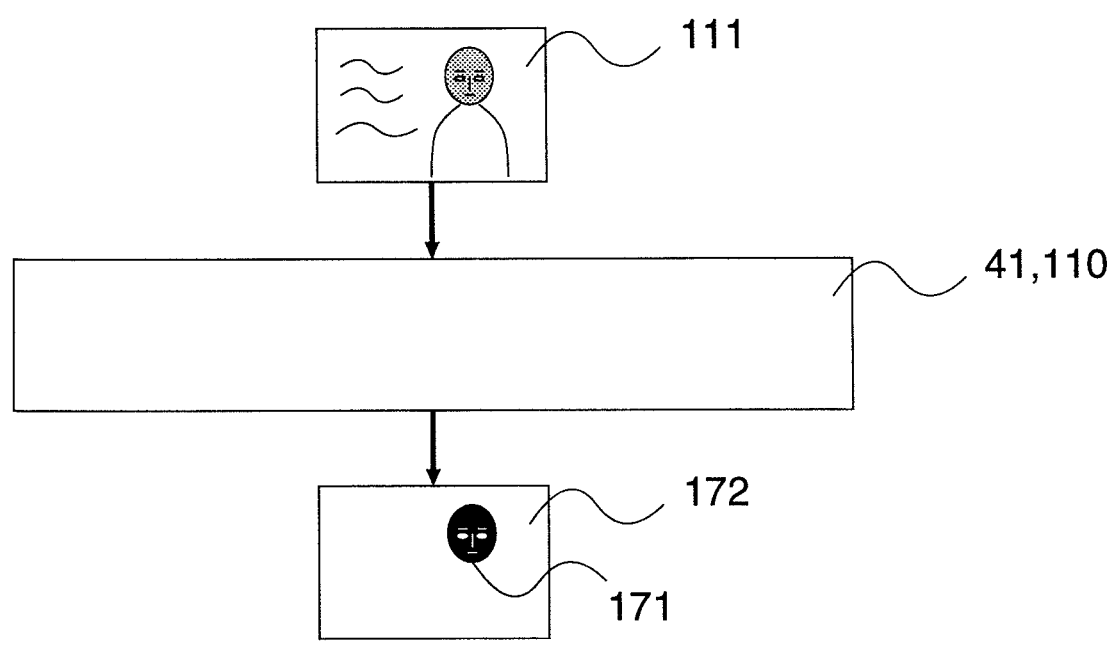
FIG. 14 is an explanation view for generating color information for some specific colors in a digital image.
Figure 15:
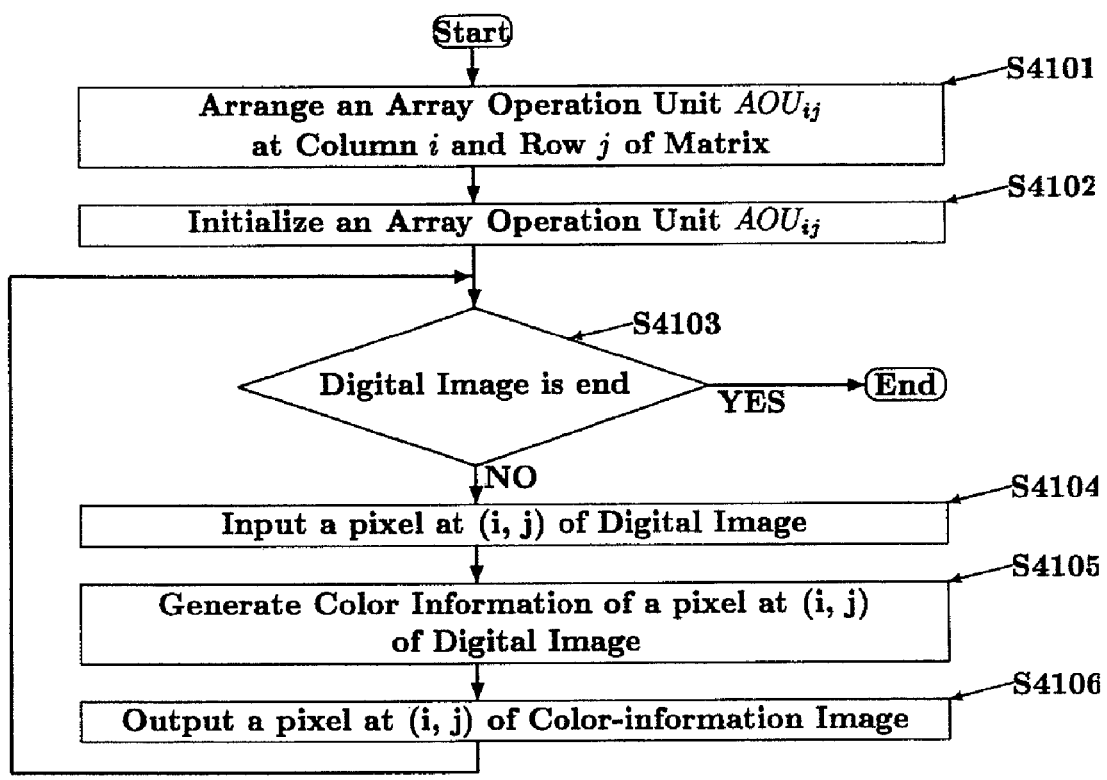
FIG. 15 is a flow chart appearing an algorithm of a color-information generation means in this enforcement form.

As shown in FIG. 14, in order for the color-information generation means 41 realized by a data processing device 110 to generate color information 171 from each pixel of a digital image 111, array operation units 100 arranged in the shape of a lattice work synchronously in parallel. Let an array operation unit 100 at a column i and a row j of a matrix be $AOU_{ij}$. Algorithm of $AOU_{ij}$ is shown in FIG. 15.

At step 4101, $AOU_{ij}$ is arranged at the column i and the row j of the matrix. This is desired to decide neighbors of $AOU_{ij}$ even though the $AOU_{ij}$ is either logical or physical.

At step 4102, neighbors of $AOU_{ij}$ are set and its parameters are initialized.

At step 4103, $AOU_{ij}$ judges whether there is a digital image 111 inputted one by one or not. If there is not the digital image 111 any more (step 4103: YES), this algorithm ends. If there is the digital image 111 (step 4103: NO), this algorithm goes to step 4104. Note that this algorithm can be an infinite loop when array operation units 100 are realized for a specific size of the image.

At step 4104, $AOU_{ij}$ inputs the whole pixel on the column i and the row j of the digital image 111. Therefore, $AOU_{ij}$ needs a memory 102 memorizing at least the number of bands of image data.

At step 4105, $AOU_{ij}$ generates color information 171 by extracting specific colors from the pixel on the column i and the row j of the digital image 111. The generated color information 171 is regarded as a band-pixel value of a color-information image 172.

At step 4106, $AOU_{ij}$ outputs the band-pixel value of the color-information image 172. This algorithm then returns to step 4103.

The color-information generation means 41 can generate the color-information image 172 from the digital image 111, by using the data processing device 110 consisting of array operation units 100.

Figure 16:
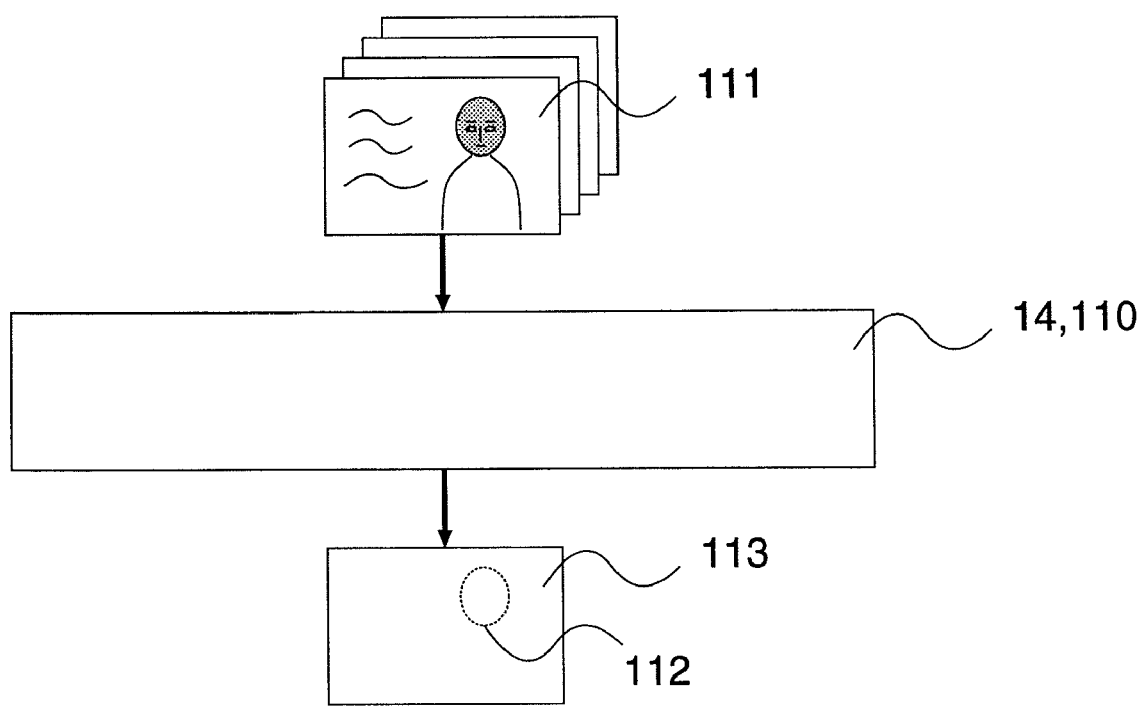
FIG. 16 is an explanation view for generating rough edge information, using a digital image.
Figure 17:
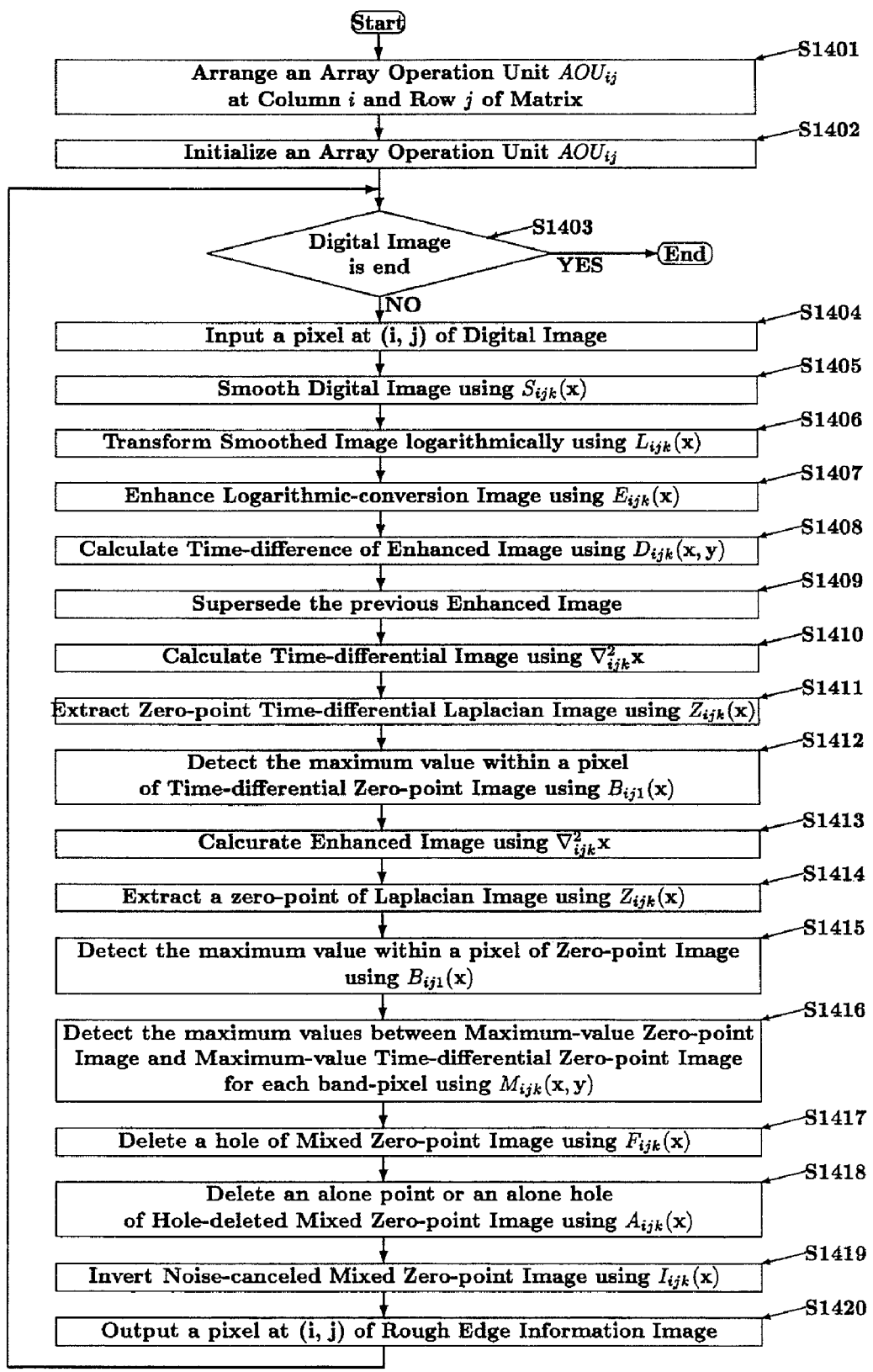
FIG. 17 is a flow chart appearing an algorithm of an edge-information generation means in this enforcement form.

As shown in FIG. 16, in order for the edge-information generation means 14 realized by a data processing device 110 to generate a rough edge-information image 113 from a digital image 111, array operation units 100 arranged in the shape of a lattice work synchronously in parallel. Let an array operation unit 100 at a column i and a row j of a matrix be $AOU_{ij}$. Algorithm of $AOU_{ij}$ is shown in FIG. 17.

At step 1401, $AOU_{ij}$ is arranged at the column i and the row j of the matrix. This is desired to decide neighbors of $AOU_{ij}$ even though the $AOU_{ij}$ is either logical or physical.

At step 1402, neighbors of $AOU_{ij}$ are set and its parameters are initialized. In setting the neighbors, the number of neighbors used in the above functions can be defined as either four or eight individually, or all of them can be defined as either four or eight uniformly. In order to make rough edge information 112 generated by the edge-information generation means 14 of the present invention more exact, the number of neighbors q has to be set to eight for all functions. The edge-information generation means 14, however, can cope with limitation of computational time to generate the rough edge information 112 and the number of bands of the digital image 111, by varying the number of neighbors suitably.

At step 1403, $AOU_{ij}$ judges whether there is a digital image 111 inputted one by one or not. If there is not the digital images 111 any more (step 1403: YES), this algorithm ends. If there is the digital image 111 (step 1403: NO), this algorithm goes to step 1404. Note that this algorithm can be an infinite loop when array operation units 100 are realized for a specific size of the image.

At step 1404, $AOU_{ij}$ inputs the whole pixel on the column i and the row j of the digital image 111. This is done for $AOU_{ij}$ to process the pixel on the column i and the row j of the digital image 111. Therefore, $AOU_{ij}$ needs a memory 102 memorizing at least the number of bands of image data.

At step 1405, for each band-pixel value of the inputted digital image 111, $AOU_{ij}$ carries out smoothing according to the function $S_{ijk}(x)$, by communicating with neighbor array operation units 100. The smoothed band-pixel value is regarded as a band-pixel value of a smooth digital image. The function $S_{ijk}(x)$ may be calculated some times if desired. It is enough for a general color image to repeat the function two times.

At step 1406, for each band-pixel value of the smooth digital image, $AOU_{ij}$ carries out logarithm conversion according to the function $L_{ijk}(x)$. The band-pixel value converted to logarithm is regarded as a band-pixel value of a logarithmic-conversion image.

At step 1407, for each band-pixel value of the logarithmic-conversion image, $AOU_{ij}$ carries out enhancement according to the function $E_{ijk}(x)$, by communicating with neighbor array operation units 100. The enhanced band-pixel value is regarded as a band-pixel value of an enhanced image. Note that this step can be omitted if the digital image 111 has much noise.

At step 1408, from each band-pixel value of the logarithmic-conversion image, $AOU_{ij}$ subtracts each band-pixel value of the previous enhanced image, respectively, according to the function $D_{ijk}(x,y)$. The band-pixel value representing the difference is regarded as a band-pixel value of a time-differential image.

At step 1409, each band-pixel value of the previous enhanced image is superseded by the corresponding band-pixel value of the enhanced image.

At step 1410, for each band-pixel value of the time-differential image, $AOU_{ij}$ carries out calculation of Laplacian according to the operator $\nabla_{ijk}^2 x$, by communicating with neighbor array operation units 100. The band-pixel value calculated by the Laplacian operator is regarded as a band-pixel value of a time-differential Laplacian image. At step 1411, for each band-pixel value of the time-differential Laplacian image, $AOU_{ij}$ extracts zero-point according to the function $Z_{ijk}(x)$, by communicating with neighbor array operation units 100. The band-pixel value representing the extracted zero-point is regarded as a band-pixel value of a time-differential zero-point image.

At step 1412, for each band-pixel value of the time-differential Laplacian image, $AOU_{ij}$ detects the maximum value among some band-pixel values of the time-differential Laplacian image, according to the function $B_{iji}(x)$. The band-pixel value representing the detected maximum value is regarded as a band-pixel value of a maximum-value time-differential zero-point image. Note that the number of bands, for convenience' sake, is one.

At step 1413, for each band-pixel value of the enhanced image, $AOU_{ij}$ carries out calculation of Laplacian according to the operator $\nabla_{ijk}^2 x$, by communicating with neighbor array operation units 100. The band-pixel value calculated by the Laplacian operator is regarded as a band-pixel value of a Laplacian image.

At step 1414, for each band-pixel value of the Laplacian image, $AOU_{ij}$ extracts zero-point according to the function $Z_{ijk}(x)$, by communicating with neighbor array operation units 100. The band-pixel value representing the extracted zero-point is regarded as a band-pixel value of a zero-point image.

At step 1415, for each band-pixel value of the Laplacian image, $AOU_{ij}$ detects the maximum value among some band-pixel values of the Laplacian image, according to the function $B_{iji}(x)$. The band-pixel value representing the detected maximum value is regarded as a band-pixel value of a maximum-value zero-point image. Note that the number of bands, for convenience' sake, is one.

At step 1416, for each band-pixel value of the Laplacian image and each band-pixel value of the time-differential Laplacian image, $AOU_{ij}$ detects the maximum value between two band-pixel values at the same position of the images according to the function $M_{ijk}$ (x,y). The band-pixel value representing the detected maximum value is regarded as a band-pixel value of a mixed zero-point image. Note that the number of bands, for convenience' sake, is one.

At step 1417, for a band-pixel value of the mixed zero-point image, $AOU_{ij}$ deletes a hole according to the function $F_{ijk}(x)$, by communicating with neighbor array operation units 100. The band-pixel value deleted the hole is regarded as a band-pixel value of a hole-deleted mixed zero-point image. Note that the number of bands, for convenience' sake, is one. The function $F_{ijk}(x)$ may be calculated some times if desired. It is enough for a general color image to calculate the function one time.

At step 1418, for a band-pixel value of the hole-deleted mixed zero-point image, $AOU_{ij}$ deletes an alone point and an alone hole according to the function $A_{ijk}(x)$, by communicating with neighbor array operation units 100. The band-pixel value deleted the point and the hole is regarded as a band-pixel value of a noise-canceled mixed zero-point image. Note that the number of bands, for convenience' sake, is one.

At step 1419, for a band-pixel value of the noise-canceled mixed zero-point image, $AOU_{ij}$ inverts zero and one according to the function $I_{ijk}(x)$. The inverted band-pixel value is regarded as a band-pixel value of a rough edge-information image 113.

At step 1420, $AOU_{ij}$ outputs a band-pixel value of the rough edge-information image 113. This algorithm then returns to step 1403.

The edge-information generation means 14 can generate the rough edge-information image 113 from the digital image 111, by using the data processing device 110 consisting of array operation units 100.

Figure 18:
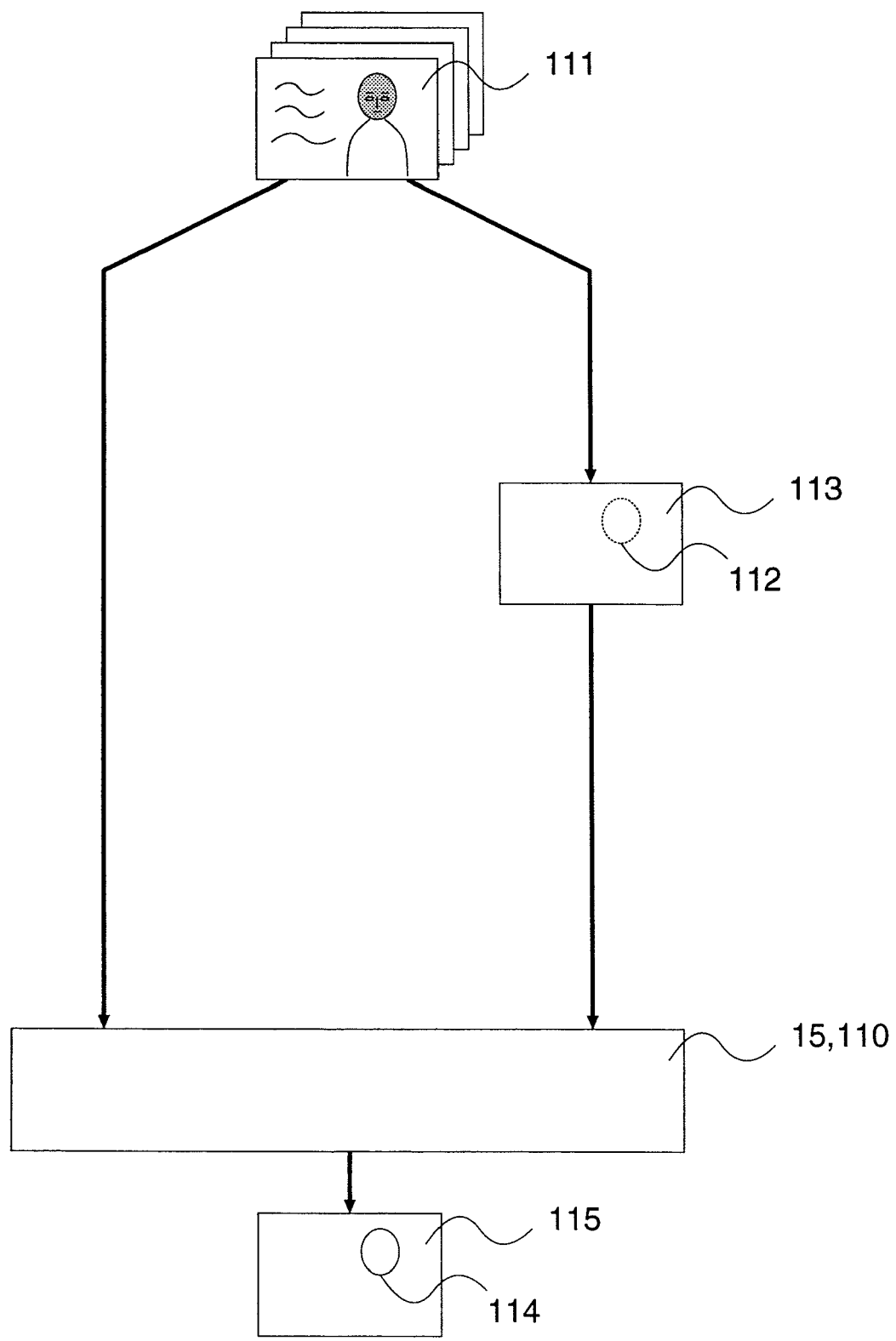
FIG. 18 is an explanation view for forming rough edge information into formed edge information, using a digital image.
Figure 19:
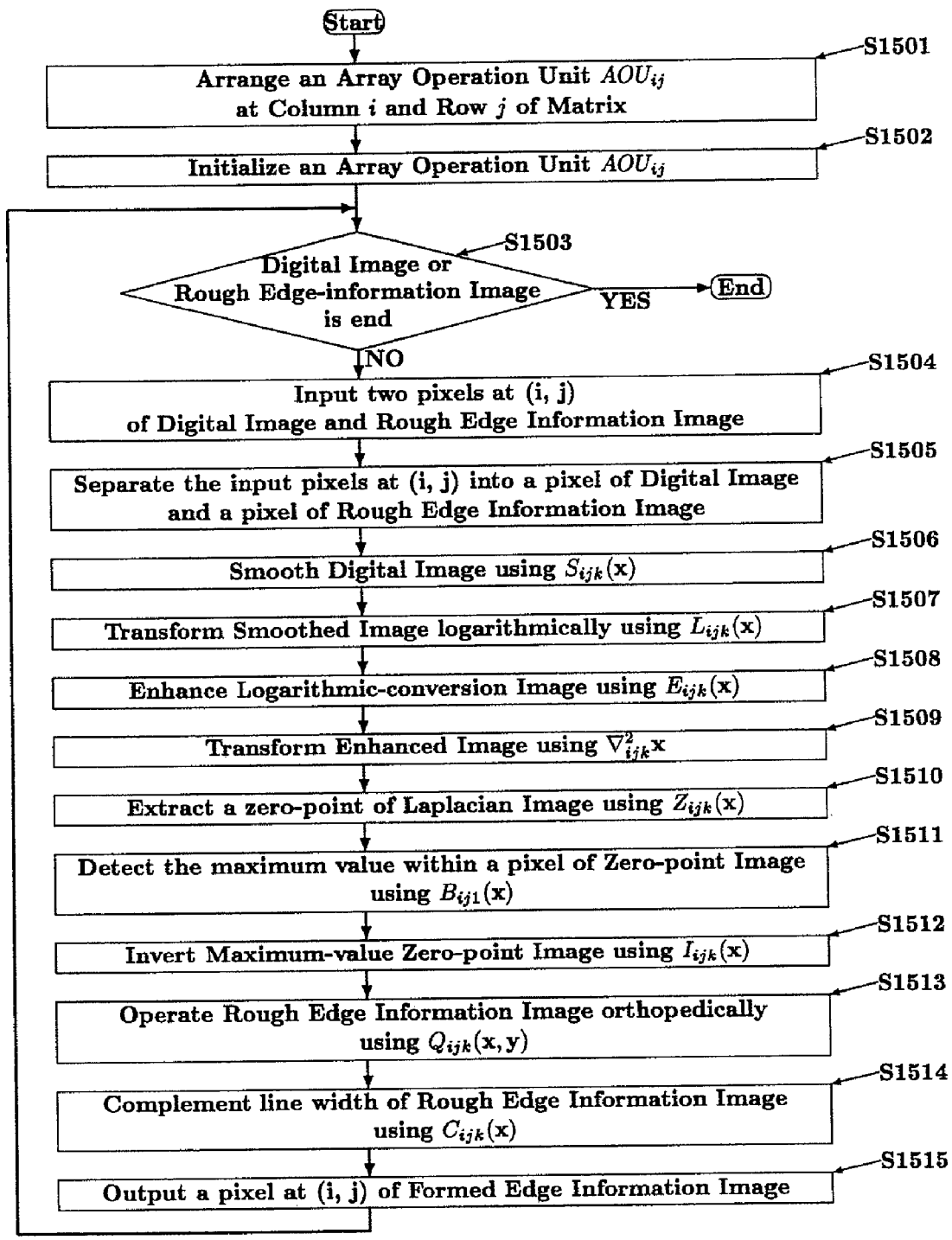
FIG. 19 is a flow chart appearing an algorithm of an edge-information formation means in this enforcement form.

As shown in FIG. 18, in order for the edge-information formation means 15 realized by a data processing device 110 to generate a formed edge-information image 115 consisting of formed edge information 114 from a rough edge-information image 113 consisting of rough edge information 112 and a digital image 111, array operation units 100 arranged in the shape of a lattice work synchronously in parallel. Let an array operation unit 100 at a column i and a row j of a matrix be $AOU_{ij}$. Algorithm of $AOU_{ij}$ is shown in FIG. 19.

At step 1501, $AOU_{ij}$ is arranged at the column i and the row j of the matrix. This is desired to decide neighbors of $AOU_{ij}$ even though the $AOU_{ij}$ is either logical or physical.

At step 1502, neighbors of $AOU_{ij}$ are set and its parameters are initialized. In setting the neighbors, the number of neighbors used in the above functions can be defined as either four or eight individually, or all of them can be defined as either four or eight uniformly. In order to make formed edge information 114 formed by the edge-information formation means 15 of the present invention more exact, the number of neighbors q has to be set to eight for all functions. The edge-information formation means 15, however, can cope with limitation of computational time to form the rough edge information 112 and the number of bands of the digital image 111, by varying the number of neighbors suitably.

At step 1503, $AOU_{ij}$ judges whether there is both a digital image 111 and a rough edge-information image 113 inputted one by one or not. If there is not the digital images 111 or the rough edge-information image 113 any more (step 1503: YES), this algorithm ends. If there is either the digital images 111 or the rough edge-information image 113 (step 1503: NO), this algorithm goes to step 1504. Note that this algorithm can be an infinite loop when array operation units 100 are realized for a specific size of the image.

At step 1504, $AOU_{ij}$ inputs the whole pixel on the column i and the row j of the digital image 111 and the whole pixel on the column i and the row j of the rough edge-information image 113. This is done for $AOU_{ij}$ to process collectively the pixel on the column i and the row j of the digital image 111 and the pixel on the column i and the row j of the rough edge-information image 113. Therefore, $AOU_{ij}$ needs a memory 102 memorizing at least the number of bands of image data.

At step 1505, $AOU_{ij}$ separates the pixel on the column i and the row j of the digital image 111 and the pixel on the column i and the row j of the rough edge-information image 113. This is done for $AOU_{ij}$ to process the pixel on the column i and the row j of the digital image 111 and the pixel on the column i and the row j of the rough edge-information image 113 as two pixel of independent images, respectively. If the pixel on the column i and the row j of the digital image 111 and the pixel on the column i and the row j of the rough edge-information image 113 are separated beforehand, followed by being inputted, $AOU_{ij}$ carries out nothing.

At step 1506, for each band-pixel value of the inputted digital image 111, $AOU_{ij}$ carries out smoothing according to the function $S_{ijk}(x)$, by communicating with neighbor array operation units 100. The smoothed band-pixel value is regarded as a band-pixel value of a smooth digital image. The function $S_{ijk}(x)$ may be calculated some times if desired. It is enough for a general color image to repeat the function two times.

At step 1507, for each band-pixel value of the smooth digital image, $AOU_{ij}$ carries out logarithm conversion according to the function $L_{ijk}(x)$. The band-pixel value converted to logarithm is regarded as a band-pixel value of a logarithmic-conversion image.

At step 1508, for each band-pixel value of the logarithmic-conversion image, $AOU_{ij}$ carries out enhancement according to the function $E_{ijk}(X)$, by communicating with neighbor array operation units 100. The enhanced band-pixel value is regarded as a band-pixel value of an enhanced image. Note that this step can be omitted if the digital image 111 has much noise.

At step 1509, for each band-pixel value of the enhanced image, $AOU_{ij}$ carries out calculation of Laplacian according to the operator $\nabla_{ijk}^2 x$, by communicating with neighbor array operation units 100. The band-pixel value calculated by the Laplacian operator is regarded as a band-pixel value of a Laplacian image.

At step 1510, for each band-pixel value of the Laplacian image, $AOU_{ij}$ extracts zero-point according to the function $Z_{ijk}(x)$, by communicating with neighbor array operation units 100. The band-pixel value representing the extracted zero-point is regarded as a band-pixel value of a zero-point image.

At step 1511, for each band-pixel value of the zero-point image, $AOU_{ij}$ detects the maximum value among some band-pixel values of the zero-point image, according to the function $B_{ijk}(x)$. The band-pixel value representing the detected maximum value is regarded as a band-pixel value of a maximum-value zero-point image. Note that the number of bands, for convenience' sake, is one.

At step 1512, for a band-pixel value of the maximum-value zero-point image, $AOU_{ij}$ inverts zero and one according to the function $I_{ijk}(x)$. The inverted band-pixel value is regarded as a band-pixel value of a based edge-information image.

At step 1513, the band-pixel value of the input rough edge-information image 113 first is regarded as a band-pixel value of an orthopedical rough edge-information image. For a band-pixel value of the orthopedical rough edge-information image, $AOU_{ij}$ operates orthopedically according to the function $Q_{ijk}(x,y)$. The band-pixel value operated orthopedically is regarded as a band-pixel value of an orthopedical rough edge-information image again. The function $Q_{ijk}(x,y)$ is repeated by nature until the band-pixel value of the orthopedical rough edge-information image stops changing. However, it is better for $AOU_{ij}$ to close this orthopedical processing in some specific repeat times, corresponding to limitation of computational time, quality of the input rough edge-information image 113, quality desired for the formed edge-information image 115.

At step 1514, for a band-pixel value of the orthopedical rough edge-information image, $AOU_{ij}$ complements line width according to the function $C_{ijk}(X)$, by communicating with neighbor array operation units 100. The complemented band-pixel value is regarded as a band-pixel value of a formed edge-information image 115.

At step 1515, $AOU_{ij}$ outputs a band-pixel value of the formed edge-information image 115. This algorithm then returns to step 1503.

The edge-information formation means 15 can generate the formed edge-information image 115 from the rough edge-information image 113, by using the data processing device 110 consisting of array operation units 100.

Figure 20:
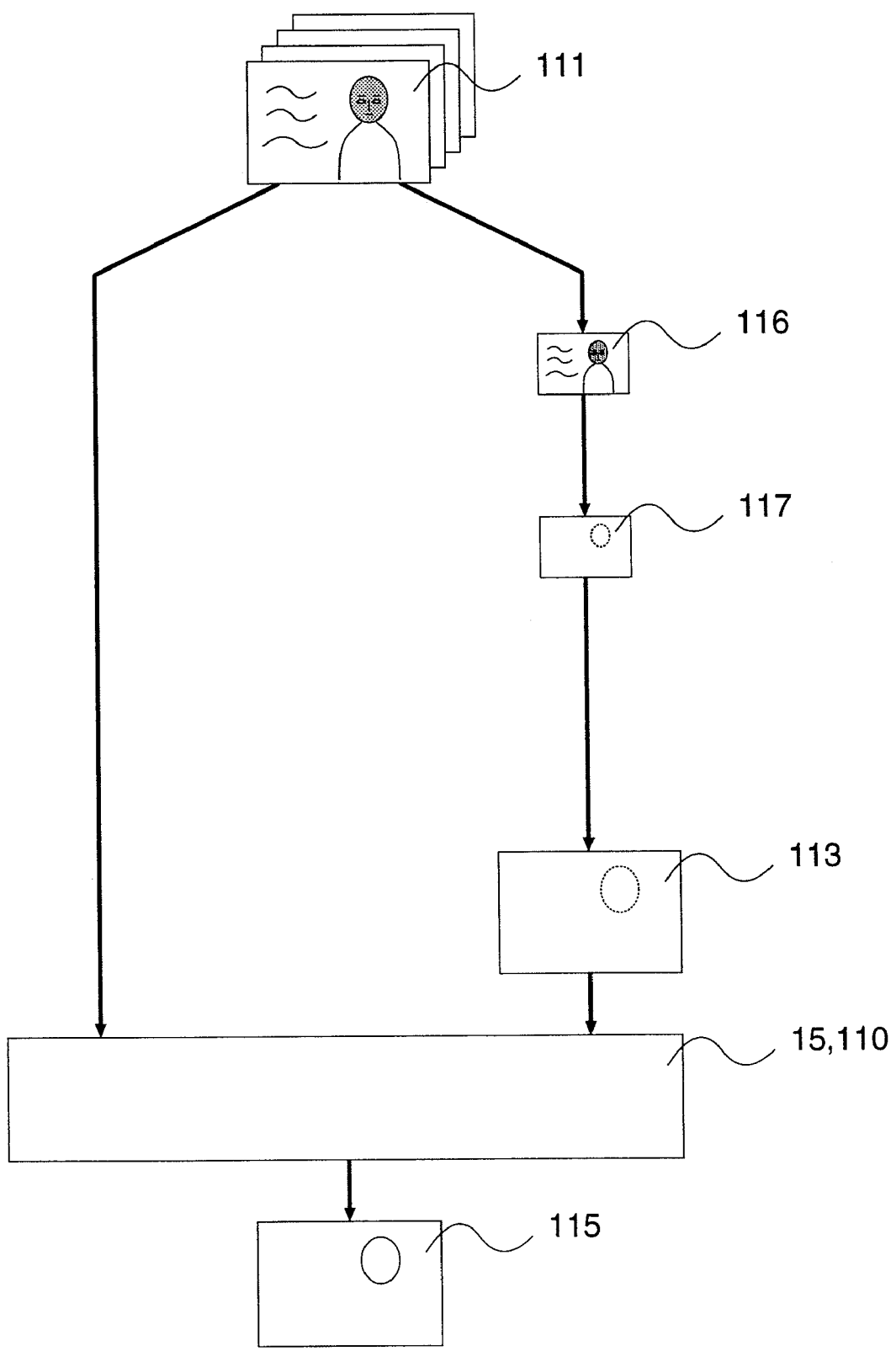
FIG. 20 is an explanation view for forming low-resolution rough edge information generated from a low-resolution digital image into formed edge information.

We can regard here that the formation from the rough edge-information image 113 to the formed edge-information image 115 is to inference edge information to be generated from a high-resolution digital image 111 taken in a scene, from edge information generated from a low-resolution digital image 111 taken in the same scene. As shown in FIG. 20, for a natural number n, the rough edge-information image 113 can be generated by expanding a low-resolution rough edge-information image 117 n times, when the edge-information generation means 14 generates the low-resolution rough edge-information image 117 from the low-resolution digital image 116 whose resolution is equivalent to 1/n resolution of the digital image 111. In order to decrease the resolution of the digital image 111 to 1/n, we only have to extract one of n pixels successive horizontally or vertically in the digital image 111. On the other hand, in order to expand the low-resolution rough edge-information image 117 n times, we only have to fill in successive pixels of the low-resolution rough edge-information image 117 with n–1 pixels whose band-pixel value is equivalent to zero. Suppose here that a rough edge-information image 113 is made by expanding a low-resolution rough edge-information image 117, and another rough edge-information image 113 is generated from the digital image 111. If n is not too large, a formed edge-information image 115, to which a data processing device 110 realizing the edge-information formation means 15 forms the former rough edge-information image 113, becomes almost same as a formed edge-information image 115, to which a data processing device 110 realizing the edge-information formation means 15 forms the latter rough edge-information image 113. This reason is because the edge-information formation means 15 only uses the rough edge-information image 113 to refer which of edge information is used, where the edge information is generated by the edge-information formation means 15 itself from digital image 111. Therefore, in a case that the edge-information formation means 15 inputs a rough edge-information image 113 made by expanding a low-resolution rough edge-information image 117, a data processing device 110 realizing the edge-information generation means 14, which generates the low-resolution rough edge-information image 117 from a low-resolution digital image 116, can reduce volume of hardware.

Figure 21:
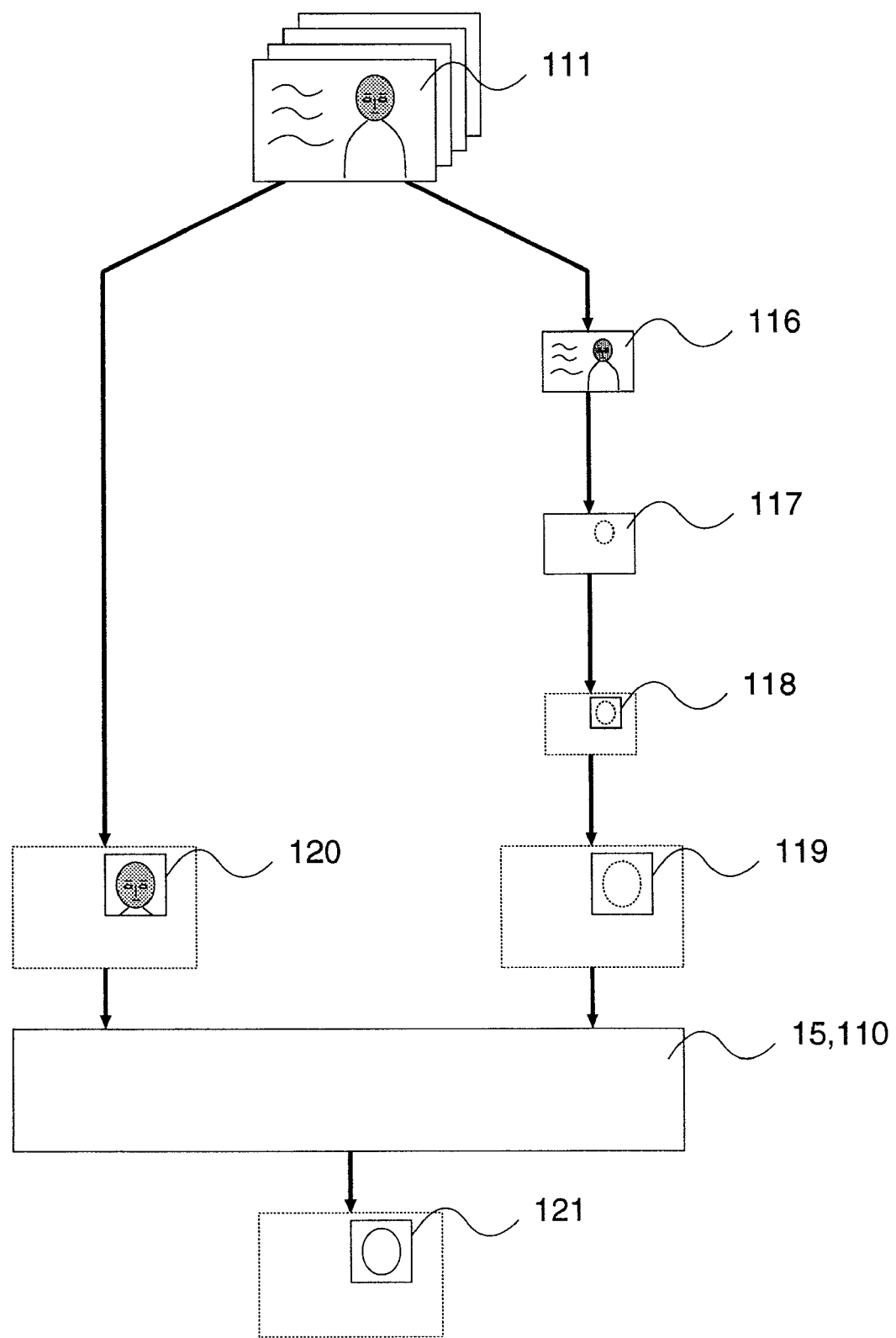
FIG. 21 is an explanation view for forming formed edge information after cutting an area of low-resolution rough edge information generated from a low-resolution digital image.

When this method is developed, furthermore, as shown in FIG. 21, the data processing device 110 can cut a low-resolution cut rough edge-information image 118 around the rough edge information 112 out of the low-resolution rough edge-information image 117 generated from low-resolution digital image 116 which is a low resolution of the digital image 111. Suppose that the data processing device 110 realizing the edge-information formation means 14 inputs a cut rough edge-information image 119 made by expanding this low-resolution cut rough edge-information image 118 and a cut digital image 120 which is the same cut domain of the digital image 111 as the cut rough edge-information image 119. The data processing device 110 can generate a cut formed edge-information image 121. In this case, the data processing device 110 realizing the edge-information formation means 15 can reduce volume of hardware. Note that the visual device 2 can be regarded as a device that changes direction and magnification of the moving camera 10, as the cut digital image 120 always comes to be located at the center of the digital image 111.

Figure 22:
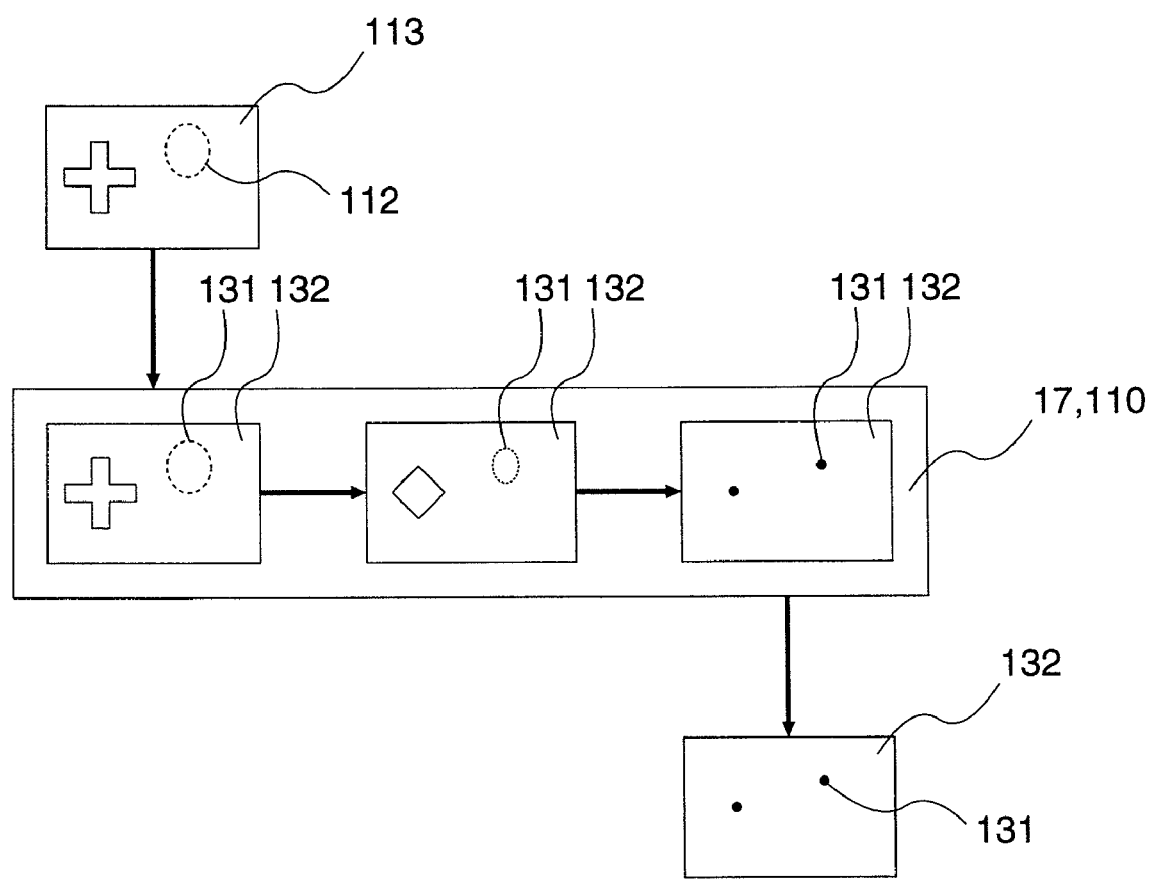
FIG. 22 is an explanation view for detecting position and size of objects in an edge-information image.
Figure 23:
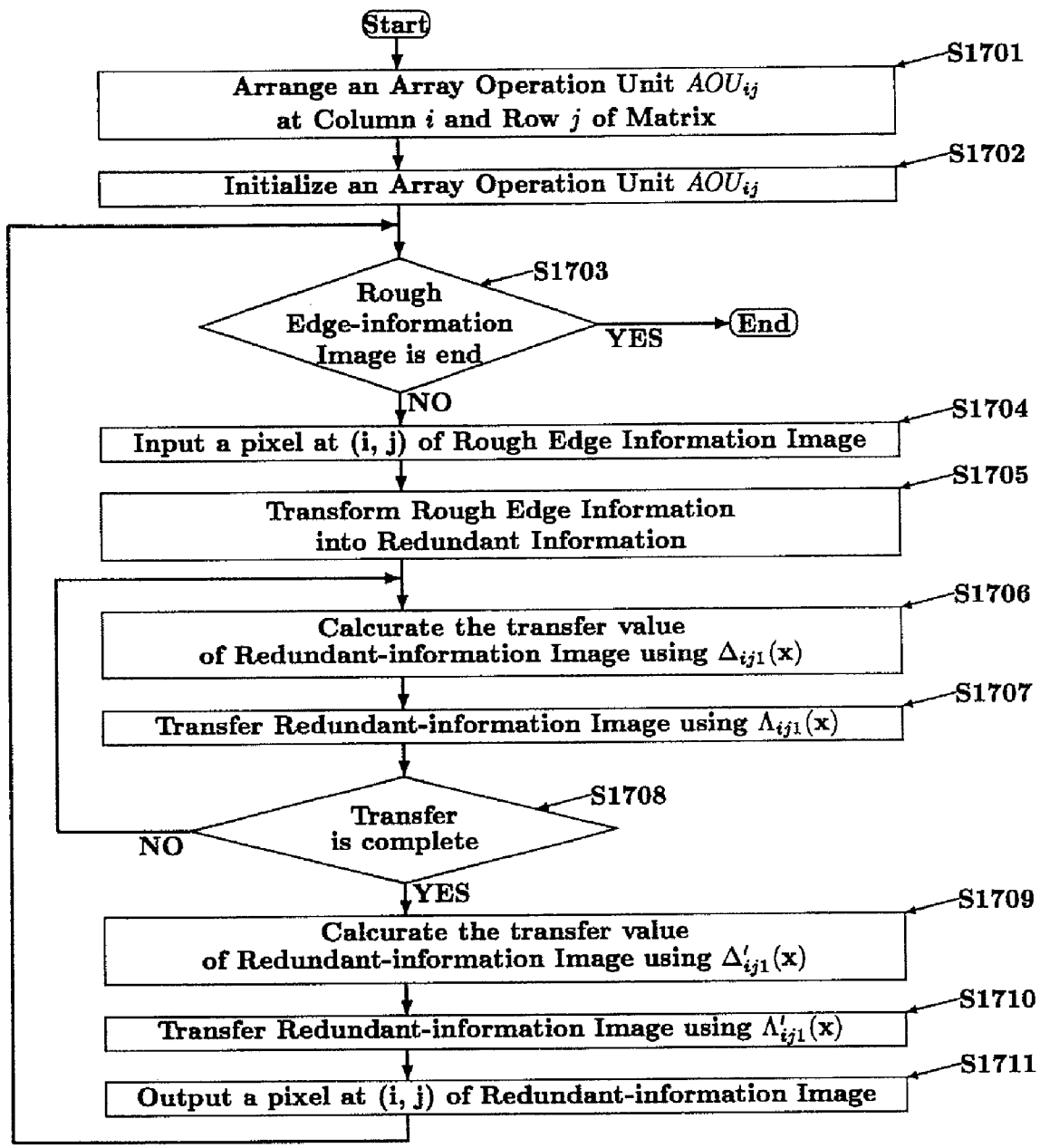
FIG. 23 is a flow chart appearing an algorithm of a position/size detection means in this enforcement form.

As shown in FIG. 22, in order for the position/size detection means 17 realized by a data processing device 110 to generate a redundant-information image 132 consisting of redundant information 131 from a rough edge-information image 113 consisting of rough edge information 112, array operation units 100 arranged in the shape of a lattice work synchronously in parallel. Let an array operation unit 100 at a column i and a row j of a matrix be $AOU_{ij}$. Algorithm of $AOU_{ij}$ is shown in FIG. 23.

At step 1701, $AOU_{ij}$ is arranged at the column i and the row j of the matrix. This is desired to decide neighbors of $AOU_{ij}$ even though the $AOU_{ij}$ is either logical or physical.

At step 1702, neighbors of $AOU_{ij}$ are set and its parameters are initialized. In setting the neighbors, the number of neighbors used in the above functions can be defined as either four or eight individually, or all of them can be defined as either four or eight uniformly. In order to make the redundant-information image 132 generated by the data processing device 110 of the present invention more exact, the number of neighbors q has to be set a large number for all functions. The position/size detection means 17, however, can cope with limitation of computational time to calculate gravity of the rough edge information 112 of an object and the size of the input rough edge-information image 113, by varying the number of neighbors suitably.

At step 1703, $AOU_{ij}$ judges whether there is a rough edge-information image 113 inputted one by one or not. If there is not the rough edge-information image 113 any more (step 1703: YES), this algorithm ends. If there is the rough edge-information image 113 (step 1703: NO), this algorithm goes to step 1704. Note that this algorithm can be an infinite loop when array operation units 100 are realized for a specific size of the image.

At step 1704, $AOU_{ij}$ inputs one band of a pixel on the column i and the row j of the rough edge-information image 113. Therefore, $AOU_{ij}$ needs a memory 102 memorizing at least one band of image data.

At step 1705, $AOU_{ij}$ converts the rough edge information 112 to the rough edge-information image 113. The redundant information 131 becomes a band-pixel value equivalent to one or zero.

At step 1706, for each band-pixel value of the redundant-information image 132, $AOU_{ij}$ calculates a transfer value according to the function $\Delta_{ijl}(x)$, by communicating with neighbor array operation units 100. The band-pixel value representing the transfer value is regarded as a band-pixel value of a transfer-value image. At step 1707, for each band-pixel value of the redundant-information image 132, $AOU_{ij}$ transfers it according to the function $\Lambda_{ijl}(x)$, by communicating with neighbor array operation units 100. The transferred band-pixel value is regarded as a band-pixel value of a new redundant-information image 132.

At step 1708, $AOU_{ij}$ judges whether the transfer times representing the repeat times from step 1706 to step 1707 achieve the directed times or not. If the transfer times do not achieve the directed times (step 1708: NO), this algorithm returns to step 1706. If the transfer times achieve the directed times (step 1708: YES), this algorithm goes to step 1709. Note that the directed times are derived by the size of the rough edge-information image 113, the size of the object represented by the rough edge information 112, and the number of neighbors q. In a case that some parameters are set to specific numbers corresponding to the aim of use, there is no problem even though the directed times are set to more than the necessary times. If the directed times are too much, however, $AOU_{ij}$ takes much time to detect the position and the size of the object.

At step 1709, for each band-pixel value of the redundant-information image 132, $AOU_{ij}$ calculates a transfer value according to the function $\Delta'_{ijl}(x)$, by communicating with neighbor array operation units 100. The band-pixel value representing the transfer value is regarded as a band-pixel value of the transfer-value image.

At step 1710, for each band-pixel value of the redundant-information image 132, $AOU_{ij}$ transfers it according to the function $\Lambda'_{ijl}(x)$, by communicating with neighbor array operation units 100. The transferred band-pixel value is regarded as a band-pixel value of a new redundant-information image 132.

At step 1711, $AOU_{ij}$ outputs a band-pixel value of the redundant-information image 132. This algorithm then returns to step 1703.

Note that each redundant information 131 of the redundant-information image 132 consequently means the size of the object, whose center is a position of the redundant-information image 132, because it means the total number of the rough edge information 112 around the position.

The position/size detection means 17 can generate the redundant-information image 132 from the rough edge-information image 113, by using the data processing device 110 consisting of array operation units 100.

Figure 24:
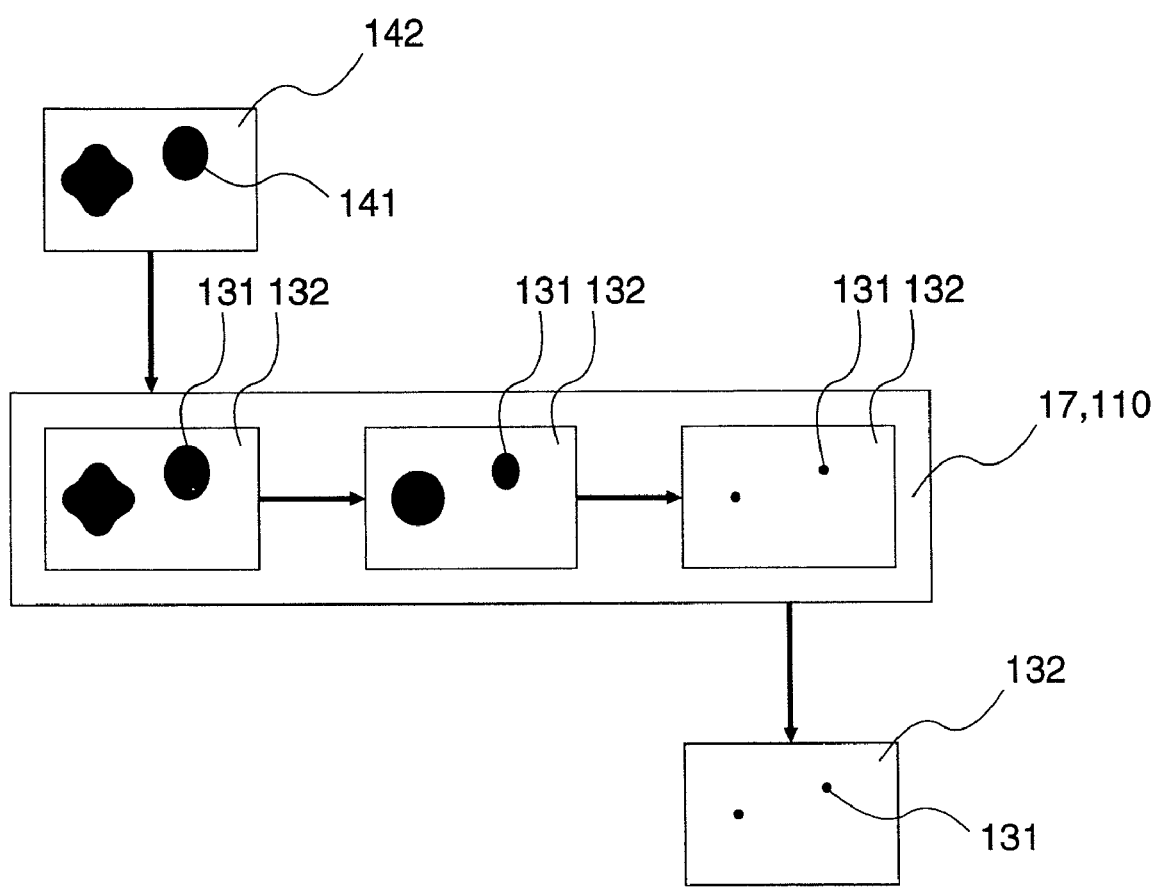
FIG. 24 is an explanation view for detecting position and size of objects in an object-area image.

By the way, suppose that an object-area image 142 representing an object area 141 is used in the algorithm shown in FIG. 23, instead of the rough edge-information image 113 consisting of the rough edge information 112. As shown in FIG. 24, the position/size detection means 17 realized by the data processing device 110 can also generate the redundant-information image 132 representing redundant information 131 from the object-area image 142 representing the object area 141. In the case that the object-area image 142 is used, however, each redundant information 131 of the redundant-information image 132 consequently means the area of the object, whose center is a position of the redundant-information image 132, because it means the total number of pixels of the object area 141 around the position. When the size of the object is derived from the redundant-information image 132, therefore, we must pay attention such as calculating the square root of the redundant information 131. Note that the position/size detection means 17 also carries out this algorithm similarly, in two cases that a formed edge-information image 115 and a color-information image 172 are used, respectively.

Figure 25:
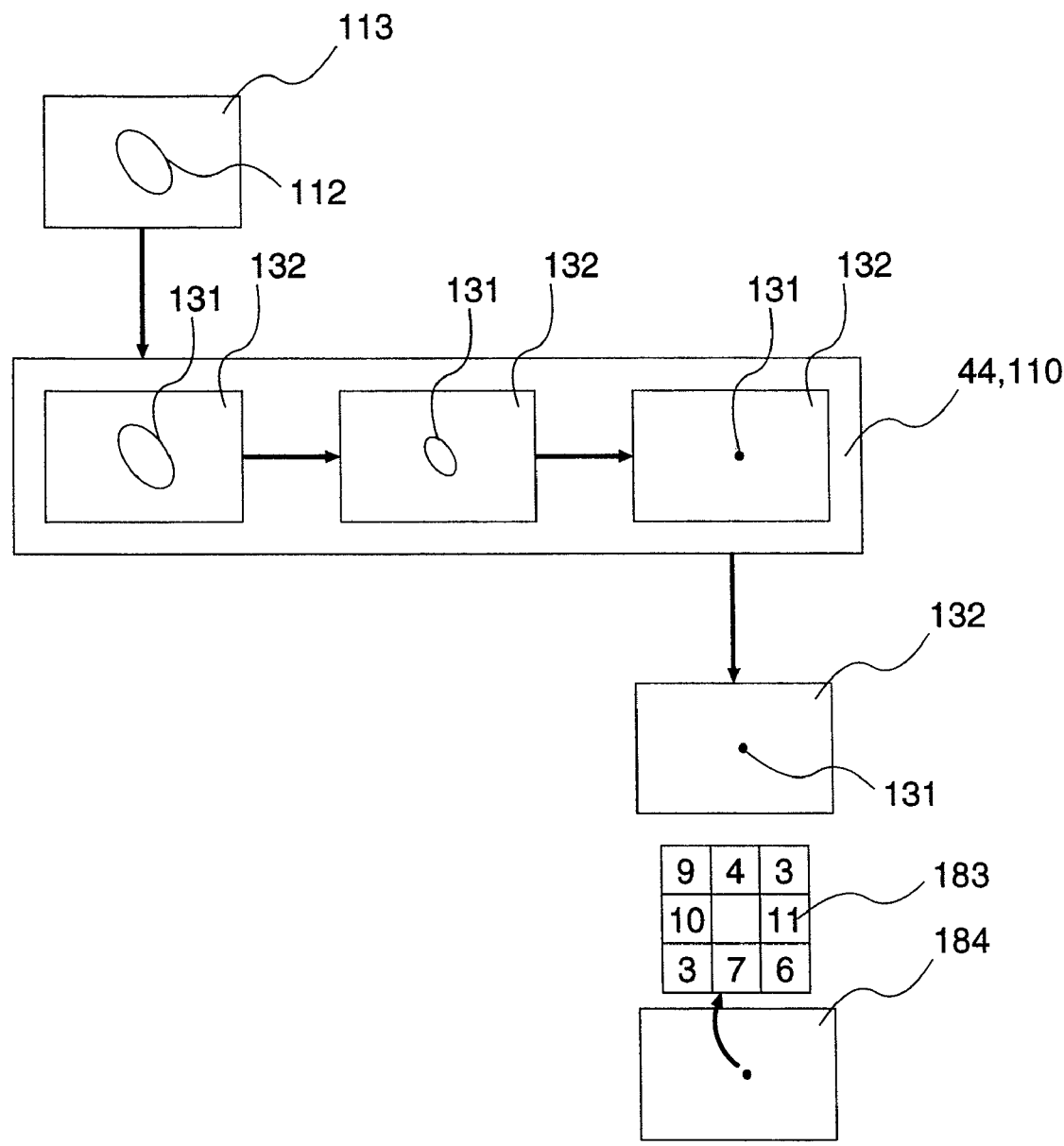
FIG. 25 is an explanation view for detecting position, size and inclination of objects in an object-area image.
Figure 26:
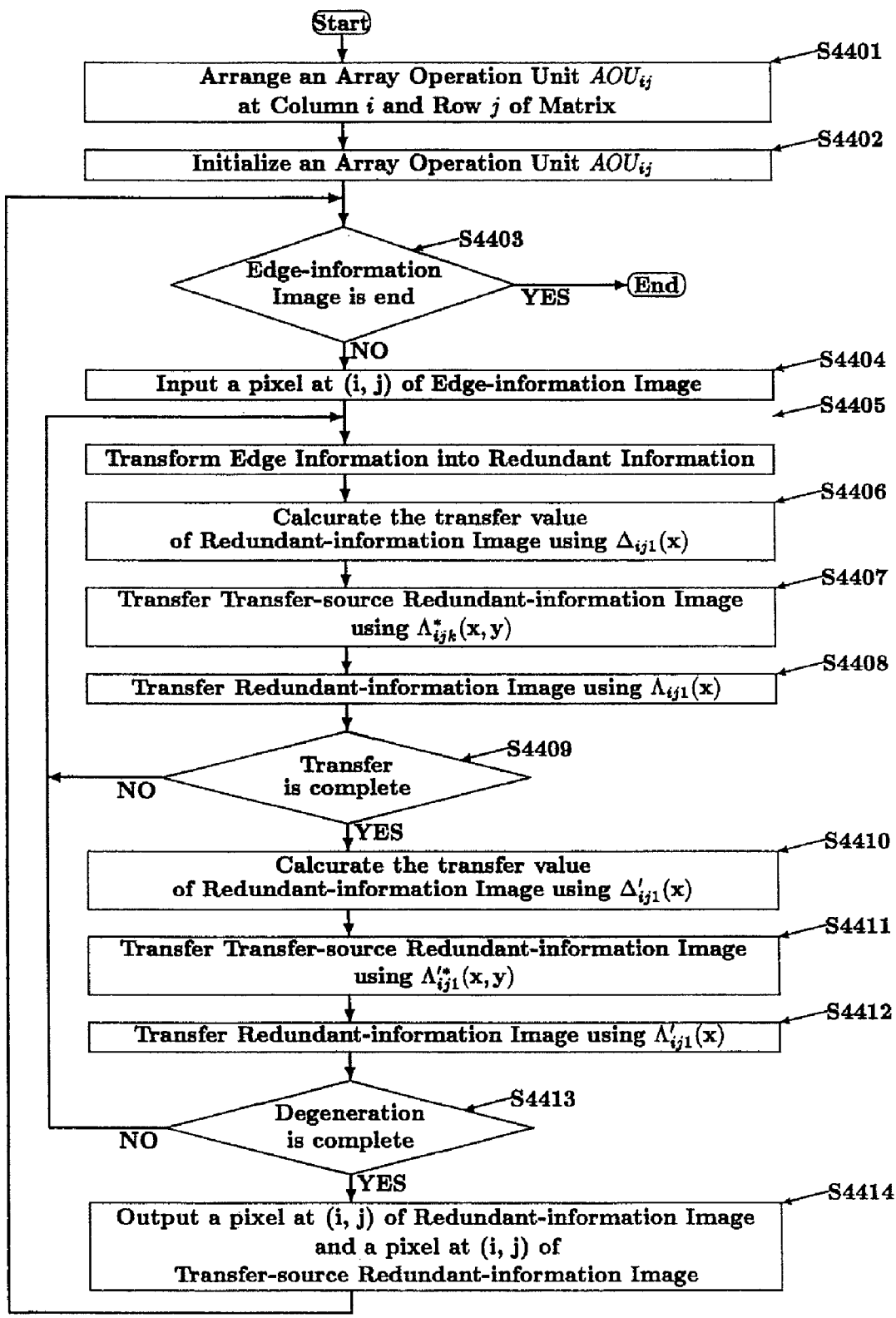
FIG. 26 is a flow chart appearing an algorithm of a position/size/inclination detection means in this enforcement form.

As shown in FIG. 25, in order for the position/size/inclination detection means 44 realized by a data processing device 110 to generate a redundant-information image 132 consisting of redundant information 131 from a rough edge-information image 113 consisting of rough edge information 112, array operation units 100 arranged in the shape of a lattice work synchronously in parallel. Let an array operation unit 100 at a column i and a row j of a matrix be $AOU_{ij}$. Algorithm of $AOU_{ij}$ is shown in FIG. 26.

At step 4401, $AOU_{ij}$ is arranged at the column i and the row j of the matrix. This is desired to decide neighbors of $AOU_{ij}$ even though the $AOU_{ij}$ is either logical or physical.

At step 4402, neighbors of $AOU_{ij}$ are set and its parameters are initialized. In setting the neighbors, the number of neighbors used in the above functions can be defined as either four or eight individually, or all of them can be defined as either four or eight uniformly. In order to make the redundant-information image 132 generated by the data processing device 110 of the present invention more exact, the number of neighbors q has to be set a large number for all functions. The position/size/inclination detection means 44, however, can cope with limitation of computational time to calculate gravity of the rough edge information 112 of an object and the size of the input rough edge-information image 113, by varying the number of neighbors suitably.

At step 4403, $AOU_{ij}$ judges whether there is a rough edge-information image 113 inputted one by one or not. If there is not the rough edge-information image 113 any more (step 4403: YES), this algorithm ends. If there is the rough edge-information image 113 (step 4403: NO), this algorithm goes to step 4404. Note that this algorithm can be an infinite loop when array operation units 100 are realized for a specific size of the image.

At step 4404, $AOU_{ij}$ inputs one band of a pixel on the column i and the row j of the rough edge-information image 113. Therefore, $AOU_{ij}$ needs a memory 102 memorizing at least one band of image data.

At step 4405, $AOU_{ij}$ converts the rough edge information 112 to the rough edge-information image 113. The redundant information 131 becomes a band-pixel value equivalent to one or zero. Eight transfer-source redundant information 183 are also cleared by a band-pixel value equivalent to zero.

At step 4406, for each band-pixel value of the redundant-information image 132, $AOU_{ij}$ calculates a transfer value according to the function $\Delta_{ijl}(x)$, by communicating with neighbor array operation units 100. The band-pixel value representing the transfer value is regarded as a band-pixel value of a transfer-value image.

At step 4407, for each band-pixel value of the transfer-source redundant-information image 184, $AOU_{ij}$ transfers it according to the function $\Lambda^*_{ijk}(x,y)$, by communicating with neighbor array operation units 100. The transferred band-pixel value is regarded as a band-pixel value of a new transfer-source redundant-information image 184.

At step 4408, for each band-pixel value of the redundant-information image 132, $AOU_{ij}$ transfers it according to the function $\Lambda_{ijl}(x)$, by communicating with neighbor array operation units 100. The transferred band-pixel value is regarded as a band-pixel value of a new redundant-information image 132.

At step 4409, $AOU_{ij}$ judges whether the transfer times representing the repeat times from step 4406 to step 4408 achieve the directed times or not. If the transfer times do not achieve the directed times (step 4409: NO), this algorithm returns to step 4406. If the transfer times achieve the directed times (step 4409: YES), this algorithm goes to step 4410. Note that the directed times are derived by the size of the rough edge-information image 113, the size of the object represented by the rough edge information 112, and the number of neighbors q. In a case that some parameters are set to specific numbers corresponding to the aim of use, there is no problem even though the directed times are set to more than the necessary times. If the directed times are too much, however, $AOU_{ij}$ takes much time to detect the position and the size of the object.

At step 4410, for each band-pixel value of the redundant-information image 132, $AOU_{ij}$ calculates a transfer value according to the function $\Lambda'_{ijl}(x)$, by communicating with neighbor array operation units 100. The band-pixel value representing the transfer value is regarded as a band-pixel value of the transfer-value image.

At step 4411, for each band-pixel value of the transfer-source redundant-information image 184, $AOU_{ij}$ transfers it according to the function $\Lambda'^{*}_{ijk}(x,y)$, by communicating with neighbor array operation units 100. The transferred band-pixel value is regarded as a band-pixel value of a new redundant-information image 132.

At step 4412, for each band-pixel value of the redundant-information image 132, $AOU_{ij}$ transfers it according to the function $\Lambda'_{ijl}(x)$, by communicating with neighbor array operation units 100. The transferred band-pixel value is regarded as a band-pixel value of a new redundant-information image 132.

At step 4413, $AOU_{ij}$ judges whether the degeneration times representing the repeat times from step 4406 to step 4412 achieve the directed times or not. If the degeneration times do not achieve the directed times (step 4413: NO), this algorithm returns to step 4406. If the degeneration times achieve the directed times (step 4413: YES), this algorithm goes to step 4414. Note that the directed times are derived by the size of the rough edge-information image 113, the size of the object represented by the rough edge information 112, and the number of neighbors q. In a case that some parameters are set to specific numbers corresponding to the aim of use, there is no problem even though the directed times are set to more than the necessary times. If the directed times are too much, however, $AOU_{ij}$ takes much time to detect the position and the size of the object.

At step 4414, $AOU_{ij}$ outputs a band-pixel value of the redundant-information image 132 and each band-pixel value of the transfer-source redundant-information image 184. This algorithm then returns to step 4403.

Note that each redundant information 131 of the redundant-information image 132 consequently means the size of the object, whose center is a position of the redundant-information image 132, because it means the total number of the rough edge information 112 around the position. Each transfer-source redundant information 183 consequently means the inclination of the object, whose center is a position of the redundant-information image 132, because it means the transfer-source redundant information 183 exists only at the pixel which has the redundant information 131.

Therefore, the position/size/inclination detection means 44 can generate the redundant-information image 132 and the transfer-source redundant-information image 184 from the rough edge-information image 113, by using the data processing device 110 consisting of array operation units 100. However, if a rough gravity position of an object represented by the redundant-information image 132 shifts much from its real gravity center, the function $\Lambda'_{ijl}(x)$ and the function $\Lambda''_{ijl}(x)$ can be used alternately in step 4410. Similarly, the function $\Lambda'^{*}_{ijk}(x,y)$ and the function $\Lambda'^{*}_{ijk}(x,y)$ can be used alternately in step 4411. In addition, the function $\Lambda'_{ijl}(x)$ and the function $\Lambda''_{ijl}(x)$ can be used alternately in step 4412.

Figure 27:
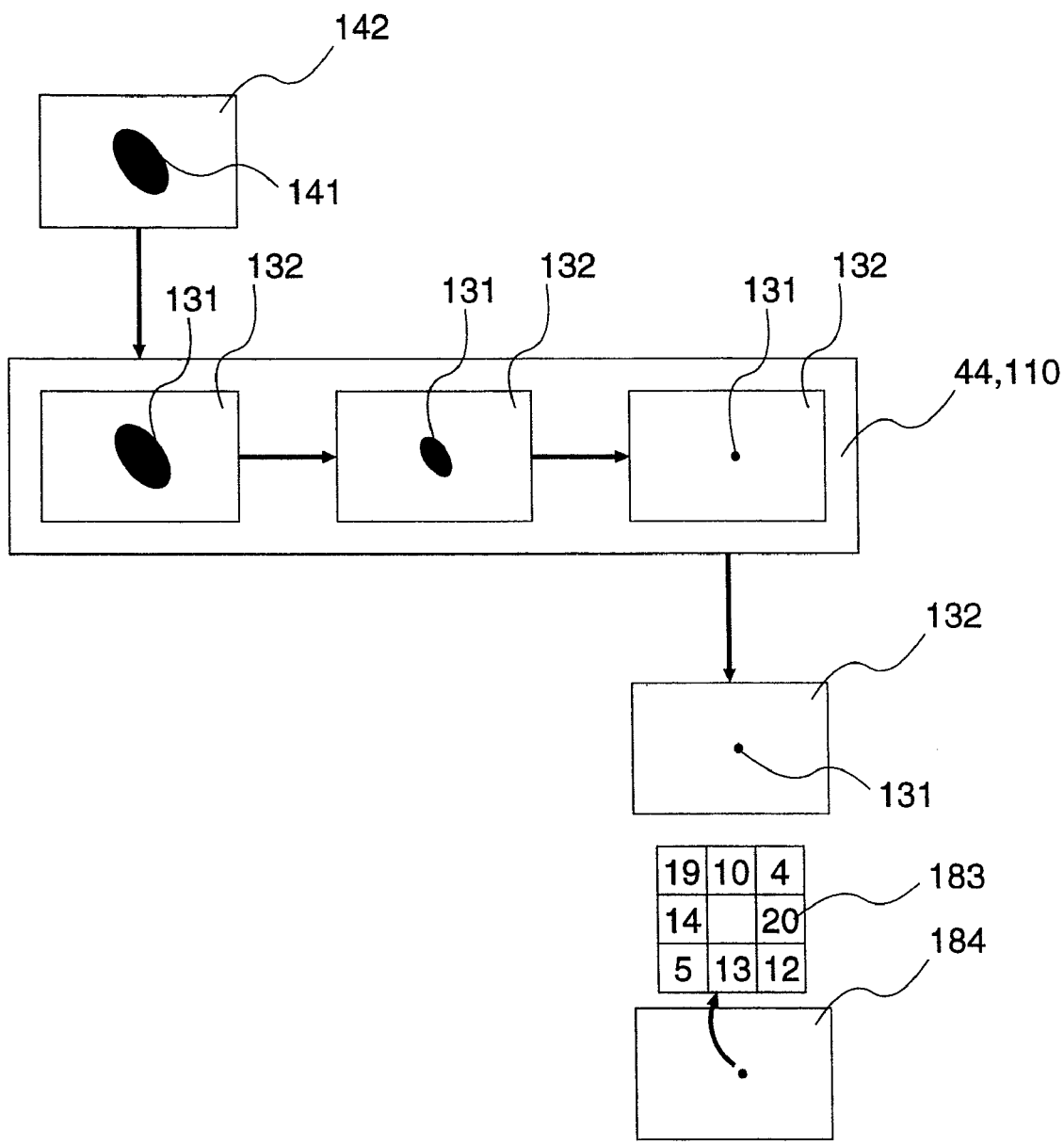
FIG. 27 is an explanation view for detecting position, size and inclination of objects in an object-area image.

Here, the formed edge-information image 115 consisting of the formed edge information 114 can be used in the algorithm shown in FIG. 26, instead of the rough edge-information image 113 consisting of the rough edge information 112. In addition, suppose that an object-area image 142 representing an object area 141 is used, instead of the rough edge-information image 113 consisting of the rough edge information 112. As shown in FIG. 27, the position/size/inclination detection means 44 can generate the redundant-information image 132 and the transfer-source redundant-information image 184 even from the object-area image 142 representing the object area 141. In the case that the object-area image 142 is used, however, each redundant information 131 of the redundant-information image 132 consequently means the area of the object, whose center is a position of the redundant-information image 132, because it means the total number of pixels of the object area 141 around the position. When the size of the object is derived from the redundant-information image 132, therefore, we must pay attention such as calculating the square root of the redundant information 131. Note that the position/size/inclination detection means 44 also carries out this algorithm similarly, in a case that a color-information image 172 representing whether there are some specific colors of objects or not, is used instead of the object-area image 142.

It has been described above about a method generating the transfer-source redundant-information image 184 from the rough edge-information image 113, the formed edge-information image 115, the object-area image 142 and the color-information image 172. It is explained here about a method deriving inclination angle of an object from the transfer-source redundant-information image 183.

Figure 28:
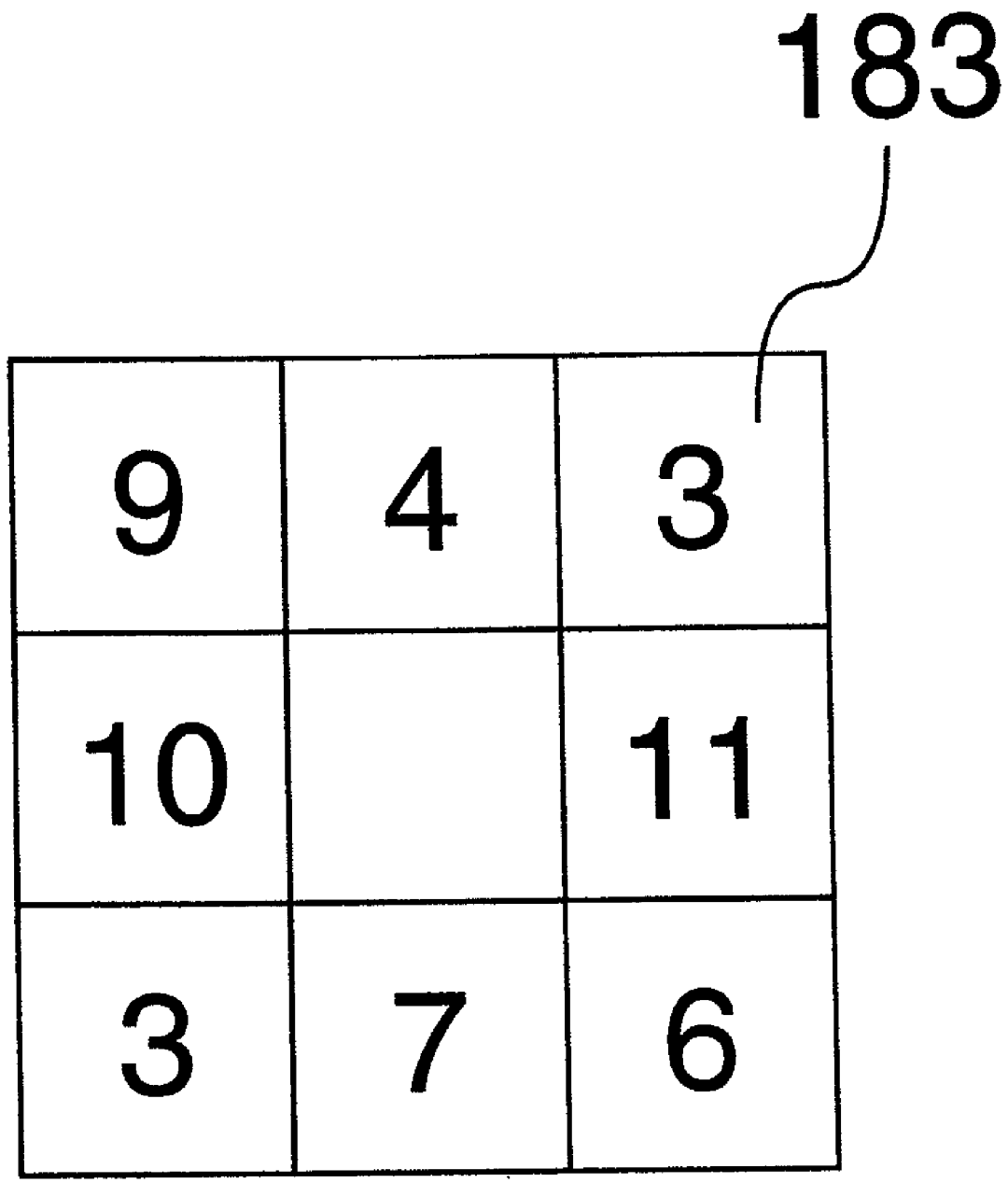
FIG. 28 is an explanation view for an example of transfer-source redundant information.

Suppose first that transfer-source redundant information 183, whose transfer source is either one of neighbor 1 to neighbor 8 shown in FIG. 12 and FIG. 28, is denoted as N1 to N8, respectively. For example, the inclination angle θ represented counter-clockwisely is derived according to EQ.51, where the inclination angle θ is represented by radian, and the inclination angle θ comes to be 0 radian when the object is horizontal or vertical.

$$\theta = \begin{cases} 0 & \text{if } N2 + N6 = 0 \text{ and } N4 + N8 = 0, \\ \arctan\left(\frac{N2 + N6}{N4 + N8}\right) - \frac{\pi}{4} & \text{if } N1 + N5 \geq N3 + N7 \\ \arctan\left(\frac{N4 + N8}{N2 + N6}\right) - \frac{\pi}{4} & \text{otherwise.} \end{cases} \quad (51)$$

For example, in a case that the transfer-source redundant-information 183 whose transfer source is either one of N1 to N8 is like FIG. 28, the inclination angle θ is about −0.4 radians. Although EQ.51 is a simple equation for deriving the inclination angle θ, of course, a user of the present invention can derive the inclination angle θ more exact, by performing finer conditioning than EQ.51. Besides this, EQ.52 is used in order to derive the inclination angle θ from a horizontal is.

$$\theta = \begin{cases} 0 & \text{if } N2+N6 = 0 \text{ and } N4+N8 = 0, \\ \arctan\left(\dfrac{N2+N6}{N4+N8}\right) - \dfrac{\pi}{4} & \text{if } N1+N5 \geq N3+N7 \text{ and } N2+N6 \geq N4+N8 \\ & \text{except } N2+N6 = 0 \text{ and } N4+N8 = 0, \\ \arctan\left(\dfrac{N2+N6}{N4+N8}\right) + \dfrac{3\pi}{4} & \text{if } N1+N5 \geq N3+N7 \text{ and } N2+N6 < N4+N8, \\ \arctan\left(\dfrac{N4+N8}{N2+N6}\right) + \dfrac{\pi}{4} & \text{otherwise.} \end{cases} \quad (52)$$

Note that the function arctan(y/x) do not have to use a table of logarithms if the inclination angle θ can be approximated. For example, if the inclination angle θ is only have to get either 0 radian, π/4 radian, π/2 radian or 3π/4 radian, the function arctan(y/x) has better be approximated like EQ.53.

$$\arctan\left(\frac{y}{x}\right) \approx \begin{cases} 0 & \text{if } x = 0 \text{ and } y = 0, \\ 0 & \text{if } 0 \leq y < x/2, \\ \dfrac{\pi}{4} & \text{if } 0 < y/2 \leq x \leq 2y \\ \dfrac{\pi}{2} & \text{if } 0 \leq x < y/2, \\ 0 & \text{otherwise.} \end{cases} \quad (53)$$

If an array operation unit 100 calculates EQ.51 and EQ.52, and generates inclination-size information 185 consisting of the redundant information 131 and the inclination angle θ, the array operation unit 100 can output a less amount of data than eight quantities of transfer-source redundant information 183. For example, in a case that the number of inclination angles θ is specified with four, an inclination-size-information image 186 becomes a four-band image if redundant information 131 corresponding to each inclination angle is assigned to an individual band-pixel value. In addition, if four inclination angles θ are represented by a band-pixel value, the inclination-size-information image 186 becomes a two-band image. Besides this, if the inclination angle θ can be represented by a specific interval, a memory 102 only has to memorize a look-up table preparing the necessary number of the inclination angles, instead of a table of logarithms. Of course, the array operation unit 100 may use an approximate function like EQ.53.

Figure 29:
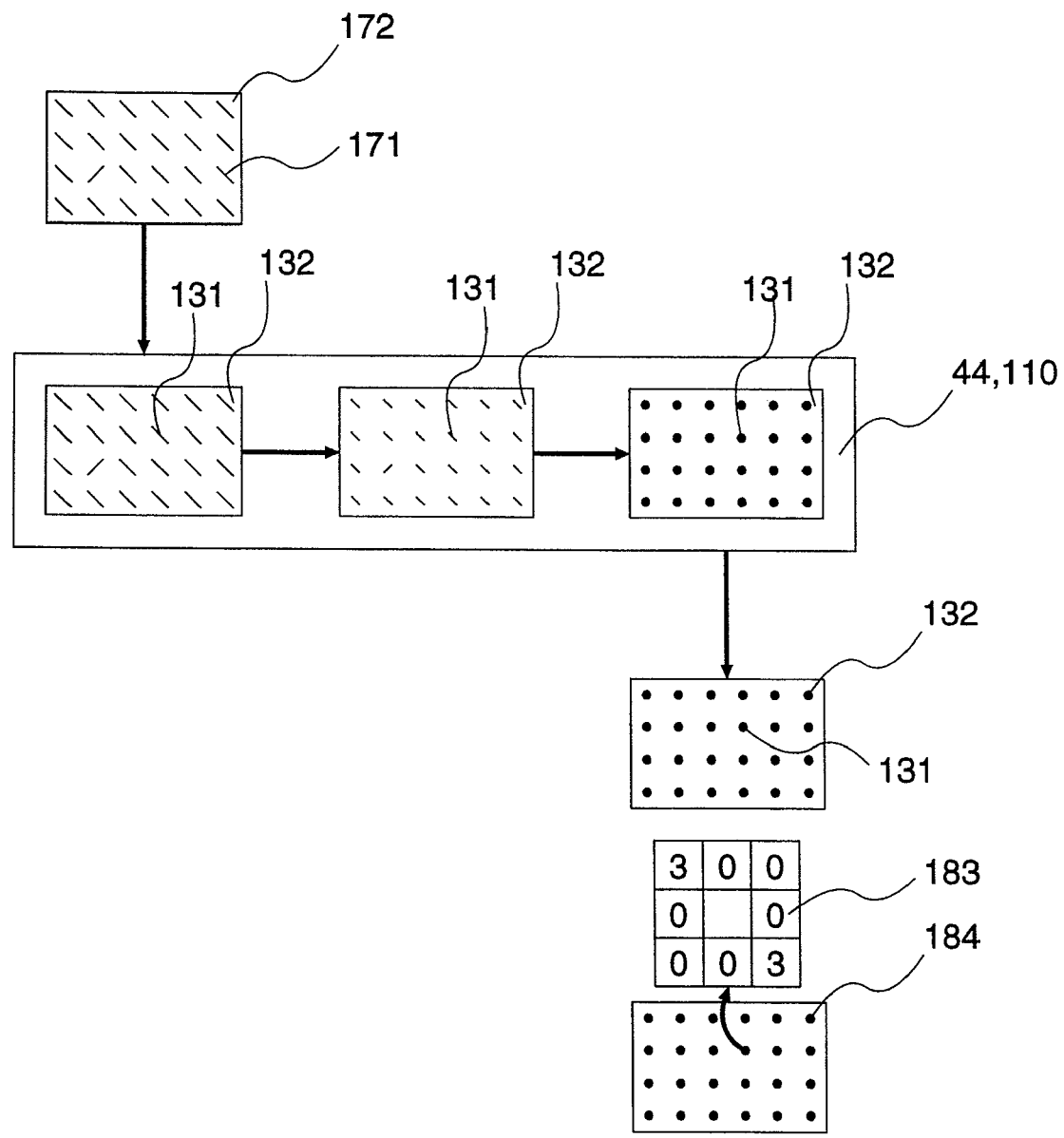
FIG. 29 is an explanation view for detecting position, size and inclination of texture in a color-information image.
Figure 30:
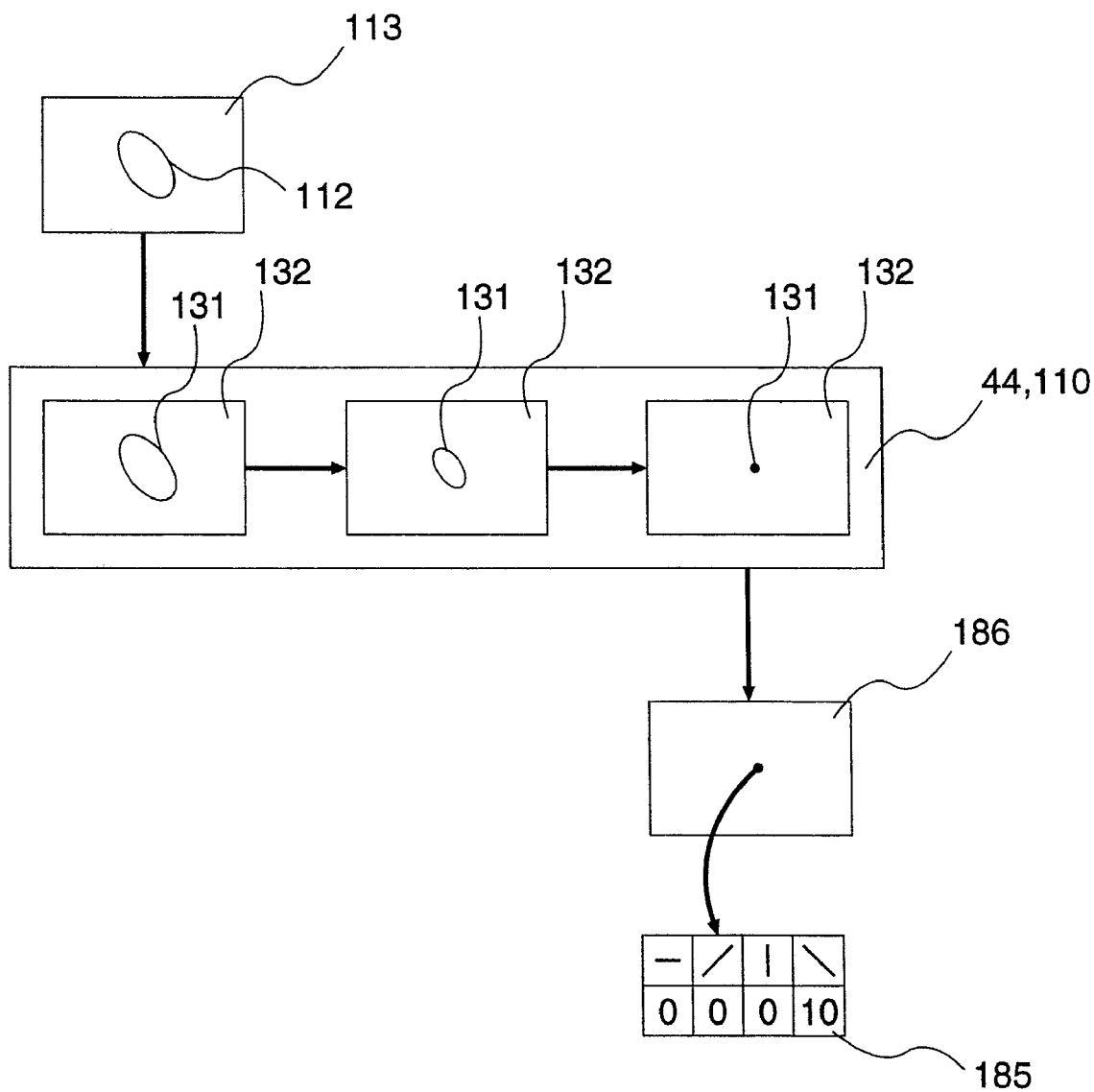
FIG. 30 is an explanation view for detecting position, size and inclination of objects in an edge-information image and outputting an inclination-size-information image.

By the way, a rough edge-information image 113 comprising rough edge information 112 and an object area image 142 comprising an object area 141 generated for an object are inputted by a position/size/inclination detection means 44 in FIG. 25 and FIG. 27, respectively. Of course, however, even though there are some objects in the rough edge-information image 113 and the object area image 142, the position/size/inclination detection means 44 can detect position, size and inclination of each object. As shown in FIG. 29, moreover, even though a color-information image 172 shows texture, the position/size/inclination detection means 44 can detect position, size and inclination from each chunk of color information 171. Therefore, the position/size/inclination detection means 44 can be also used to analyze texture.

Now, it has been described above about the position/size/inclination detection means 44. As is clear from the above description, if contours of an object in a rough edge-information image 113 is represented by many line segments whose intervals are equal, the position/size/inclination detection means 44 can derive length and inclination of the line segments. In order to generate such a rough edge-information image 113 for any object at any place, however, a special image processing device using many large masks are optionally needed. Therefore, the position/size/inclination detection means 44 can really input only a rough edge-information image 113 or a formed edge-information image 115 including the little number of line segments for an object. Thus, the position/size/inclination detection means 44 can not derive length and inclination of line segments representing contours of an object from the rough edge-information image 113, whenever the above method is used.

Figure 31:
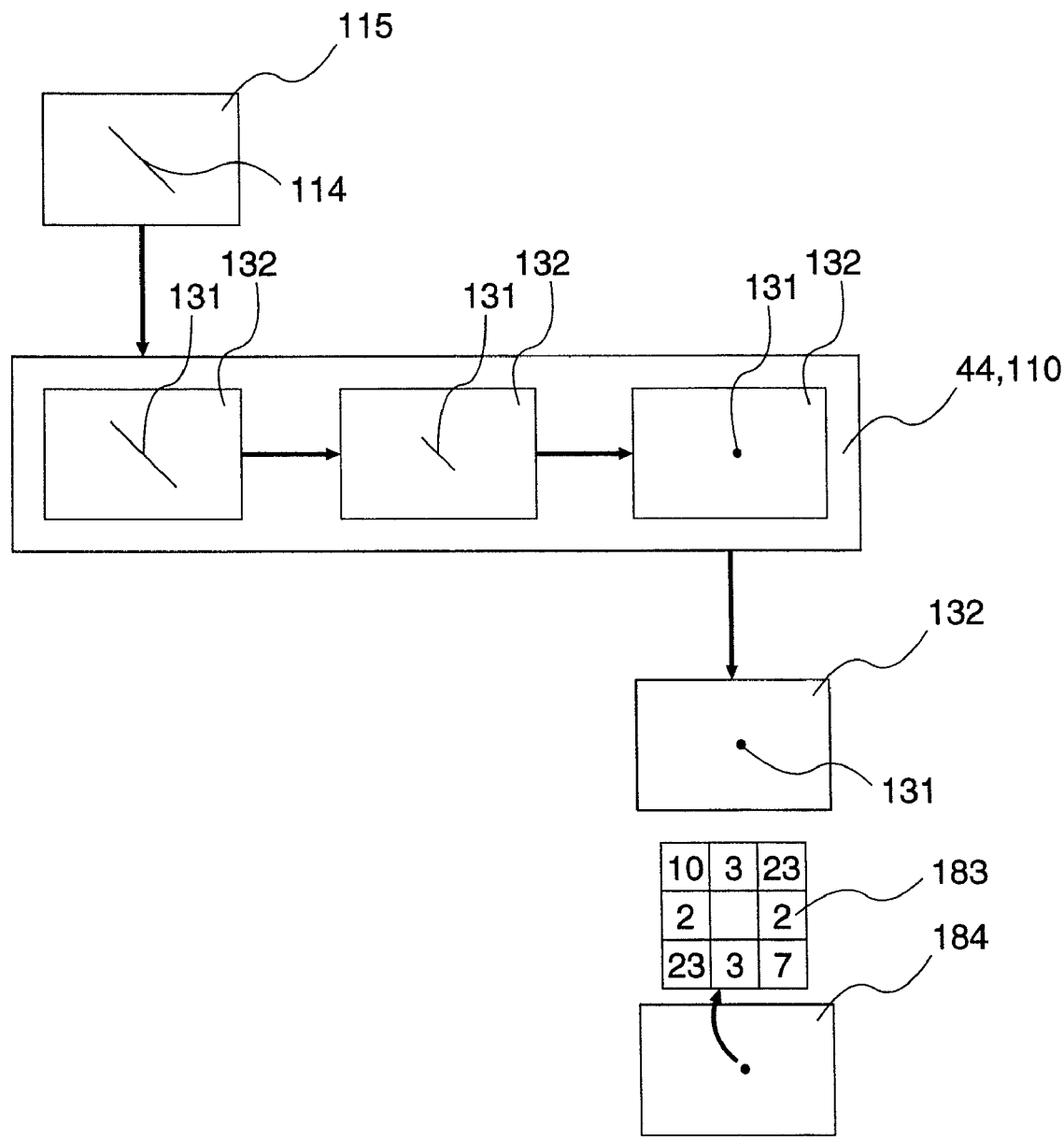
FIG. 31 is an explanation view for detecting normal direction of line segments in a formed edge-information image.
Figure 32:
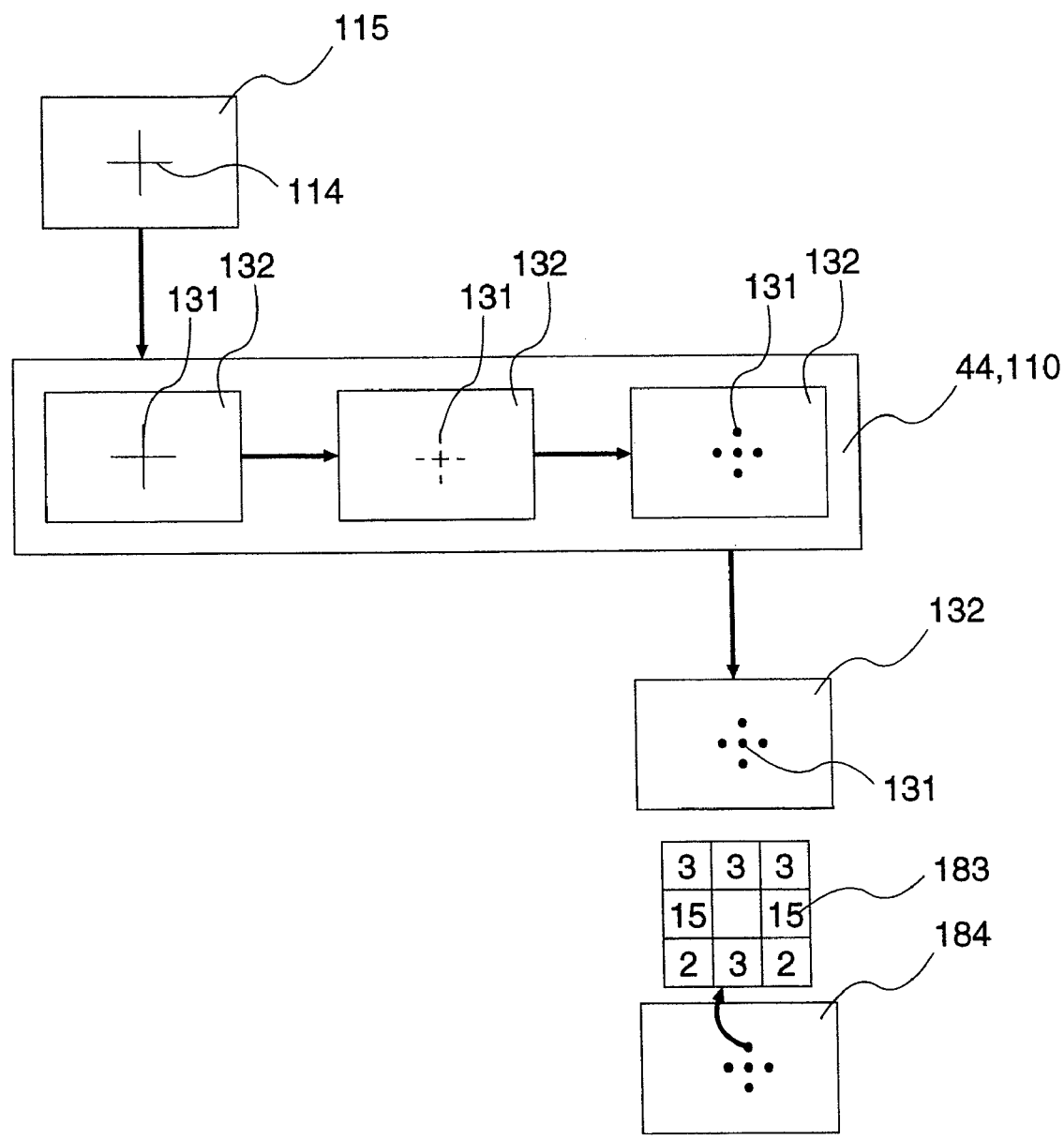
FIG. 32 is an explanation view for detecting normal direction of cross-shaped line segments in a formed edge-information image.
Figure 33:
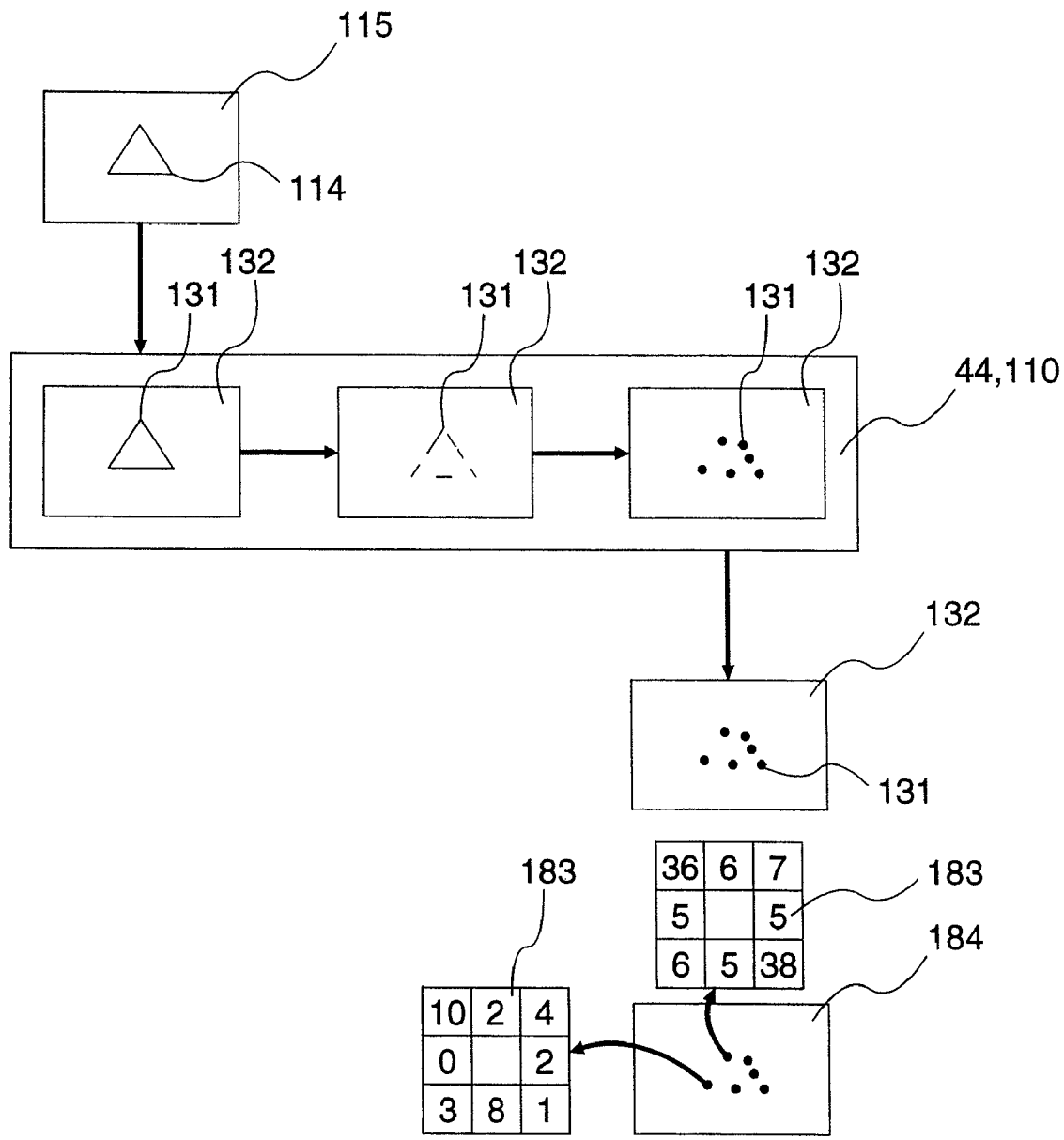
FIG. 33 is an explanation view for detecting normal direction of line segments constructing a triangle in a formed edge-information image.
Figure 34:
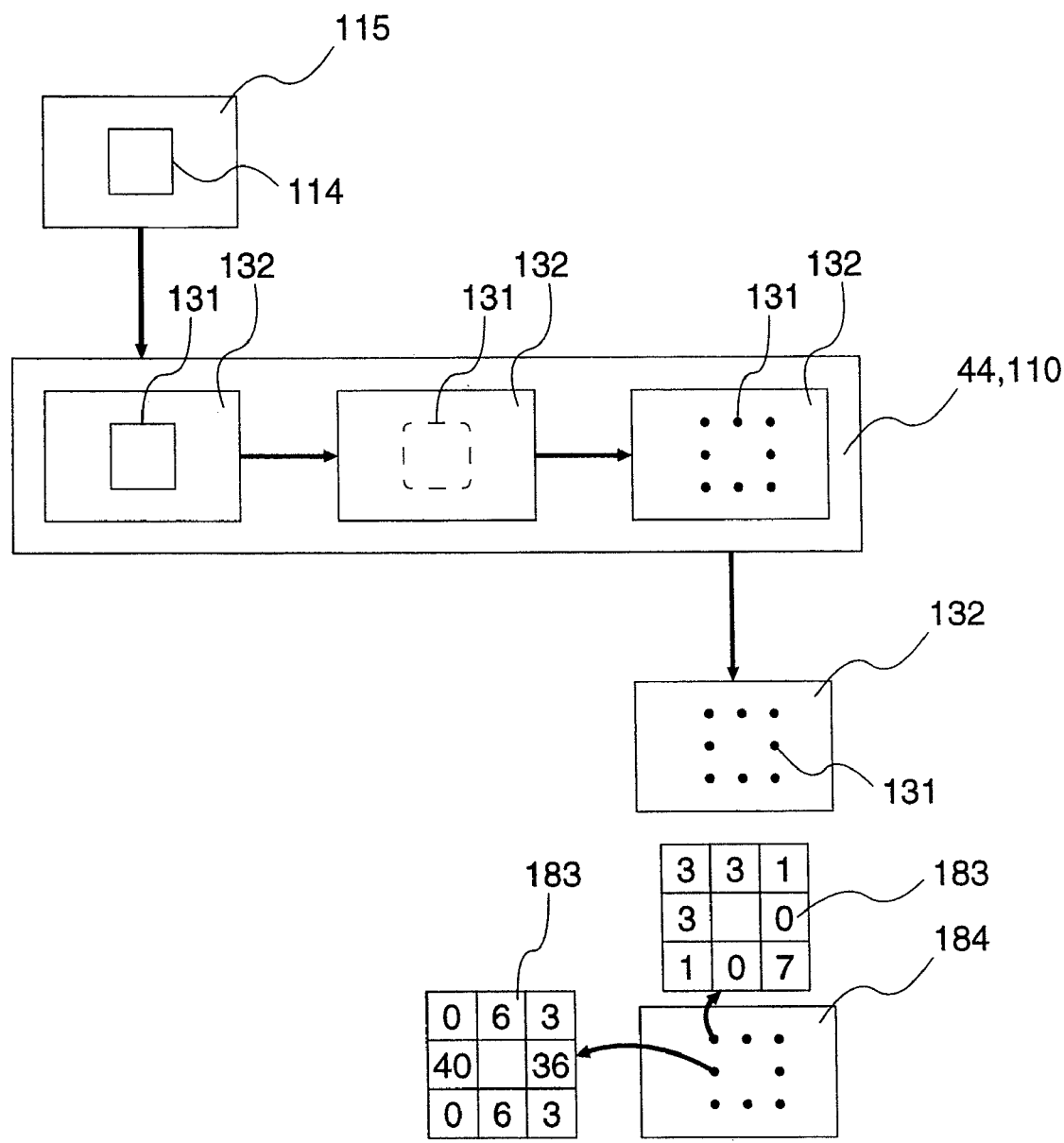
FIG. 34 is an explanation view for detecting normal direction of line segments constructing a rectangle in a formed edge-information image.
Figure 35:
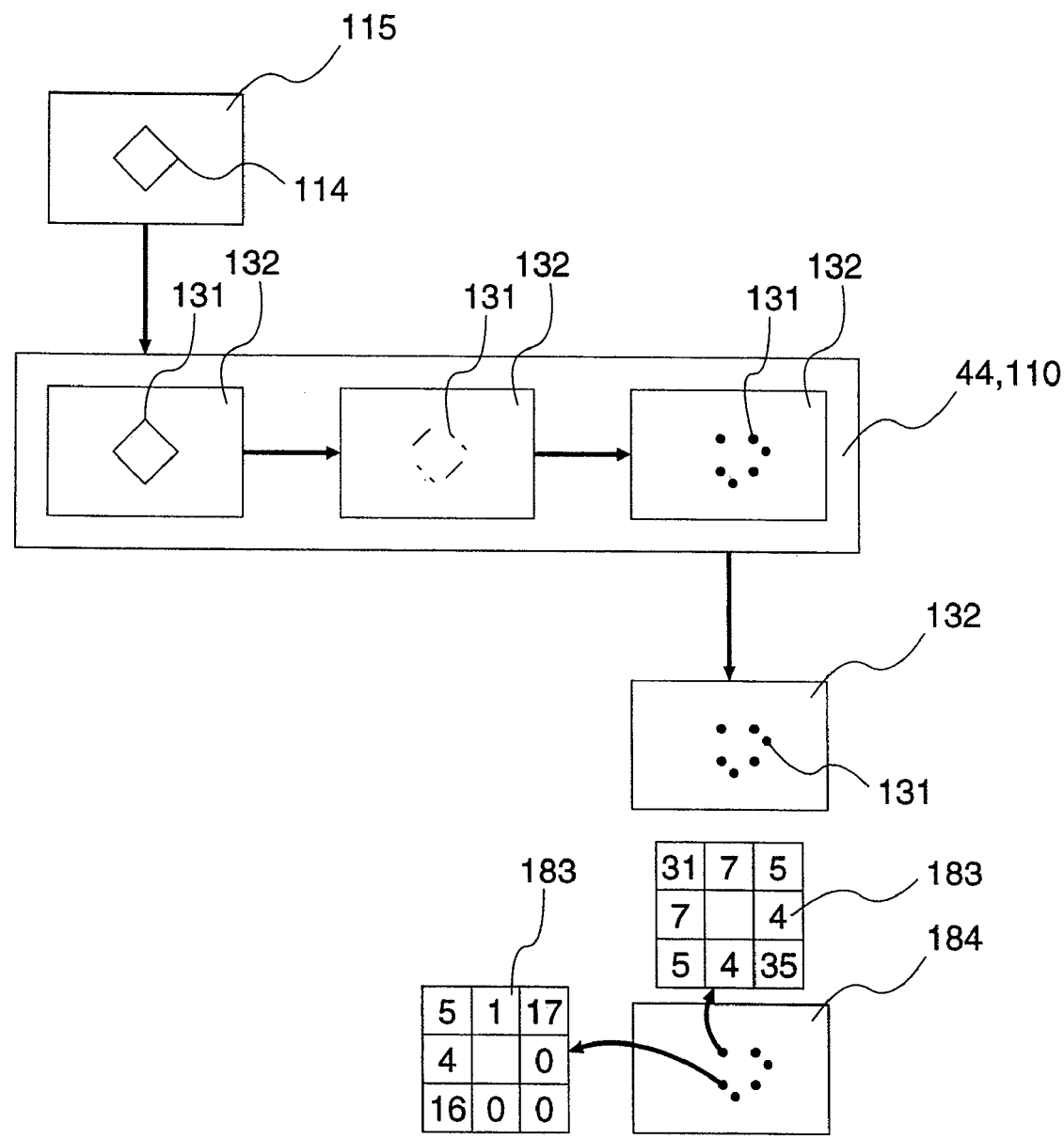
FIG. 35 is an explanation view for detecting normal direction of line segments constructing a rhombus in a formed edge-information image.
Figure 36:
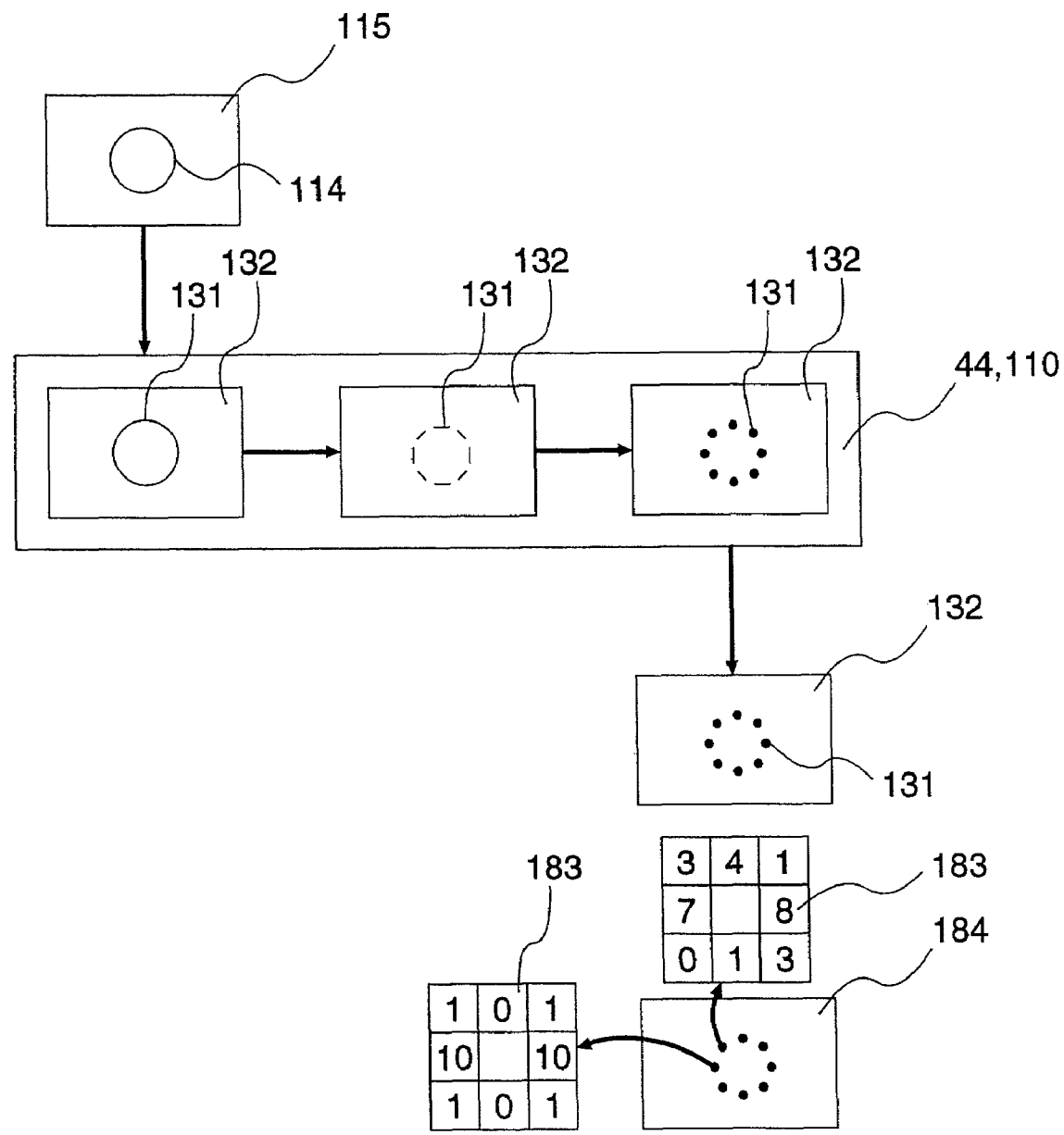
FIG. 36 is an explanation view for detecting normal direction of line segments constructing a circle in a formed edge-information image.
Figure 37:
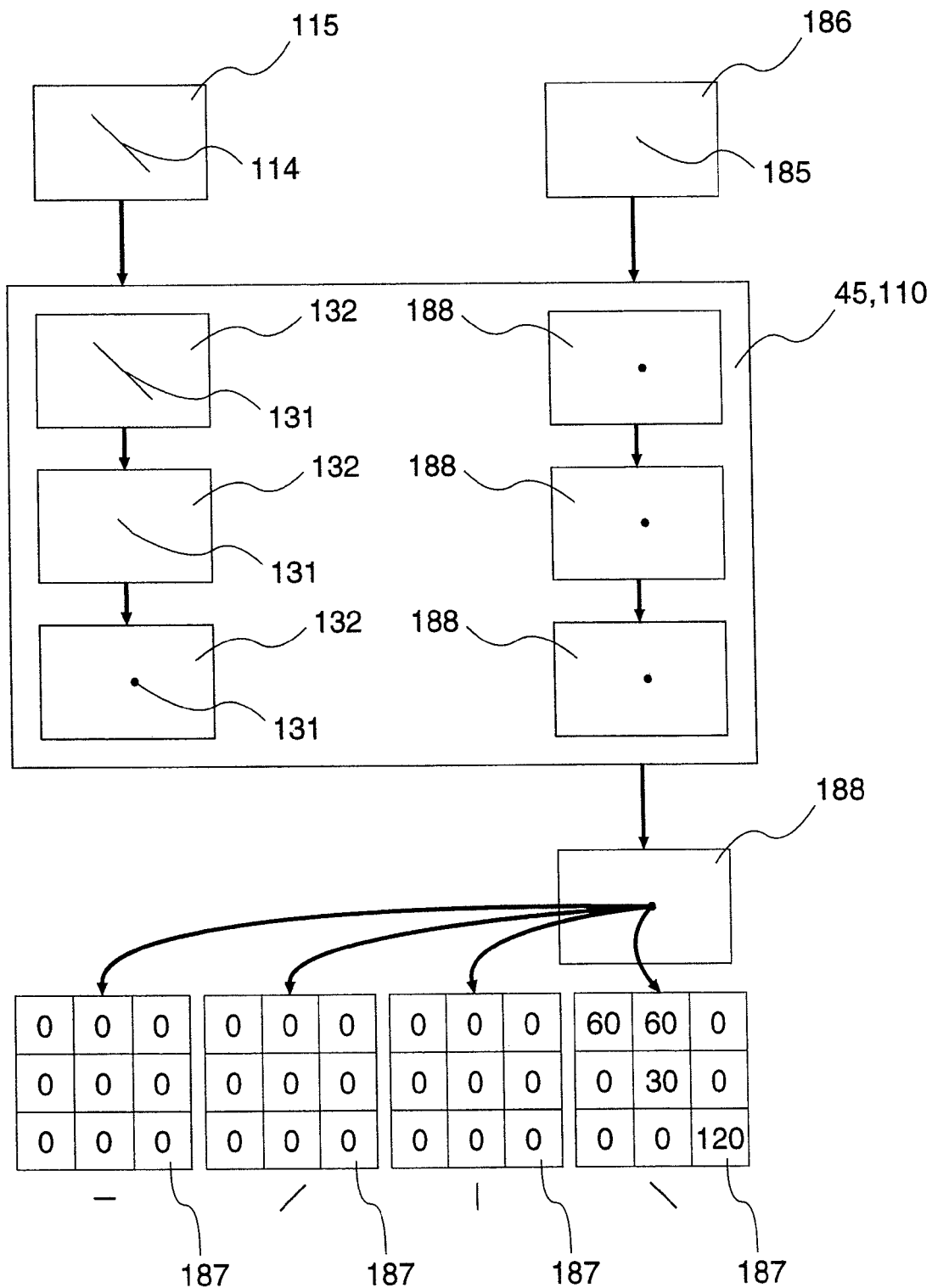
FIG. 37 is an explanation view for generating a transfer-source inclination-redundant-information image from a formed edge-information image including a line segment and an inclination-size-information image.
Figure 38:
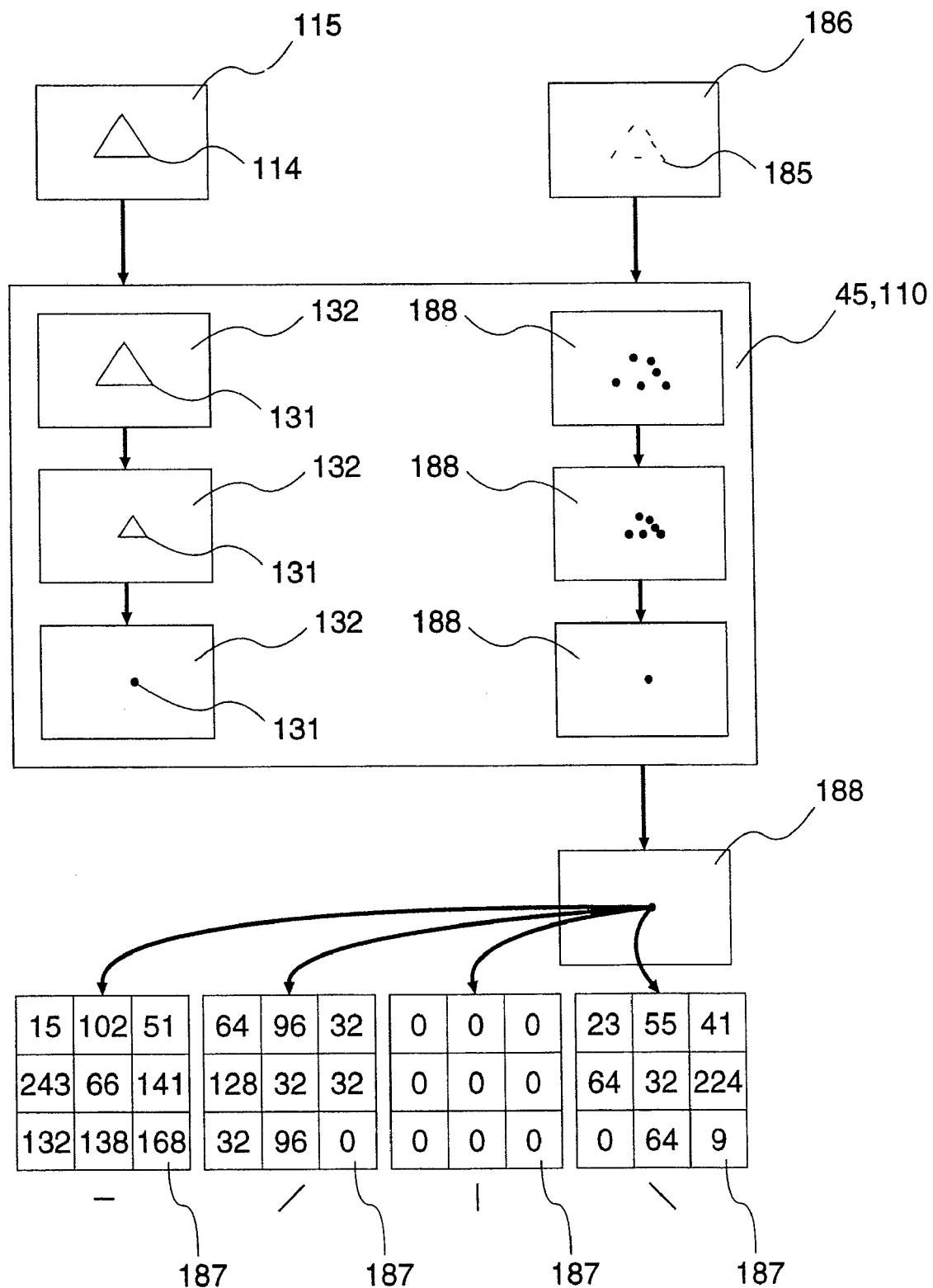
FIG. 38 is an explanation view for generating a transfer-source inclination-redundant-information image from a formed edge-information image including a triangle and an inclination-size-information image.
Figure 39:
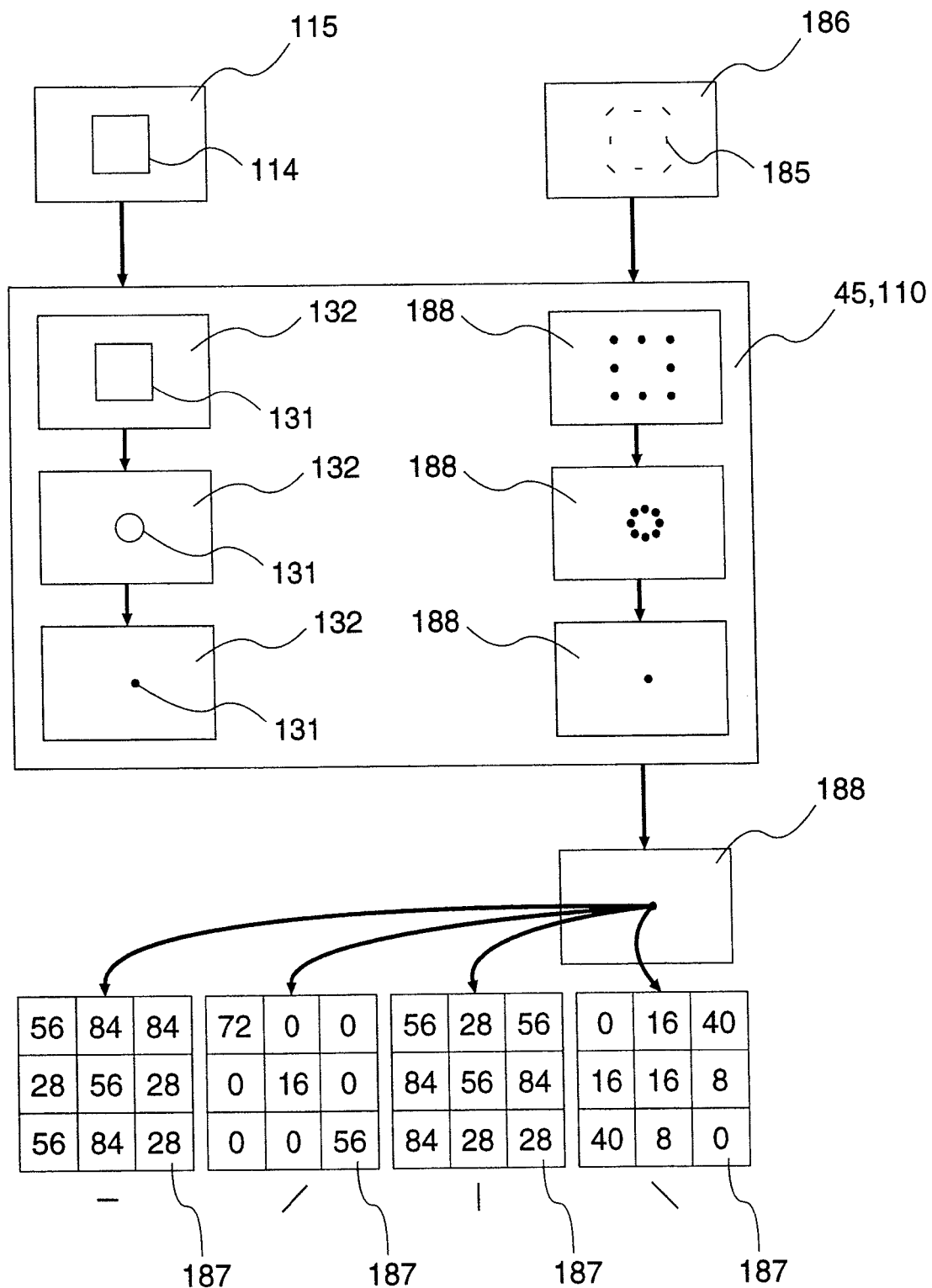
FIG. 39 is an explanation view for generating a transfer-source inclination-redundant-information image from a formed edge-information image including a rectangle and an inclination-size-information image.
Figure 40:
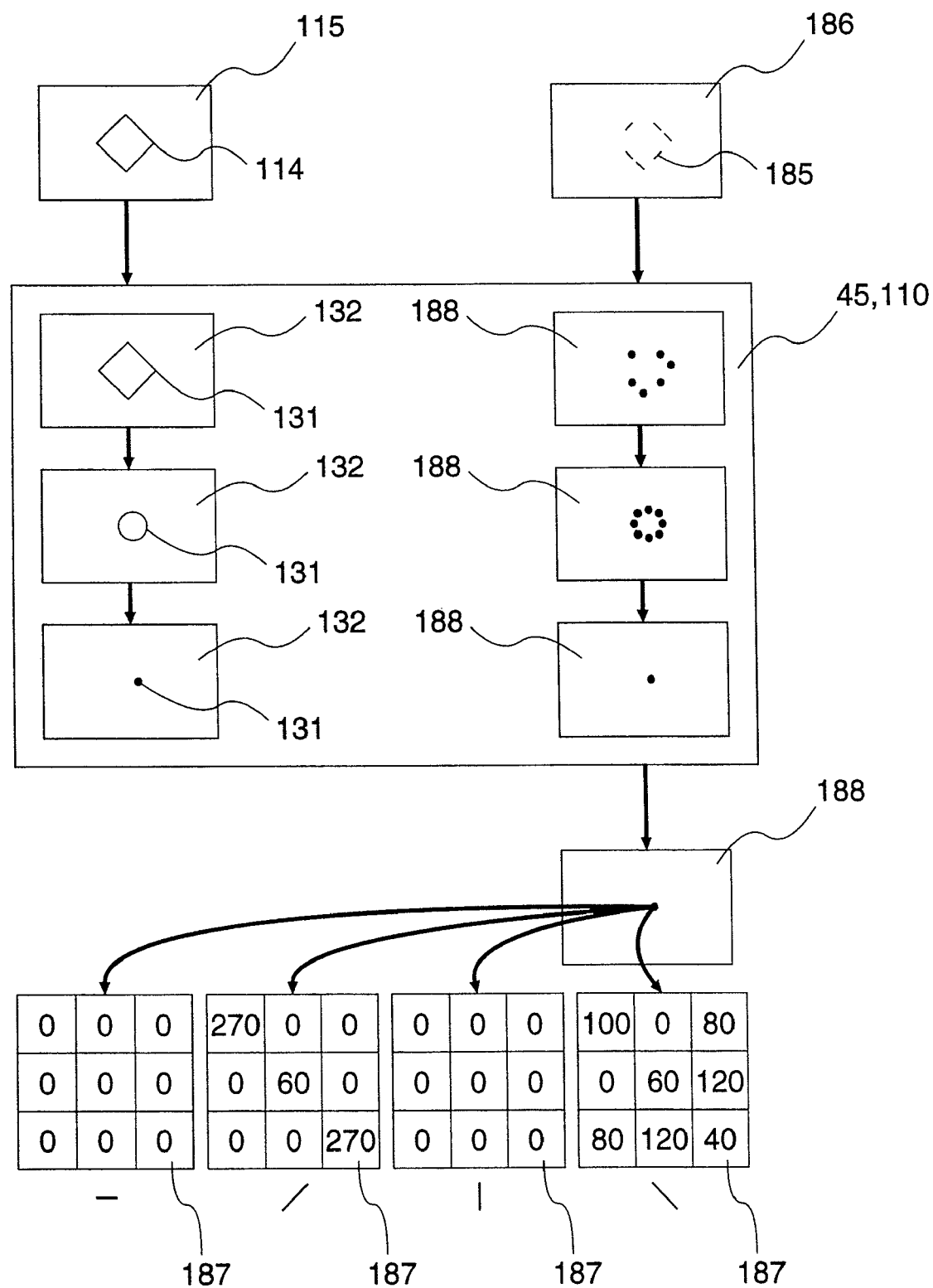
FIG. 40 is an explanation view for generating a transfer-source inclination-redundant-information image from a formed edge-information image including a rhombus and an inclination-size-information image.
Figure 41:
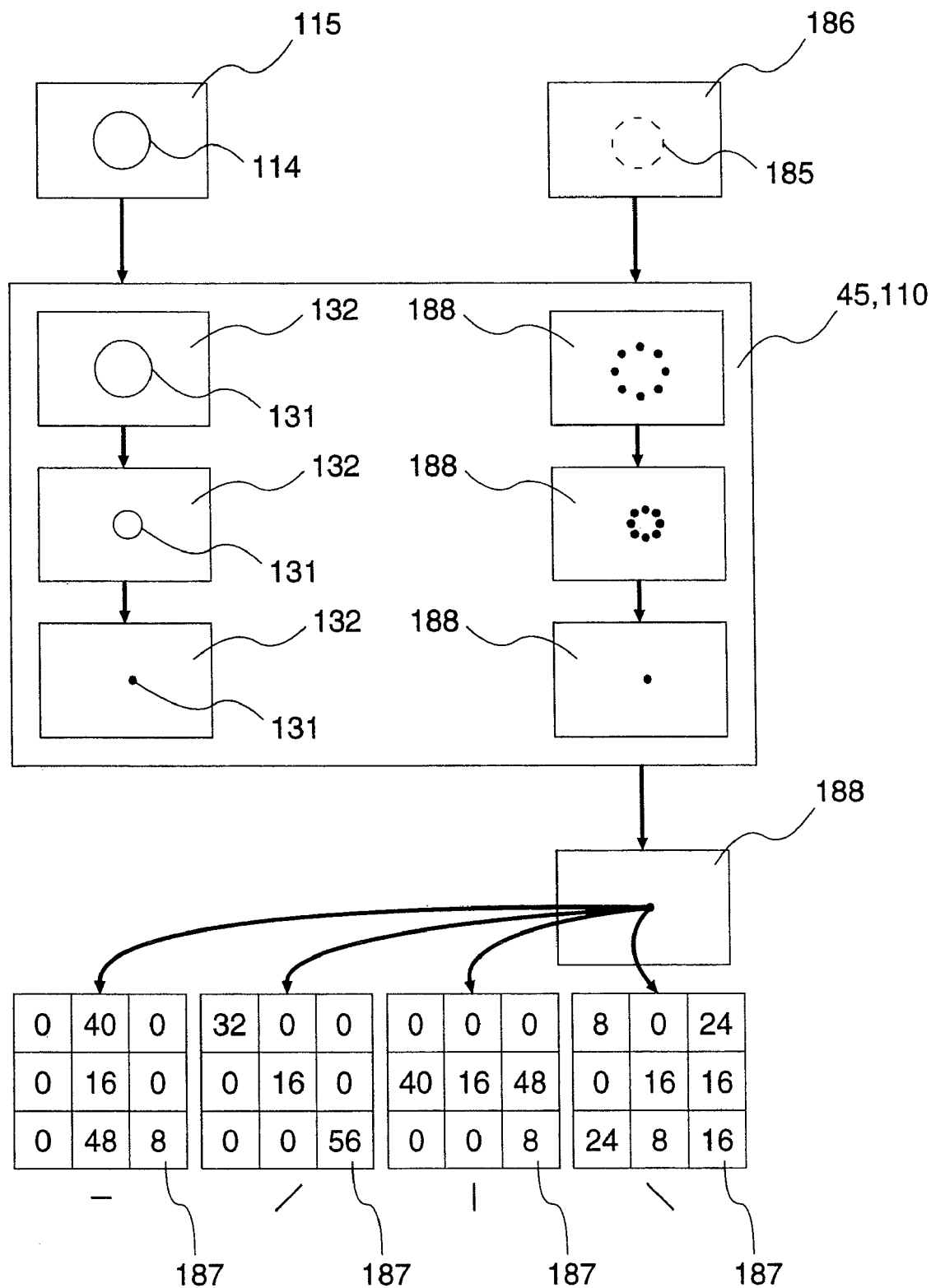
FIG. 41 is an explanation view for generating a transfer-source inclination-redundant-information image from a formed edge-information image including a circle and an inclination-size-information image.

By the way, in a case that the position/size/inclination detection means 44 carries out local processing for only eight neighbors 182, that is, in a case that neighbor size q is eight in step 4406 and step 4410 in FIG. 26, the position/size/inclination detection means 44 may be able to derive normal direction of some line segments and curves constructed by rough edge information 112 in the rough edge-information image 113, if some condition is satisfied. Especially, in a case that line width of some line segments and curves in the rough edge-information image 113 is approximated to two or three pixels, that is, for a formed edge-information image 114, the position/size/inclination image 44 can certainly divide the line segments and the curves into formed edge information 114 whose size is less than a specific value. Moreover, it can derive angles in the normal direction of the line segments and the curves. For example, in a case of FIG. 31, the position/size/inclination detection means 44 outputs a 45-degree angle against a horizontal axis for a line segment in the formed edge-information image 115, which leans at 135 degrees against the horizontal axis. Of course, size of an object outputted by the position/size/inclination detection means 44 becomes length of the line segment leaning at 135 degrees against the horizontal axis. In addition, in a case of FIG. 32, the position/size/inclination detection means 44 divides a cross-shape figure in the formed edge-information image 115 into five line segments, followed by outputting a 90-degree angle against a horizontal line segment in the formed edge-information image 115, and a 0-degree angle against a vertical line segment in the formed edge-information image 115. Next, in a case of FIG. 33, the position/size/inclination detection means 44 divides a triangle in the formed edge-information image 115 into six line segments, followed by outputting their normal angles in the formed edge-information image 115, respectively. Next, in a case of FIG. 34, the position/size/inclination detection means 44 divides a rectangle in the formed edge-information image 115 into eight line segments, followed by outputting their normal angles in the formed edge-information image 115, respectively. Note that, as is clear from FIG. 34, four angles of the rectangle are converted into short line segments leaning toward a center of gravity of the rectangle, respectively. Next, in a case of FIG. 35, the position/size/inclination detection means 44 divides a rectangle (we here call it a rhombus) leaning at 90 degrees in the formed edge-information image 115 into six line segments, followed by outputting their normal angles in the formed edge-information image 115, respectively. Finally, in a case of FIG. 36, the position/size/inclination detection means 44 divides a circle in the formed edge-information image 115 into eight line segments, followed by outputting their normal angles in the formed edge-information image 115, respectively. Thus, if the position/size/inclination detection means 44 adds these normal angles to 90 degrees, by using EQ.54, the position/size/inclination detection means 44 can derive tangent angles of the line segments and the curves representing the contours of the object in the formed edge-information image 115.

$$\theta' = \left(\theta + \frac{\pi}{2}\right) \bmod \pi \qquad (54)$$

Note that the position/size/inclination detection means 44 can also use EQ.52 if the geometrical analysis means 37 regards as the position/size/inclination detection means 44 outputs normal angles of the line segments and the curves representing the contours of the object in the formed edge-information image 115.

For each of all objects in the formed edge-information image 115, here, if the geometrical analysis means 37 can collect inclination-size information 185 of an inclination-size-information image 186 outputted by the position/size/inclination detection means 44 at one place, the geometrical analysis means 37 can discriminate form of the object. Such a method collecting plurality of information at one place has already been realized by the position/size/inclination detection means 44. However, since inclination-size information 185 related with an object is distributed around the inclination-size-information image 186, it is difficult for the geometrical analysis means 37 to collect the inclination-size information 185 at one place in a similar method to the position/size/inclination detection means 44, as shown in FIG. 29. It is explained here about a position/size/form detection means 45 collecting the inclination-size information 185 at one place, by using the formed edge-information image 115.

First, EQ.37 to EQ.44 are expanded to EQ.55 to EQ.62, respectively. Note that, in a case that a range possible to be taken by an inclination angle θ of a line segment represented by the inclination-size information 185, which is zero or more degrees and less than 180 degrees, is segmented into some domains, k denotes a number assigned to each domain. For example, suppose the inclination angle θ is segmented into four domains of 0 degree, 45 degrees, 90 degrees and 135 degrees. k denotes the domain of 0 degree if k=0, k denotes the domain of 45 degree if k=1, k denotes the domain of 90 degree if k=2, and k denotes the domain of 135 degree if k=3.

$$\Gamma^{**}_{i,j,9k+1}(x, y) = \begin{cases} x_{i+1,j,9k+9} & \text{if } \#^{-1}y_{i+1,j,1} = p(-1, 0, 0), \\ 0 & \text{otherwise.} \end{cases} \qquad (55)$$

$$\Gamma^{**}_{i,j,9k+2}(x, y) = \begin{cases} x_{i+1,j-1,9k+9} & \text{if } \#^{-1}y_{i+1,j-1,1} = p(-1, 1, 0), \\ 0 & \text{otherwise.} \end{cases} \qquad (56)$$

$$\Gamma^{**}_{i,j,9k+3}(x, y) = \begin{cases} x_{i,j-1,9k+9} & \text{if } \#^{-1}y_{i,j-1,1} = p(0, 1, 0), \\ 0 & \text{otherwise.} \end{cases} \qquad (57)$$

$$\Gamma^{**}_{i,j,9k+4}(x, y) = \begin{cases} x_{i-1,j-1,9k+9} & \text{if } \#^{-1}y_{i-1,j-1,1} = p(1, 1, 0), \\ 0 & \text{otherwise.} \end{cases} \qquad (58)$$

$$\Gamma^{**}_{i,j,9k+5}(x, y) = \begin{cases} x_{i-1,j,9k+9} & \text{if } \#^{-1}y_{i-1,j,1} = p(1, 0, 0), \\ 0 & \text{otherwise.} \end{cases} \qquad (59)$$

$$\Gamma^{**}_{i,j,9k+6}(x, y) = \begin{cases} x_{i-1,j+1,9k+9} & \text{if } \#^{-1}y_{i-1,j+1,1} = p(1, -1, 0), \\ 0 & \text{otherwise.} \end{cases} \qquad (60)$$

-continued $$\Gamma^{**}_{i,j,9k+7}(x, y) = \begin{cases} x_{i,j+1,9k+9} & \text{if } \#^{-1}y_{i,j+1,1} = p(0, -1, 0), \\ 0 & \text{otherwise.} \end{cases} \qquad (61)$$

$$\Gamma^{**}_{i,j,9k+8}(x, y) = \begin{cases} x_{i+1,j+1,9k+9} & \text{if } \#^{-1}y_{i+1,j+1,1} = p(-1, -1, 0), \\ 0 & \text{otherwise.} \end{cases} \qquad (62)$$

Of course, it is possible to segment the inclination angle θ into any number of domains, but this condition is used here in order to explain easily. Note that, if k is equal to zero in EQ.55 to EQ.62, EQ.55 to EQ.62 become EQ.37 to EQ.44, respectively. In the position/size/inclination detection means 44, therefore, each of the array operation units 100 can use EQ.55 to EQ.62 instead of EQ.37 to EQ.44, respectively.

Next, EQ.63 is appended to EQ.55 to EQ.62. The EQ.63 is used for calculating sum of length of line segments represented by inclination-size information 185 included within each domain of the inclination angles θ in the inclination-size information image 186.

$$\Gamma^{**}_{i,j,9k+9}(x,y)=0 \qquad (63)$$

By using EQ.64, EQ.65 and EQ.66 instead of EQ.45, EQ.46 and EQ.47, transfer-source inclination-redundant information 187 of each of eight transfer sources and transfer-source inclination-redundant information 187 representing the sum of length of the line segments represented by inclination-size information 185 are generated from a 36-band grayscale image x consisting of 36 amounts of transfer-source inclination-redundant-information 187 and a single-band grayscale image y consisting of redundant information 131, every domain of the inclination angle θ.

$$\Lambda^{}_{ijk}(x,y)=\Gamma_{ijk}(x,\Delta(\Phi(y)))+\Gamma^{}_{ijk}(x,\Delta(\Phi(y))) \qquad (64)$$

$$\Lambda'^{}_{ijk}(x,y)=\Gamma_{ijk}(x,\Delta'(\Phi(y)))+\Gamma^{}_{ijk}(x,\Delta'(\Phi(y))) \qquad (65)$$

$$\Lambda''^{}_{ijk}(x,y)=\Gamma_{ijk}(x,\Delta''(\Phi(y)))+\Gamma^{}_{ijk}(x,\Delta''(\Phi(y))) \qquad (66)$$

Figure 42:
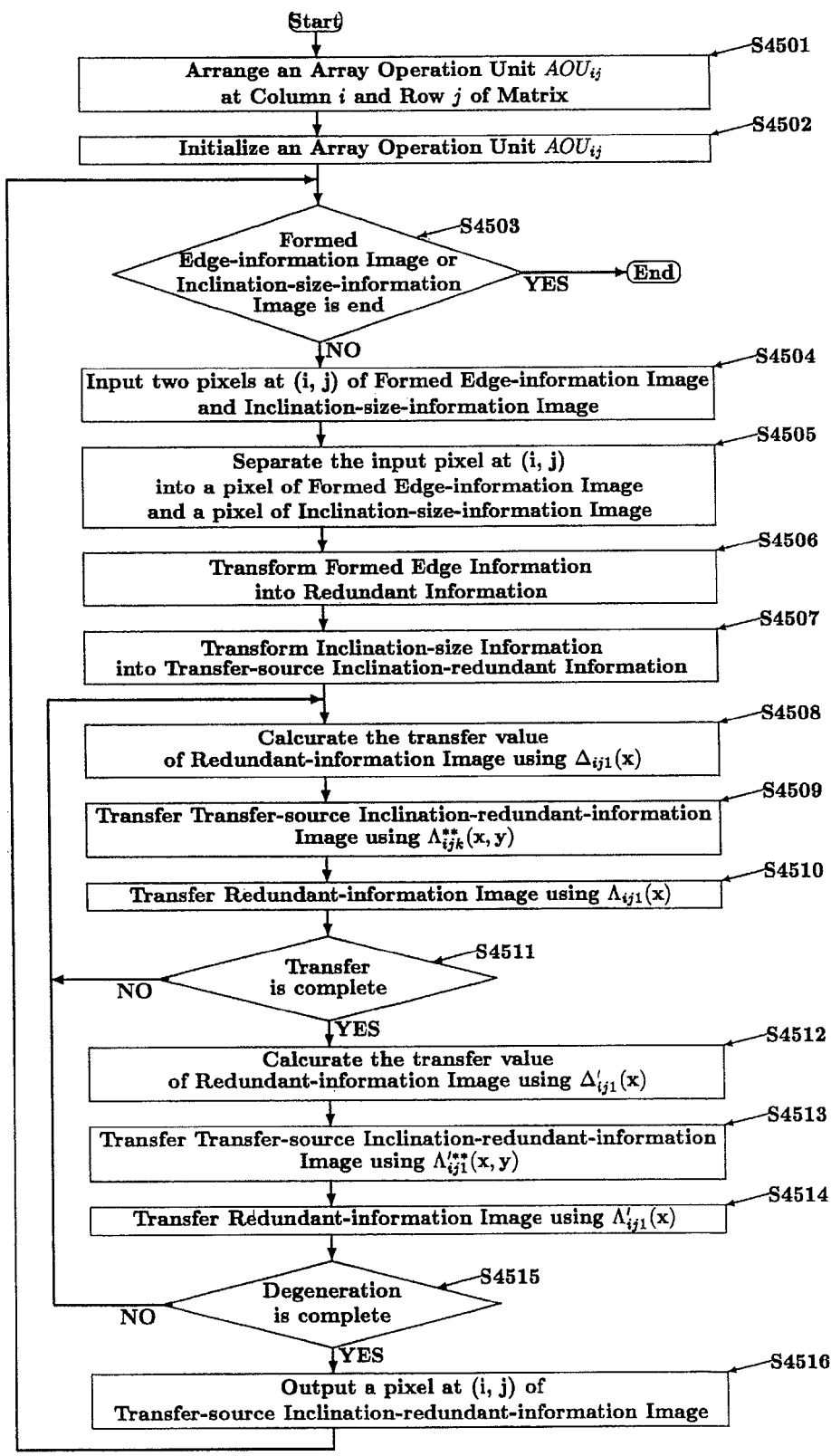
FIG. 42 is a flow chart appearing an algorithm of a position/size/form detection means in this enforcement form.

Now, as shown in FIG. 37 to FIG. 41, in order for the position/size/form detection means 45 realized by a data processing device 110 to generate a redundant-information image 132 consisting of redundant information 131 from a formed edge-information image 115 consisting of formed edge information 114, and to generate a transfer-source inclination-redundant-information image 188 consisting of transfer-source inclination-redundant information 187 from an inclination-size information image 186 consisting of inclination-size information 185, array operation units 100 arranged in the shape of a lattice work synchronously in parallel. Let an array operation unit 100 at a column i and a row j of a matrix be $AOU_{ij}$. Algorithm of $AOU_{ij}$ is shown in FIG. 42.

At step 4501, $AOU_{ij}$ is arranged at the column i and the row j of the matrix. This is desired to decide neighbors of $AOU_{ij}$ even though the $AOU_{ij}$ is either logical or physical.

At step 4502, neighbors of $AOU_{ij}$ are set and its parameters are initialized. In setting the neighbors, the number of neighbors used in the above functions can be defined as either four or eight individually, or all of them can be defined as either four or eight uniformly. In order to make the redundant-information image 132 generated by the data processing device 110 of the present invention more exact, the number of neighbors q has to be set a large number for all functions. The position/size/inclination detection means 44, however, can cope with limitation of computational time to calculate gravity of the formed edge information 114 of an object and the size of the input formed edge-information image 115, by varying the number of neighbors suitably.

At step 4503, $AOU_{ij}$ judges whether there is a formed edge-information image 115 inputted one by one or not. If there is not the formed edge-information image 115 any more (step 4503: YES), this algorithm ends. If there is the formed edge-information image 115 (step 4503: NO), this algorithm goes to step 4504. Note that this algorithm can be an infinite loop when array operation units 100 are realized for a specific size of the image.

At step 4504, $AOU_{ij}$ inputs one band of a pixel on the column i and the row j of the formed edge-information image 115 and one band of a pixel on the column i and the row j of the inclination-size-information image 186. Therefore, $AOU_{ij}$ needs a memory 102 memorizing at least one band of image data.

At step 4505, $AOU_{ij}$ separates the pixel on the column i and the row j of the formed edge-information image 115 and the pixel on the column i and the row j of the inclination-size-information image 186. If the pixel on the column i and the row j of the formed edge-information image 115 and the pixel on the column i and the row j of the inclination-size-information image 186 are separated beforehand, followed by being inputted, $AOU_{ij}$ carries out nothing.

At step 4506, $AOU_{ij}$ converts the formed edge information 114 of the formed edge-information image 115 to the redundant information 131 of the redundant-information image 132. The redundant information 131 becomes a pixel value equivalent to one or zero.

At step 4507, $AOU_{ij}$ converts the inclination-size information 185 of the inclination-size-information image 186 to the transfer-source inclination-redundant information 187 of the transfer-source inclination-redundant-information image 188. For each of all domains of an inclination angle θ represented by the inclination-size information 185, the transfer-source inclination-redundant information 187 at a center becomes a band-pixel value equivalent to a non-negative integer. In addition, 32 of transfer-source inclination-redundant information 187 are also cleared by a band-pixel value equivalent to zero.

At step 4508, for each band-pixel value of the redundant-information image 132, $AOU_{ij}$ calculates a transfer value according to the function $\Delta_{iji}(x)$, by communicating with neighbor array operation units 100. The band-pixel value representing the transfer value is regarded as a band-pixel value of a transfer-value image.

At step 4509, for each band-pixel value of the transfer-source inclination-redundant-information image 188, $AOU_{ij}$ transfers it according to the function $\Lambda^{**}_{ijk}(x,y)$, by communicating with neighbor array operation units 100. The transferred band-pixel value is regarded as a band-pixel value of a new transfer-source inclination-redundant-information image 188.

At step 4510, for each band-pixel value of the redundant-information image 132, $AOU_{ij}$ transfers it according to the function $\Lambda_{iji}(x)$, by communicating with neighbor array operation units 100. The transferred band-pixel value is regarded as a band-pixel value of a new redundant-information image 132.

At step 4511, $AOU_{ij}$ judges whether the transfer times representing the repeat times from step 4508 to step 4510 achieve the directed times or not. If the transfer times do not achieve the directed times (step 4511: NO), this algorithm returns to step 4508. If the transfer times achieve the directed times (step 4511: YES), this algorithm goes to step 4512. Note that the directed times are derived by the size of the formed edge-information image 115, the size of the object represented by the formed edge information 114, and the number of neighbors q. In a case that some parameters are set to specific numbers corresponding to the aim of use, there is no problem even though the directed times are set to more than the necessary times. If the directed times are too much, however, $AOU_{ij}$ takes much time to detect the position, the size and the form of the object.

At step 4512, for each band-pixel value of the redundant-information image 132, $AOU_{ij}$ calculates a transfer value according to the function $\Delta'_{iji}(x)$, by communicating with neighbor array operation units 100. The band-pixel value representing the transfer value is regarded as a band-pixel value of the transfer-value image.

At step 4513, for each band-pixel value of the transfer-source inclination-redundant-information image 188, $AOU_{ij}$ transfers it according to the function $\Lambda'^{**}_{ijk}(x,y)$, by communicating with neighbor array operation units 100. The transferred band-pixel value is regarded as a band-pixel value of a new transfer-source inclination-redundant-information image 188.

At step 4514, for each band-pixel value of the redundant-information image 132, $AOU_{ij}$ transfers it according to the function $\Lambda'_{iji}(x)$, by communicating with neighbor array operation units 100. The transferred band-pixel value is regarded as a band-pixel value of a new redundant-information image 132.

At step 4515, $AOU_{ij}$ judges whether the degeneration times representing the repeat times from step 4508 to step 4514 achieve the directed times or not. If the degeneration times do not achieve the directed times (step 4515: NO), this algorithm returns to step 4508. If the degeneration times achieve the directed times (step 4515: YES), this algorithm goes to step 4516. Note that the directed times are derived by the size of the formed edge-information image 115, the size of the object represented by the formed edge information 115, and the number of neighbors q. In a case that some parameters are set to specific numbers corresponding to the aim of use, there is no problem even though the directed times are set to more than the necessary times. If the directed times are too much, however, $AOU_{ij}$ takes much time to detect the position, the size and the form of the object.

At step 4516, $AOU_{ij}$ outputs a band-pixel value of the redundant-information image 132 and each band-pixel value of the transfer-source inclination-redundant-information image 188. This algorithm then returns to step 4503.

Note that each redundant information 131 of the redundant-information image 132 consequently means the size of the object, whose center is a position of the redundant-information image 132, because it means the total number of the formed edge information 114 around the position. In addition, almost all transfer-source inclination-redundant information 187 gathers at one place with the redundant information 131, because the transfer-source inclination-redundant information 187 exists at the pixel which has the redundant information 131. Moreover, sum of transfer-source inclination-redundant information 187 at a center of each of domains of inclination angles θ of line segments almost coincide with the size of the object.

The position/size/form detection means 45 can generate the redundant-information image 132 and the transfer-source inclination-redundant-information image 188 from the formed edge-information image 115, by using the data processing device 110 consisting of array operation units 100. Note that the function $\Delta'_{iji}(x)$ and the function $\Delta''_{iji}(x)$ can be used alternately in step 4512 if an approximate position of a center of gravity of an object represented by the redundant-information image 132 shifts much from a real position of the center of gravity. Similarly, the function $\Lambda'^{}_{ijk}(x,y)$ and the function $\Lambda''^{}_{ijk}(x,y)$ can be used alternately in step 4513, and the function $\Lambda'_{iji}(x)$ and the function $\Lambda'_{iji}(x)$ can be used alternately in step 4514.

Suppose here that an inclination angle θ is segmented into four domains of 0 degree (0 radian), 45 degrees (π/4 radian), 90 degrees (π/2 radian) and 135 degrees (3π/4 radian), according to EQ.54. In short, the inclination angle θ represents a normal angle of a line segment represented by a formed edge-information image 115. It is explained here about a method generating a form-size-information image 190 from a transfer-source inclination-redundant-information image 188, referring to this example.

First, suppose that a 36-band grayscale image x is the transfer-source inclination-redundant-information image 188. The image x is divided into four images every 9 bands, and they are the transfer-source redundant-information images 184 corresponding to line segments of the inclination angles θ segmented into 0 degree, 45 degrees, 90 degrees and 135 degrees, respectively. Here, transfer direction of the line segments $\theta^*_{i,j,k+1}(x)$ is derived, by transforming EQ.52 into EQ.67. Note that k denotes the domain of 0 degree if k=0, k denotes the domain of 45 degree if k=1, k denotes the domain of 90 degree if k=2, and k denotes the domain of 135 degree if k=3.

memorize a look-up table preparing the necessary number of the transfer directions instead of a table of logarithms.

Suppose here that form $\chi_{ijl}(x)$ of an object at a position p(i,j,k) in the 36-band grayscale image x is either a horizontal line segment (0 degree), a upward line segment (45 degrees), a vertical line segment (90 degrees), a downward line segment (135 degrees), a cross (0 degree), an X (45 degrees), a star (a combination of the cross and the X), a upward triangle, a downward triangle, a leftward triangle, a rightward triangle, a rectangle, a rhombus (90 degrees), a circle or other, and numbers of 1 to 15 are assigned to them, respectively. The form $\chi_{ijl}(x)$ of the object is calculated, according to EQ.68 and EQ.69. Note that the number of bands is one, for convenience' sake.

$$\theta^*_{i,j,k+1}(x) \quad (67)$$

$$= \begin{cases} 0 & \text{if } x_{i,j,9k+2} + x_{i,j,9k+6} = 0 \\ & \text{and } x_{i,j,9k+4} + x_{i,j,9k+8} = 0, \\ \arctan\left(\dfrac{x_{i,j,9k+2} + x_{i,j,9k+6}}{x_{i,j,9k+4} + x_{i,j,9k+8}}\right) - \dfrac{\pi}{4} & \text{if } x_{i,j,9k+1} + x_{i,j,9k+5} \geq x_{i,j,9k+3} + x_{i,j,9k+7} \\ & \text{and } x_{i,j,9k+2} + x_{i,j,9k+6} \geq x_{i,j,9k+4} + x_{i,j,9k+8} \\ & \text{except } x_{i,j,9k+2} + x_{i,j,9k+6} = 0 \\ & \text{and } x_{i,j,9k+4} + x_{i,j,9k+8} = 0, \\ \arctan\left(\dfrac{x_{i,j,9k+2} + x_{i,j,9k+6}}{x_{i,j,9k+4} + x_{i,j,9k+8}}\right) + \dfrac{3\pi}{4} & \text{if } x_{i,j,9k+1} + x_{i,j,9k+5} \geq x_{i,j,9k+3} + x_{i,j,9k+7}, \\ & \text{and } x_{i,j,9k+2} + x_{i,j,9k+6} < x_{i,j,9k+4} + x_{i,j,9k+8}, \\ \arctan\left(\dfrac{x_{i,j,9k+4} + x_{i,j,9k+8}}{x_{i,j,9k+2} + x_{i,j,9k+6}}\right) + \dfrac{\pi}{4} & \text{otherwise.} \end{cases}$$

Of course, if the transfer direction $\theta^*_{i,j,k+1}(x)$ can be represented by a specific interval, a memory 102 has only to $$\chi_{ij1}(x) = \begin{cases} 1 & \text{if } x_{i,j,9} > 0, \, 2x_{i,j,18} < x_{i,j,9}, \, 2x_{i,j,27} < x_{i,j,9}, \, 2x_{i,j,36} < x_{i,j,9}, \\ 2 & \text{if } 2x_{i,j,9} < x_{i,j,18}, \, x_{i,j,18} > 0, \, 2x_{i,j,27} < x_{i,j,18}, \, 2x_{i,j,36} < x_{i,j,18}, \\ 3 & \text{if } 2x_{i,j,9} < x_{i,j,27}, \, 2x_{i,j,18} < x_{i,j,27}, \, x_{i,j,27} > 0, \, 2x_{i,j,36} < x_{i,j,27}, \\ 4 & \text{if } 2x_{i,j,9} < x_{i,j,36}, \, 2x_{i,j,18} < x_{i,j,36}, \, 2x_{i,j,27} < x_{i,j,36}, \, x_{i,j,36} > 0, \\ 5 & \text{if } 2x_{i,j,18} < \min(x_{i,j,9}, x_{i,j,27}), \, 2x_{i,j,36} < \min(x_{i,j,9}, x_{i,j,27}), \\ & x_{i,j,9} > 0, \, x_{i,j,27} > 0, \, 0 \leq \theta^*_{ij1} < \dfrac{\pi}{4}, \, \dfrac{3\pi}{4} \leq \theta^*_{ij1} < \pi, \, \dfrac{\pi}{4} \leq \theta^*_{ij3} < \dfrac{3\pi}{4}, \\ 6 & \text{if } 2x_{i,j,9} < \min(x_{i,j,18}, x_{i,j,36}), \, x_{i,j,18} > 0, \\ & 2x_{i,j,27} < \min(x_{i,j,18}, x_{i,j,36}), \, x_{i,j,36} > 0, \, 0 \leq \theta^*_{ij2} < \dfrac{\pi}{2}, \, \dfrac{\pi}{2} \leq \theta^*_{ij4} < \pi, \\ 7 & \text{if } 2x_{i,j,18} > \min(x_{i,j,9}, x_{i,j,27}), \, 2x_{i,j,36} > \min(x_{i,j,9}, x_{i,j,27}), \\ & x_{i,j,9} > 0, \, x_{i,j,27} > 0, \, 0 \leq \theta^*_{ij1} < \dfrac{\pi}{4} \text{ or } \dfrac{3\pi}{4} \leq \theta^*_{ij1} < \pi, \, 0 \leq \theta^*_{ij2} < \dfrac{\pi}{2}, \\ & \dfrac{\pi}{4} \leq \theta^*_{ij3} < \dfrac{3\pi}{4}, \, \dfrac{\pi}{4} \leq \theta^*_{ij4} < \dfrac{3\pi}{4}, \\ & \text{or if } 2x_{i,j,9} > \min(x_{i,j,18}, x_{i,j,36}), \, x_{i,j,18} > 0, \\ & 2x_{i,j,27} > \min(x_{i,j,18}, x_{i,j,36}), \, x_{i,j,36} > 0, \, 0 \leq \theta^*_{ij1} < \dfrac{\pi}{4} \text{ or } \\ & \dfrac{3\pi}{4} \leq \theta^*_{ij1} < \pi, \, 0 \leq \theta^*_{ij2} < \dfrac{\pi}{2}, \, \dfrac{\pi}{4} \leq \theta^*_{ij3} < \dfrac{3\pi}{4}, \, \dfrac{\pi}{4} \leq \theta^*_{ij4} < \dfrac{3\pi}{4}. \end{cases} \quad (68)$$

$$\chi_{ij1}(x) = \begin{cases} 8 & \text{if } x_{i,j,9} > 0, x_{i,j,18} > 0, 2x_{i,j,27} < \min(x_{i,j,9}, x_{i,j,18}, x_{i,j,36}), x_{i,j,36} > 0, \\ & x_{i,j,10} + x_{i,j,11} + x_{i,j,17} < x_{i,j,13} + x_{i,j,14} + x_{i,j,15}, \\ & x_{i,j,28} + x_{i,j,29} + x_{i,j,35} > x_{i,j,31} + x_{i,j,32} + x_{i,j,33}, \\ & 0 \le \theta^*_{ij2} < \frac{\pi}{4} \text{ or } \frac{3\pi}{4} \le \theta^*_{ij2} < \pi, 0 \le \theta^*_{ij4} < \frac{\pi}{4} \text{ or } \frac{3\pi}{4} \le \theta^*_{ij4} < \pi, \\ 9 & \text{if } x_{i,j,9} > 0, x_{i,j,18} > 0, 2x_{i,j,27} < \min(x_{i,j,9}, x_{i,j,18}, x_{i,j,36}), x_{i,j,36} > 0, \\ & x_{i,j,10} + x_{i,j,11} + x_{i,j,17} > x_{i,j,13} + x_{i,j,14} + x_{i,j,15}, \\ & x_{i,j,28} + x_{i,j,29} + x_{i,j,35} < x_{i,j,31} + x_{i,j,32} + x_{i,j,33}, \\ & 0 \le \theta^*_{ij2} < \frac{\pi}{4} \text{ or } \frac{3\pi}{4} \le \theta^*_{ij2} < \pi, 0 \le \theta^*_{ij4} < \frac{\pi}{4} \text{ or } \frac{3\pi}{4} \le \theta^*_{ij4} < \pi, \\ 10 & \text{if } 2x_{i,j,9} < \min(x_{i,j,18}, x_{i,j,27}, x_{i,j,36}), x_{i,j,18} > 0, x_{i,j,27} > 0, x_{i,j,36} > 0, \\ & x_{i,j,11} + x_{i,j,12} + x_{i,j,13} < x_{i,j,15} + x_{i,j,16} + x_{i,j,17}, \\ & x_{i,j,29} + x_{i,j,30} + x_{i,j,31} > x_{i,j,33} + x_{i,j,34} + x_{i,j,35}, \\ & \frac{\pi}{4} \le \theta^*_{ij2} < \frac{3\pi}{4}, \frac{\pi}{4} \le \theta^*_{ij4} < \frac{3\pi}{4}, \\ 11 & \text{if } 2x_{i,j,9} < \min(x_{i,j,18}, x_{i,j,27}, x_{i,j,36}), x_{i,j,18} > 0, x_{i,j,27} > 0, x_{i,j,36} > 0, \\ & x_{i,j,11} + x_{i,j,12} + x_{i,j,13} < x_{i,j,15} + x_{i,j,16} + x_{i,j,17}, \\ & x_{i,j,29} + x_{i,j,30} + x_{i,j,31} < x_{i,j,33} + x_{i,j,34} + x_{i,j,35}, \\ & \frac{\pi}{4} \le \theta^*_{ij2} < \frac{3\pi}{4}, \frac{\pi}{4} \le \theta^*_{ij4} < \frac{3\pi}{4}, \\ 12 & \text{if } 2x_{i,j,18} < \min(x_{i,j,9}, x_{i,j,27}), 2x_{i,j,36} < \min(x_{i,j,9}, x_{i,j,27}), \\ & x_{i,j,9} > 0, x_{i,j,27} > 0, \frac{1\pi}{4} \le \theta^*_{ij1} < \frac{3\pi}{4}, 0 \le \theta^*_{ij3} < \frac{\pi}{4} \text{ or } \frac{3\pi}{4} \le \theta^*_{ij3} < \pi, \\ 13 & \text{if } 2x_{i,j,9} < \min(x_{i,j,18}, x_{i,j,36}), 2x_{i,j,27} < \min(x_{i,j,18}, x_{i,j,36}), \\ & x_{i,j,18} > 0, x_{i,j,36} > 0, \frac{\pi}{2} \le \theta^*_{ij2} < \pi, 0 \le \theta^*_{ij4} < \frac{\pi}{2}, \\ 14 & \text{if } 2x_{i,j,18} > \min(x_{i,j,9}, x_{i,j,27}), 2x_{i,j,36} > \min(x_{i,j,9}, x_{i,j,27}), \\ & x_{i,j,9} > 0, x_{i,j,27} > 0, \frac{\pi}{4} \le \theta^*_{ij1} < \frac{3\pi}{4}, 0 \le \theta^*_{ij3} < \frac{\pi}{4} \text{ or } \frac{3\pi}{4} \le \theta^*_{ij3} < \pi, \\ & \text{or if } 2x_{i,j,9} > \min(x_{i,j,18}, x_{i,j,36}), x_{i,j,18} > 0, \\ & 2x_{i,j,27} > \min(x_{i,j,18}, x_{i,j,36}), x_{i,j,36} > 0, \frac{\pi}{2} \le \theta^*_{ij2} < \pi, 0 \le \theta^*_{ij4} < \frac{\pi}{2}, \\ 15 & \text{otherwise.} \end{cases} \quad (69)$$

Of course, EQ.68 and EQ.69 can change conditions, according to accuracy. In addition, if the conditions are subdivided in EQ.68 and EQ.69 more and more, EQ.68 and EQ.69 can also discriminate form of distorted objects and form of objects in a noisy image. Moreover, a neural network like a Perceptron can be used instead of EQ.68 and EQ.69. On the other hand, if EQ.67 outputs either one of 0 degree (0 radian), 45 degrees ($\pi/2$ radian), 90 degrees ($\pi/2$ radian) and 135 degrees ($3\pi/4$ radian), by using EQ.53, conditional equations of EQ.68 and EQ.69 become simpler.

Figure 45:
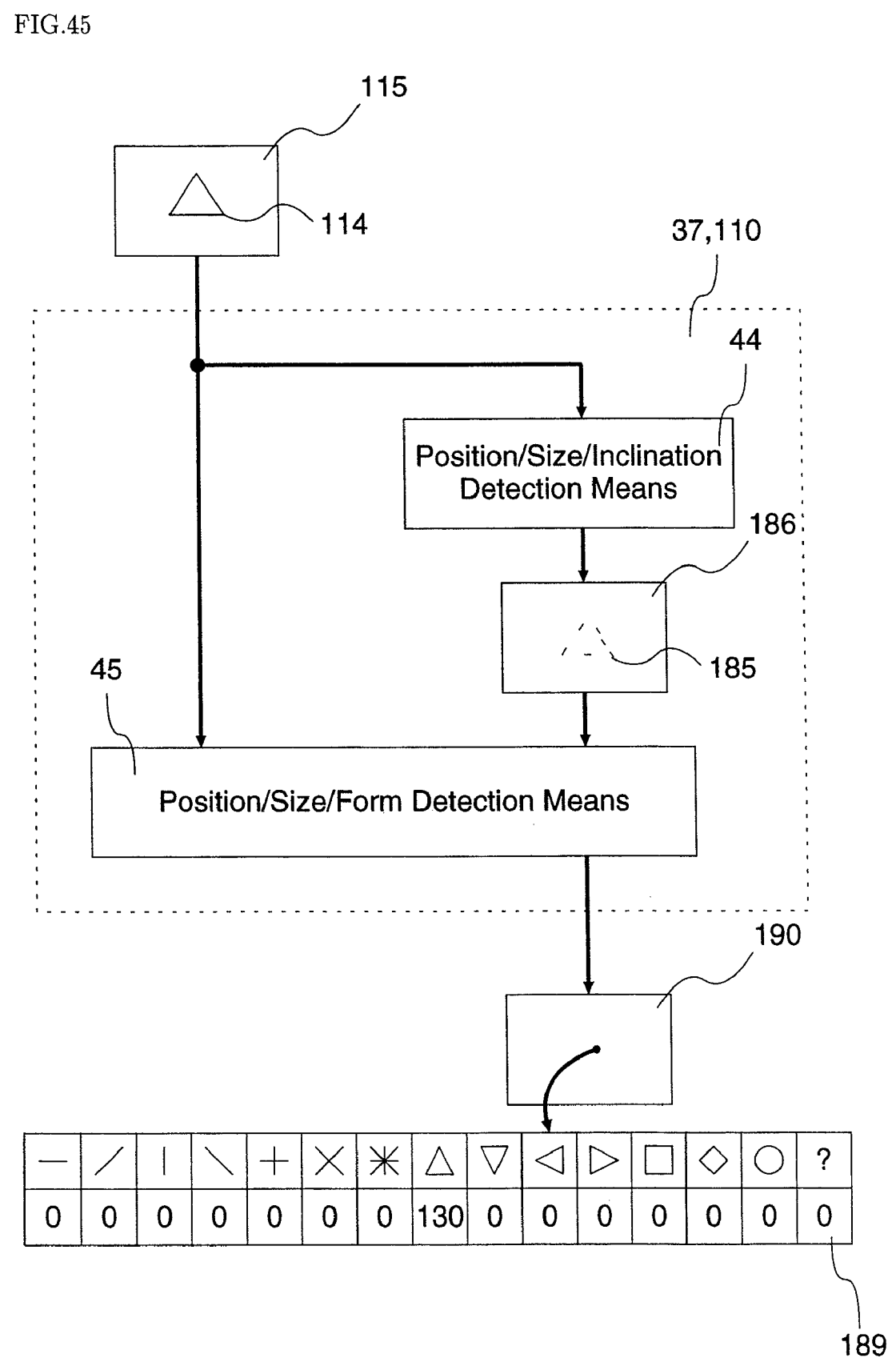

Since each of array operation units 100 in a position/size/form detection means 45 generates form-size information 189, combining form $\chi_{ijk}(x)$ of objects and redundant information 131 on the column i and the row j of a redundant-information image 132, the position/size/form detection means 45 can output a 15-band form-size-information image 190, each of whose band-pixel values represents size of the corresponding figure (refer to FIG. 45). Of course, the position/size/form detection means 45 can also output a two-band form-size-information image 190, one of whose band-pixel values represents a number of figure, and another band-pixel value represents size of the figure.

Now, by combining a position/size/inclination detection means 44 and a position/size/form detection means 45, a visual device 2 can detect form of an object from a formed edge-information image 115. It is explained here about a geometrical analysis means 37 which is a combination of the position/size/inclination detection means 44 and the position/size/form detection means 45.

Figure 43:
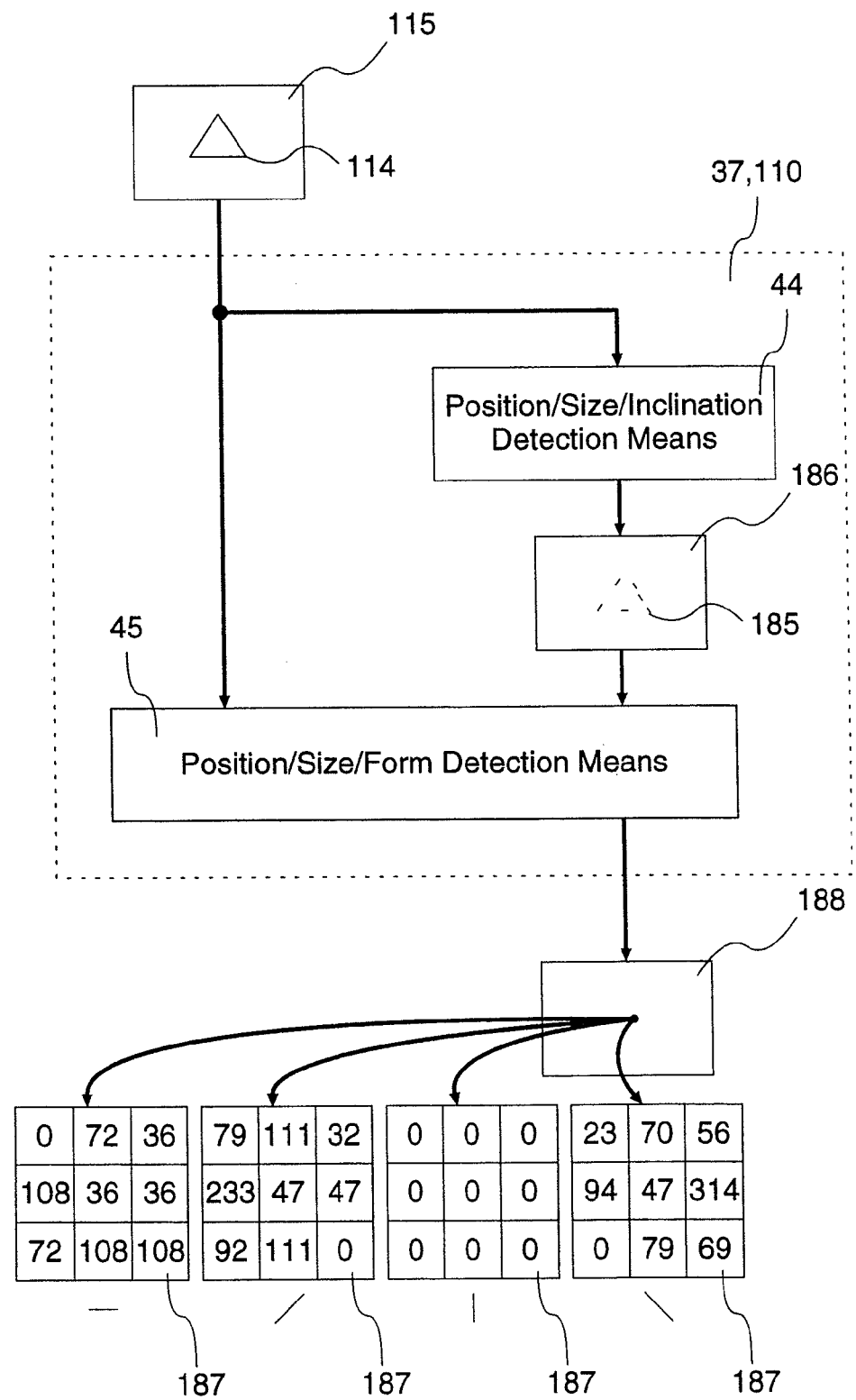
FIG. 43 is an explanation view for outputting a transfer-source inclination-redundant-information image after inputting a formed edge-information image representing a triangle.
Figure 44:
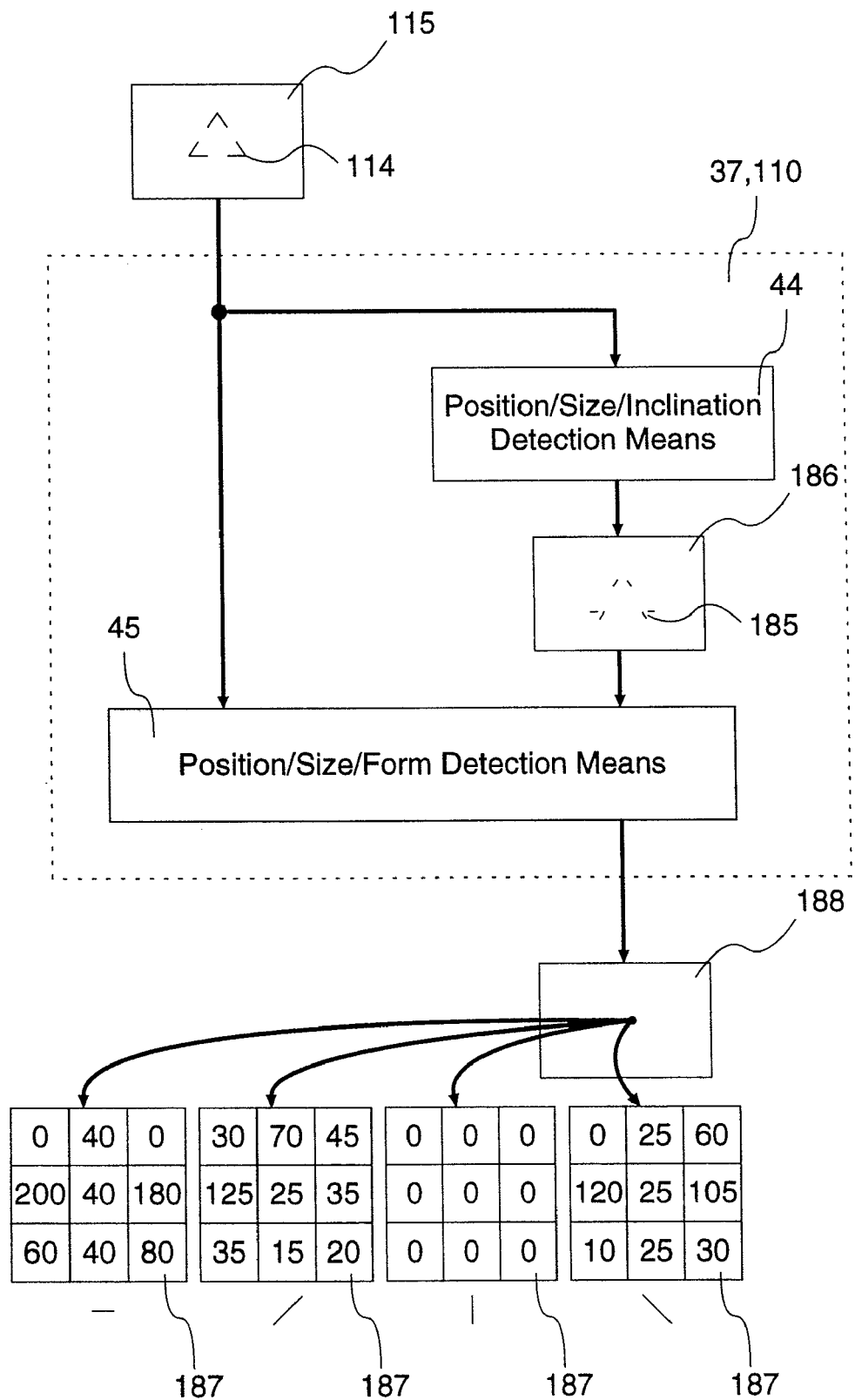
FIG. 44 is an explanation view for outputting a transfer-source inclination-redundant-information image after inputting a formed edge-information image representing an incomplete triangle.

First, as shown in FIG. 43, a geometrical analysis means 37 consists of a position/size/inclination detection means 44 and a position/size/form detection means 45. In addition, the position/size/inclination detection means 44 inputs a formed edge-information image 115 consisting of formed edge information 114 representing whether there are edges of objects or not, and outputs an inclination-size-information image 186 consisting of inclination-size information 185. Moreover, the position/size/form detection means 45 inputs the formed edge-information image 115 and the inclination-size-information image 186, and outputs a transfer-source inclination-redundant-information image 188 consisting of transfer-source inclination-redundant information 187. For example, in FIG. 43, the geometrical analysis means 37 detects some line segments leaning at 0 degree, 45 degrees and 135 degrees against a horizontal axis from a formed edge-information image 115 representing contours of a triangle. Note that, as shown in FIG. 44, the geometrical analysis means 37 can detect form of a triangle even though the formed edge-information image 115 represents contours of the triangle by dash lines. This can be guessed easily from a feature that the position/size/inclination detection means 44 hashes at least one line segment constructing a figure.

Next, as shown in FIG. 45, the geometrical analysis means 37 can directly output a form-size-information image 190 consisting of form-size information representing a discrimination result of form of an object in a formed edge-information image 115. In this case, although the position/size/form detection means 45 needs a method discriminating the form of the object from a transfer-source inclination-redundant-information image 188, the amount of data of the discrimination results outputted by the geometrical analysis means 37 becomes a much more little than the transfer-source inclination-redundant-information image 188. Note that a form-size-information image 190 can be a two-band image consisting of a band representing the form and a band representing size although FIG. 45 shows the form-size-information image 190 as all forms are arranged in a different band.

Figure 46:
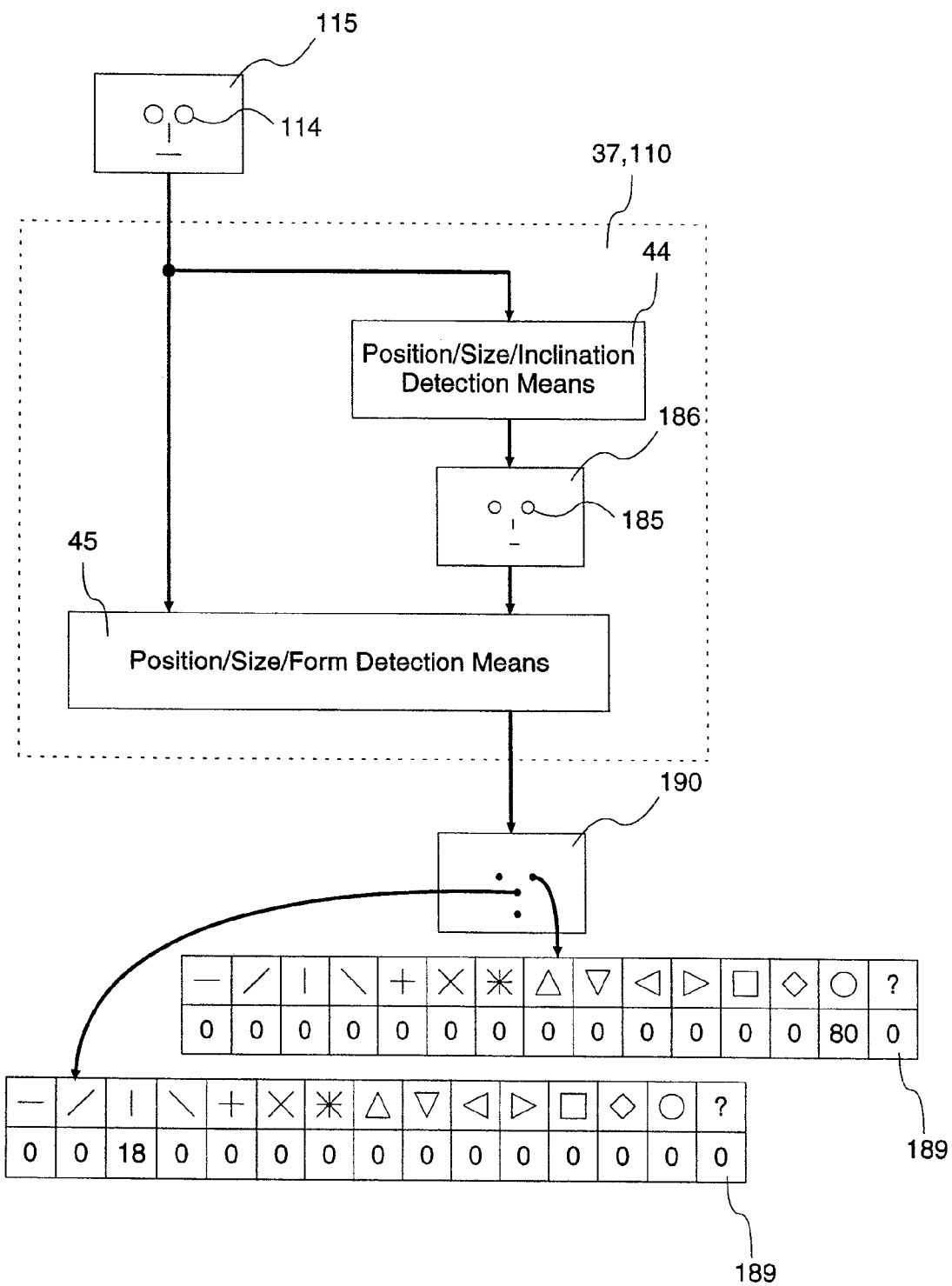
FIG. 46 is an explanation view for outputting a form-size-information image after inputting a formed edge-information image representing facial parts.
Figure 47:
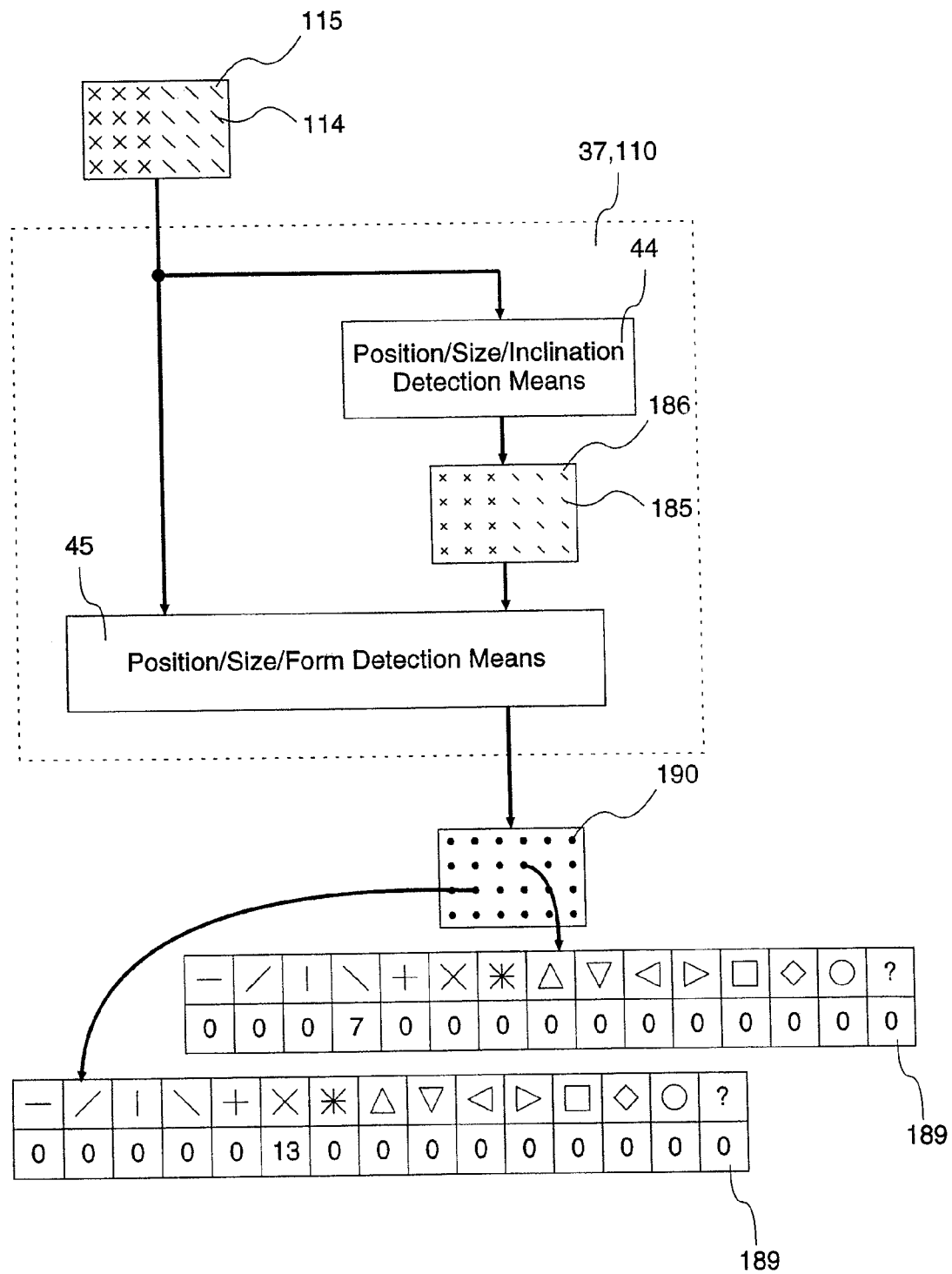
FIG. 47 is an explanation view for outputting a form-size-information image after inputting a formed edge-information image representing texture.

Finally, as shown in FIG. 46, the geometrical analysis means 37 can detect position, size and form of each figure, for a pattern consisting of some figures like a facial pattern. In addition, as shown in FIG. 47, the geometrical analysis means 37 can also detect form and size of figures within each minute area, by dividing texture into some minute areas.

It has been described above about a case that the geometrical analysis means 37 uses the formed edge-information image 115. However, if the image is a one-band image whose line width is about two or three pixels, the image can be generated in anyway.

Figure 48:
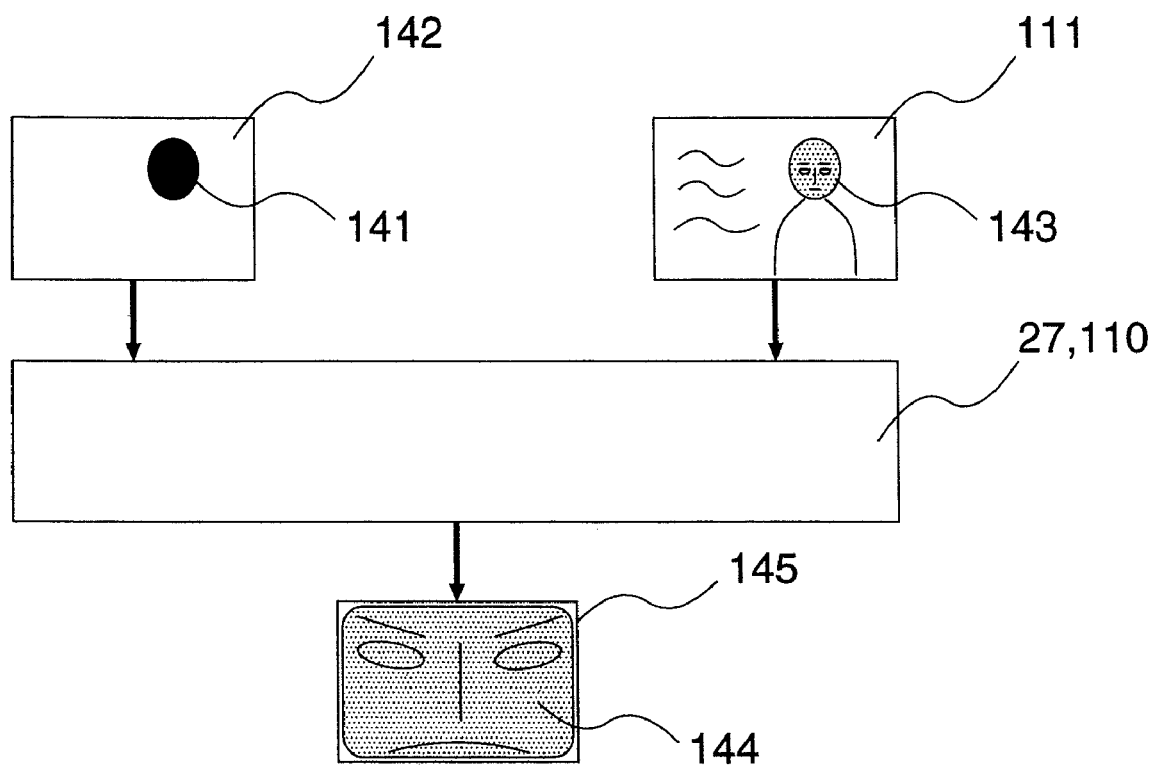
FIG. 48 is an explanation view for normalizing a segmented object area in a digital image.
Figure 49:
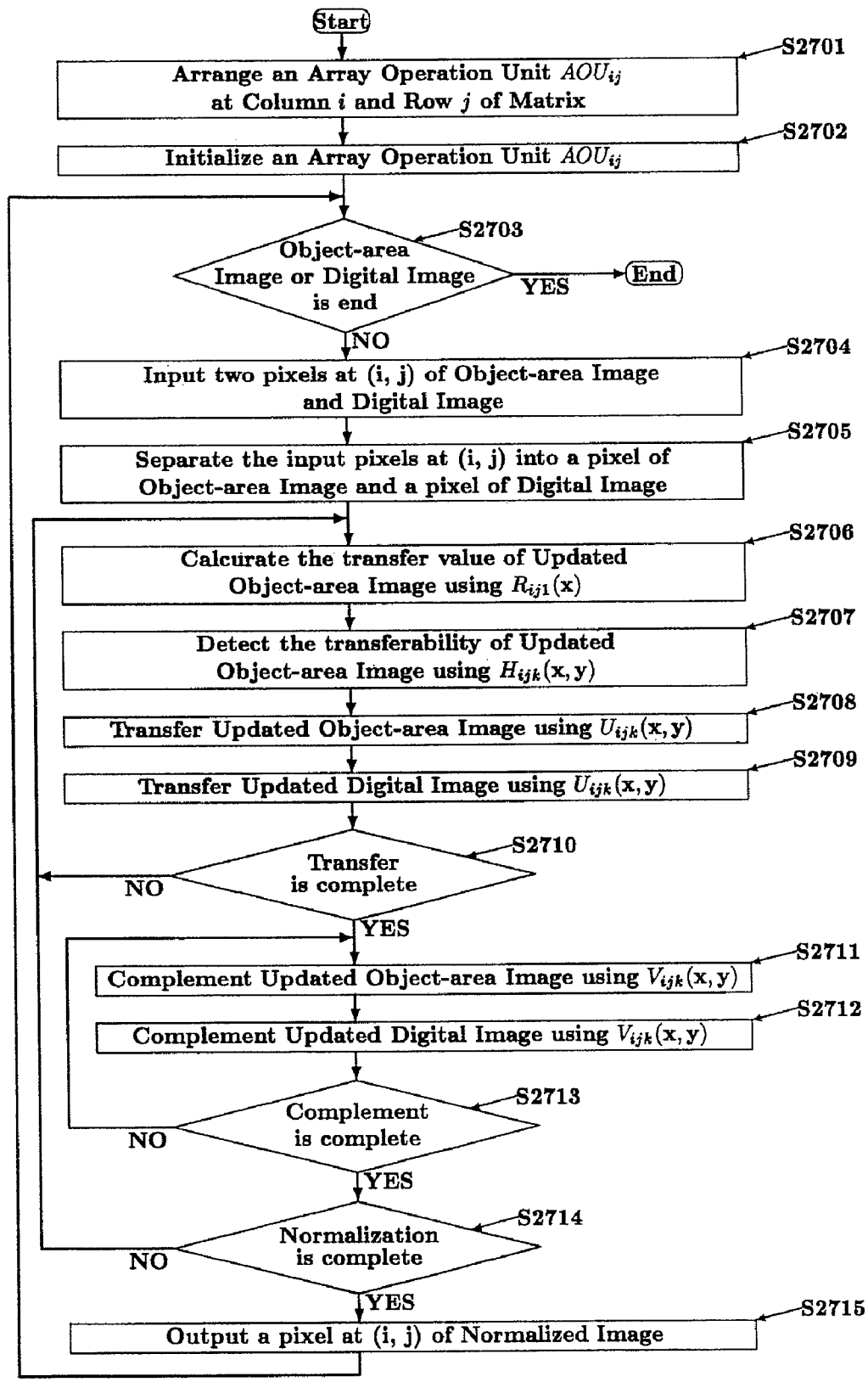
FIG. 49 is a flow chart appearing an algorithm of an area normalization means in this enforcement form.

As shown in FIG. 48, in order for the area normalization means 27 realized by a data processing device 110 to generate a normalized image 145 including a normalized area 144 from an object-area image 142 including an object area 141 and a digital image 111, array operation units 100 arranged in the shape of a lattice work synchronously in parallel. Let an array operation unit 100 at a column i and a row j of a matrix be $AOU_{ij}$. Algorithm of $AOU_{ij}$ is shown in FIG. 49.

At step 2701, $AOU_{ij}$ is arranged at the column i and the row j of the matrix. This is desired to decide neighbors of $AOU_{ij}$ even though the $AOU_{ij}$ is either logical or physical.

At step 2702, neighbors of $AOU_{ij}$ are set and its parameters are initialized. In setting the neighbors, the number of neighbors used in the above functions can be defined as either four or eight individually, or all of them can be defined as either four or eight uniformly. In order to make the normalized image 145 generated by the area normalization means 27 of the present invention more exact, the number of neighbors q has to be set a large number for all functions. The area normalization means 27, however, can cope with limitation of computational time to normalize a segmented object area 143 and the size of the input digital image 111, by varying the number of neighbors suitably.

At step 2703, $AOU_{ij}$ judges whether there is both an object-area image 142 and a digital image 111 inputted one by one or not. If there is not the object-area image 142 or the digital images 111 any more (step 2703: YES), this algorithm ends. If there is either the object-area image 142 or the digital image 111 (step 2703: NO), this algorithm goes to step 2704. Note that this algorithm can be an infinite loop when array operation units 100 are realized for a specific size of the image.

At step 2704, $AOU_{ij}$ inputs one band of a pixel on the column i and the row j of the object-area image 142 and the whole pixel on the column i and the row j of the digital image 111. This is done for $AOU_{ij}$ to process collectively the pixel on the column i and the row j of the object-area image 142 and the pixel on the column i and the row j of the digital image 111. Therefore, $AOU_{ij}$ needs a memory 102 memorizing at least the number of total bands of image data.

At step 2705, $AOU_{ij}$ separates the pixel on the column i and the row j of the object-area image 142 and the pixel on the column i and the row j of the digital image 111. This is done for $AOU_{ij}$ to process the pixel on the column i and the row j of the object-area image 142 and the pixel on the column i and the row j of the digital image 111 as two pixel of independent images, respectively. If the pixel on the column i and the row j of the object-area image 142 and the pixel on the column i and the row j of the digital image 111 are separated beforehand, followed by being inputted, $AOU_{ij}$ carries out nothing. The object-area image 142 and the digital image 111 can be copied an updated object-area image and an updated digital image, respectively.

At step 2706, for each band-pixel value of the updated object-area image, $AOU_{ij}$ calculates a transfer value, according to the function $R_{ijk}(x)$, by communicating with neighbor array operation units 100. The band-pixel value representing the transfer value is regarded as a band-pixel value of a transfer-value image.

At step 2707, for each band-pixel value of the updated object-area image, $AOU_{ij}$ can find a transfer-place band-pixel value possible to transfer according to the function $H_{ijk}(x,y)$, by communicating with neighbor array operation units 100. The value representing whether the transfer-place band-pixel value is a transfer place possible to transfer or not is regarded as a band-pixel value of a transferable image.

At step 2708, for each band-pixel value of the updated object-area image, $AOU_{ij}$ transfers it to the transfer place according to the function $U_{ijk}(x,y)$, by communicating with neighbor array operation units 100. The transferred band-pixel value is regarded as a band-pixel value of a new updated object-area image.

At step 2709, for each band-pixel value of the updated digital image, $AOU_{ij}$ transfers it to the transfer place according to the function $U_{ijk}(x,y)$, by communicating with neighbor array operation units 100. The transferred band-pixel value is regarded as a band-pixel value of a new updated digital image.

At step 2710, $AOU_{ij}$ judges whether the transfer times representing the repeat times from step 2706 to step 2709 achieve the directed times or not. If the transfer times do not achieve the directed times (step 2710: NO), this algorithm returns to step 2706. If the transfer times achieve the directed times (step 2710: YES), this algorithm goes to step 2711. Note that the directed times are derived by the size of the digital image 111, the size of the segmented object area 143 of the digital image 111, and the number of neighbors q. In a case that some parameters are set to specific numbers corresponding to the aim of use, there is no problem even though the directed times are set to more than the necessary times. If the directed times are too much, however, $AOU_{ij}$ takes much time to normalize the images.

At step 2711, for each band-pixel value of the updated object-area image which has been finished transferring, $AOU_{ij}$ complements it with the average of its neighbors according to the function $V_{ijk}(x,y)$, by communicating with neighbor array operation units 100. Note that both x and y are dealt as the updated object-area image. The complemented band-pixel value is regarded as a band-pixel value of a normalized updated object-area image.

At step 2712, for each band-pixel value of the updated digital image which has been finished transferring, $AOU_{ij}$ complements it with the average of its neighbors according to the function $V_{ijk}(x,y)$, by communicating with neighbor array operation units 100. Note that x is dealt as the updated digital image, and y is dealt as the updated object-area image. The transferred band-pixel value is regarded as a band-pixel value of a normalized digital image.

At step 2713, $AOU_{ij}$ judges whether the transfer times representing the complement times from step 2711 to step 2712 achieve the directed times or not. If the complement times do not achieve the directed times (step 2713: NO), this algorithm returns to step 2711. If the complement times achieve the directed times (step 2713: YES), this algorithm goes to step 2714. In general, there is no problem if the complement times are about half of the number of neighbors q.

At step 2714, $AOU_{ij}$ judges whether the remain times representing the repeat times from step 2706 to step 2713 achieve the directed times or not. If the remain times do not achieve the directed times (step 2714: NO), this algorithm returns to step 2706. If the remain times achieve the directed times (step 2714: YES), this algorithm goes to step 2715. Note that the directed times are derived by the size of the digital image 111, the size of the segmented object area 143 of the digital image 111, and the number of neighbors q. In a case that some parameters are set to specific numbers corresponding to the aim of use, there is no problem even though the directed times are set to more than the necessary times. If the directed times are too much, however, $AOU_{ij}$ takes much time to normalize the images.

At step 2715, $AOU_{ij}$ outputs a band-pixel value of the updated digital image as a band-pixel value of the normalized image 145. This algorithm then returns to step 2703. The area normalization means 27 can generate the normalized image 145 from the object-area image 142 and the digital image 111, by using the data processing device 110 consisting of array operation units 100.

Figure 50:
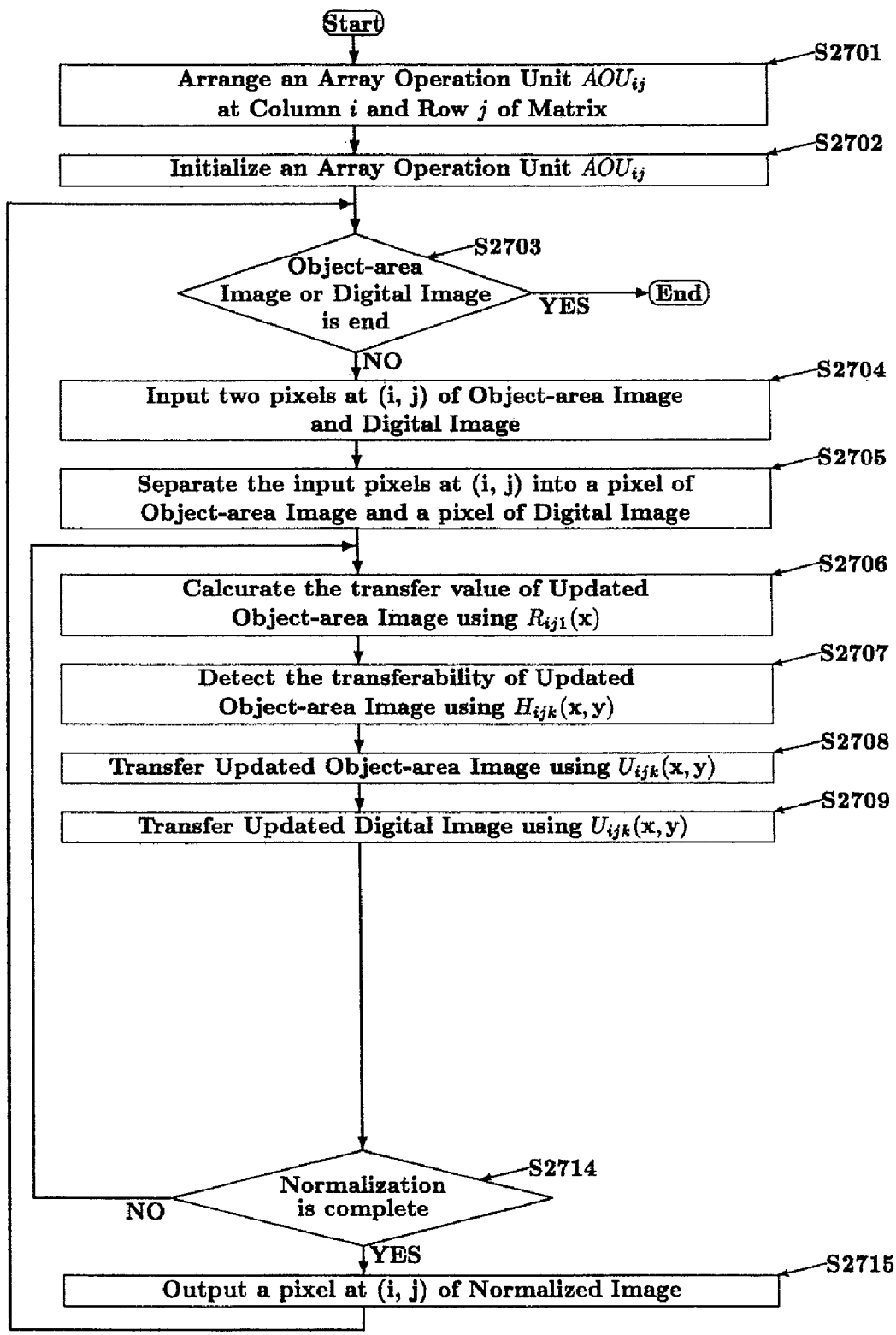
FIG. 50 is a flow chart appearing an algorithm of an area normalization means in this enforcement form, in a case of omitting complement between pixels.

Here, in a case that a pixel comprises independent information like a form-size-information image 190, an area normalization means 27 does not have to complement between the pixels. In this case, as shown in FIG. 50, the area normalization means 27 can omit step 2710, 2711, 2712 and 2713. In short, the area normalization means 27 does not have to carry out the function $V_{ijk}(x,y)$. Therefore, when the array operation unit 100 is realized by a hardware, a division circuit can be omitted. Note that a method using a normalized image 145 normalized from a segmented object area 143 as before is also useful for pattern matching of an eyeball pattern and a striped pattern.

Figure 51:
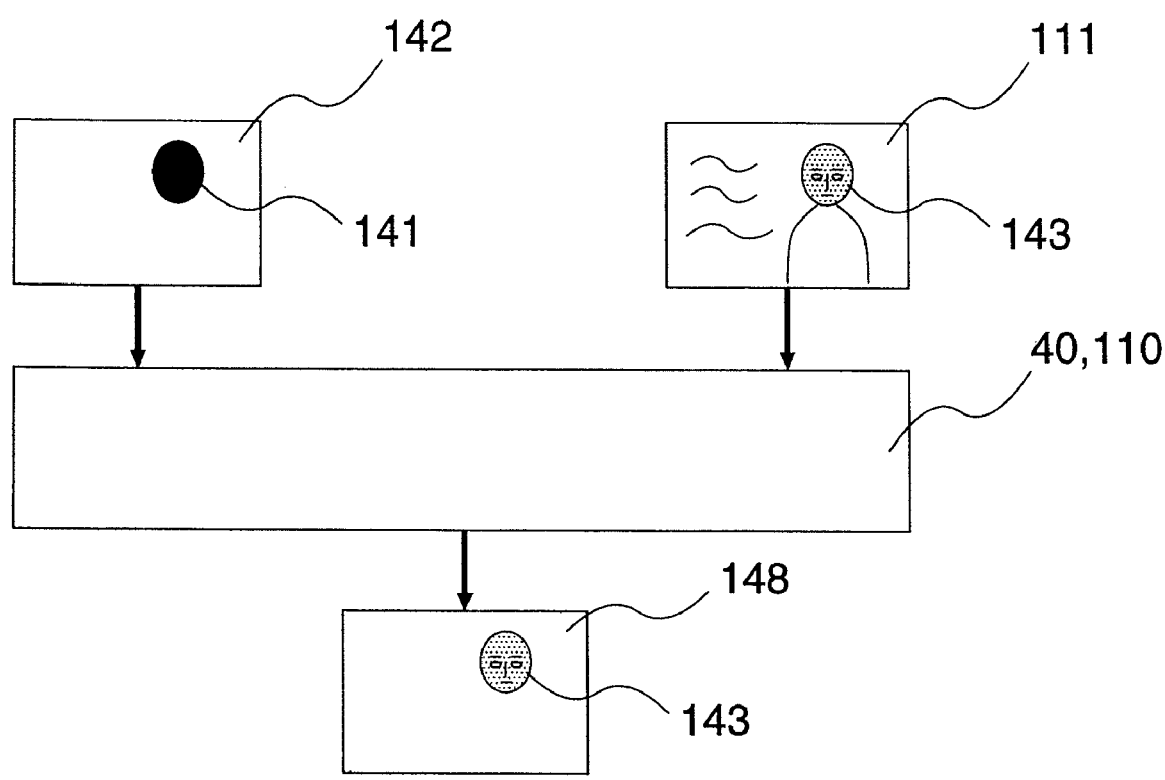
FIG. 51 is an explanation view for generating a masked image from a digital image, using a segmented object-area image.
Figure 52:
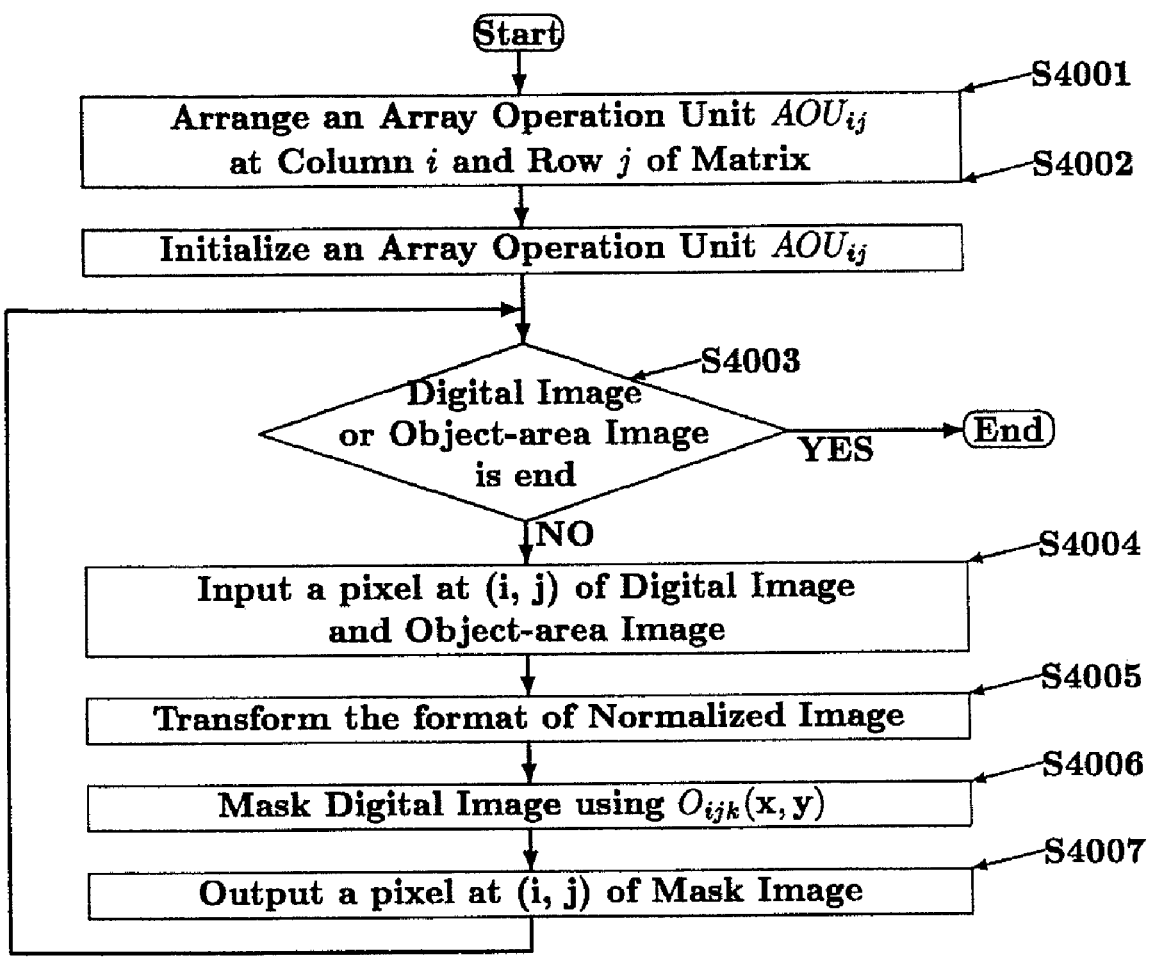
FIG. 52 is a flow chart appearing an algorithm of a mask means in this enforcement form.

As shown in FIG. 51, in order for the mask means 40 realized by a data processing device 110 to generate a masked image 148 from a digital image 111 and an object-area image 142, array operation units 100 arranged in the shape of a lattice work synchronously in parallel. Let an array operation unit 100 at a column i and a row j of a matrix be $AOU_{ij}$. Algorithm of $AOU_{ij}$ is shown in FIG. 52.

At step 4001, $AOU_{ij}$ is arranged at the column i and the row j of the matrix. This is desired to decide neighbors of $AOU_{ij}$ even though the $AOU_{ij}$ is either logical or physical.

At step 4002, neighbors of $AOU_{ij}$ are set and its parameters are initialized.

At step 4003, $AOU_{ij}$ judges whether there are both a digital image 111 and an object-area image 142 inputted one by one or not. If there is not the digital image 111 or the object-area image 142 any more (step 4003: YES), this algorithm ends. If there is either the digital image 111 or the object-area image 142 (step 4003: NO), this algorithm goes to step 4004. Note that this algorithm can be an infinite loop when array operation units 100 are realized for a specific size of the image.

At step 4004, $AOU_{ij}$ inputs the whole pixel on the column i and the row j of the digital image 111 and the whole pixel on the column i and the row j of the object-area image 142. This is done for $AOU_{ij}$ to process collectively the pixel on the column i and the row j of the digital image 111 and the pixel on the column i and the row j of the object-area image 142. Therefore, $AOU_{ij}$ needs a memory 102 memorizing at least the number of bands of image data.

At step 4005, for each band-pixel value of the digital image 111, $AOU_{ij}$ carries out mask processing, according to the function $O_{ijk}(x,y)$ The masked band-pixel value is regarded as a band-pixel value of a masked image 148.

At step 4006, $AOU_{ij}$ outputs the band-pixel value of the masked image 148. This algorithm then returns to step 4003.

Figure 53:
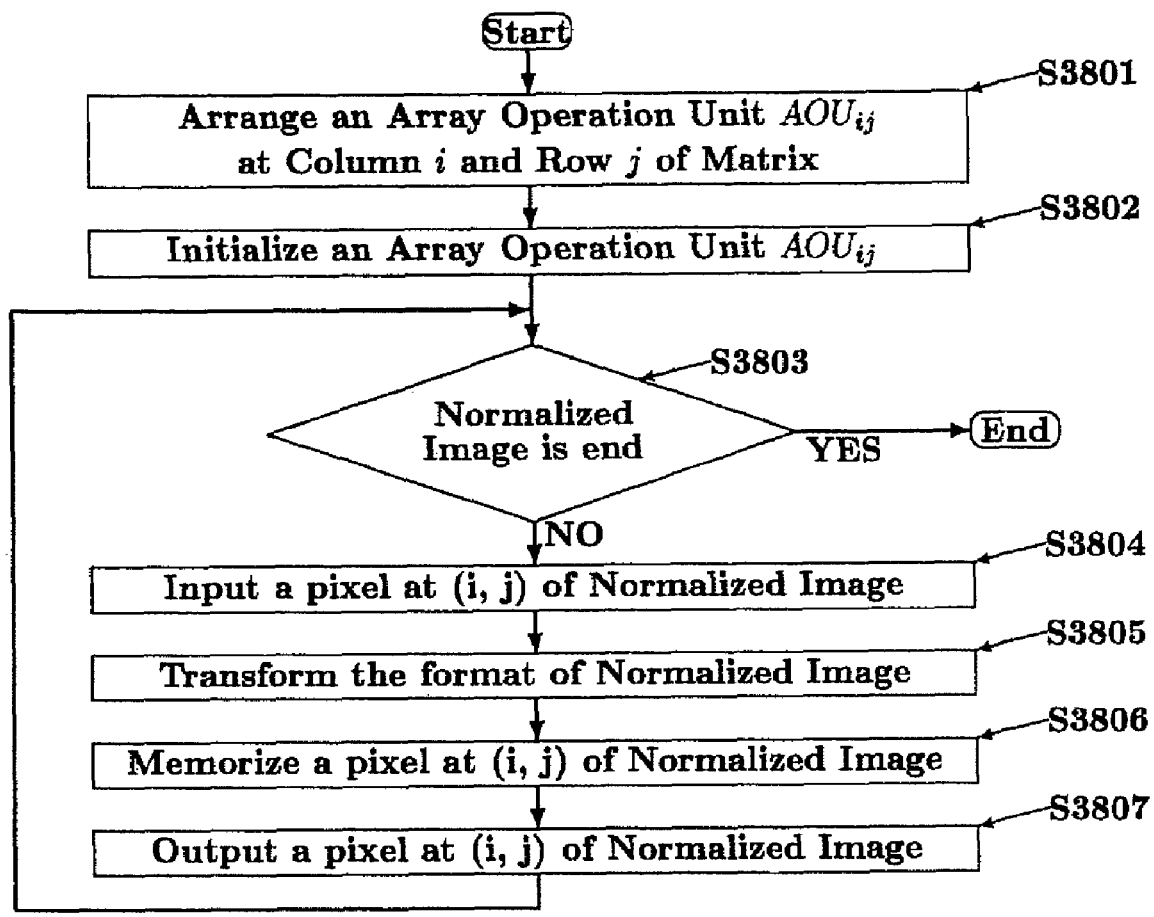
FIG. 53 is a flow chart appearing an algorithm of an image keeping means in this enforcement form.

The mask means 40 can mask the digital image 111 except a segmented object area 143, by using the data processing device 110 consisting of array operation units 100. In order for the image keeping means 39 realized by a data processing device 110 to memorize a normalized image 145, array operation units 100 arranged in the shape of a lattice work synchronously in parallel. Let an array operation unit 100 at a column i and a row j of a matrix be $AOU_{ij}$. Algorithm of $AOU_{ij}$ is shown in FIG. 53.

At step 3801, $AOU_{ij}$ is arranged at the column i and the row j of the matrix. This is desired to decide neighbors of $AOU_{ij}$ even though the $AOU_{ij}$ is either logical or physical.

At step 3802, neighbors of $AOU_{ij}$ are set and its parameters are initialized.

At step 3803, $AOU_{ij}$ judges whether there is a normalized image 145 inputted one by one or not. If there is not the normalized image 145 any more (step 3803: YES), this algorithm ends. If there is the normalized image 145 (step 3803: NO), this algorithm goes to step 3804. Note that this algorithm can be an infinite loop when array operation units 100 are realized for a specific size of the image.

At step 3804, $AOU_{ij}$ inputs the whole pixel on the column i and the row j of the normalized image 145. Therefore, $AOU_{ij}$ needs a memory 102 memorizing at least the number of bands of image data.

At step 3805, $AOU_{ij}$ changes the format of the normalized image 145 if desired, for a device of an output place. This is useful for the device to generate analog signals easily, especially by converting the normalized image 145 to any one-band image, or converting the normalized image 145, the number of whose bands is four or more, to any three-band image. Otherwise, $AOU_{ij}$ does nothing.

At step 3806, $AOU_{ij}$ memorizes a pixel on the column i and the row j of the normalized image 145, as it can certainly send image data to the devices of the output place, which has the different computational power from it.

At step 3807, $AOU_{ij}$ outputs a band-pixel value of the normalized image 145. This algorithm then returns to step 3803.

The image keeping means 39 can output the normalized image 145, by using the data processing device 110 consisting of array operation units 100. Note that the image keeping means 39 which keeps the digital image 111 or the masked image 148 also carries out this algorithms similarly.

Now, the image memorization means 12, the color-information generation means 41, the edge-information generation means 14, the edge-information formation means 15, the position/size detection means 17, the position/size/inclination detection means 44, the area normalization means 27, the mask means 40 and the image keeping means 39 have been described above. Note that they carry out image processing consisting of only neighbor processing after the data processing device 110 inputted one or two image. The pattern matching means 38, however, must use very many images. It is explained here about a method realizing the pattern matching means 38 in the data processing device 110, showing neighbor processing used in the pattern matching means 38. Suppose first that an image is denoted as x, and n template images 146 as $y^1, y^2, y^h, y^n$. For a natural number g, a matching result $\delta_{ij}$ for a pixel on the column i and the row j of a matching-result image 147 represents a number of template image 146 which has the most similar pixel as the pixel of the normalized image 145 after comparing the pixels on the column i and the row j of the image x and the template image 146. Note that the number of bands of the matching-result image 147 is dealt with one, for convenience' sake, because the matching-result image 147 becomes a one-band image. The third index of the matching result $\delta_{ijl}$ is then equal to one. In addition, in a case of q=0, q neighbors have no pixels.

$$\delta_{ij1} = \begin{cases} g & \text{if } \sum_k (x_{ijk} - y^g_{lmk})^2 = \min_{1 \le h \le n} \sum_k (x_{ijk} - y^h_{stk})^2 \\ & \text{for } 1 \le g \le n \text{ and only one } g, \\ & \text{and } \forall\, p(s, t, k) \in \{p(i, j, k), P_{i,j,k}(q)\}, \\ & \text{and only one } p(l, m, k) \in \{p(i, j, k), P_{i,j,k}(q)\}, \\ 0 & \text{otherwise.} \end{cases} \quad (70)$$

Figure 54:
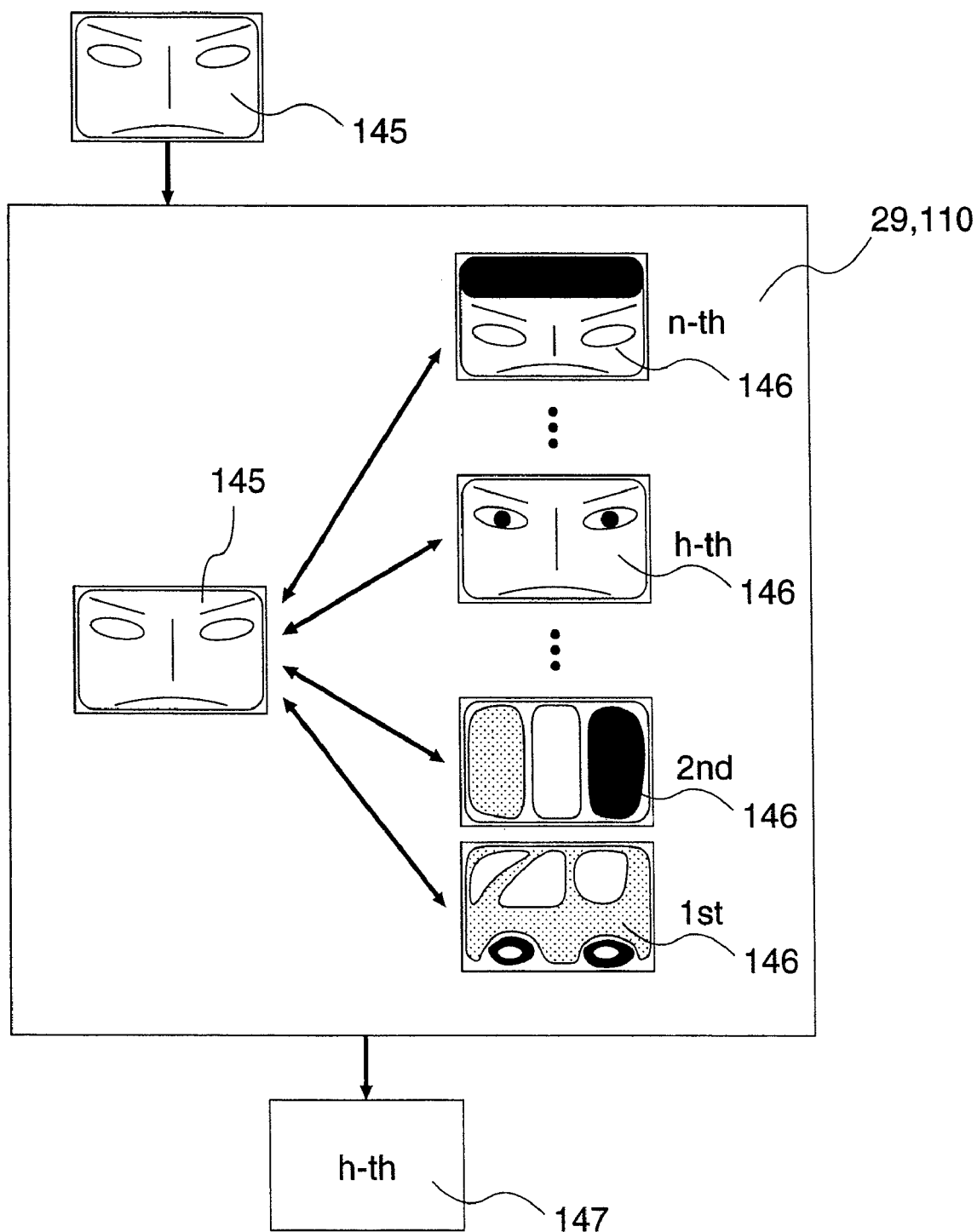
FIG. 54 is an explanation view for carrying out pattern matching of a normalized image with some template images.
Figure 55:
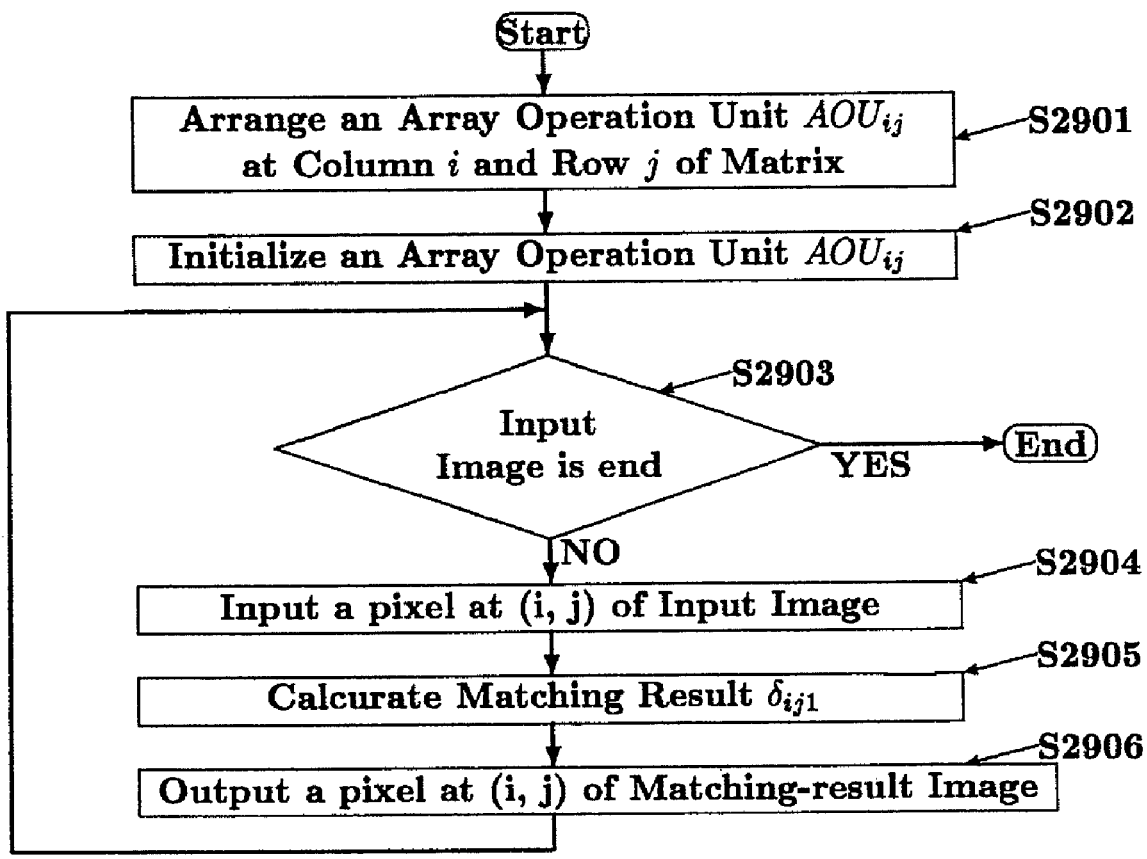
FIG. 55 is a flow chart appearing an algorithm of a pattern matching means in this enforcement form.

As shown in FIG. 54, in order for pattern matching realized by a data processing device 110 to generate a matching-result image 147 consisting of matching results representing a number of a template image 146 which is most similar to a normalized image 145, array operation units 100 arranged in the shape of a lattice work synchronously in parallel. Let an array operation unit 100 at a column i and a row j of a matrix be $AOU_{ij}$. Algorithm of $AOU_{ij}$ is shown in FIG. 55.

At step 2901, $AOU_{ij}$ is arranged at the column i and the row j of the matrix. This is desired to decide neighbors of $AOU_{ij}$ even though the $AOU_{ij}$ is either logical or physical.

At step 2902, neighbors of $AOU_{ij}$ are set and its parameters are initialized. In setting the neighbors, the number of neighbors q used in the above functions can be defined individually, or all of them can be defined uniformly. In order to make the matching-result image 147 generated by the data processing device 110 of the present invention more exact, the number of neighbors q has to be set a large number for all functions. The pattern matching, however, can cope with limitation of computational time to update the matching results and the size of the input normalized image 145, by varying the number of neighbors suitably. Note that, in this step, a pixel on the column i and the row j of some template images 146 prepared beforehand and all pixels at its q neighbors are also initialized.

At step 2903, $AOU_{ij}$ judges whether there is a template image 146 inputted one by one or not. If there is not the template images 146 any more (step 2903: YES), this algorithm goes to step 2905. If there is the template image 146 (step 2903: NO), this algorithm goes to step 2904. Note that this algorithm can be an infinite loop when array operation units 100 are realized for a specific size of the image.

At step 2904, $AOU_{ij}$ inputs the whole pixel on the column i and the row j of the input image. Therefore, $AOU_{ij}$ needs a memory 102 memorizing image data whose number is equal to at least the number of bands by the number of template image 146.

At step 2905, $AOU_{ij}$ computes the matching result $\delta_{ijl}$ of the matching-result image 147 by the input image and the template image 146. The matching result is a band-pixel value representing number of the most similar template image 146 to the input image.

At step 2906, $AOU_{ij}$ outputs a band-pixel value of the matching-result image 147. This algorithm then returns to step 2903.

Pattern matching in the image recognition means 29 can generate the matching-result image 147 from the input image, by using the data processing device 110 consisting of array operation units 100. Note that the necessary local processing is carried out after step 2906, in a case that the input image is appended to the template images 146.

It has been described above about methods carrying out image processing which uses only neighbor processing, using a data processing device 110 consisting of array operation units 100. It is explained here about the figure/ground separation means 16 by only neighbor processing, using a data processing device 110 consisting of array operation units 100.

First, nonlinear oscillators generally presents attraction phenomenon. This attraction phenomenon is phenomenon limited as some nonlinear oscillators representing different cycles vibrate in cycles, which show a simple constant ration, because of interaction. When oscillation of one nonlinear oscillator is changed, other nonlinear oscillators change their oscillation together. These nonlinear oscillators, therefore, are synchronizing. In addition., the adjusted interaction among the nonlinear oscillators can cause making the difference of phases of any two oscillators as small or big as possible. Controlling the interaction, a group of nonlinear oscillators can be divided into some groups whose oscillators represent different phases. The figure/ground separation means 16 separates objects and background by using such attraction of oscillators, as edge information of an edge-information image becomes the border. The figure/ground separation means 16 then generates an object-area image 142 representing an object area 141. A case that a van der Pole oscillator is used for the nonlinear oscillator is described here.

First, in a nonlinear oscillator network consisting of nonlinear oscillators arranged in the shape of a lattice, let a nonlinear oscillator on the column i and the row j be $\omega_{ij}$. A set $\Omega_{ij}(q)$ of q neighbors of the nonlinear oscillator $\omega_{ij}$ is represented by EQ.71, where q is a progression of 4, 8, 24, 48, 80, 120, $(2r+1)^2-1$, and r is a natural number. When a nonlinear oscillator outside of the network is included in the neighbor set $\Omega_{ij}(q)$, it is superseded by the nonlinear oscillator $\omega_{ij}$. Processing around the border is automatically carried out by this replacement. Then, the number of elements of the neighbor set $\Omega_{ij}(q)$ is always q. As this showing, the nonlinear oscillator network is regarded as a one-band image. In order to describe simply, there are only two indexes of the nonlinear oscillator network, which represent horizontal axis and vertical axis.

$$\Omega_{ij}(q) = \begin{cases} \{\omega_{i+1,j}, \omega_{i,j+1}, \omega_{i-1,j}, \omega_{i,j-1}\} & \text{if } q = 4, \\ \{\omega_{l,m} | i - r \le l \le i + r, \\ \quad j - r \le m \le j + r, \omega_{l,m} \ne \omega_{i,j}\} & \text{if } q = (2r+1)^2 - 1. \end{cases} \quad (71)$$

Next, the nonlinear oscillator is connected by a link value $\tau_{ijkl}$ calculated by EQ.72 between it and one of nonlinear oscillators in a neighbor set $\Omega_{ij}(q_a)$, which is included within its $q_a$ neighbors. If you do not use a table of logarithms, you can also use approximation by EQ.73. Note that μ and ν are positive constants.

$$\tau_{ijkl} = \mu \operatorname{sinc}\left(\frac{(i-k)^2 + (j-l)^2}{\nu^2}\right) \text{for } \forall\, \omega_{kl} \in \Omega_{ij}(q_a) \quad (72)$$

$$\operatorname{sinc}(x) \approx \begin{cases} 1 - 2|x|^2 + |x|^3 & \text{if } 0 \le |x| < 1, \\ 4 - 8|x| + 5|x|^2 - |x|^3 & \text{if } 1 \le |x| < 2, \\ 0 & \text{otherwise.} \end{cases} \quad (73)$$

Of course, ν is a constant. Therefore, if a reciprocal of ν is used, division in EQ.72 is changed to multiplication. In addition, if the link value $\tau_{ijkl}$ takes only a non-negative real number, the function sinc(x) can be always equal to one.

In a case that all nonlinear oscillators of a nonlinear oscillator network synchronize with the same phase completely, a nonlinear oscillator $\omega_{ij}$ remains permanently oscillating with the same phase as long as a processor calculates the oscillation. This situation can be avoided if an external noise $\rho_{ij}$ is given to the network. Although a pseudo-random number can be used for the external noise, a simple equation like EQ.74 can be also used, by inputting a grayscale image from an external part. Note that $\zeta'_{ij}$ represents a band-pixel value on the column i and the row j of the grayscale image. In addition, $\kappa$ is a positive constant.

$$\rho_{ij} = k\zeta_{ij} \qquad (74)$$

In order for a nonlinear oscillator $\omega_{ij}$ to synchronize with a nonlinear oscillator $\omega_{kl}$ of a neighbor set $\Omega_{ij}(q_a)$, a neighbor input summation $\sigma_{ij}$ is calculated by EQ.75. Note that $\zeta_{ij}$ represents whether there is edge information on the column i and the row j of the edge-information image or not. If there is edge information, it is equal to one. Otherwise, it is equal to zero.

$$\sigma_{ij} = \sum_{\omega_{kl} \in \Omega_{ij}(q_a)} T_{ijkl}(1 - \zeta_{kl})\xi_{kl}(\psi_{kl} - \psi_{ij}) \qquad (75)$$

Two parameters, $\Phi_{ij}$ and $\psi_{ij}$, constituting a van der Pole nonlinear oscillator $\omega_{ij}$ are calculated by EQ.76 and EQ.77. Note that $\gamma$ and $\epsilon$ are positive constants.

$$\frac{d\phi_{ij}}{dt} = \psi_{ij} \qquad (76)$$

$$\frac{d\psi_{ij}}{dt} = -\gamma\phi_{ij} - \epsilon(1 - \phi_{ij}^2)\psi_{ij} + \sigma_{ij} + \rho_{ij} \qquad (77)$$

The difference of phases between any two of all nonlinear oscillators must be calculated in order to separate nonlinear oscillators in an object area 141 from nonlinear oscillators in a background area. However, the phase gap is derived from judging whether a parameter $\psi_{ij}$ is more than or equal to threshold value $\theta$, or less than the value, because the present invention only has to separate the object area 141 from the background area. An output $\lambda_{ij}$ representing a result of separating the object area from the background area is derived by EQ.78. Note that $\theta$ is a positive constant.

$$\lambda_{ij} = \begin{cases} 1 & \text{if } \psi_{ij} \geq \theta, \\ 0 & \text{otherwise.} \end{cases} \qquad (78)$$

If edge information is not enough to separate an object from background, the edge information must be complemented. It is desired for the complement to count how many nonlinear oscillators shift their phases among a set of nonlinear oscillators $\Omega_{ij}(q_b)$ within $q_b$ neighbors of a nonlinear oscillator $\omega_{ij}$. A contour parameter $\eta_{ij}$ is computed by EQ.79.

$$\eta_{ij} = \sum_{\omega_{kl} \in \Omega_{ij}(q_b)} \lambda_{ij}\lambda_{kl} + (\lambda_{ij})^2 \qquad (79)$$

Based on this result, a border parameter $\xi_{ij}$, which represents a complemental rate for edge information, is computed by EQ.80. Note that $\alpha$, $\beta$, $\eta_{min}$ and $\eta_{max}$ are positive constant.

$$\frac{d\xi_{ij}}{dt} = \begin{cases} -\alpha\xi_{ij} & \text{if } \eta_{min} \leq \eta_{ij} \leq \eta_{max}, \\ \beta(1 - \xi_{ij}) & \text{otherwise.} \end{cases} \qquad (80)$$

Although it has been explained about the case of using van der Pole for a nonlinear oscillator, this separation can be carried out by any nonlinear oscillator presenting attraction phenomenon such as nonlinear oscillators like a blasselator and an integrated-and-fire type of oscillator stabilized in a limit cycle, and chaos oscillators generating Lorentz Attractor and attractor of Ressler Equation, and so on. In this case, two parameters, $\phi_{ij}$ and $\psi_{ji}$, only have to be superseded by parameters of each nonlinear oscillator, or some parameters are only appended to van der Pole. In addition, we only have to add a neighbor input summation $\sigma_{ij}$ and an external noise $\rho_{ij}$ to a specific parameter. Note that a chaos oscillator does not need the external noise $\rho_{ij}$ especially.

Algorithm of all array operation units 100 in a data processing device 110 which can realize the figure/ground separation means 16 can be described by EQ.71 to EQ.80. It is explained here about the figure/ground separation means 16, using the algorithm of any array operation unit 100 in the data processing device 110.

Figure 56:
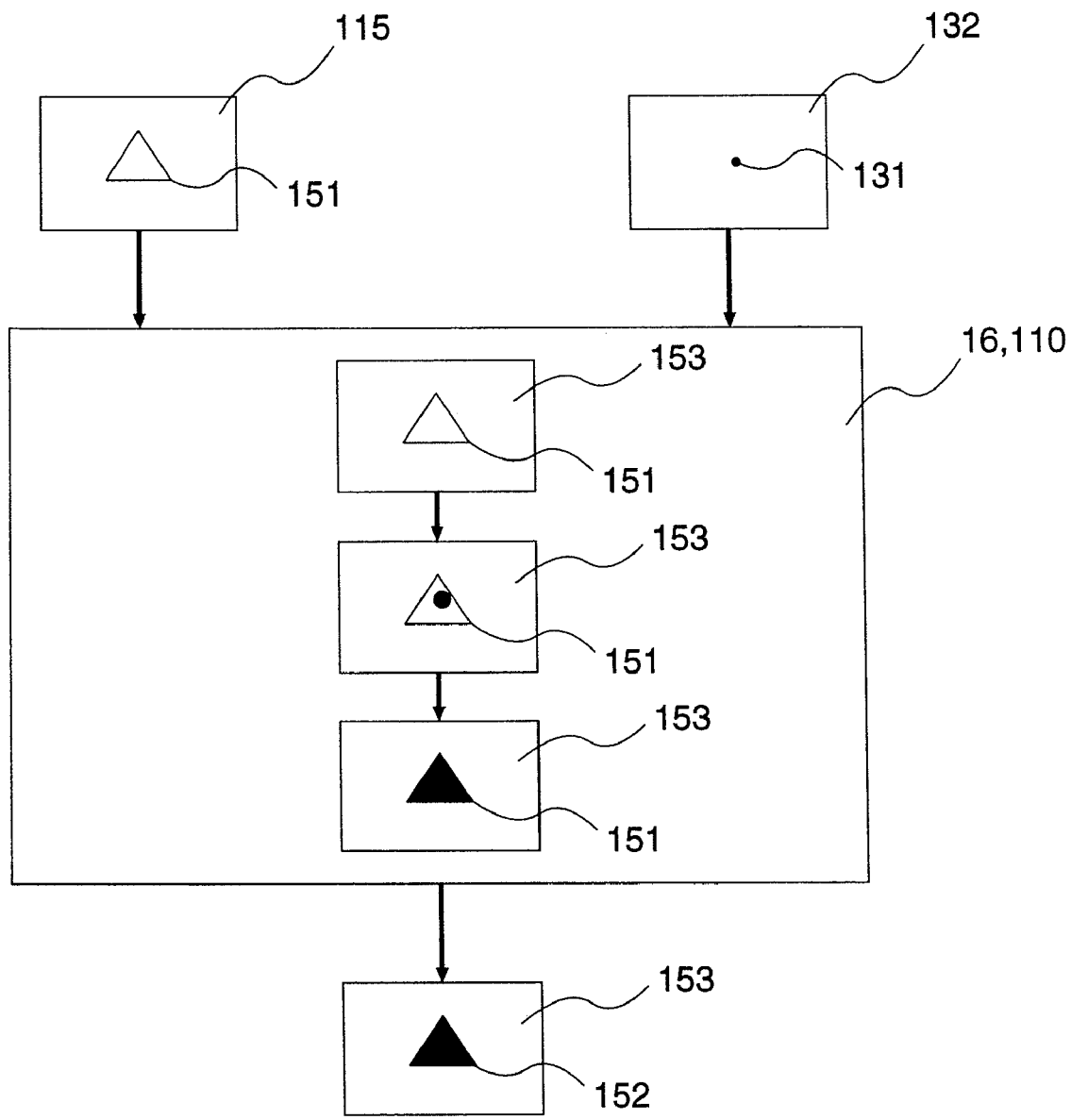
FIG. 56 is an explanation view for generating an object-area image from a formed edge-information image representing a triangle and a redundant-information image.
Figure 57:
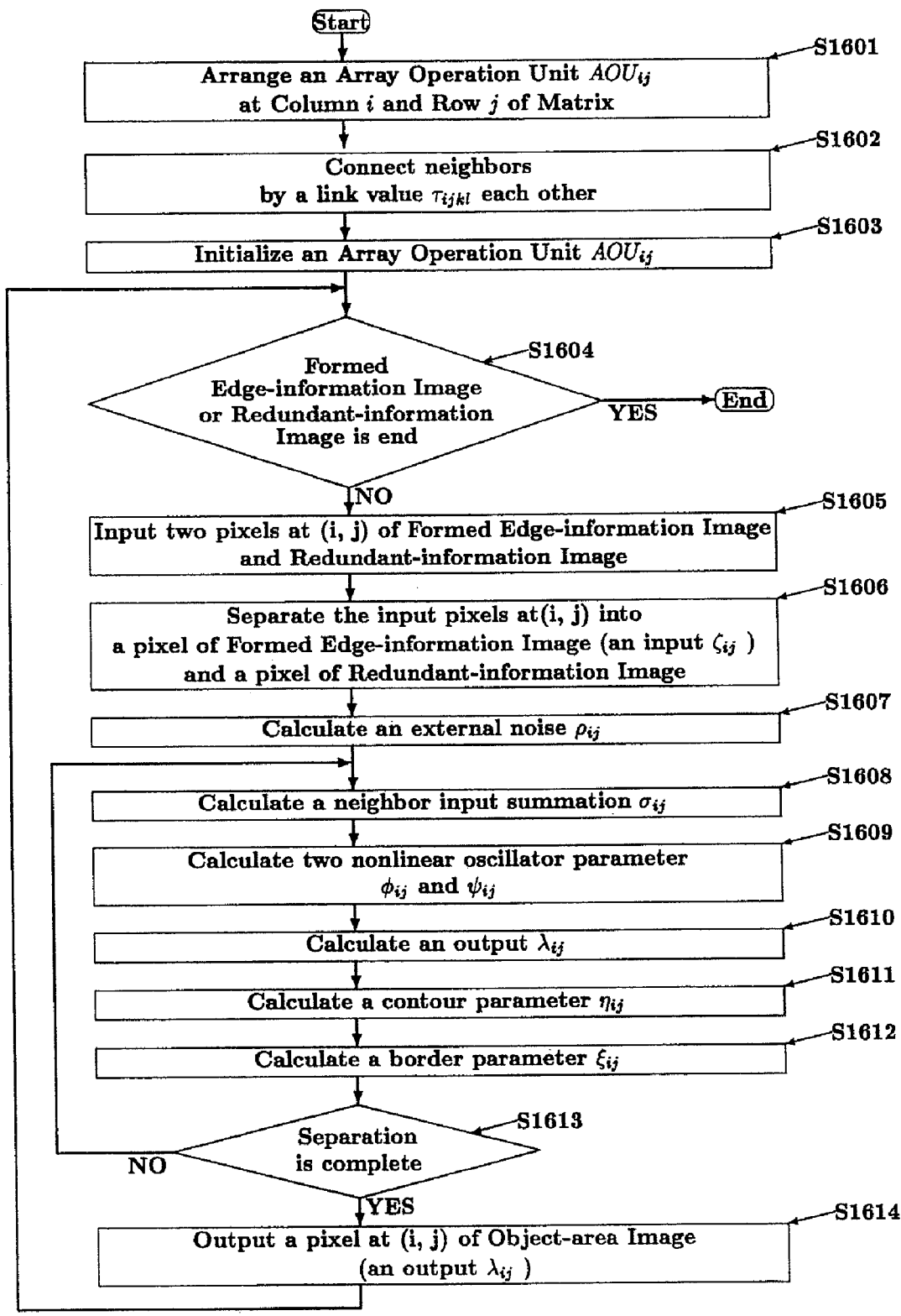
FIG. 57 is a flow chart appearing an algorithm of a figure/ground separation means in this enforcement form.

As shown in FIG. 56, in order for the figure/ground separation means 16 realized by a data processing device 110 to separate an inside area of triangle 152 from an outside area of triangle 153, by using formed triangular edge information 151, array operation units 100 arranged in the shape of a lattice work synchronously in parallel. Let an array operation unit 100 at a column i and a row j of a matrix be $AOU_{ij}$. Algorithm of $AOU_{ij}$ is shown in FIG. 57.

At step 1601, $AOU_{ij}$ is arranged at the column i and the row j of the matrix.

At step 1602, two neighbors, $\omega_{ij}$ and $\omega_{kl}$, are connected by a link value $\Gamma_{ijkl}$ each other, based on EQ.72 and EQ.73.

At step 1603, two parameters of the nonlinear oscillator, $\phi_{ij}$ and $\psi_{ij}$, are initialized by specific values.

At step 1604, $AOU_{ij}$ judges whether there is a formed edge-information image 115 inputted one by one or not. If there is not the formed edge-information image 115 any more (step 1604: YES), this algorithm ends. If there is the formed edge-information image 115 (step 1604: NO), this algorithm goes to step 1605. Note that this algorithm can be an infinite loop when array operation units 100 are realized for a specific number of bands and a specific size of the image.

At step 1605, $AOU_{ij}$ inputs the whole pixel on the column i and the row j of the formed edge-information image 115 and a redundant-information image 132. This is done for $AOU_{ij}$ to process collectively the pixel on the column i and the row j of the formed edge-information image 115 and the redundant-information image 132. Therefore, $AOU_{ij}$ needs a memory 102 memorizing at least the number of bands of image data.

At step 1606, $AOU_{ij}$ separates the pixel on the column i and the row j of the formed edge-information image 115 and the pixel on the column i and the row j of the redundant-information image 132. This is done for $AOU_{ij}$ to process the pixel on the column i and the row j of the formed edge-information image 115 and the pixel on the column i and the row j of the redundant-information image 132, as two pixel of independent images, respectively. If the pixel on the column i and the row j of the formed edge-information image 115 and the pixel on the column i and the row j of the redundant-information image 132 are separated beforehand, followed by being inputted, $AOU_{ij}$ carries out nothing.

At step 1607, $AOU_{ij}$ derives an external noise $\rho_{ij}$ from the redundant information 113 $\zeta'_{ij}$ according to EQ.74.

At step 1608, $AOU_{ij}$ inputs $\zeta_{kl}$, $\xi_{kl}$, $\psi_{kl}$ from an array operation unit 100 $AOU_{kl}$ which has a nonlinear oscillator $\omega_{kl}$ in a neighbor set $\Omega_{ij}(q_a)$, and calculates a summation $\sigma_{ij}$ according to EQ.75.

At step 1609, two parameters of the nonlinear oscillator, $\phi_{ij}$ and $\psi_{ij}$ are calculated by EQ.76 and EQ.77. In short, differential equations described by these equations are solved in Ruge-Kutta method.

At step 1610, an output of the nonlinear oscillator $\lambda_{ij}$ is computed according to EQ.78. $\lambda_{ij}=1$ if $\psi_{ij} \geq \theta$. Otherwise, $\lambda_{ij}=0$.

At step 1611, $AOU_{ij}$ inputs $\lambda_{kl}$ from an array operation unit 100 $AOU_{kl}$ which has a nonlinear oscillator $\omega_{kl}$ in a neighbor set $\Omega_{ij}(q_b)$, and calculates a contour parameter $\eta_{ij}$ according to EQ.79.

At step 1612, a border parameter $\xi_{ij}$ are calculated by EQ.80. In short, a differential equation described by this equation is solved in finite difference method or Ruge-Kutta method.

At step 1613, $AOU_{ij}$ judges whether the separation times representing the repeat times from step 1608 to step 1612 achieve the directed times or not. If the separation times do not achieve the directed times (step 1613: NO), this algorithm returns to step 1608. If the separation times achieve the directed times (step 1613: YES), this algorithm goes to step 1614.

At step 1614, $AOU_{ij}$ outputs the output of the nonlinear oscillator $\lambda_{ij}$, which is a band-pixel value of the object-area image 142. This algorithm then returns to step 1604.

In order to derive the separation time at step 1613, we can use the following method: In the case that almost any formed edge information 114, whose size is constant, is used, the figure/ground separation means 16 finishes the separation within a specific period, in spite of initial state of nonlinear oscillators. Therefore, there is no problem if the repeat times from step 1608 to step 1612 in the period are counted beforehand. Because time which nonlinear oscillators take to synchronize by attraction phenomenon does not almost vary when their initial states are within the fixed limits.

Although only nonlinear oscillators are computed, as described above, the reason why the figure/ground separation means 16 can separate the inside area of triangle 152 from the outside area of triangle 153 by using the formed triangular edge information 151 is to use attraction phenomenon which is character of a nonlinear oscillator. In short, phases of two nonlinear oscillators comes to be as same as possible if the nonlinear oscillators are connected by a positive link value. On the other hand, the difference of their phases comes to be as large as possible if they are connected by a negative link value. In a case of using this character, both of two nonlinear oscillators not connecting directly come to have the same phase, by connecting nonlinear oscillators arranged in the shape of a lattice with neighbors by positive link values one another. Suppose, furthermore, that two nonlinear oscillators lying at pixels, between which formed edge information 114 is put, are connected by a negative link value each to each. The oscillators at both sides of the edge information shift their phases as differently as possible each to each. Because of this, two different phase sets can be present at an inside domain and an outside domain divided by triangular edge information 151. The figure/ground separation means 16, therefore, separates an inside area of triangle 152 and an outside area of triangle 153 shown in FIG. 56. Since the difference of phases of the inside area of triangle 152 and the outside area of triangle 153 is as close to 180 degrees as possible, beyond 90 degrees, a triangle area and a background area can be separated.

It is important here that a link value is changed on appearance in the following way in this enforcement form, once formed edge information 114 is got. As defined in EQ.72 and EQ.73, first, a link value for connecting a nonlinear oscillator $\omega_{kl}$ to a nonlinear oscillator $\omega_{ij}$ is set to $\tau_{ijkl}$ (refer to step 1602). For both formed edge information 114 $\zeta_{ij}$ and $\zeta_{kl}$, the formed edge information 114 is set to one if there is an edge. Otherwise, it is set to zero. If the formed edge information 114 $\zeta_{ij}$ and $\zeta_{kl}$ is inputted (refer to step 1605), the formed edge information 114 $\zeta_{kl}$ is transmitted from an array operation unit 100 $AOU_{kl}$ to $AOU_{ij}$. Moreover, $AOU_{ij}$ calculates a link value $\tau_{ijkl}(1-\zeta_{kl})$, and substitutes it for a link value $\tau_{ijkl}$ (refer to step 1608). For this substituted link value $\tau_{ijkl}(1-\zeta_{kl})$ a border parameter $\xi_{ij}$ acts as the magnification between zero and one (refer to step 1608).

Figure 58:
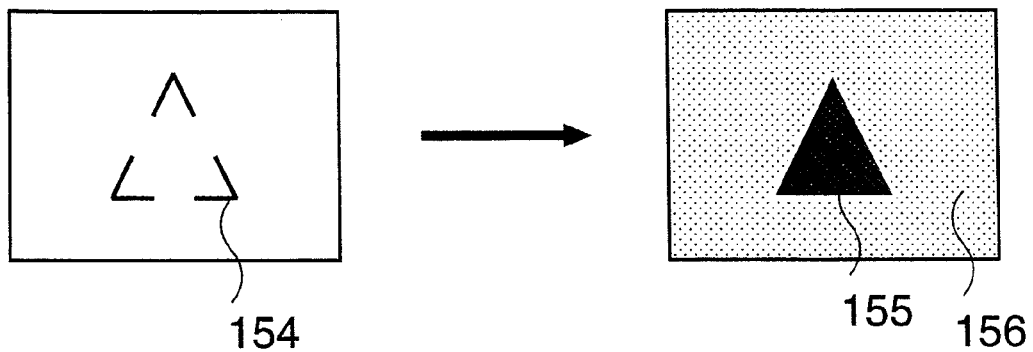
FIG. 58 is an explanation view appearing a state where dashed triangular edge information separates an inside area of dashed triangle and an outside area of dashed triangle.

As shown in FIG. 58, when formed edge information 114 becomes dashed triangular edge information 154, a dashed line has to be complemented. Suppose first that a system works, using the dashed triangular edge information 154 (refer to step 1605). Although the difference of phases between an inside area and an outside area divided by dashed triangular edge information 154 comes to be beyond about 90 degrees, an domain around the border of the inside and outside areas of the triangle is not clear. Each $AOU_{ij}$ calculates an output of its nonlinear oscillator $\lambda_{ij}$ (refer to step 1610). Suppose that this output $\lambda_{ij}$ is equal to one. When a nonlinear oscillator, whose $\lambda_{kl}$ is equal to one, among neighbor nonlinear oscillators is $\omega_{kl}$, both two parameters, $\psi_{ij}$ and $\psi_{kl}$, are more than or equal to $\theta$. In short, phases of $\lambda_{ij}$ and $\lambda_{kl}$ are almost same, and the difference of phases is not beyond at most 90 degrees if $\theta$ is positive. The maximum value of this difference of phases is decided by $\theta$. Within a range that both $\lambda_{ij}$ and $\lambda_{kl}$ are equal to one, the bigger the value $\theta$ becomes, the closer to zero degree the difference of phases becomes. By using $\lambda_{ij}$ and $\lambda_{kl}$, then, a contour parameter $\eta_{ij}$ representing the number of neighbor nonlinear oscillators whose phases are almost same are computed by EQ.79 (refer to step 1611). Moreover, a border parameter $\xi_{ij}$ which is the magnification of a link value is decreased according to EQ.80 if this contour parameter $\eta_{ij}$ is about half of all neighbors. Otherwise, the border parameter is increased according to EQ.80 (refer to step 1612). For an example of eight neighbors, the border parameter can be decreased according to EQ.80 if the contour parameter lies between three and five. By remaining carrying out this process repeatedly, an inside area of dashed triangle 155 and an outside area of dashed triangle 156 are separated when the dashed triangular edge information 154 shown in FIG. 58 is given.

Figure 59:
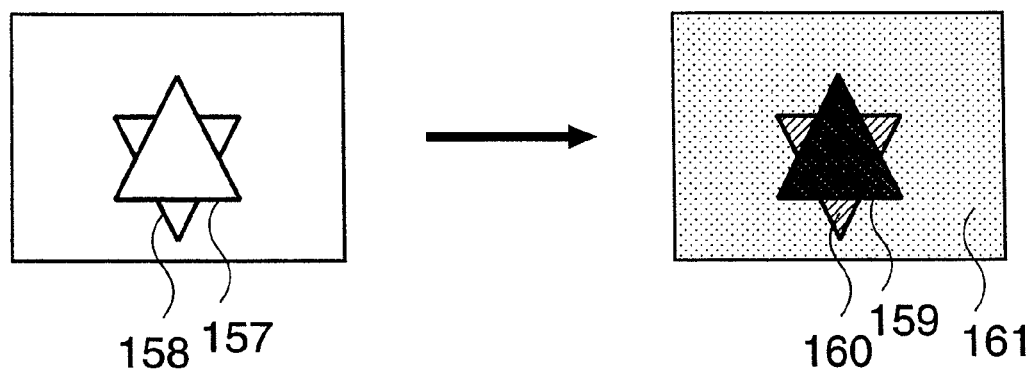
FIG. 59 is an explanation view appearing a state where edge information of two stacked triangles separates two triangle areas and a background area.
Figure 60:
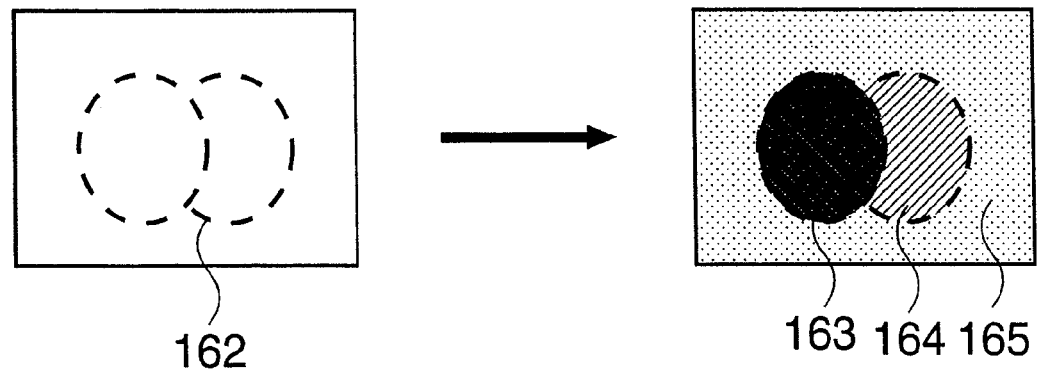
FIG. 60 is an explanation view appearing a state where dashed edge information separates two circular areas and a background area, in a case that two circular object areas are overlapping.

As shown in FIG. 59, edge information of front triangle 157 and edge information of rear triangle 158 can be derived when two triangles are stacked. Three areas, an inside area of front triangle 159, an inside area of rear triangle 160 and a ground area of double triangle 161, are separated by shifting phases of nonlinear oscillators in the areas one another. As shown in FIG. 60, in addition, an inside area of front circle 163, an inside area of rear circle 164 and a ground area of overlapping circles 165 are separated even though edge information of overlapping circles 162 makes a dashed lined.

Therefore, the figure/ground separation means 16 can separate some object areas 141 from a background area, whose borders are represented by formed edge information 114 of a formed edge-information image 115, by using the data processing device 110 consisting of array operation units 100. Note that some separated areas are taken out via an output $\lambda_{ij}$ in order with progress of time, but an array operation unit 100 can also output these separated areas as some phase groups all at once, by calculating phases of nonlinear oscillators.

It has been mainly described above about algorithms of a visual device 2. It is explained here about an architecture of an array operation unit 100, especially circuit design of an LSI.

First, the array operation unit 100 generates a pixel of an output image, by using a pixel and its neighbor pixels of an input image. As shown in FIG. 11, the data processing device 110 can generate the output image from the input image, when some array operation units 100 are arranged in the shape of a lattice in the data processing device 110, according to the size of the input image. Note that the array operation unit 100 is denoted as AOU in FIG. 11. Next, the array operation unit 100 may be implemented by a specialized hardware. Otherwise, it can be implemented by a software on a general computer, too. That is, if the data processing device 110 can generate the output image from the input image, the implementation way of the array operation unit 100 is not limited. It is explained here about a case that the array operation unit 100 is implemented by the specialized hardware, followed by a case that a virtual array operation unit 105 is implemented by the specialized hardware.

Figure 61:
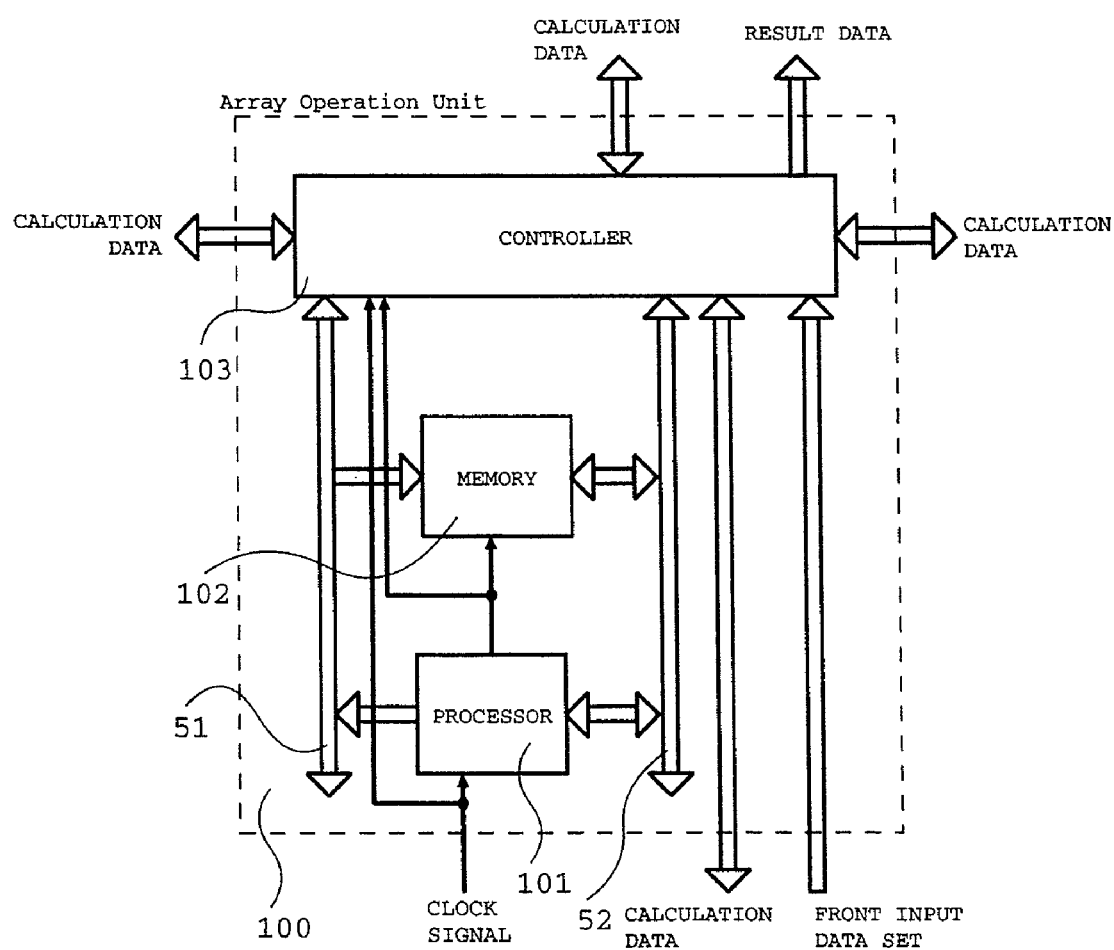
FIG. 61 is a block diagram of internal architecture of an array operation unit.

As shown in FIG. 61, an array operation unit 100 consists of a processor 101 for computing equations of image processing, a memory 102 for memorizing all parameters, constant values, functions and operators used in the equations, a controller 103 for communicating with neighbor array operation units 100. The processor 101 can select any memory elements and registers in the memory 102 and the controller 103, by an address directed by address bus 51. The processor 101 is also connected bidirectionally with the memory 102 and the controller 103 via data bus 52, and can access to data in any memory elements and registers directed by address bus 51. Once the controller 103 inputs a front input data set consisting of one or more input pixels, the processor 101 makes the memory 102 memorize the front input data set. In addition, the controller 103 sends a calculation datum calculated by the processor 101 to some adjoining array operation units 100, while the processor 101 makes the memory 102 to memorize a calculation datum received from some adjoining array operation units 100. If desired, moreover, the processor 101 transmits the datum to other adjoining array operation units 100, which does not send the datum. Finally, the controller 103 outputs pixels of output images as result data.

The reasons why each array operation unit 100 has the controller 103 as described above are the followings: First, the processor 101 can compute during waiting communication, that is, it can realize fast processing because the processor 101 can work while the array operation units 100 are communicating with one another. Second, a hardware of the array operation unit 100 does not have to be changed, even though the number of its neighbor array operation units 100 varies. Third, a program of the processor 101 does not have to carry out border processing of image, that is, exception handling for border pixels in the image. The program, then, becomes extremely simple, since the controller 103 can carry out border processing automatically.

Figure 62:
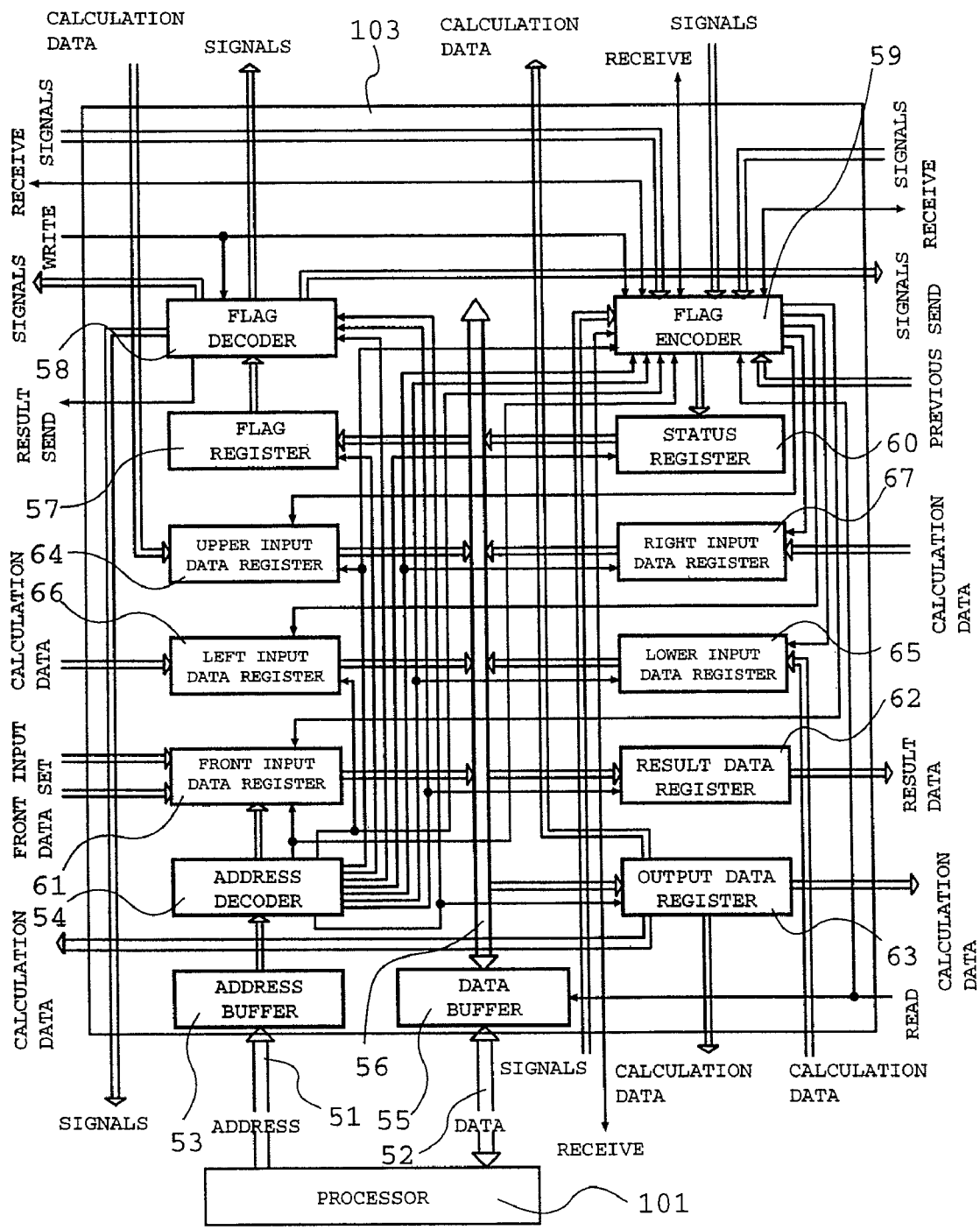
FIG. 62 is a block diagram of a controller.
Figure 63:
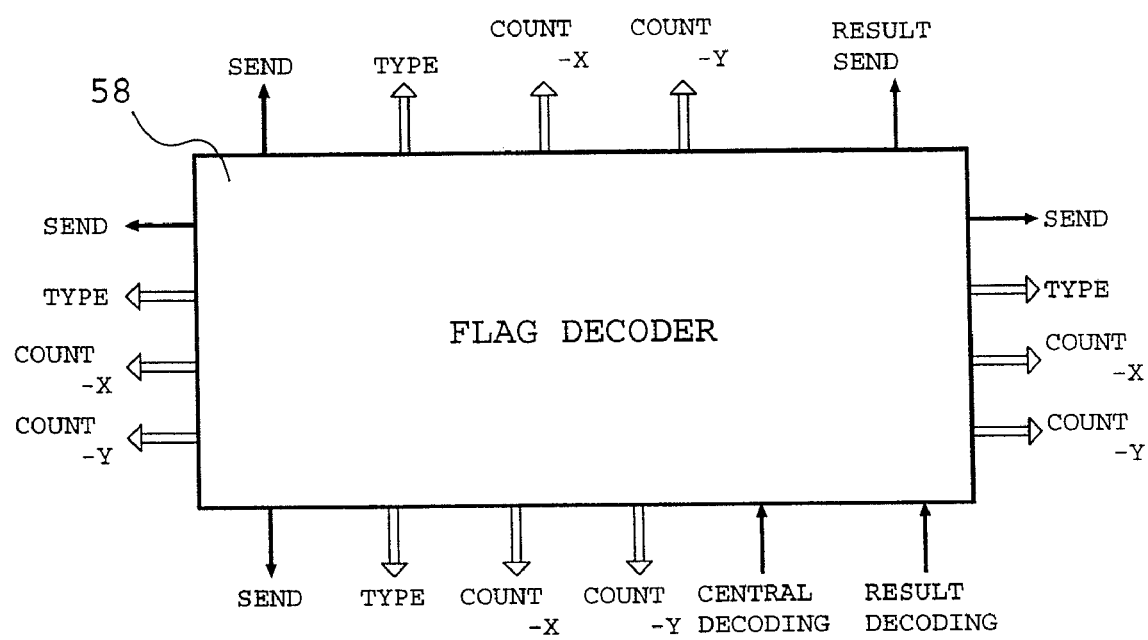
FIG. 63 is an explanation view appearing some input and output signals of a flag decoder.
Figure 64:
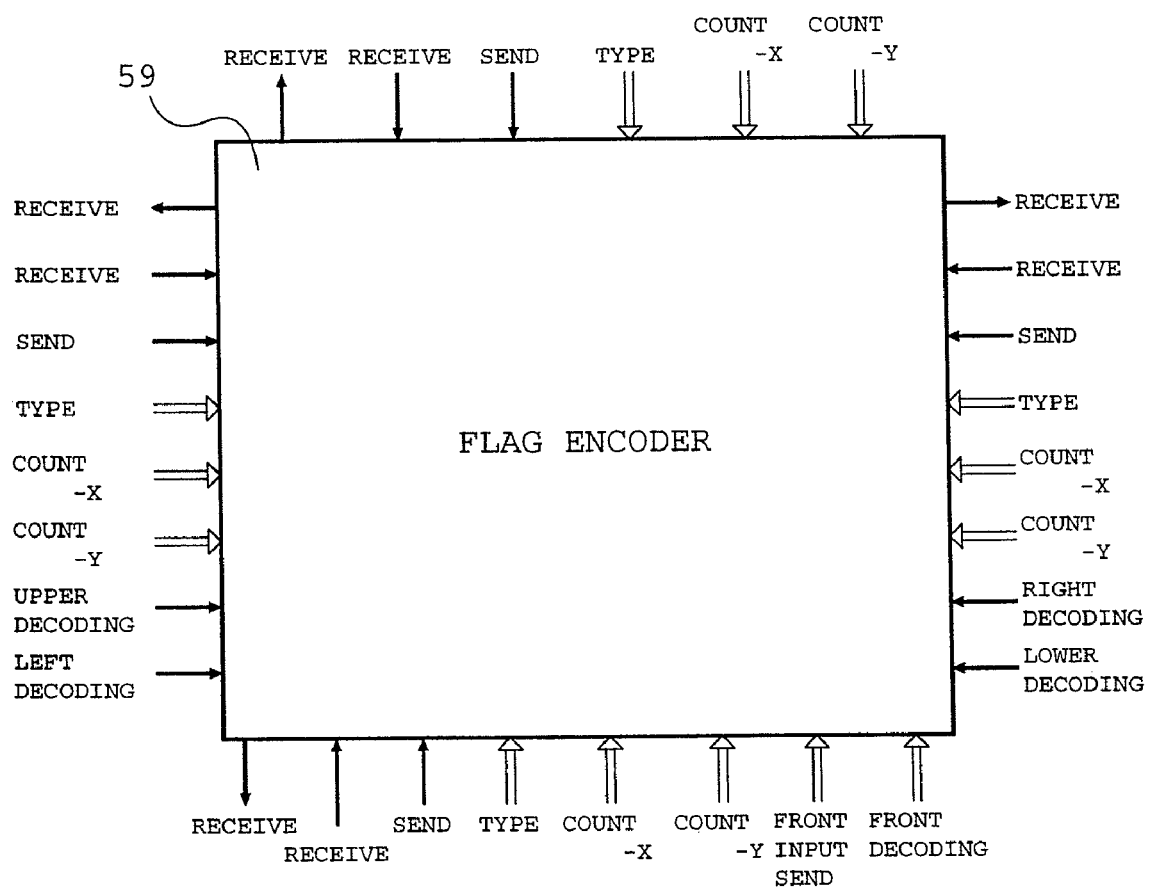
FIG. 64 is an explanation view appearing some input and output signals of a flag encoder.

A block diagram of the controller 103 is shown in FIG. 62. After an address buffer 53 receives an address from the processor 101 via address bus 51, an address decoder 54 selects one of registers and other functional blocks. After a data buffer 55 receives a datum from the processor 101 via data bus 52, it exclusively communicates with a register selected by the address decoder 54 via internal data bus 56, where the direction of communication is directed by READ. When the address directed a flag register 57, a datum is memorized in the flag register 57, followed by being decoded by a flag decoder 58. After that, the datum is sent to some adjoining array operation units 100 as SIGNALS. Note that a detail of the SIGNALS is shown in FIG. 63 and FIG. 64. After the SIGNALS are received and analyzed by a flag encoder 59, they are memorized in a status register 60, while they are replied to the array operation units 100 as a RECEIVE(OUTPUT). The RECEIVE(OUTPUT) is received by the flag encoder 59, which is a sender of the SIGNALS. As a result, it is checked that transmission of the SIGNALS has completed. Once the status register 60 is selected by an address, contents of the status register 60 are sent to the processor 101 via data bus 52, regarding them as data. After the flag encoder 59 received one or more FRONT INPUT SENDs, corresponding to one or more input images, respectively, front input data sets made from one or more input images are read by a front input data register 61, which prepares a memory area necessary to memorize the sets. After the front input data register 61 is selected by an address, contents of the front input data register 61 are sent to the processor 101, regarding them as data. Once the processor 101 has computed, a result data register 62 is selected by an address, followed by reading result data from the processor 101. At this time, the flag encoder 59 sends RESULT SEND.

If a neighbor array operation unit 100 has been able to receive a calculation datum, the processor 101 writes the calculation datum to an address of an output data register 63, followed by that the controller 103 stores the calculation datum in the output data register 63. After that, the controller 103 sends the calculation datum to some adjoining array operation units 100. Suppose that SIGNALS are received from an upper array operation unit 100. The calculation datum already received from the upper array operation unit 100 is stored in an upper input data register 64. After the upper input data register 64 is selected by an address, the calculation datum of the upper input data register 64 is sent to the processor 101. Even though SIGNALS are received from either an lower, left or right array operation unit 100, it can work similarly, that is, a lower input data register 65, a left input data register 66, and a right input data register 67 work as well as the upper input data register 64 does.

Each block such as some buffers, some registers and the address decoder 54 is a general digital circuit. The flag decoder 58 and the flag encoder 59 have input and output signals, as shown concretely in FIG. 63 and FIG. 64.

TYPE represents some kinds of contents read by the output data register 63 by one or more bits. The number of the bits is decided as an array operation unit 100 can distinguish all calculation data due to transmit. COUNT-X and COUNT-Y denote one or more bits of unsigned integers, respectively, and represent transmit times between the array operation units 100. In a case that the array operation unit 100 sends a calculation datum first, both the COUNT-X and the COUNT-Y are set to zero. Whenever the array operation unit 100 transmits a calculation datum in horizontal directions, one is added to the COUNT-X. Whenever the array operation unit 100 transmits a calculation datum in vertical directions, one is added to the COUNT-Y. After the processor 101 specified which direction of upper, lower, left and right a content of the output data register 63 is sent to, to SEND FLAG of the flag register 57, suppose that the flag decoder 58 receives CENTRAL DECODING of the address decoder 54 specifying the output data register 63. The flag decoder 58 outputs SEND to the specified directions in the SEND FLAG. The SEND FLAG denotes a four-bit signal. When the array operation unit 100 transmits a calculation datum to the up side, the processor 101 sets the SEND FLAG to 1000. When the array operation unit 100 transmits the calculation datum to the down side, the processor 101 sets the SEND FLAG to 0100. When the array operation unit 100 transmits the calculation datum to the left side, the processor 101 sets the SEND FLAG to 0010. When the array operation unit 100 transmits the calculation datum to the right side, the processor 101 sets the SEND FLAG to 0001. In addition, in a case that the array operation unit 100 sends the calculation datum to four array operation units 100, the processor 101 sets the SEND FLAG to 1111.

Besides this, when result data are read to the result data register 62, the flag decoder 58 receives RESULT DECODING simultaneously, followed by sending RESULT SEND.

Whenever the flag encoder 59 receives SEND(INPUT) from at least one of four array operation units 100, it sends RECEIVE(OUTPUT), which is changed to one immediately, to a receiving direction. Moreover, after the flag encoder 59 inputs TYPE of a calculation datum, COUNT-X and COUNT-Y from the receiving direction, the corresponding part of contents of status register 60 is updated. On the other hand, in a flag encoder 59 in an array operation unit 100 of the sender, RECEIVE STATUS in the status register 60 is updated if the RECEIVE(INPUT) becomes one. In each array operation unit 100, therefore, the processor 101 can judge which input data register a valid calculation datum is memorized by, only by checking RECEIVE STATUS in its status register 60. For example, suppose that a calculation datum is read by the right input data register 67. The processor 101 can read the calculation datum from the right input data register 67 by directing its address. RIGHT DECODING is simultaneously sent from the address decoder 54 to the flag encoder 59. After a part representing a right direction in RECEIVE STATUS goes back to zero, RECEIVE toward the right side, which represents zero, is sent In all cases of the upper input data register 64, the lower input data register 65 and the left input data register 66, each array operation unit 100 also works similarly.

Besides this, whenever the flag encoder 59 receives at least one of FRONT INPUT SENDs for some input images, the flag encoder 59 sets FRONT INPUT SEND STATUS in the status register 60 to one. Note that the FRONT INPUT SEND STATUS is used for an input image corresponding to the received FRONT INPUT SEND. Moreover, when the processor 101 reads calculation data from the front input data register 61 for input images, the address decoder 54 sends FRONT DECODING to the flag encoder 59. After that, the flag encoder 59 sets FRONT INPUT SEND STATUS corresponding to the received FRONT INPUT SEND to zero. The processor 101 can judge whether a last input image is memorized in the front input data register 61, by reading contents of the status register 60.

It has been assumed above that the array operation unit 100 mainly generates an output image from one or more input image, but its circuit has to be changed as it can output some calculation data generated on a way of calculation, according to an application. In this case, we have only to increase the same number of RESULT SENDs in the flag encoder 58 as the number of result data to output, followed by changing a program as only RESULT SENDs corresponding to result data read by the result data register 62 are set to one.

It is explained here about the flag decoder 58, the flag register 57, the flag encoder 59 and the status register 60, referring to some concrete circuit diagrams.

Figure 65:
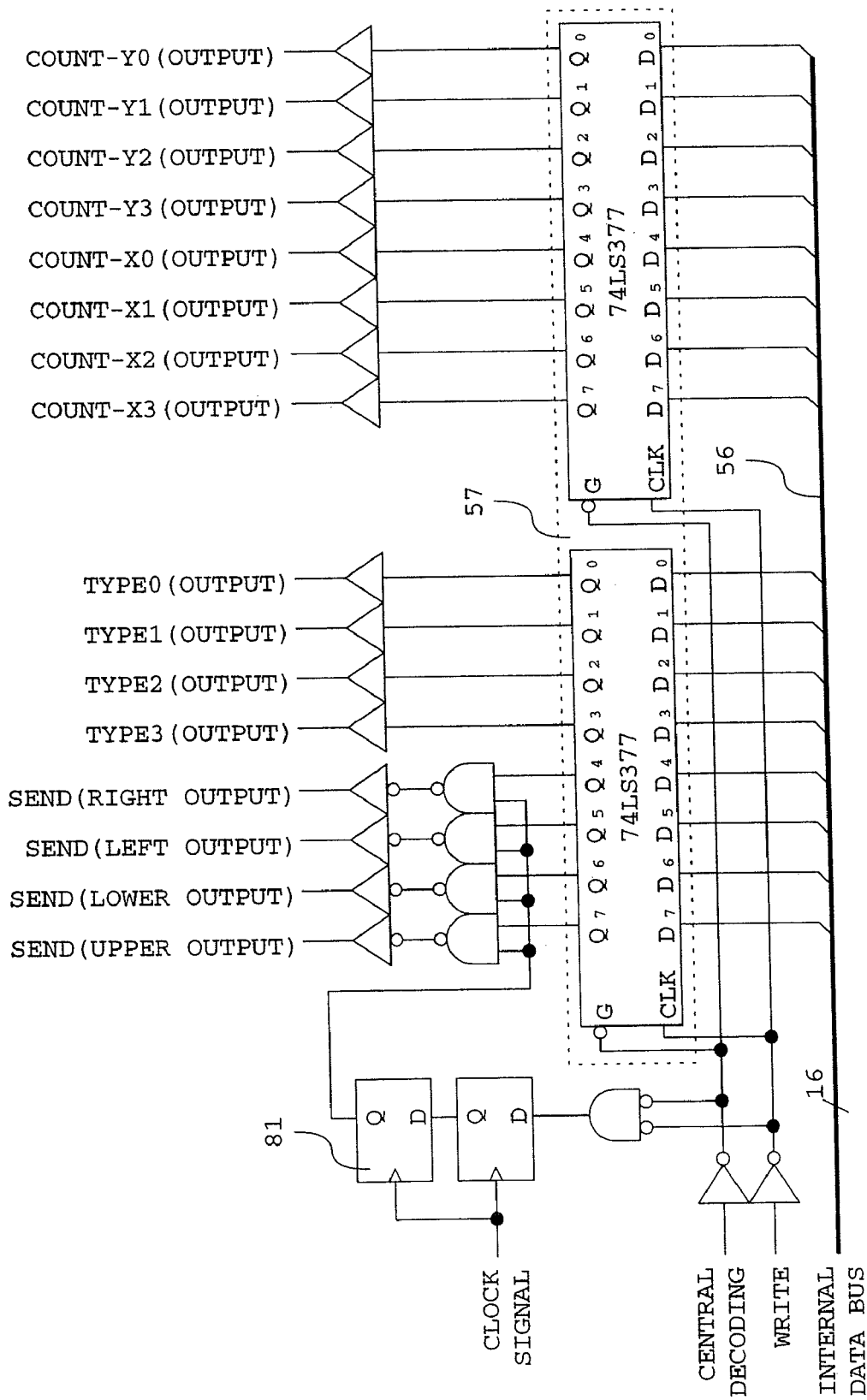
FIG. 65 is a circuit diagram of a flag decoder and a flag encoder.

In a case that a digital circuit 402 of IC number, 74LS377, is used as the flag register 57, circuit diagrams of the flag decoder 58 and the flag register 57 are like FIG. 65. Note that a WRITE synchronizes with a CLK, and the flag register 57 stores a flag via internal data bus 56 when the WRITE rose. In addition, a circuit on a RESULT SEND is omitted in FIG. 65. In FIG. 65, after passing one clock from a time that both the WRITE and a CENTRAL DECODING are active, a SEND (OUTPUT) is outputted for only one clock period. On the other hand, after storing the flag, the flag register 57 outputs a TYPE of the calculation datum, a COUNT-X and a COUNT-Y immediately. If a designer of the flag decoder 58 wants to change timing of sending the SEND(OUTPUT), he has only to change the number of flip-flops for send 81 or invert logic of a trigger of the flip-flops for send 81.

Figure 66:
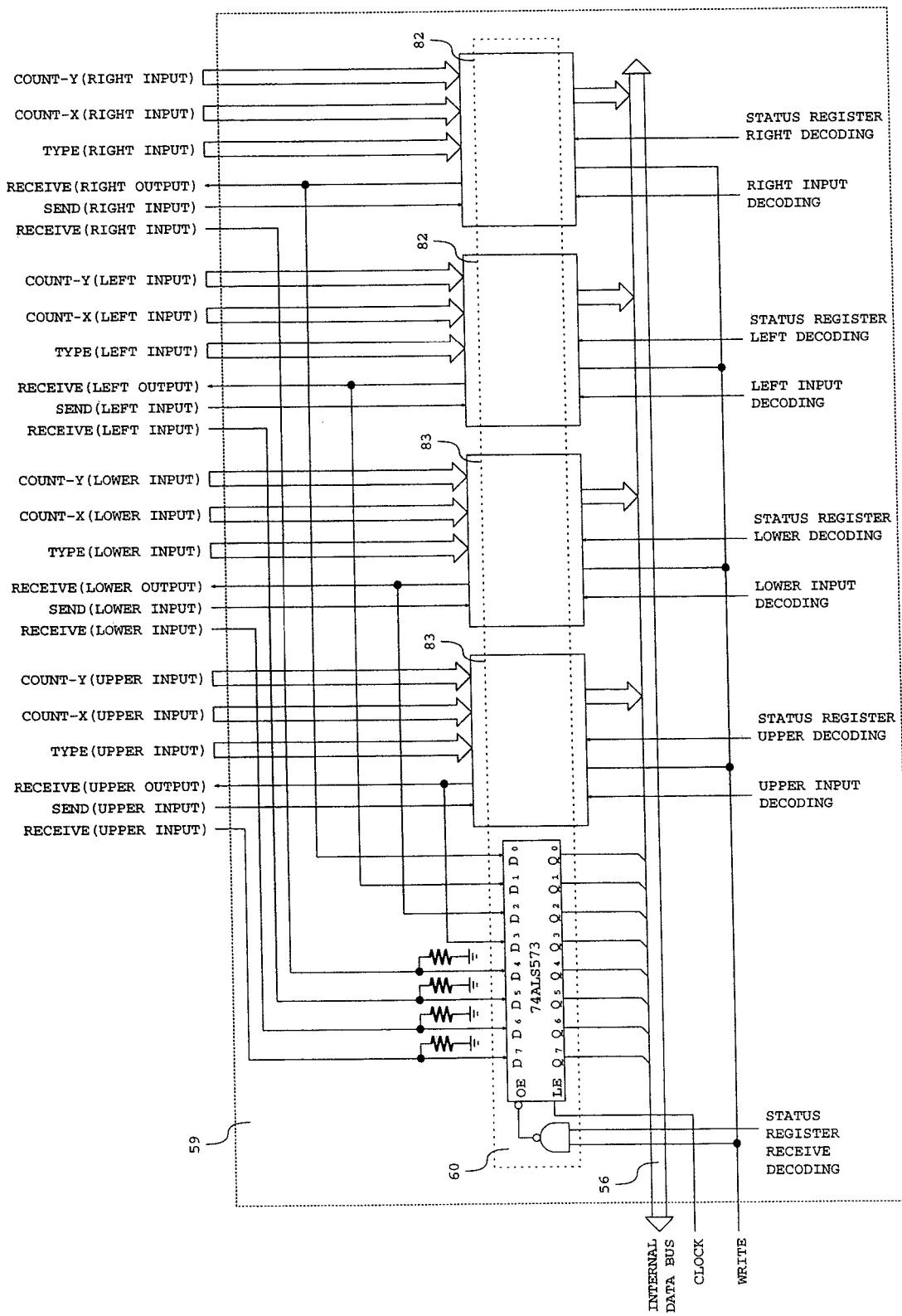
FIG. 66 is a block diagram of a flag encoder and a status register.

In a case that a digital circuit 402 of IC number, 74ALS573, is used as the status register 60, circuit diagrams of the flag encoder 59 and the status register 60 are like FIG. 66. Note that a READ synchronizes with a CLK, and the processor 101 stores a status via the internal data bus 56 when the READ is active and the CLK rose. In addition, a circuit on a FRONT INPUT SEND is omitted in FIG. 66. Some pull-down resistors are attached to input terminals from four neighbor array operation units 100. A SEND(INPUT), a TYPE of a calculation datum, a COUNT-X and a COUNT-Y received from each of left and right array operation units 100 are inputted by a status circuit for horizontal directions 82, and a SEND(INPUT), a TYPE of a calculation datum, a COUNT-X and a COUNT-Y received from each of upper and lower array operation units 100 are inputted by a status circuit for vertical directions 83. Four RECEIVE(OUTPUT) outputted by the status circuit for horizontal directions 82 and the status circuit for vertical directions 83 are stored asynchronously in a status register 60 with four RECEIVE(INPUT) received from four neighbor array operation units 100. Therefore, the processor 101 can understand a situation of communicating with the four neighbor array operation units 100, only by reading the status from the status register 60.

Figure 67:
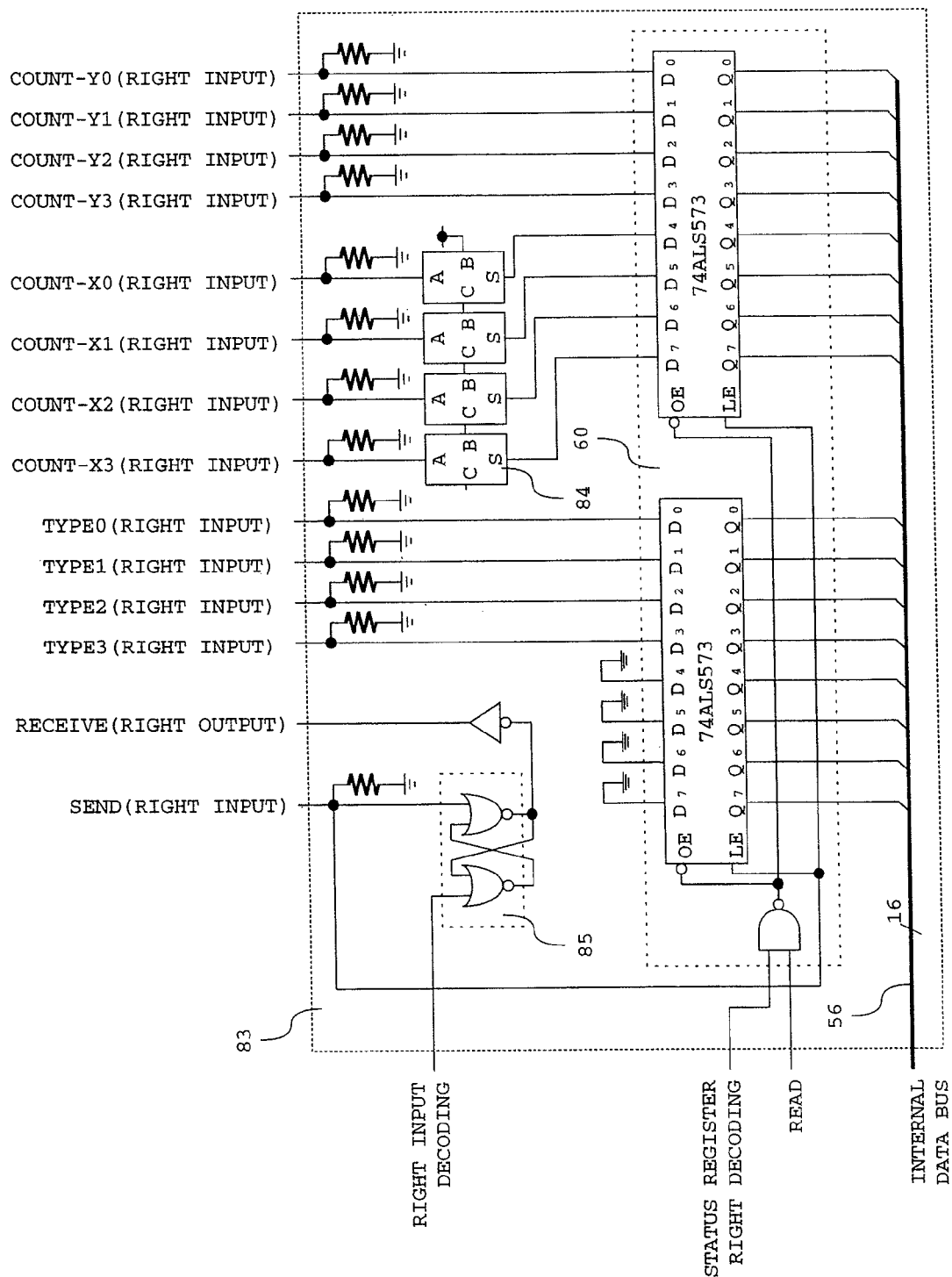
FIG. 67 is a circuit diagram of a flag encoder and a status register communicating with a right array operation unit.

A circuit diagram of the status circuit for horizontal directions 82 in an array operation unit 100 connected with a right array operation unit 100 is like FIG. 67. If the status circuit for horizontal directions 82 receives a SEND (INPUT) which is equal to one, a latch circuit for send input 85 memorizes the SEND(INPUT) asynchronously. Therefore, a RECEIVE(OUTPUT) remains one until a RIGHT INPUT DECODING is inputted by the status circuit for horizontal directions 82. Moreover, since the status circuit for horizontal directions 82 can reply the RECEIVE(INPUT) which is equal to one to the right array operation unit 100, the right array operation unit 100 can receive a RECEIVE(INPUT) which is equal to one after sending a SEND(OUTPUT) which is equal to one within a half period of the clock signal. In the right array operation unit 100, therefore, the processor 101 does not have to wait until it reads a RECEIVE STATUS from the status register 60 after writing the SEND FLAG to the flag register 57. In addition, the status circuit for horizontal directions 82 adds one to the COUNT-X received, by using some half adders for counting 84 On the other hand, the TYPE of the calculation datum, the COUNT-X and the COUNT-Y are stored asynchronously to the status register 60 while the SEND(INPUT) is one. Here, the calculation datum is also stored asynchronously to a right input data register 67, by using the SEND(INPUT). When both a READ and a STATUS REGISTER RIGHT DECODING are active, the status register 60 outputs the TYPE of the calculation datum, the COUNT-X and the COUNT-Y to the processor 101 via the internal data bus 56. Note that, in the circuit diagram of the status circuit for horizontal directions 82 connected with a left array operation unit 100, a LEFT INPUT DECODING and a STATUS REGISTER LEFT DECODING are used instead of the RIGHT INPUT DECODING and the STATUS REGISTER RIGHT DECODING, respectively. In addition, in a circuit diagram of the status circuit for vertical directions 83, one is added to the COUNT-Y received, by using some half adders for counting 84.

It has been described above about the array operation unit 100 comprising only one controller 103. However, in a case that the array operation unit 100 comprises only one controller 103, transmission efficiency may drop. It is explained here about an array operation unit 100 comprising some controllers 103.

Figure 68:
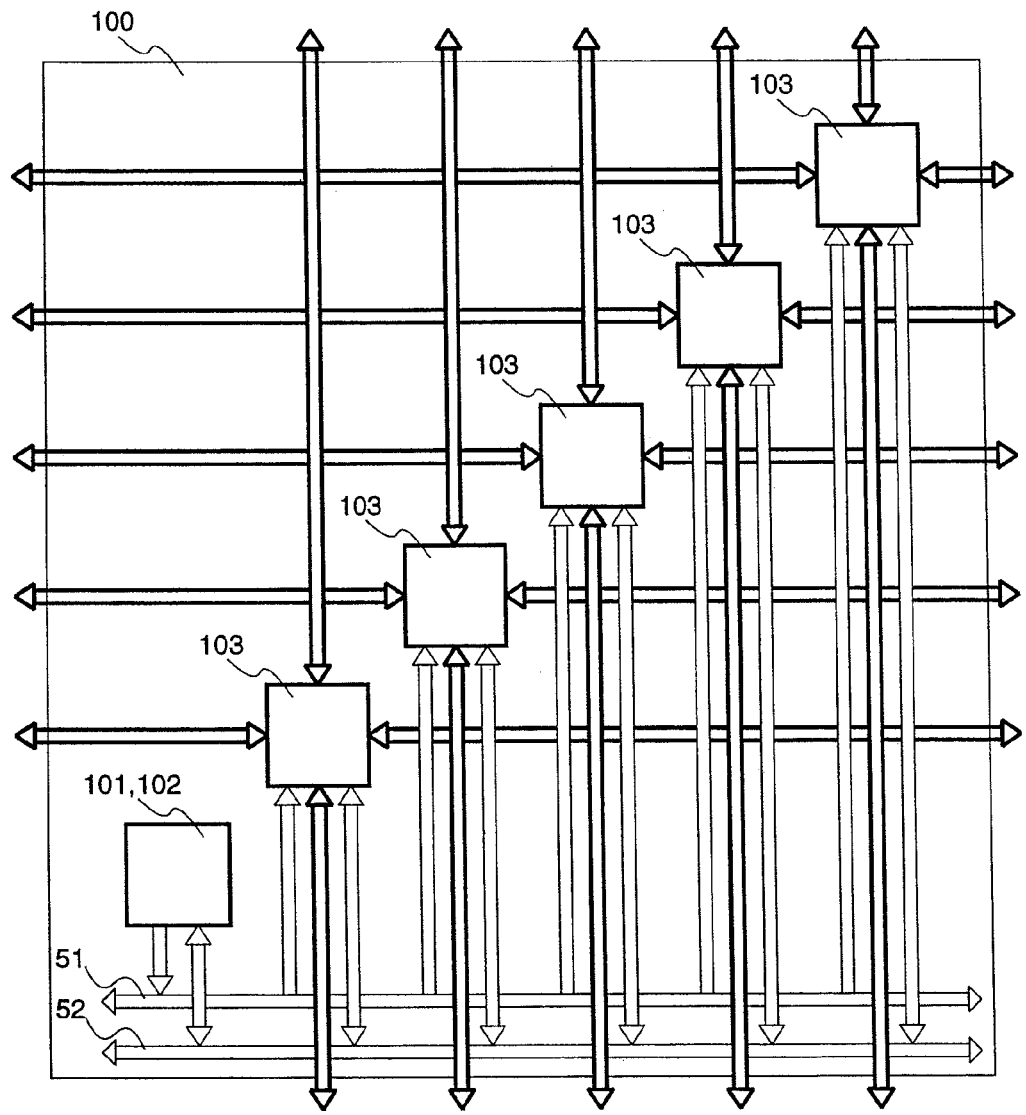
FIG. 68 is an explanation view for an array operation unit whose five controllers are arranged on a plane.

As shown in FIG. 68, an array operation unit 100 can comprise some controllers 103. In a case of FIG. 68, the array operation unit 100 has five controllers 103 arranged on a diagonal line, and each controller 103 is connected to address bus 51 and data bus 52. Five different addresses are assigned to address decoders 54 in the five controllers 103, respectively, as the processor 101 can distinguish these controllers 103. Since each controller 103 comprises a front input data register 61 and a result data register 62, all controllers 103 can input some front input data sets independently, and output a result data. Furthermore, the array operation unit 100 can extend communication bands up to five times, by connecting each controller 103 to a controller 103 in the adjoining array operation unit 100, which is different from each other. Even though the array operation unit 100 transmits the image, the number of whose bands is as many as the transfer-source redundant-information image 184, therefore, the more controllers 103 the array operation unit 100 comprises, the less the transmission efficiency comes to decrease.

In a case that the array operation unit 100 comprises some controllers 103, note that the processor 101 must supervise STATUSes in the status registers 60 in all controllers 103. A round robin system is mainly used for supervisor scheduling.

In the round robin system, some controllers 103 are arranged logically in the shape of a circle. The processor 101 accesses these controllers 103 along the circle in turns. If the controller 103 has received a calculation datum, the processor 101 reads the calculation datum from the controller 103. After that, the processor 101 accesses the next controller 103. All controllers 103, thus, are treated on equal terms. In a case that the communication bands of the controller 103 is narrower than the amount of data transmitted by the array operation unit 100 for a short time, this system is effective.

Besides this, we can use a priority system in which the processor 101 accesses some controllers 103 in an order from the highest priority each time, by giving numbers to all controllers 103. Note that the numbers are called the priority and they are different from each other. In a case that the communication bands of the controller 103 is wider than the amount of data transmitted by the array operation unit 100 for a short time, this system is effective.

In general, since it is assumed that the array operation unit 100 comprises only a few controllers 103, the round robin system is better than the priority system in a case that the visual device 2 carries out local and parallel image processing. Suppose, however, that the array operation unit 100 has the enough number of controllers 103 in order for the visual device 2 to carry out local and parallel image processing including some functions, in which the visual device 2 must transmit a lot of data. In this case, communication efficiency of the round robin system comes to fall if the remaining functions refer to only band-pixel values in four neighbors or eight neighbors 182. Therefore, the priority system is better than the round robin system. Of course, if interrupt function is installed in all controllers 103 and a processor 101, the processor 101 does not have to supervise STATUS in a status register 60 in each controller 103 periodically.

Now, in a case that some controllers 103 are arranged on a mounting side of LSI (Large-scale Integration Circuits), there are three major problems as follows: First, a mounting area of an LSI comes to be very large. Second, wiring between the controllers 103 is complex and long. Third, we can not increase the number of the controllers 103 easily. If three-dimensional LSI technology is adopted, however, an LSI designer can solve these problems easily. It is explained here about an array operation unit 100 adopting the three-dimensional LSI technology.

Figure 69:
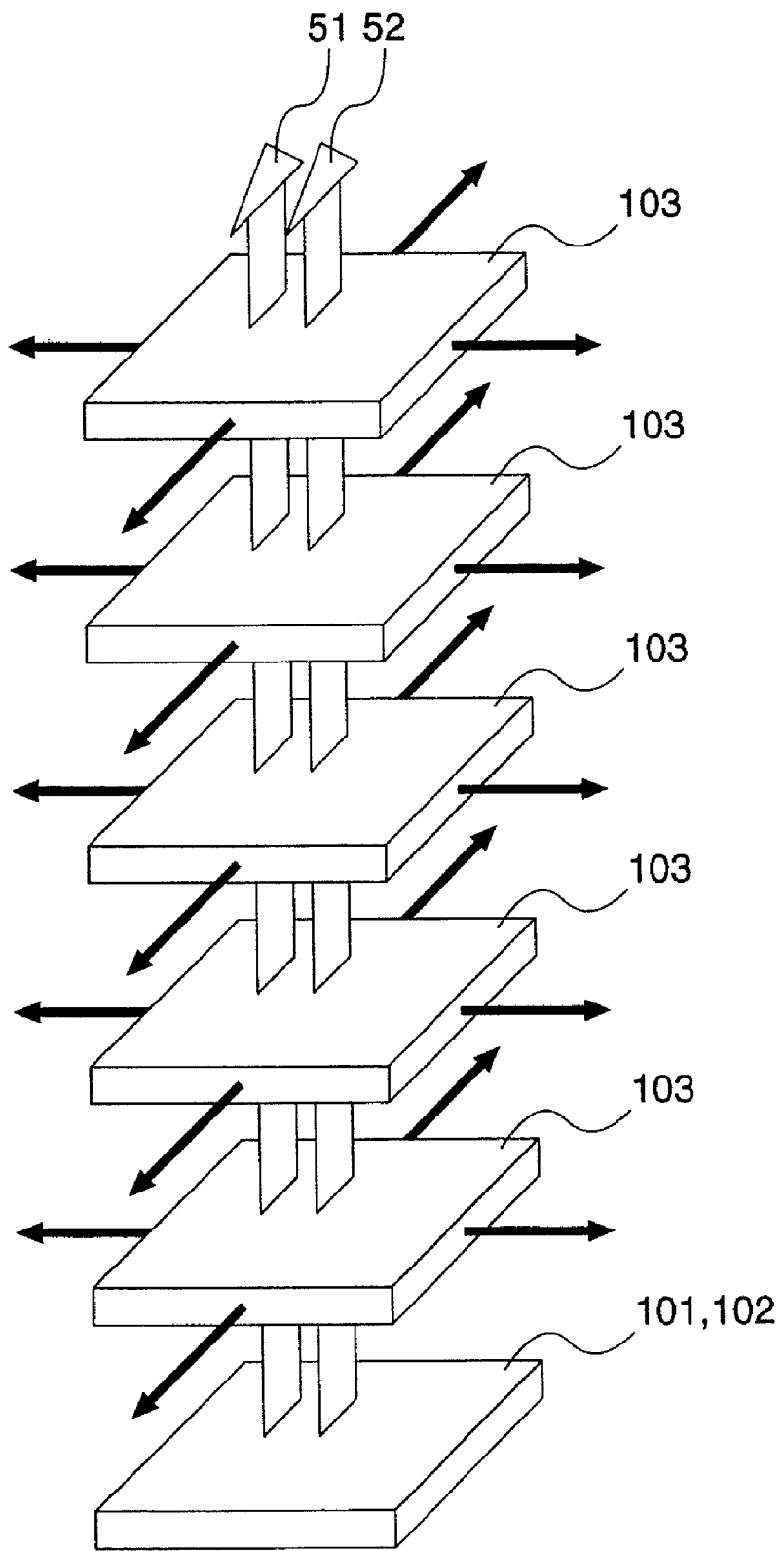
FIG. 69 is an explanation view for an array operation unit whose five controllers are stacked.

As shown in FIG. 69, the controllers 103 are stacked within the array operation unit 100, by using the three-dimensional LSI technology. In a case of FIG. 69, five controllers 103 are stacked on the processor 101 and the memory 102, and each controller 103 is connected to the processor 101 and the memory 103 via address bus 51 and data bus 52 which were wired vertically. As is clear by FIG. 69, even though the number of the controllers 103 is increased, the mounting area of each layer is not increased. In addition, each controller 103 has only to be connected to some adjoining controllers 103 in the same layer. Moreover, if the LSI designer would like to increase the number of the controllers 103, he can increase only the required number of layers implementing the controllers 103. He also never has to revise layers underlying the appended layers if even address bus 51 of the controllers 103 is designed appropriately. With a natural thing, since a controller 103 in each layer is constructed by the same circuit except an address decoder 54, a controller 103 in a layer stacked newly is designed very easily.

As shown in FIG. 68 and FIG. 69, now, suppose that an array operation unit 100 comprises some controllers 103. Not only the array operation unit 100 can expand communication bands between some adjoining array operation units 100, but also it can distinguish which controller 103 it received from, and which data it received. It is explained here about a data processing device 110 which gets together some successive array operation units 100 into one group, whose array operation units 100 share a processor 101 and a memory 102, by using some controllers 103.

Figure 70:
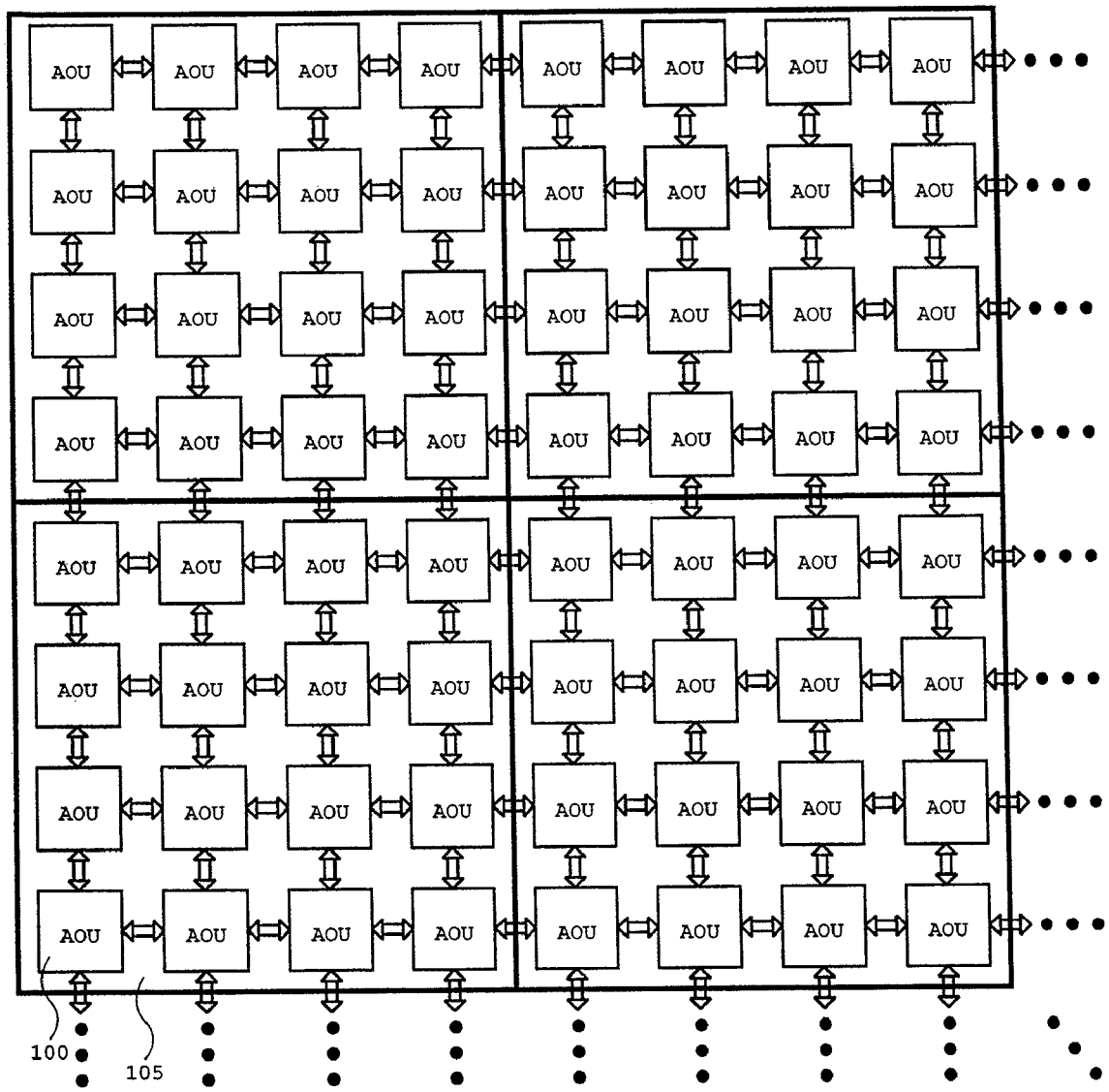
FIG. 70 is an explanation view for regarding 16 array operation units as a virtual array operation unit.
Figure 71:
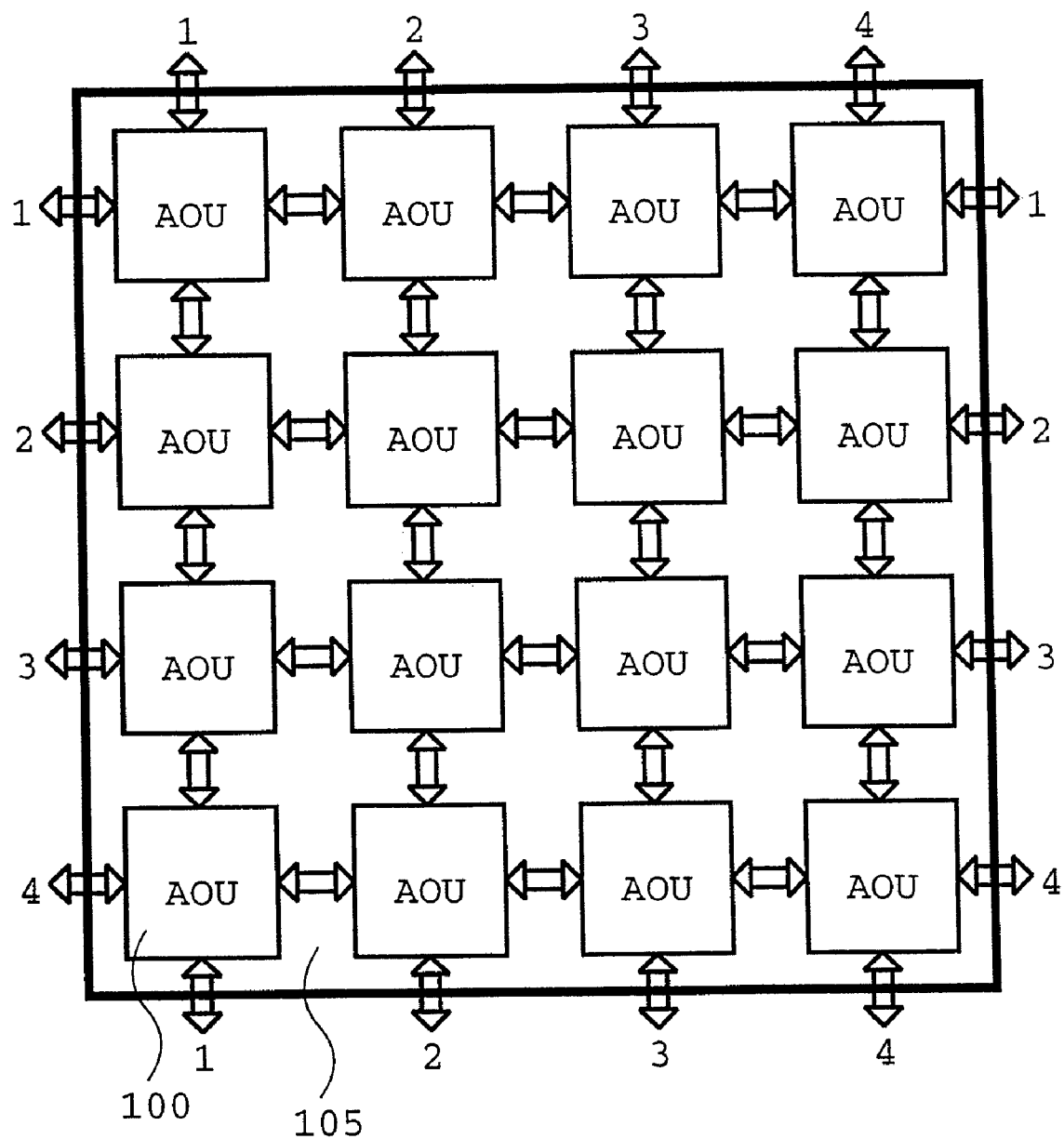
FIG. 71 is an explanation view for giving three quota numbers for controllers to 16 array operation units included in a virtual array operation unit, respectively.

As shown in FIG. 70, first, some array operation units 100 arranged in the shape of a two-dimensional lattice are got together into a rectangular group whose size is suitable. This group is called a virtual array operation unit 105. In a case of FIG. 70, the virtual array operation unit 105 is a group which gets together 4×4 array operation units 100. As shown in FIG. 61, FIG. 68 and FIG. 69, next, the virtual array operation unit 105 comprises a processor 101, a memory 102 and controllers 103, the number of which is more than or equal to maximum of the vertical number and the horizontal number of array operation units 100. In a case of FIG. 70, the virtual array operation unit 105 needs at least four controllers 103. Note that each of the controllers 103 comprises a status circuit for horizontal directions 82 like FIG. 67. Numbers, 1 to 4, are assigned to the controllers 103 for convenience' sake. Even though the number of the controllers 103 goes over four, the numbers, 1 to 4, are assigned to the controllers 103. Therefore, some controllers 103 are assigned to a specific array operation unit 100. As shown in FIG. 71, in addition, the same numbers as the numbers of controllers 103, which is different from each other, are also given to communication lines between array operation units 100. Note that two numbers facing each other becomes equal, for each of upward-downward and leftward-rightward communication lines. Finally, a program, by which the processor 101 carries out processing of 16 array operation units 100, is memorised in the memory 102. In a case that each of the array operation units 100 communicates with some array operation units 100 in an adjoining virtual array operation unit 105, this program is implemented as the array operation unit 100 must communicate via a controller 103 whose number identifies with a number given to a communication line. Therefore, the virtual array operation unit 105 can distinguish which array operation unit 100 a calculation datum was sent from, and which array operation unit 100 the calculation datum was sent to.

By the way, a virtual array operation unit 105 must input front input data sets from other virtual array operation units 105, and output result data to other virtual array operation units 105. Therefore, the virtual array operation unit 105 can not implement some array operation units 100 completely, only by increasing the number of controllers 103. In a case that some controllers 103 are implemented on a two-dimensional plane, as shown in FIG. 68, this problem is solved by a program, by giving the controllers 103 to some numbers, as similar to calculation data, if the number of the controllers 103 is enough. Even in a case of FIG. 71, however, 16 controllers 103 must be prepared. When the number of array operation units 100 included in a virtual array operation unit 105 was increased, this method becomes very inefficient. In a case that the controllers 103 are stacked, furthermore, as shown in FIG. 69, it is very difficult for the virtual array operation unit 105 to secure communication lines for the front input data sets and the result data. It is described here about a method for solving this problem, by changing only a front input data register 61 in a controller 103.

Figure 72:
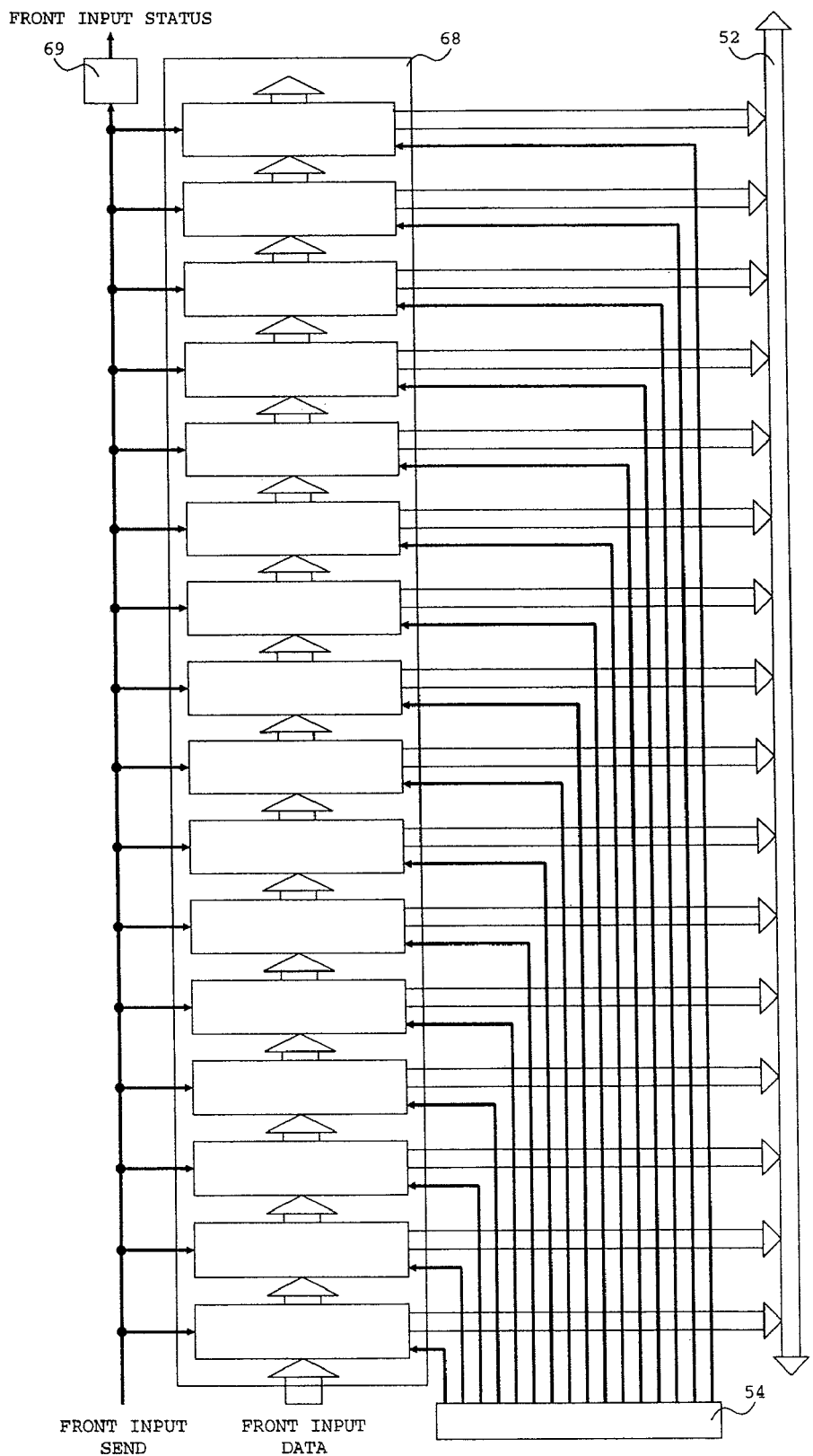
FIG. 72 is an explanation view for a shift register memorizing sequentially 16 front input data outputted by 16 array operation units.

Suppose first that a controller 103 inputs result data as front input data of a front input data set from another controller 103. Suppose, moreover, that it inputs a RESULT SEND as a FRONT INPUT SEND. In this case, as shown in FIG. 72, a front input data register 61 comprises a front input shift register 68 and a front input counter 69. Note that the front input shift register 68 consists of the same number of registers as the number of array operation units 100 in a virtual array operation unit 105. The front input counter 69 is a down counter whose initial value is the number of the registers. When a count number of the front input counter 69 became zero, the front input counter 69 outputs the FRONT INPUT SEND. The front input counter 69 is then initialized to the initial value if the result data are inputted. The front input shift register 68 consists of 16 registers in FIG. 72. If 16 result data are inputted by the front input shift register 68, the FRONT INPUT SEND is outputted. Next, each register in the front input shift register 68 and the front input counter 69 input the FRONT INPUT SEND as a trigger signal. Moreover, an address decoder 54 selects one of the registers in the front input shift register 68, by decoding an address. Each register, thus, can output the front input data to data bus 52 if a processor 101 specified an address of a suitable register in the front input shift register 68. Note that other signal lines of the address decoder 54 are omitted in FIG. 72. Suppose that the virtual array operation unit 105 outputs front input data of 16 array operation units 100 in fixed turns. The front input data are memorized by the registers in the front input shift register 68 in the order of their outputs. At the time that the FRONT INPUT SEND outputted by the front input counter 69 was memorized by a status register 60, the processor 101 can get the front input data of a specific array operation unit 100.

Figure 73:
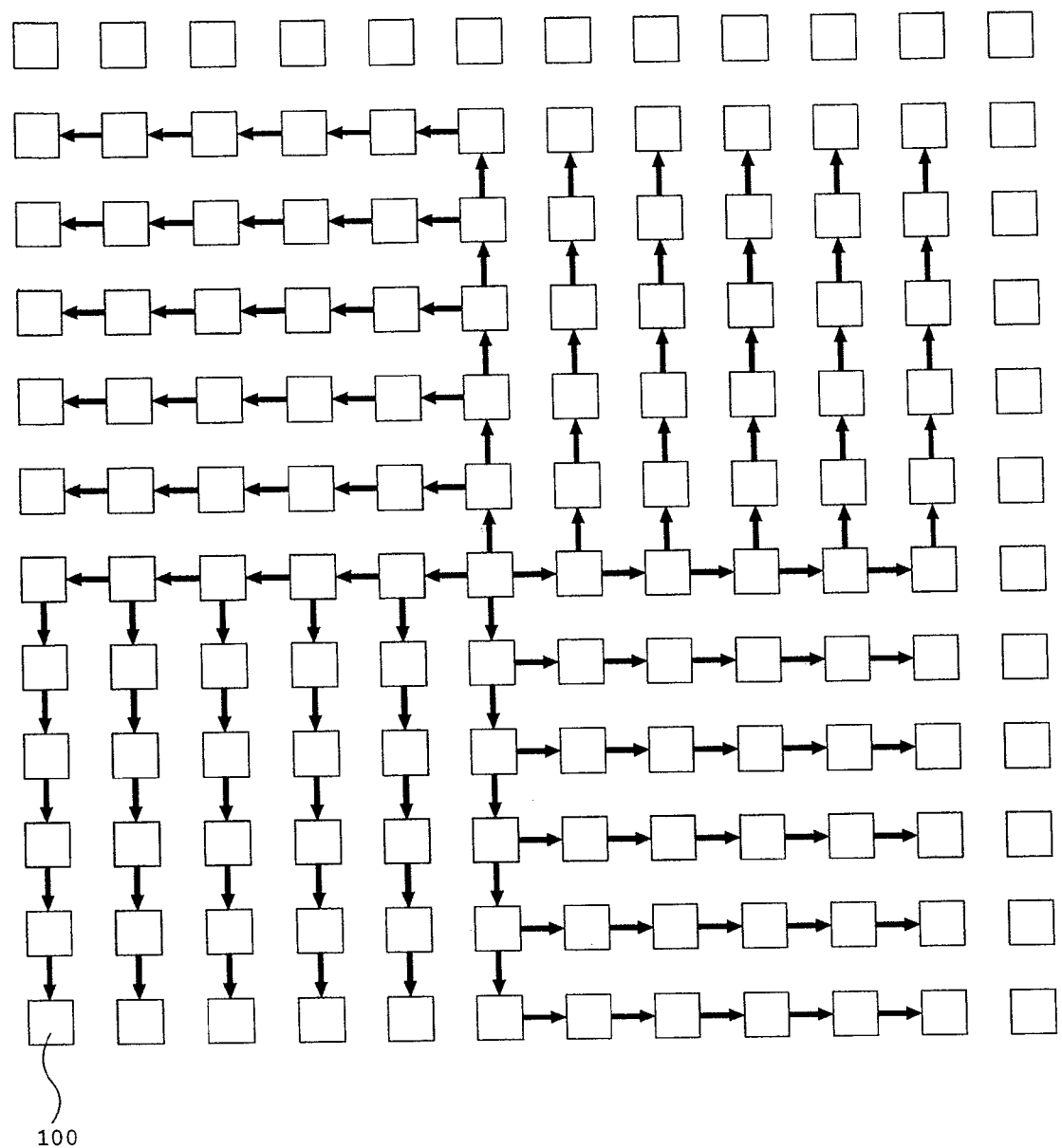
FIG. 73 is an explanation view for a transmit route, in a case that an array operation unit transmits data counter-clockwisely to 120 neighbors.
Figure 74:
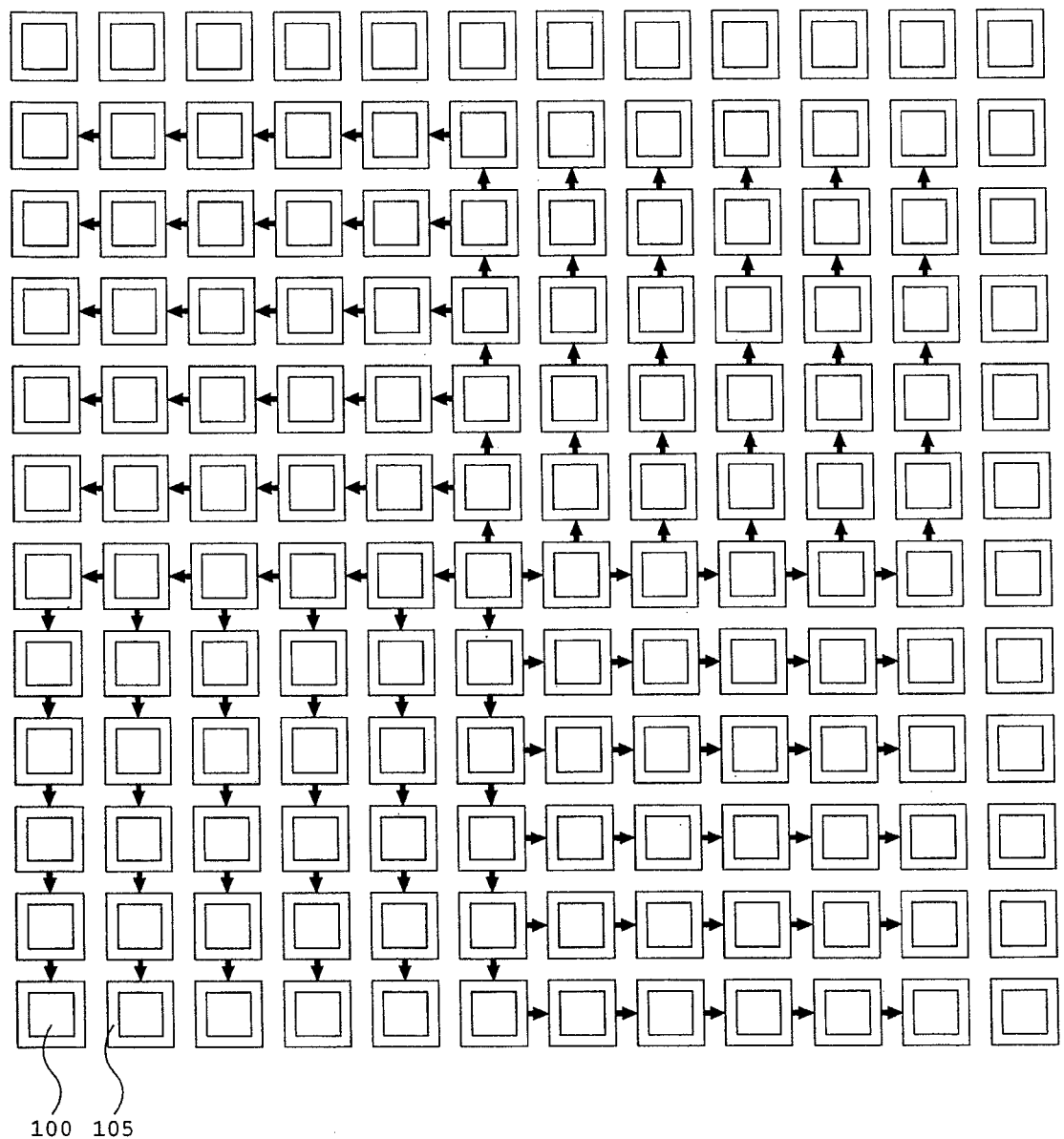
FIG. 74 is an explanation view for a transmit route, in a case that a virtual array operation unit identifying with an array operation unit transmits data counter-clockwisely to 120 neighbors.
Figure 75:
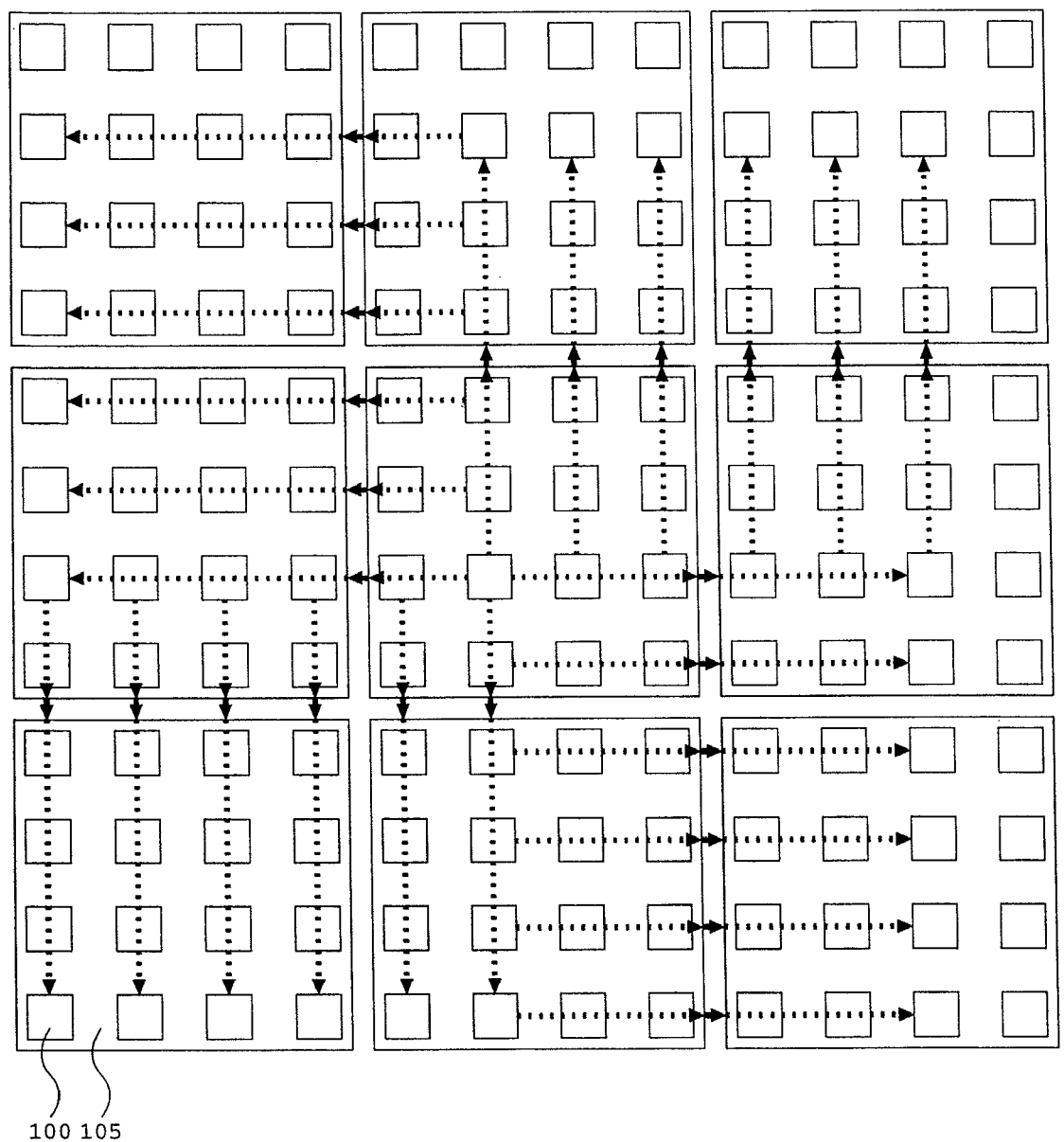
FIG. 75 is an explanation view for a principle transmit route, in a case that a virtual array operation unit including 4×4 array operation units transmits data counter-clockwisely to 120 neighbors.

Note that the array operation unit 100 can transmit a calculation datum efficiently, by transmitting the calculation datum counter-clockwisely, as shown in FIG. 73. Of course, the array operation unit 100 can transmit the calculation datum clockwisely. Here, if the memory 102 and the processor 101 comprise a stack and a cyclic buffer, the array operation unit 100 can store only calculation data to be transmitted beforehand in the stack and the cyclic buffer. Therefore, when the array operation unit 100 writes the calculation datum to the controller 103, the array operation unit 100 can refer only the calculation datum within a short time. Similarly, the virtual array operation unit 105 can transmit a calculation datum efficiently, by transmitting the calculation datum counter-clockwisely and clockwisely, as shown in FIG. 74.

Now, it has been described above such methods as a processor 101 reads a calculation datum from a controller 103 or writes the calculation datum to the controller 103. In the methods, hardware complexity of a controller 103 becomes a little because the processor 101 carries out calculation necessary to transmit the calculation datum. Therefore, an array operation unit 100 and a virtual array operation unit 105 can comprise many controllers 103. Whenever the controller 103 transmits the calculation datum, however, the processor 101 must communicate the calculation datum with the controller 103. Therefore, not only communication time of the processor 101 becomes long, but also the processor 101 must check transmission times of the calculation datum, in order to finish transmitting the calculation datum. It is explained here about a method that the number of times communicating the calculation datum with the controller 103 is reduced, and moreover, that the processor 101 does not have to check the transmission times of the calculation datum.

As shown in FIG. 77 to FIG. 80, in an enforcement form of a visual device 2 corresponding to the invention described in claim 12, the successive numbers are assigned to two or more controllers 103 comprised by an array operation unit 100. In addition, when the numbers are assigned to all controllers 103, some signal lines are wired in such a way as each of all controllers 103 can send a calculation datum to some controllers 103 among controllers 103 in an adjoining array operation unit 100, whose number shifts only one from it. For example, in FIG. 77 to FIG. 80, an array operation unit 100 comprises four controllers 103, where the numbers, 0 to 3, are assigned to the controllers 103, respectively.

Figure 77:
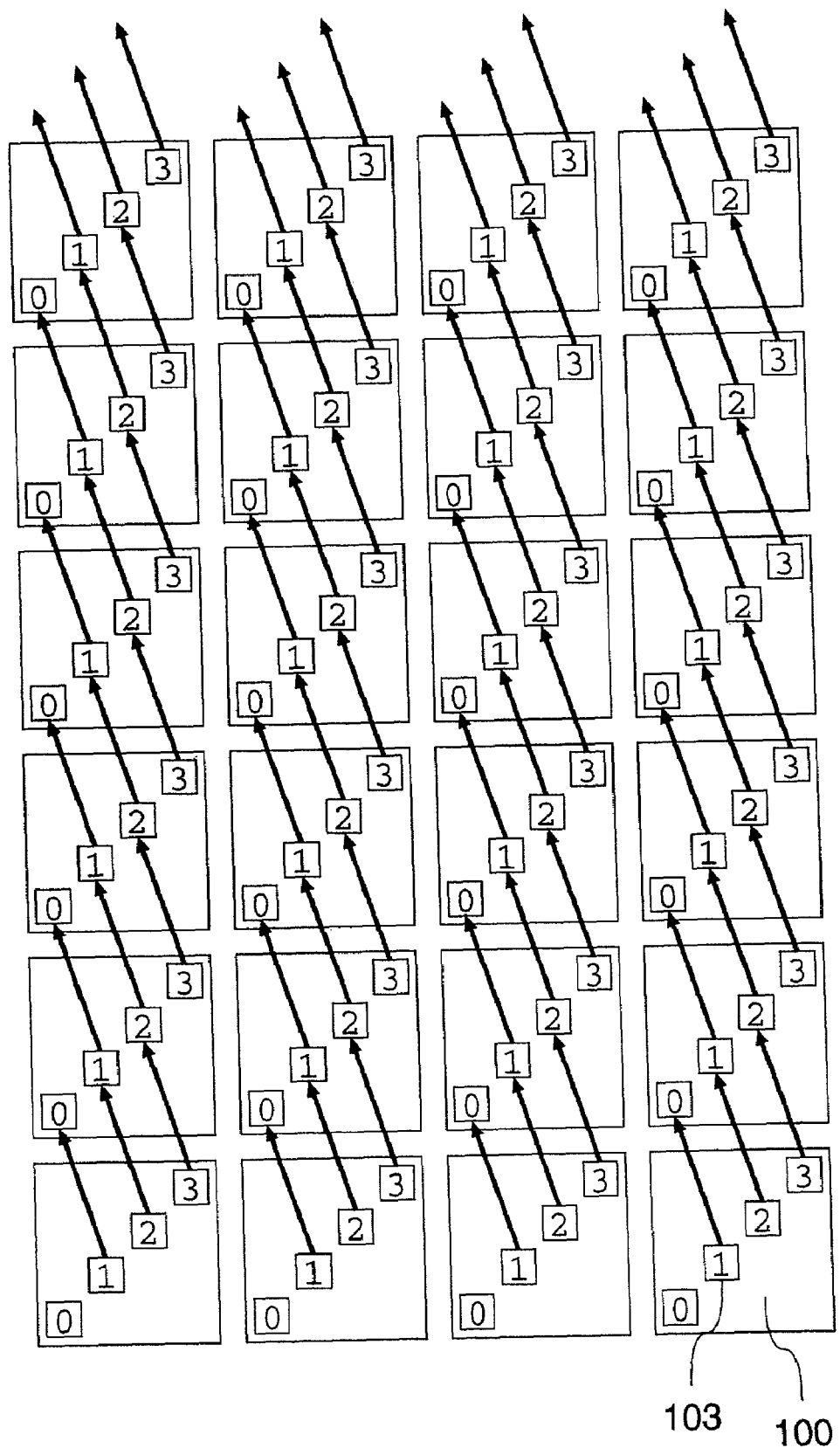
FIG. 77 is an explanation view for wiring, in a case that each of four controllers in an array operation unit sends data to a controller in an upper array operation unit, whose assigned number is one smaller than a number of the controller.
Figure 78:
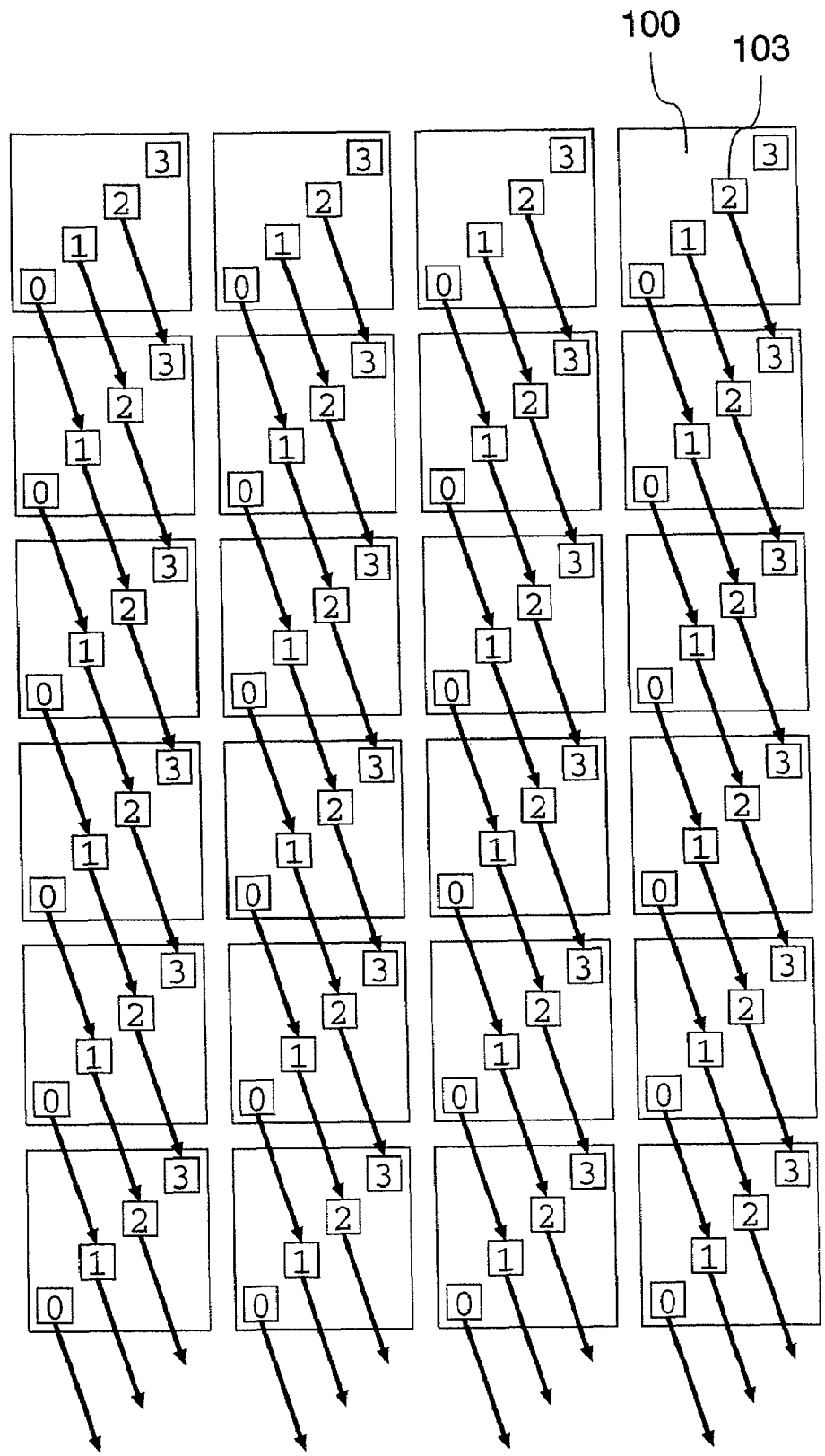
FIG. 78 is an explanation view for wiring, in a case that each of four controllers in an array operation unit sends data to a controller in a lower array operation unit, whose assigned number is one bigger than a number of the controller.
Figure 79:
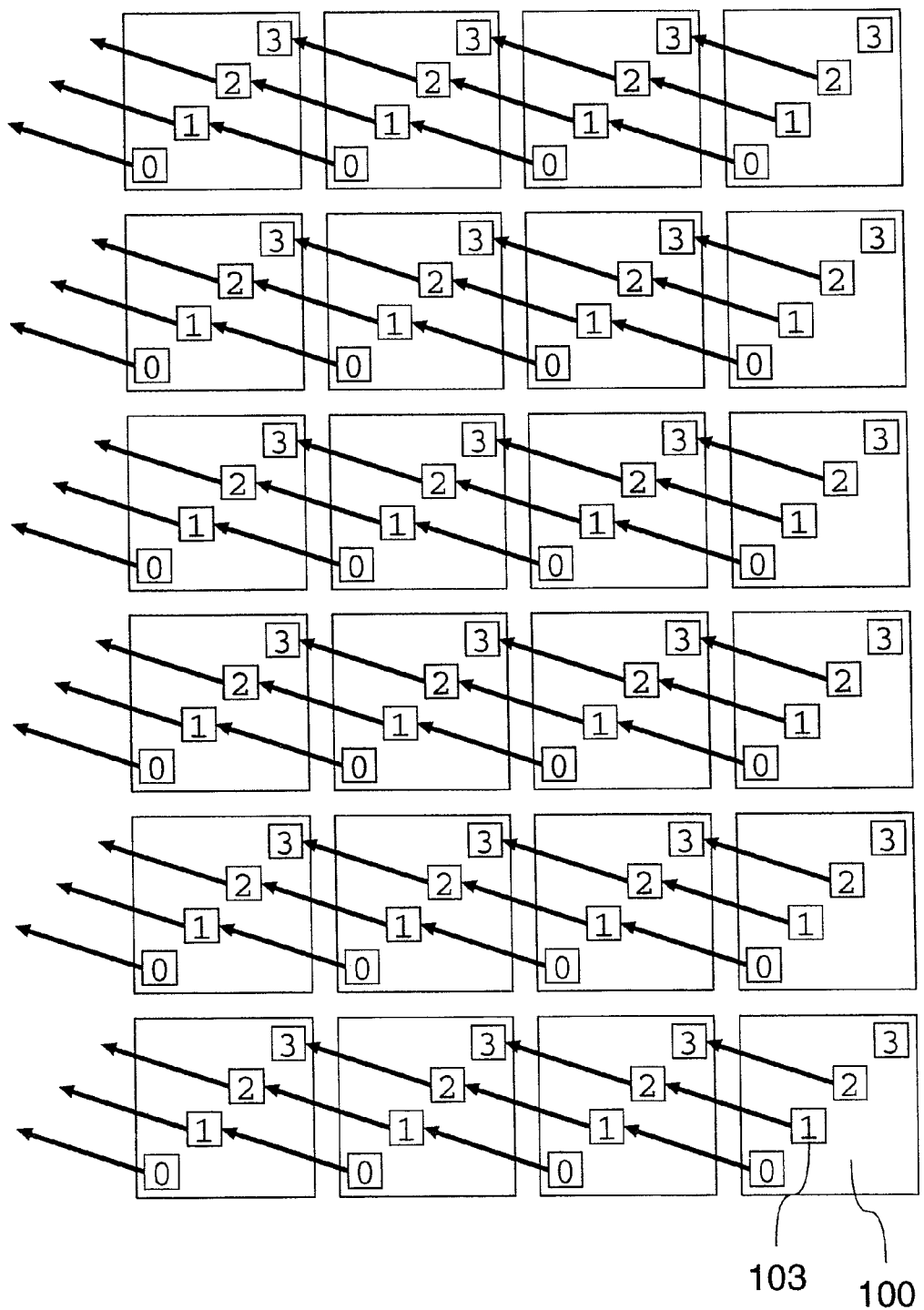
FIG. 79 is an explanation view for wiring, in a case that each of four controllers in an array operation unit sends data to a controller in a left array operation unit, whose assigned number is one bigger than a number of the controller.
Figure 80:
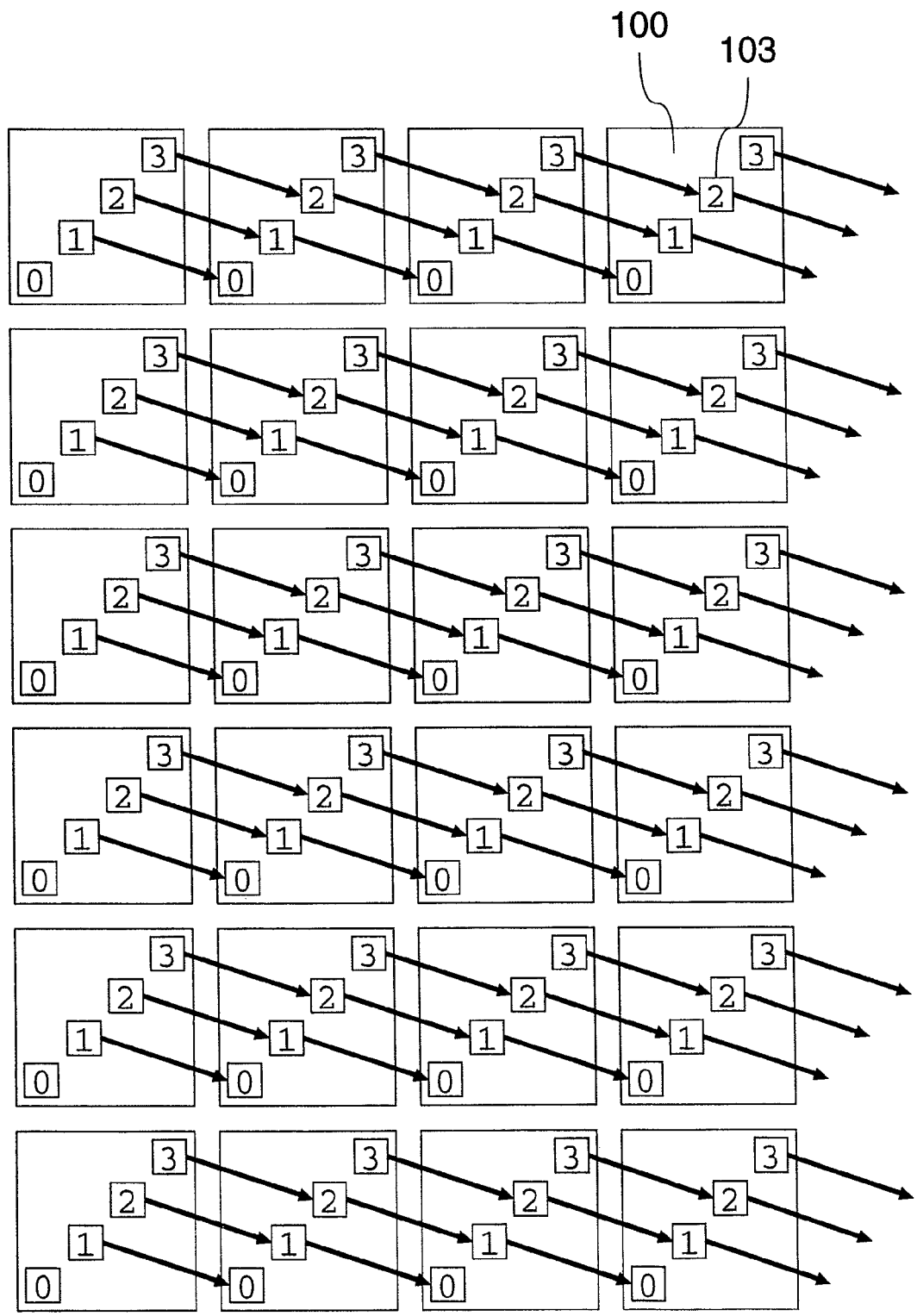
FIG. 80 is an explanation view for wiring, in a case that each of four controllers in an array operation unit sends data to a controller in a right array operation unit, whose assigned number is one smaller than a number of the controller.
Figure 81:
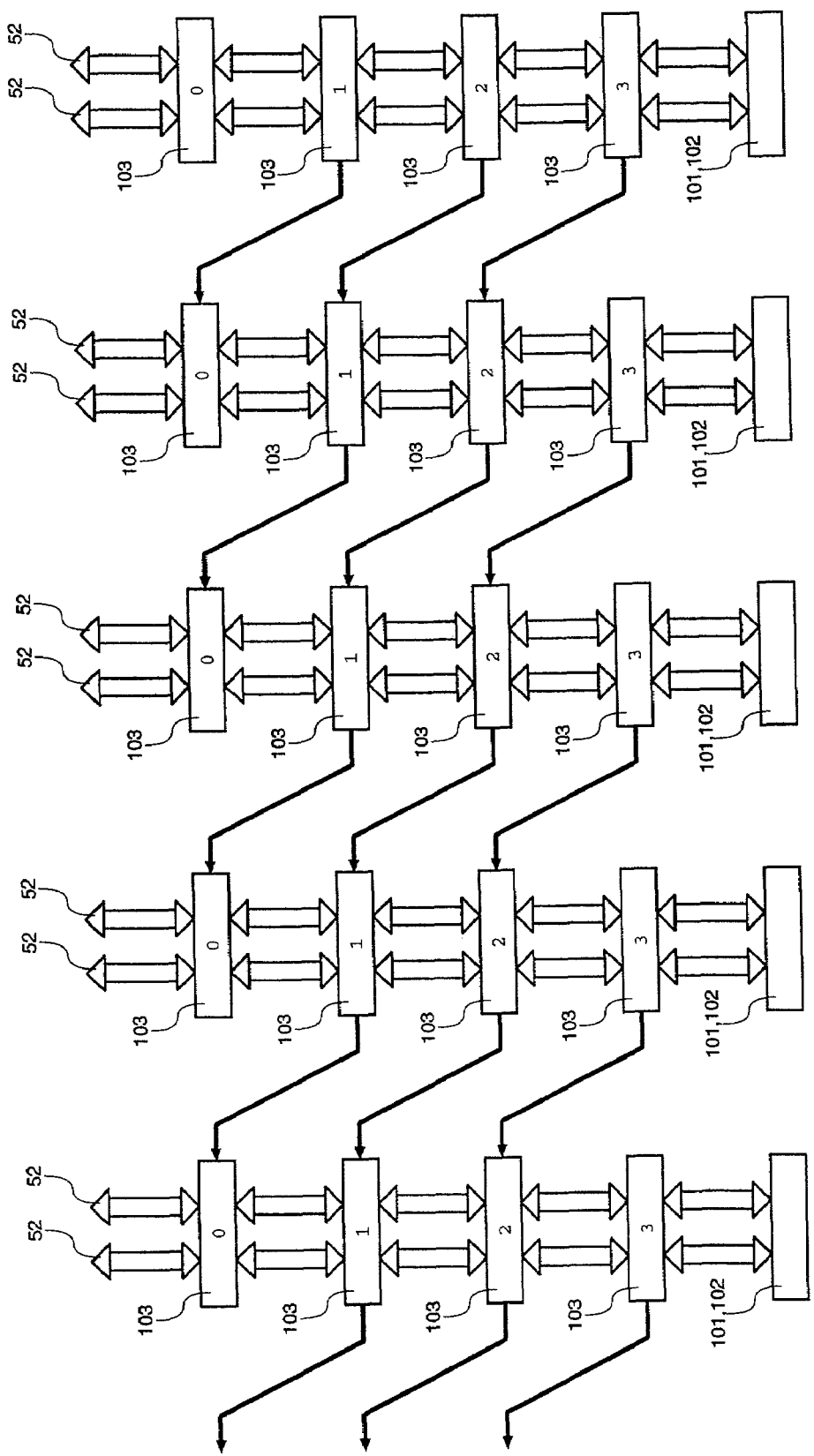
FIG. 81 is an explanation view for wiring, in a case that each of four controllers arranged vertically in an array operation unit sends data to a controller in an upper array operation unit, whose assigned number is one smaller than a number of the controller.

FIG. 77 shows that each controller 103 in all array operation units 100 sends a calculation datum to one among four controllers 103 in an upper array operation unit 100, whose number is only one smaller than it. Note that the calculation datum received by the controller 103 with the number, 0, is destroyed. FIG. 78 shows that each controller 103 in all array operation units 100 sends a calculation datum to one among four controllers 103 in a lower array operation unit 100, whose number is only one bigger than it. Note that the calculation datum received by the controller 103 with the number, 3, is destroyed. FIG. 79 shows that each controller 103 in all array operation units 100 sends a calculation datum to one among four controllers 103 in a left array operation unit 100, whose number is only one bigger than it. Note that the calculation datum received by the controller 103 with the number, 3, is destroyed. FIG. 80 shows that each controller 103 in all array operation units 100 sends a calculation datum to one among four controllers 103 in an upper array operation unit 100, whose number is only one smaller than it. Note that the calculation datum received by the controller 103 with the number, 0, is destroyed. Since each controller 103 transmits a calculation datum, according to flows of calculation data shown in FIG. 77 to FIG. 80, transmission times of the calculation datum are less than or equal to three times. Moreover, since the processor 101 writes the calculation datum to a controller 103 with any number, the calculation datum is transmitted only times related with the number of the controller 103. For example, in FIG. 77, if a calculation datum was written to a controller 103 with the number, 2, the calculation datum is transmitted upward only two times. Similarly, in FIG. 78, if a calculation datum was written to the controller 103 with the number, 2, the calculation datum is transmitted downward only one time. Therefore, after the processor 101 calculated transmission times of the calculation datum first, the processor 101 does not have to check the transmission times. Moreover, after the processor 101 wrote the calculation datum to a controller 103 first, a processor 101 in each of some upper array operation units 100 has only to reads the calculation datum. As a result, the processor 101 does not have to write the calculation datum again. In short, a processor 101 in each array operation unit 100 can reduce access times to some controllers 103. In FIG. 77 to FIG. 80, some array operation units 100 are arranged in the shape of a lattice, but these facts are similar even though some virtual array operation units 105 are arranged in the shape of a lattice. In addition, as shown in FIG. 81, these facts are similar even though some controllers 103 are stacked.

Figure 76:
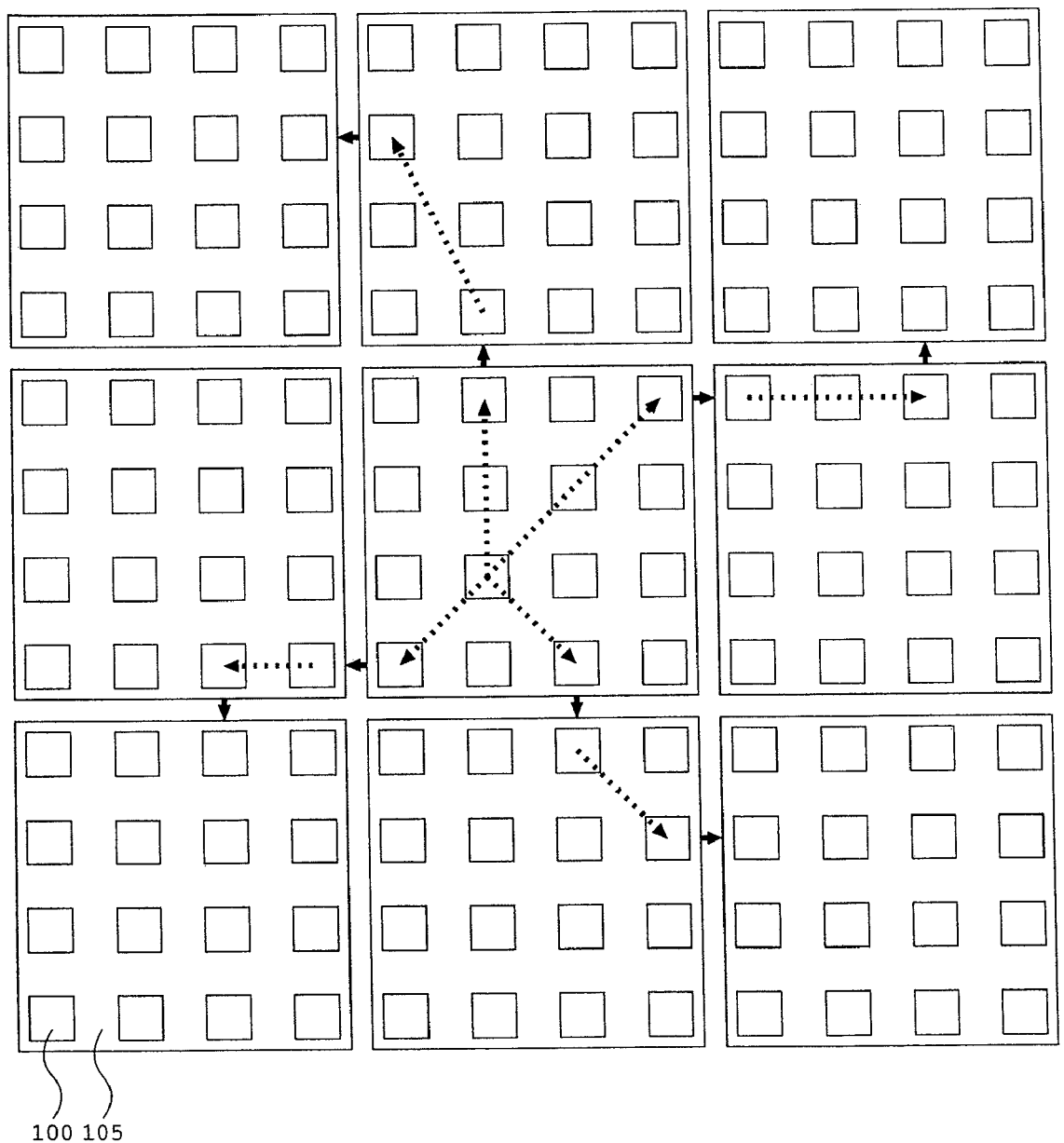
FIG. 76 is an explanation view for a real transmit route, in a case that a virtual array operation unit including 4×4 array operation units transmits data counter-clockwisely to 120 neighbors.
Figure 82:
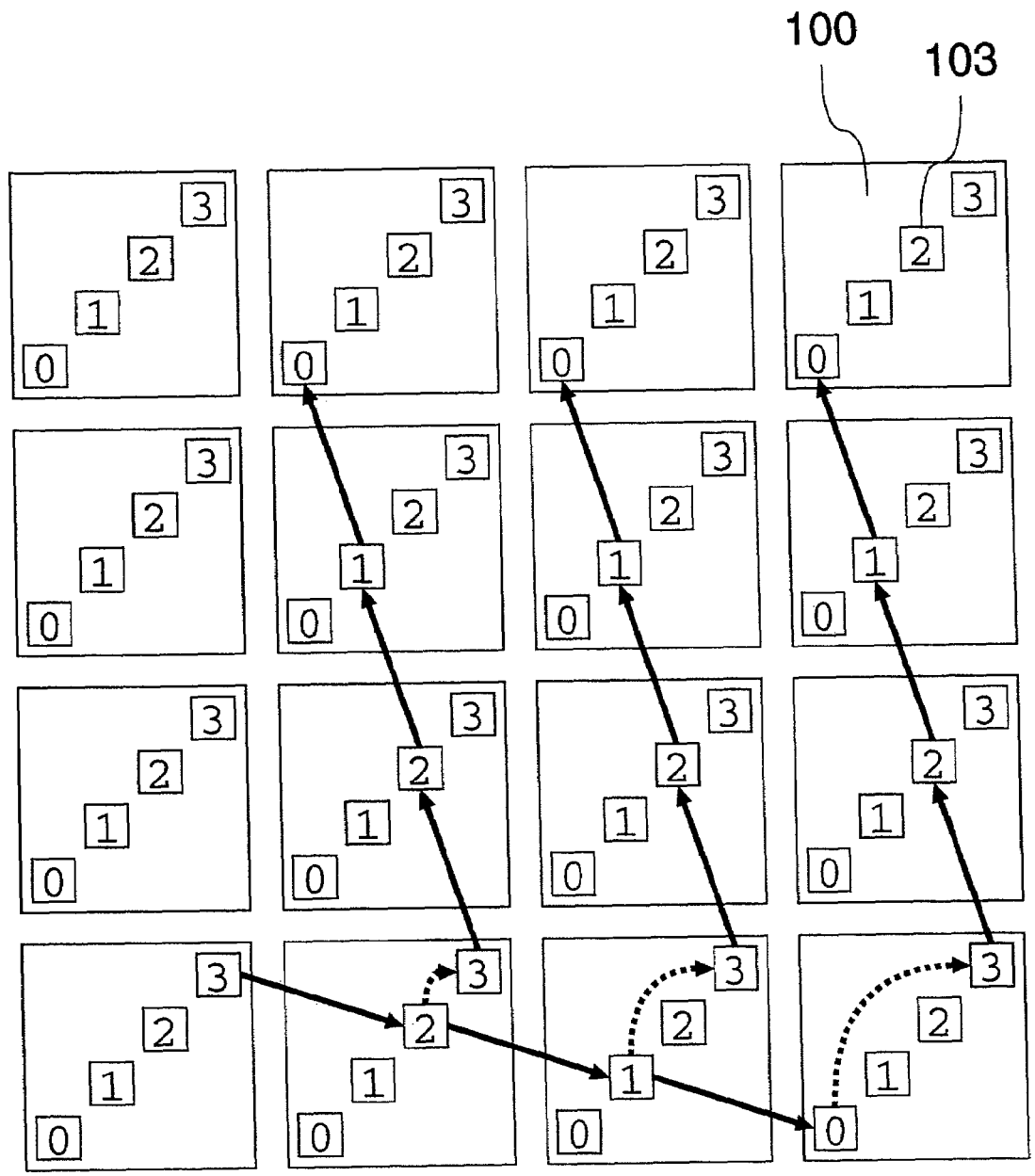
FIG. 82 is an explanation view for a transmit route in upper-right direction, in a case that an array operation unit comprising controllers for transmit transmits data counter-clockwisely.
Figure 83:
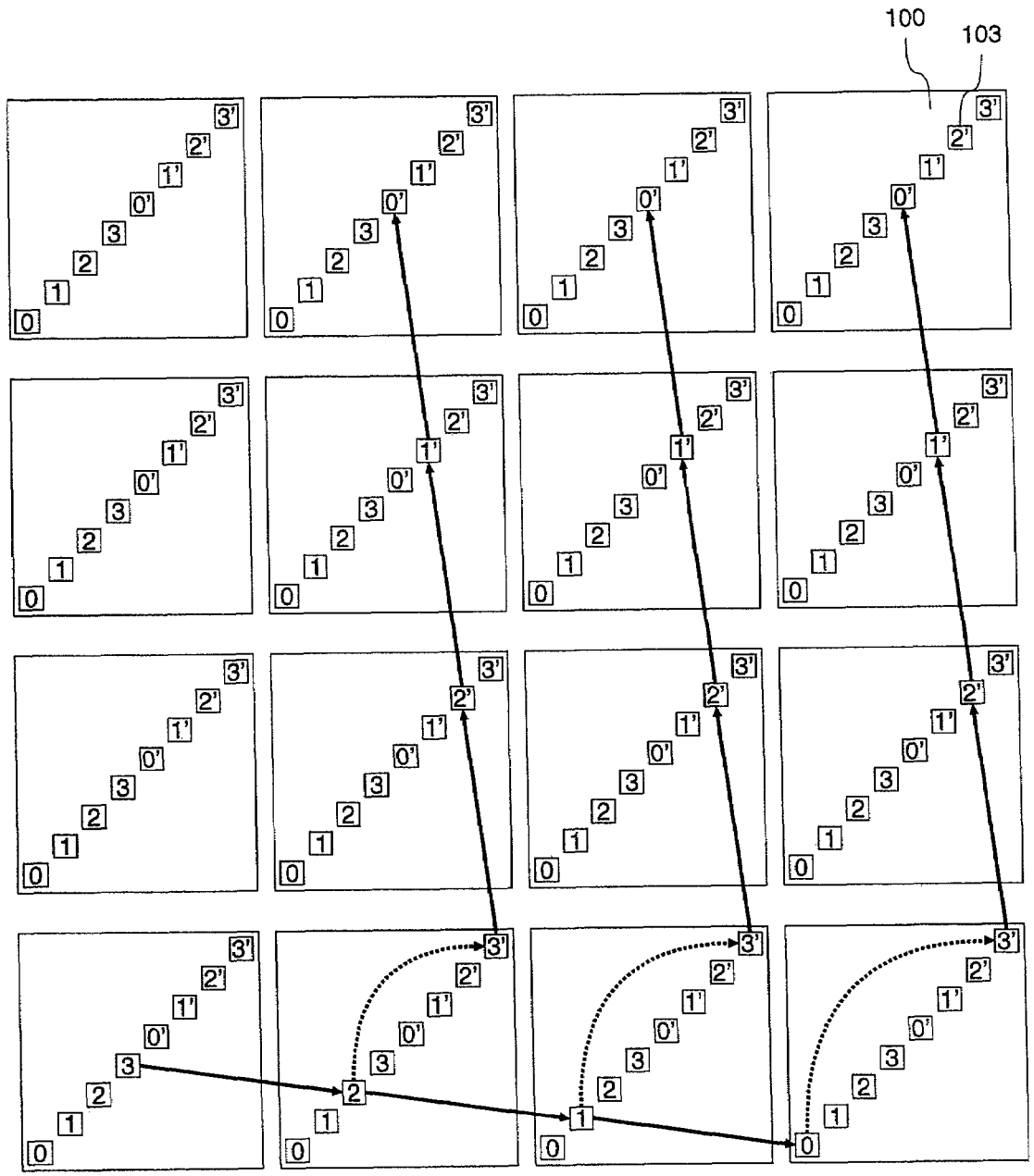
FIG. 83 is an explanation view for a transmit route in upper-right direction, in a case that an array operation unit comprising controllers for transmit and retransmit transmits data counter-clockwisely.

By the way, a calculation datum can be transmitted to either one of upper, lower, left and right directions only specific times, by the methods shown in FIG. 77 to FIG. 80. In order to transmit the calculation datum counter-clockwisely and clockwisely in the shape of a spiral like FIG. 76, transmitting to two directions among the upper, lower, left and right directions has better be combined, as shown in FIG. 82. In order to transmit the calculation datum to 48 neighbors of array operation units 100 counter-clockwisely, note that FIG. 82 shows a case that the calculation datum is transmitted to three upper array operation units 100 in each of three right array operation units 100 while the calculation datum is transmitted to the three array operation units 100. As shown by dashed curves, here, the calculation datum received by a controller 103 in each of the three right array operation units 100 is transmitted to a controller 103 with the number, 3. This transmission is called retransmission. Note that the retransmission is generally carried out by a processor 101. This reason is that the number of a controller 103, to which a calculation datum received by the controller 103 is written, is varied by size of neighbors to which the calculation datum is transmitted, that is, the number of combinations of retransmission becomes up to a square of the number of controllers 103. In addition, even though the array operation unit 100 comprises many controllers 103, the processor 101 can retransmit the calculation datum between any controllers 103. As shown in FIG. 83, suppose that some (now eight) controllers 103 are divided into two sets every four controllers 103, and the numbers, 0 to 3 and 0' to 3', are assigned to them, respectively. Moreover, the controllers 103 with the numbers, 0 to 3, are assigned for transmission, and the controllers 103 with the numbers, 0' to 3', are assigned for retransmission. Since a processor 101 retransmits a calculation datum received by the controllers 103 for transmission to the controllers 103 for retransmission, the calculation datum is transmitted to six array operation units 100 in a horizontal direction and to six array operation units 100 in a vertical direction, via the controllers 103 for transmission, followed by transmitting it to 48 neighbors of array operation units 100 via the controllers 103 for retransmission. In this method, some calculation data before retransmitting and some calculation data after retransmitting are transmitted individually by the controllers 103 for transmission and the controllers 103 for retransmission, respectively, in transmitting the calculation data before retransmitting and the calculation data after retransmitting are transmitted toward one direction. Therefore, the processor 101 can carries out retransmitting efficiently.

Now, it has been described above about flows of calculation data between controllers 103 and retransmission. The controller 103 like FIG. 62, however, can not carry out such a transmission method. It is explained here about a new controller 103 comprising a function transmitting the calculation data. Although width of internal data bus 56 can be decided freely, suppose that the width of the internal data bus 56 is 16 bits. In addition, it is explained here, referring to an array operation unit 100, but it is similar even in a case of a virtual array operation unit 105 if there are no specific indications.

Figure 84:
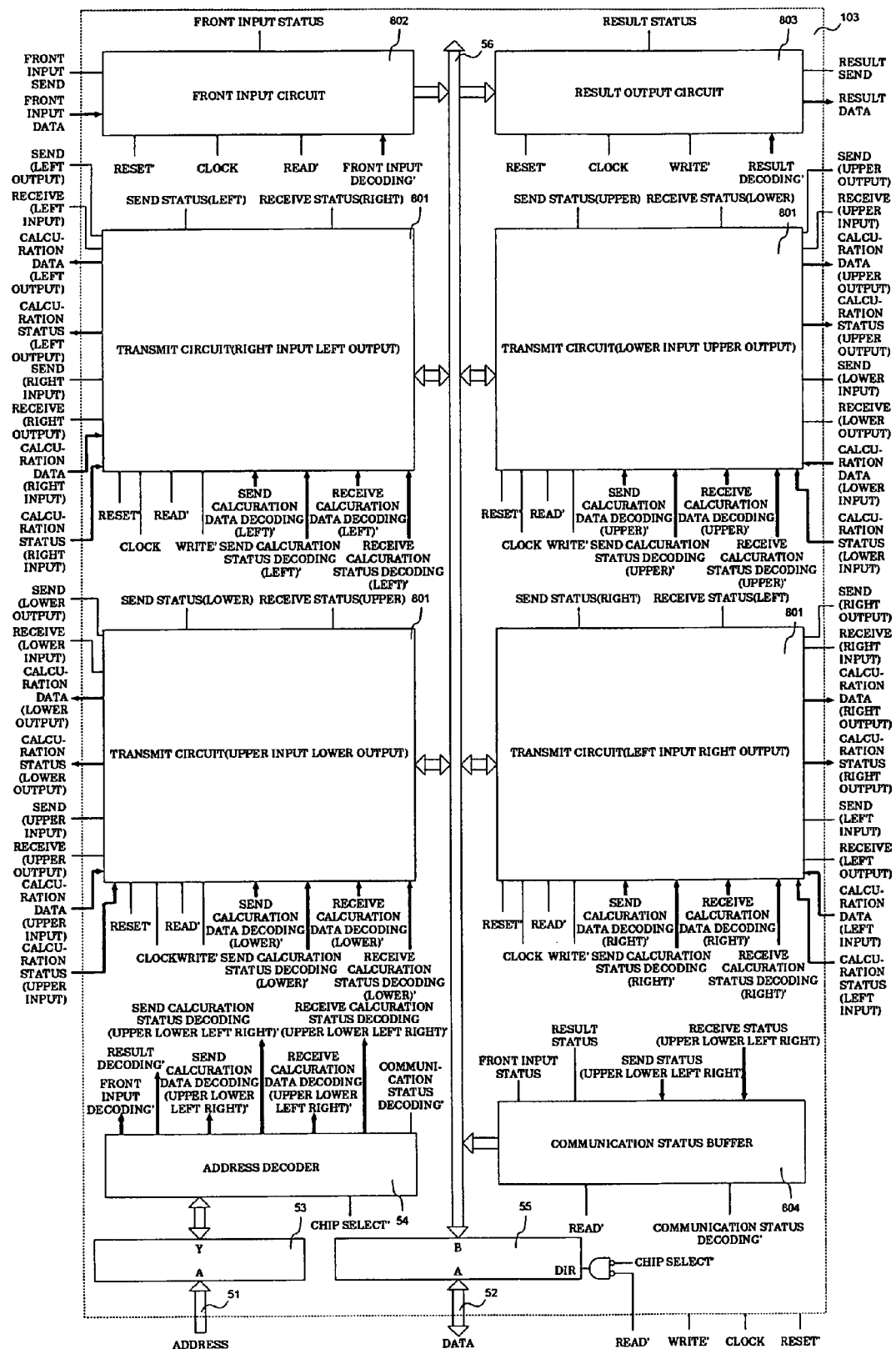
FIG. 84 is an explanation view for a controller comprising four transmit circuits.

As shown in FIG. 84, first, a controller 103 comprises an address buffer 53, a data buffer 55, an address decoder 54, four transmit circuits 801, one or more front input circuits 802, one or more result output circuits 803 and a communication status buffer 804. Note that a signal x' denotes a negative-logic of a signal x, and a thick line denotes a ream of some signals. Here, four transmit circuits 801 transmit a calculation datum and a calculation status from a down side to an up side, from an up side to a down side, from a right side to a left side, and from a left side to a right side, respectively. Therefore, in order to realize flows of calculation data shown in FIG. 77, transmit circuits 801 transmitting a calculation datum from a down side to an up side are connected with each other, in each controller 103. Similarly, in cases of FIG. 78 to FIG. 80, transmit circuits 801 transmitting the calculation datum from an up side to a down side, a right side to a left side and a left side to a right side are connected with each other, respectively. A detail of the transmit circuit 801 is explained later.

Next, the address buffer 53, the data buffer 55 and the address decoder 54 are similar with the past ones. Note that the address decoder 54 generates some decoding signals, if desired.

Next, the communication status buffer 804 outputs a SEND STATUS toward each of up, down, left and right directions, a RECEIVE STATUS toward each of up, down, left and right directions, a FRONT INPUT STATUS and a RESULT STATUS, which are outputted by four transmit circuits 801, a front input circuit 802 and a result output circuit 803, to the internal data bus 56. A general line buffer is used as the communication status buffer 804. Note that, as is clear from FIG. 85, in a case of the internal data bus 56 with 16-bit width, the communication status buffer 804 can increase the number of the FRONT INPUT STATUSes and the RESULT STATUSes up to seven, respectively. Therefore, a designer of the controller 103 can increase the number of the front input circuits 802 and the result output circuits 803, if desired.

Figure 86:
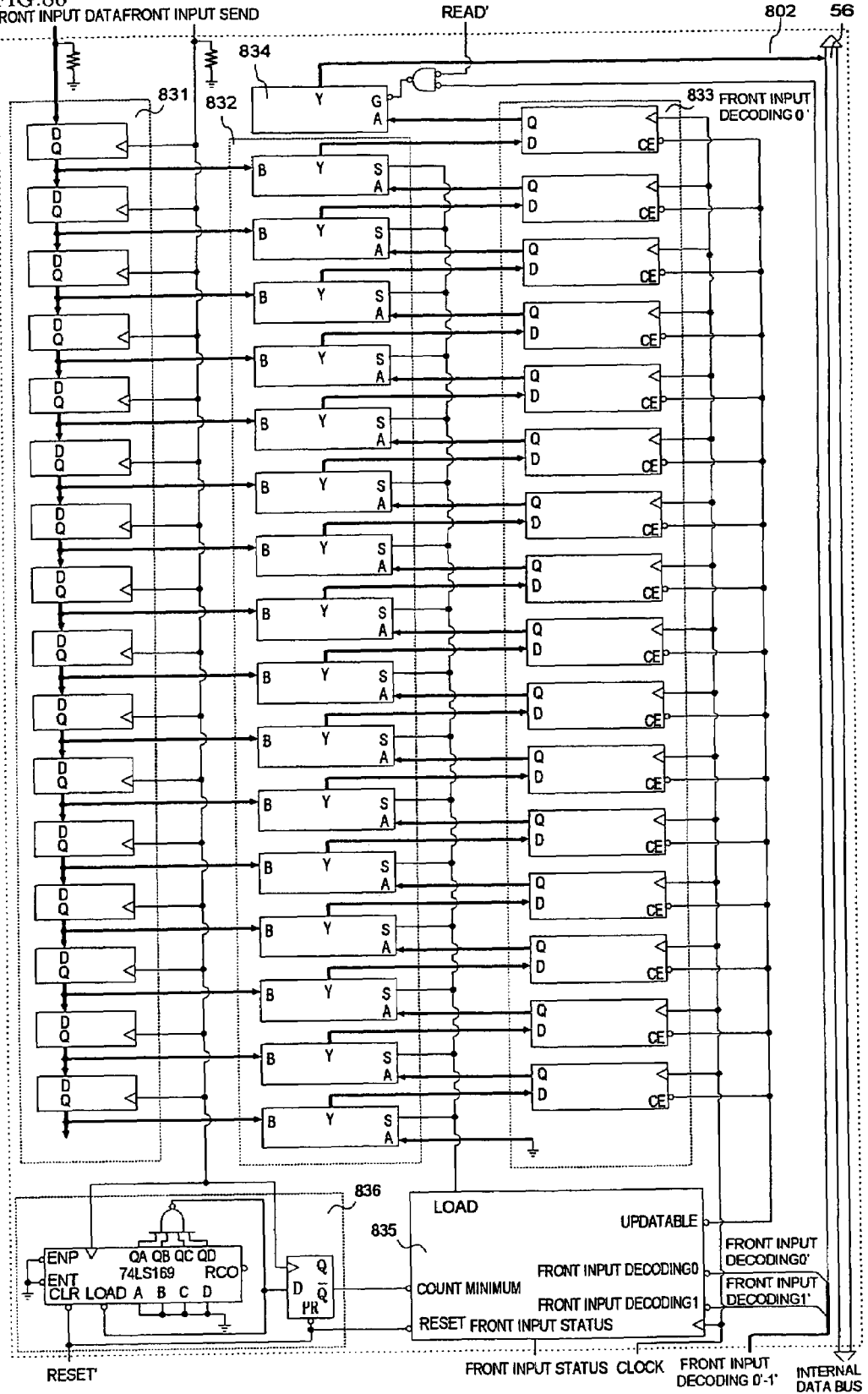
FIG. 86 is an explanation view for a front input circuit inputting 16 front input data.

As shown in FIG. 86, next, whenever a FRONT INPUT SEND rose, the front-input-data input register 831 memorizes some (now 16) front input data in order, in the front input circuit 802. Of course, when the FRONT INPUT SEND fell, the front-input-data input register 831 can also memorize some (now 16) front input data in order. Moreover, the front-input-data counter 836 counts rising times of the FRONT INPUT SEND. After the rising times arrived at appointed times, a COUNT MINIMUM' is outputted as zero. Note that other counters, of course, can be used although a 74LS169 IC is used as a counter of the front-input-data counter 836 in FIG. 86. In addition, once the COUNT MINIMUM' becomes zero, some (now 16) front input data are memorized by a front-input-data output register 833. Therefore, even though additional front input data are inputted, the front input data memorized by the front-input-data output register 833 are never changed. After that, whenever a FRONT INPUT DECODING0' became zero, some front input data memorized by the front-input-data output register 833 are shifted, followed by outputting to the internal data bus 56 one by one via a front-input-data line buffer 834.

Figure 87:
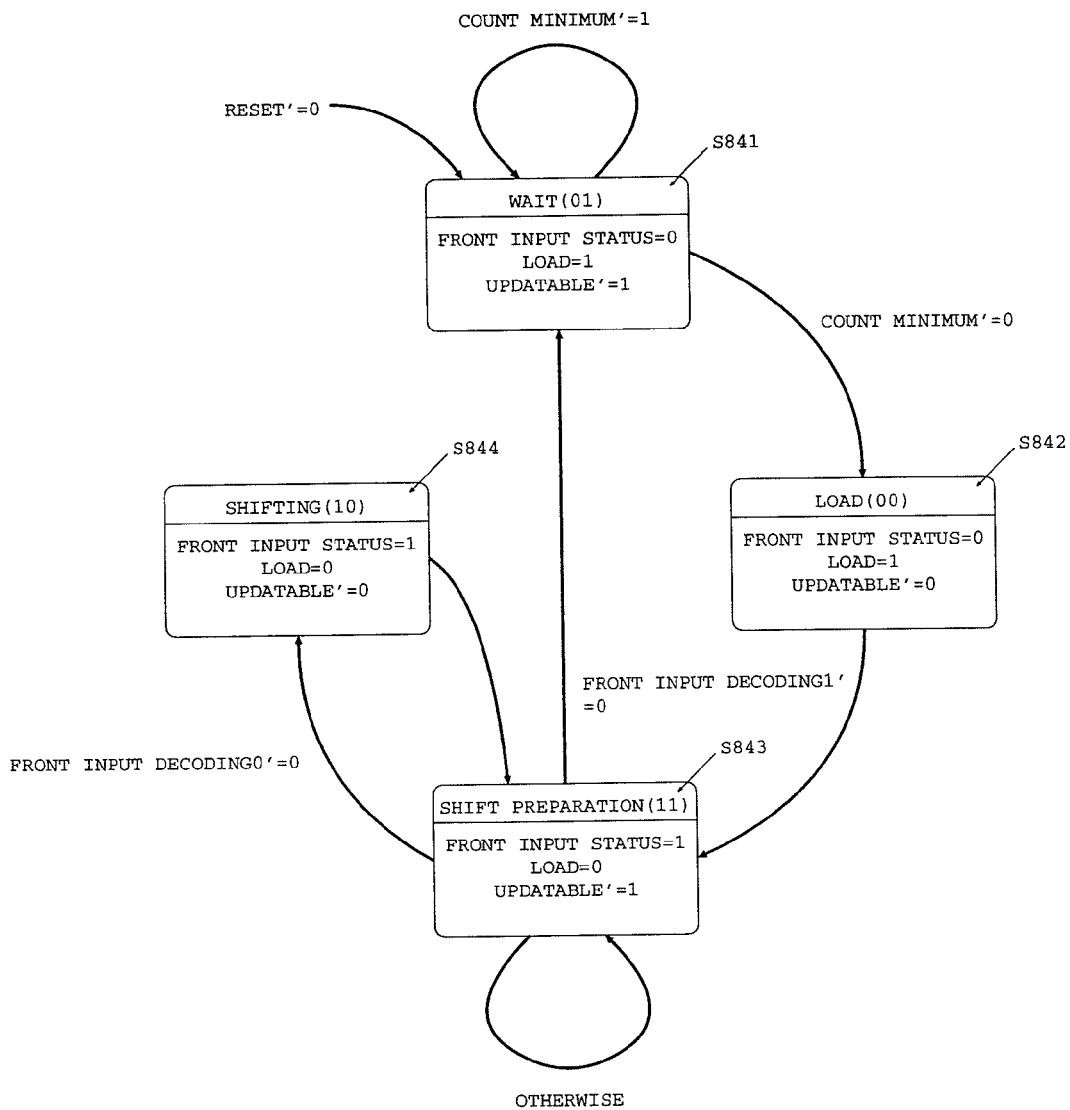
FIG. 87 is a state transition diagram of a controller for a front input circuit.

Now, a state transition diagram of a controller for front-input circuit 835 is like FIG. 87. It is explained here about the state transition diagram.

A state 841 is a WAIT state (01). It sets a FRONT INPUT STATUS to zero, a LOAD to one, and a UPDATABLE' to one. If a RESET' is active, it goes to the state 841. In addition, if a COUNT MINIMUM' is zero, it goes to a state 842. Otherwise, it goes to the state 841.

The state 842 is a LOAD state (00). It sets the FRONT INPUT STATUS to zero, the LOAD to one, and the UPDATABLE' to zero, followed by going to a state 843.

The state 843 is a SHIFT PREPARATION state (11). It sets the FRONT INPUT STATUS to one, the LOAD to zero, and the UPDATABLE' to one. If a FRONT INPUT DECODING0' is zero, it goes to a state 844. Otherwise, it goes to the state 843.

The state 844 is a SHIFTING state (10). It sets the FRONT INPUT STATUS to one, the LOAD to zero, and the UPDATABLE' to zero, followed by going to the state 843.

Note that the number assigned to each state can be varied.

In addition, although the front-input-data input register 831 inputs front input data according to the width of the internal data bus 56 in FIG. 86, of course, it can input the front input data every one bit. In this case, the maximum count number of the front-input-data counter 836 becomes a product of a specific times (now 15 times) and the number of bits of the internal data bus 56. By inputting the front input data every one bit like this, an LSI designer can reduce the number of vertical signal lines 278 very much, in implementing a visual device 2 into a three-dimensional LSI. Therefore, the LSI designer can reduce the number of vias whose implement area is big. Thus, implementation of the three-dimensional LSI.

Figure 88:
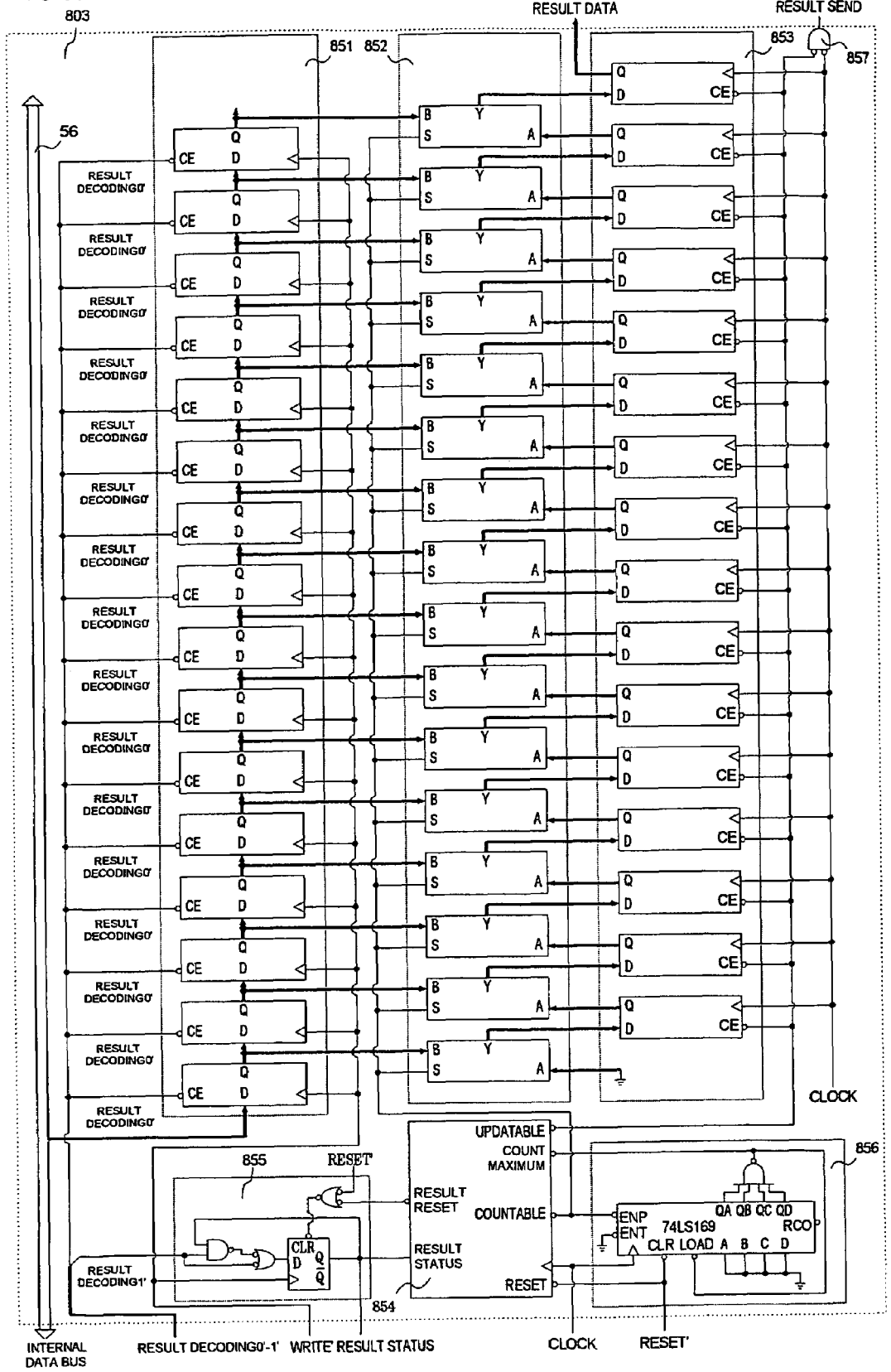
FIG. 88 is an explanation view for a result output circuit outputting 16 result data.

Next, as shown in FIG. 88, a RESULT DECODING0' is selected in the result output circuit 803. Moreover, whenever a WRITE' rose, a result-data input register 851 memorizes some (now 16) result data via the internal data bus 56, shifting them. After this, when a RESULT DECODING1' became active, and moreover, the WRITE' rose, the RESULT STATUS becomes one. A controller for result-output circuit 854 transfers some result data to the result-data output register 853 via a result-data multiplexer 852, while it shifts some result data in the result-data output register 853 via the result-data multiplexer 852. Here, the RESULT SEND repeats one and zero. Moreover, a result-data counter 856 counts output times of the result data. After the output times arrived at appointed times (now 16 times), the RESULT STATUS is outputted as zero. Note that other counters, of course, can be used although a 74LS169 IC is used as a counter of the result-data counter 836 in FIG. 88.

Figure 89:
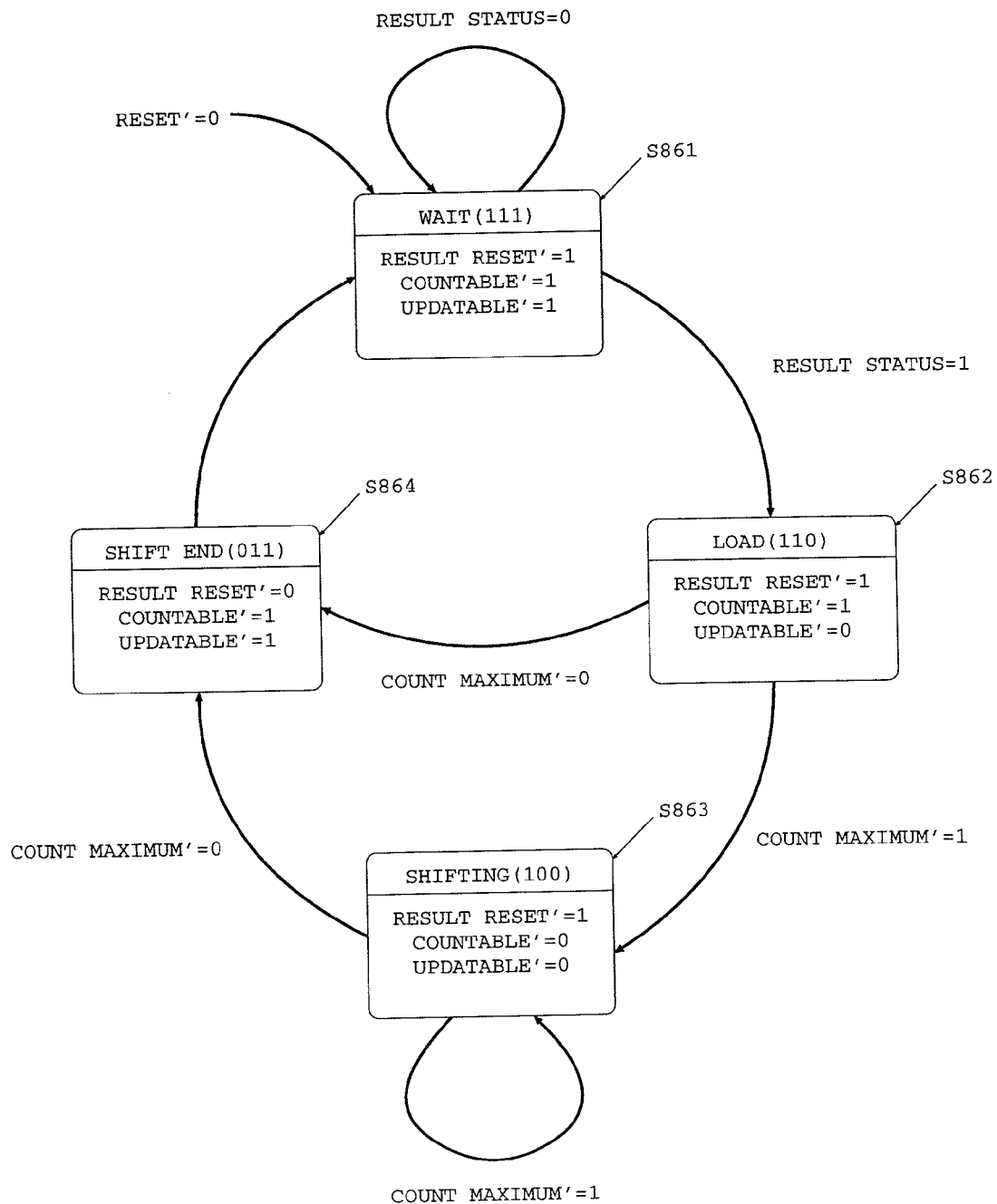
FIG. 89 is a state transition diagram of a controller for a result output circuit.

Now, a state transition diagram of a controller for result-output circuit 854 is like FIG. 89. It is explained here about the state transition diagram.

A state 861 is a WAIT state (111). It sets a RESULT RESET' to one, a COUNTABLE' to one, and an UPDATABLE' to one. If a RESET' is active, it goes to the state 861. In addition, if a RESULT STATUS is one, it goes to a state 862. Otherwise, it goes to the state 861.

The state 862 is a LOAD state (110). It sets the RESULT RESET' to one, the COUNTABLE' to one, and the UPDATABLE' to zero. If a COUNT MAXIMUM' is zero, it goes to a state 864. Otherwise, it goes to a state 863.

The state 863 is a SHIFTING state (100). It sets the RESULT RESET' to one, the COUNTABLE' to zero, and the UPDATABLE' to zero. If the COUNT MAXIMUM' is zero, it goes to the state 864. Otherwise, it goes to the state 863.

The state 864 is a SHIFT END state (011). It sets the RESULT RESET' to zero, the COUNTABLE to one, and the UPDATABLE' to one, followed by going to the state 861.

Note that the number assigned to each state can be varied.

In addition, although the result-data output register 853 and the result-data multiplexer 852 shift the result data, according to the width of the internal data bus 56 in FIG. 88, of course, they can input the result data every one bit. In this case, the maximum count number of the result-data counter 856 becomes a product of a specific times (now 15 times) and the number of bits of the internal data bus 56. By inputting the result data every one bit like this, an LSI designer can reduce the number of vertical signal lines 278 very much, in implementing a visual device 2 into a three-dimensional LSI. Therefore, the LSI designer can reduce the number of vias whose implement area are big. Thus, implementation of the three-dimensional LSI.

Now, it has been described above about a part except the transmit circuits 801 in the new controller 103. It is explained here about the transmit circuit 801.

Figure 90:
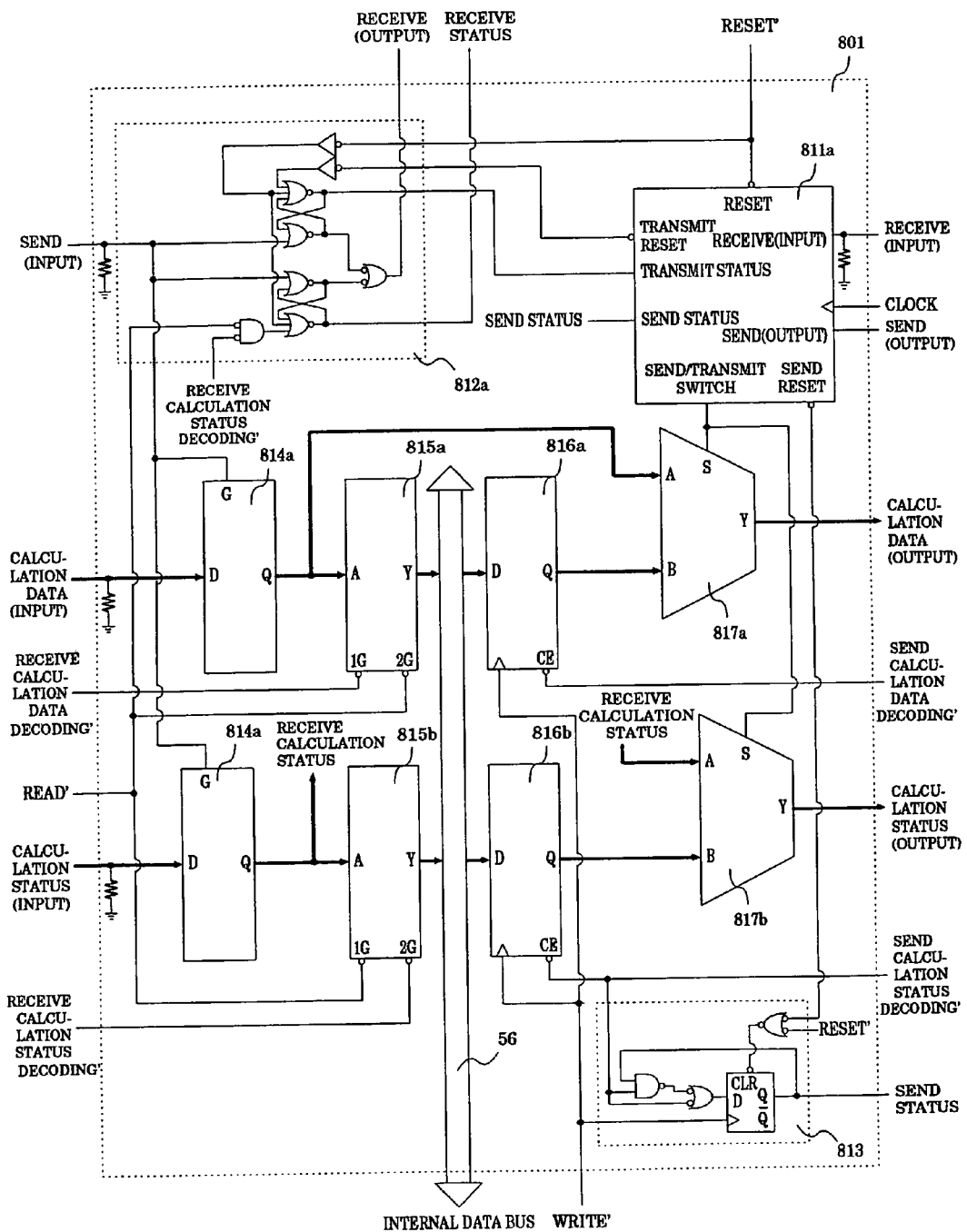
FIG. 90 is an explanation view for a transmit circuit communicating a positive-logical SEND and a positive-logical RECEIVE, and memorizing a calculation datum when the SEND is active.

As shown in FIG. 90, each transmit circuit 801 comprises a controller for positive-logical transmit circuit 811a, a latch for positive-logical transmit 812a, a send-status generation circuit 813, a calculation-data receive latch 814a, a calculation-status receive latch 814b, a calculation-data line buffer 815a, a calculation-status line buffer 815b, a calculation-data send buffer 816a, a calculation-status send buffer 816b, a calculation-data multiplexer 817a and a calculation-status multiplexer 817b. Note that some pull-up resistors and pull-down resistors are attached to input terminals, if desired. When a SEND(INPUT) is active, a calculation datum and a calculation status received from a controller 103 in adjoining array operation units 100 are memorized in the calculation-data receive latch 814a and the calculation-status receive latch 814b. When a RECEIVE CALCULATION DATA DECODING' is active, and a READ' is also active, the calculation datum is outputted to the internal data bus 56 via the calculation-data line buffer 815a. In addition, when a RECEIVE CALCULATION STATUS DECODING' is active, and the READ' is also active, the calculation status is outputted to the internal data bus 56 via the calculation-status line buffer 815b. On the other hand, when a SEND CALCULATION DATA DECODING' is active, and a WRITE' is also active, a calculation datum and a calculation status written by the processor 101 via the internal data bus 56 are memorized by the calculation-data send buffer 816a and the calculation-status send buffer 816b. The calculation-data multiplexer 817a selects a calculation datum from either the calculation-data receive latch 814a or the calculation-data send buffer 816a, according to a SEND/TRANSMIT SWITCH, followed by sending it to a controller 103 in the adjoining array operation units 100. The calculation-status multiplexer 817b selects a calculation status from either the calculation-status receive latch 814b or the calculation-status send buffer 816b, according to the SEND/TRANSMIT SWITCH, followed by sending it to a controller 103 in the adjoining array operation units 100. Here, a SEND(OUTPUT) becomes active. When the SEND(INPUT) is active, the latch for positive-logical transmit 812a makes a RECEIVE(OUTPUT) active, while it sets a RECEIVE STATUS and a TRANSMIT STATUS to one. Note that the RECEIVE STATUS becomes zero when the RECEIVE CALCULATION STATUS DECODING' is active. However, when the RECEIVE CALCULATION DATA DECODING' is active, the RECEIVE STATUS can also become zero. In addition, when a TRANSMIT RESET' is active, the TRANSMIT STATUS becomes zero. The send-status generation circuit 813 sets the SEND STATUS to one when the calculation status was written to the calculation-status send buffer 816*b*. Note that the send-status generation circuit 813 can also set the SEND STATUS to one when the calculation data was written to the calculation-data send buffer 816*a*. When a SEND RESET' is active, the SEND STATUS becomes zero. The controller for positive-logical transmit circuit 811*a* inputs the RECEIVE(INPUT), followed by outputting the SEND(OUTPUT), while it inputs the SEND STATUS and the TRANSMIT STATUS, followed by outputting the SEND/TRANSMIT SWITCH, the SEND RESET and the TRANSMIT RESET.

Figure 91:
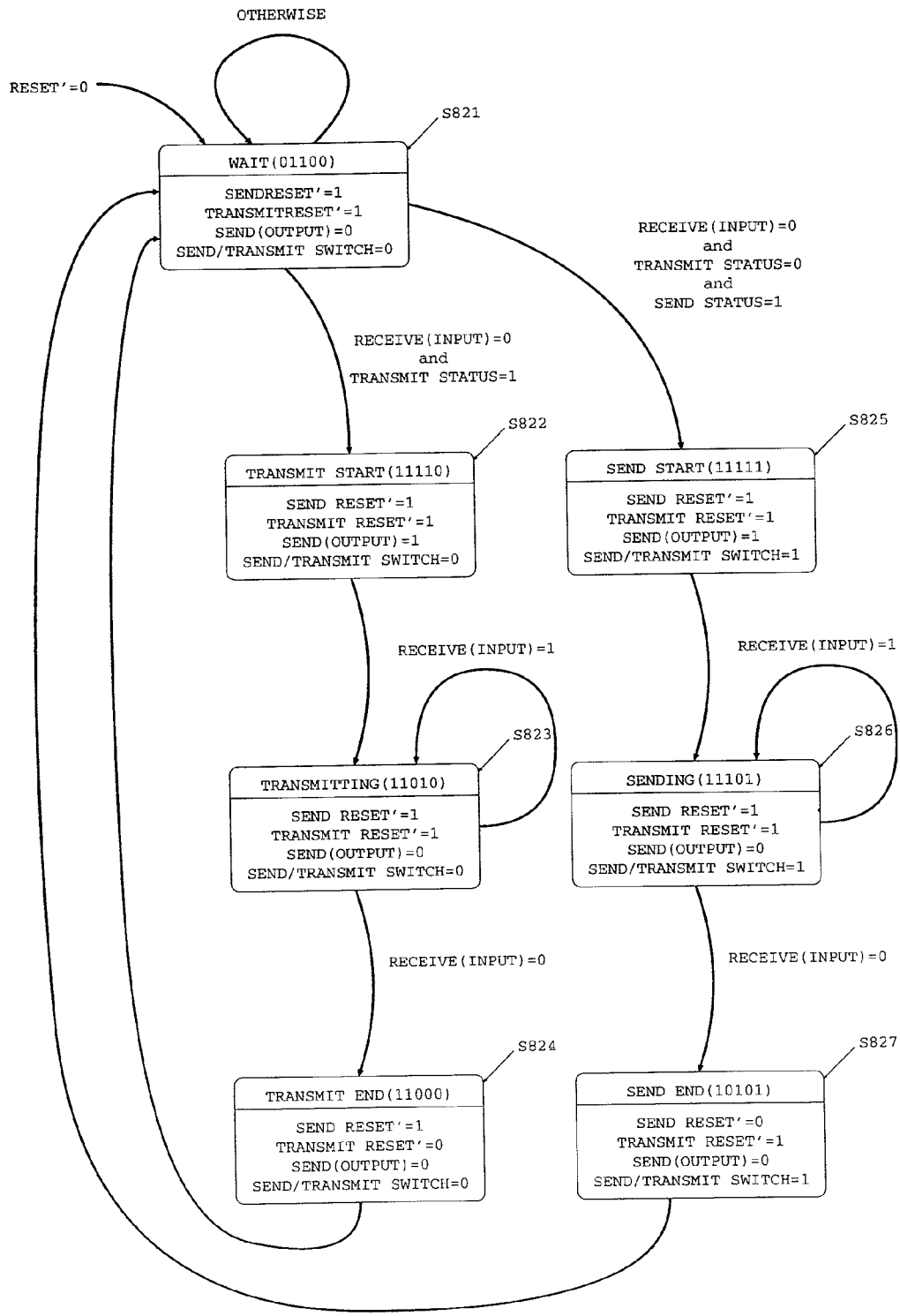
FIG. 91 is a state transition diagram of a controller for a transmit circuit communicating a positive-logical SEND and a positive-logical RECEIVE.

Now, a state transition diagram of the controller for positive-logical transmit circuit 811*a* is like FIG. 91. It is explained here about the state transition diagram.

A state 821 is a WAIT state (01100). It sets a SEND RESET' to one, a TRANSMIT RESET' to one, a SEND (OUTPUT) to zero, and a SEND/TRANSMIT SWITCH to zero. If a RESET' is active, it goes to the state 821. If a RECEIVE(INPUT) is zero and a TRANSMIT STATUS is one, it goes to a state 822. If the RECEIVE(INPUT) is zero, the TRANSMIT STATUS is zero, and a SENDT STATUS is one, it goes to a state 825. Otherwise, it goes to the state 821.

The state 822 is a TRANSMIT START state (11110). It sets the SEND RESET' to one, the TRANSMIT RESET' to one, the SEND(OUTPUT) to one, and the SEND/TRANSMIT SWITCH to zero, followed by going to the state 823.

The state 823 is a TRANSMITTING state (11010). It sets the SEND RESET' to one, the TRANSMIT RESET' to one, the SEND(OUTPUT) to zero, and the SEND/TRANSMIT SWITCH to zero. If the RECEIVE(INPUT) is zero, it goes to a state 824. Otherwise, it goes to the state 823.

The state 824 is a TRANSMIT END state (11000). It sets the SEND RESET' to one, the TRANSMIT RESET' to zero, the SEND (OUTPUT) to zero, and the SEND/TRANSMIT SWITCH to zero, followed by going to the state 821.

The state 825 is a SEND END state (11111). It sets the SEND RESET' to one, the TRANSMIT RESET' to one, the SEND(OUTPUT) to one, and the SEND/TRANSMIT SWITCH to one, followed by going to the state 826.

The state 826 is a SENDING state (11001). It sets the SEND RESET' to one, the TRANSMIT RESET' to one, the SEND(OUTPUT) to zero, and the SEND/TRANSMIT SWITCH to one. If the RECEIVE(INPUT) is zero, it goes to a state 827. Otherwise, it goes to the state 826.

The state 827 is a SEND END state (10101). It sets the SEND RESET' to zero, the TRANSMIT RESET' to one, the SEND(OUTPUT) to zero, and the SEND/TRANSMIT SWITCH to one, followed by going to the state 821.

Note that the number assigned to each state can be varied.

Figure 92:
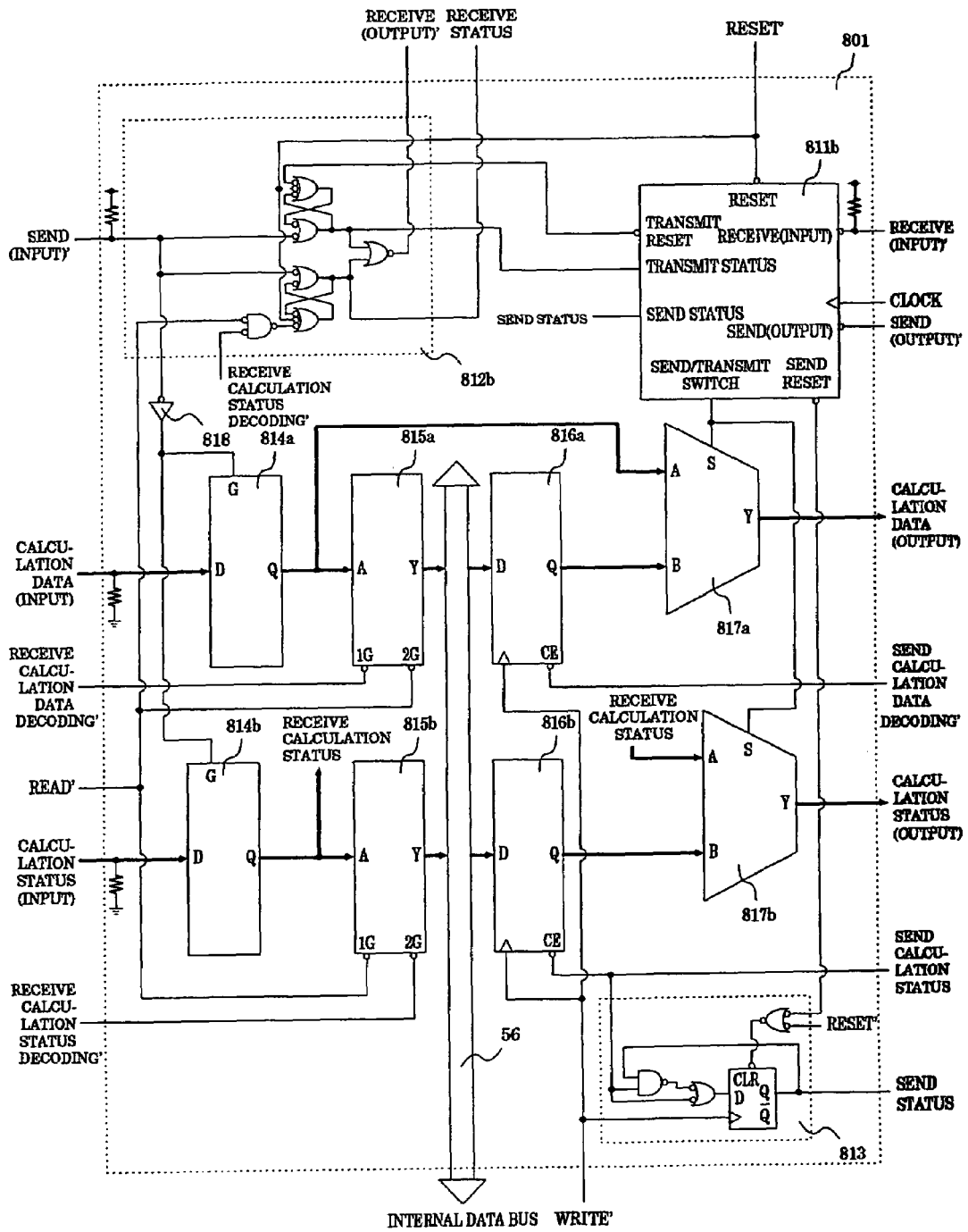
FIG. 92 is an explanation view for a transmit circuit communicating a negative-logical SEND and a negative-logical RECEIVE, and memorizing a calculation datum when the SEND is active.

A transmit circuit 801 is shown in FIG. 90, where the SEND(INPUT), the SEND(OUTPUT), the RECEIVE(INPUT) and the RECEIVE(OUTPUT) are positive logic. Of course, however, the SEND(INPUT), the SEND(OUTPUT), the RECEIVE(INPUT) and the RECEIVE(OUTPUT) can be also negative logic, as shown in FIG. 92. In this case, logic of the SEND(INPUT), the SEND(OUTPUT), the RECEIVE (INPUT) and the RECEIVE(OUTPUT) is inverted, by using an inverter for send 818 and so on, if desired.

Figure 93:
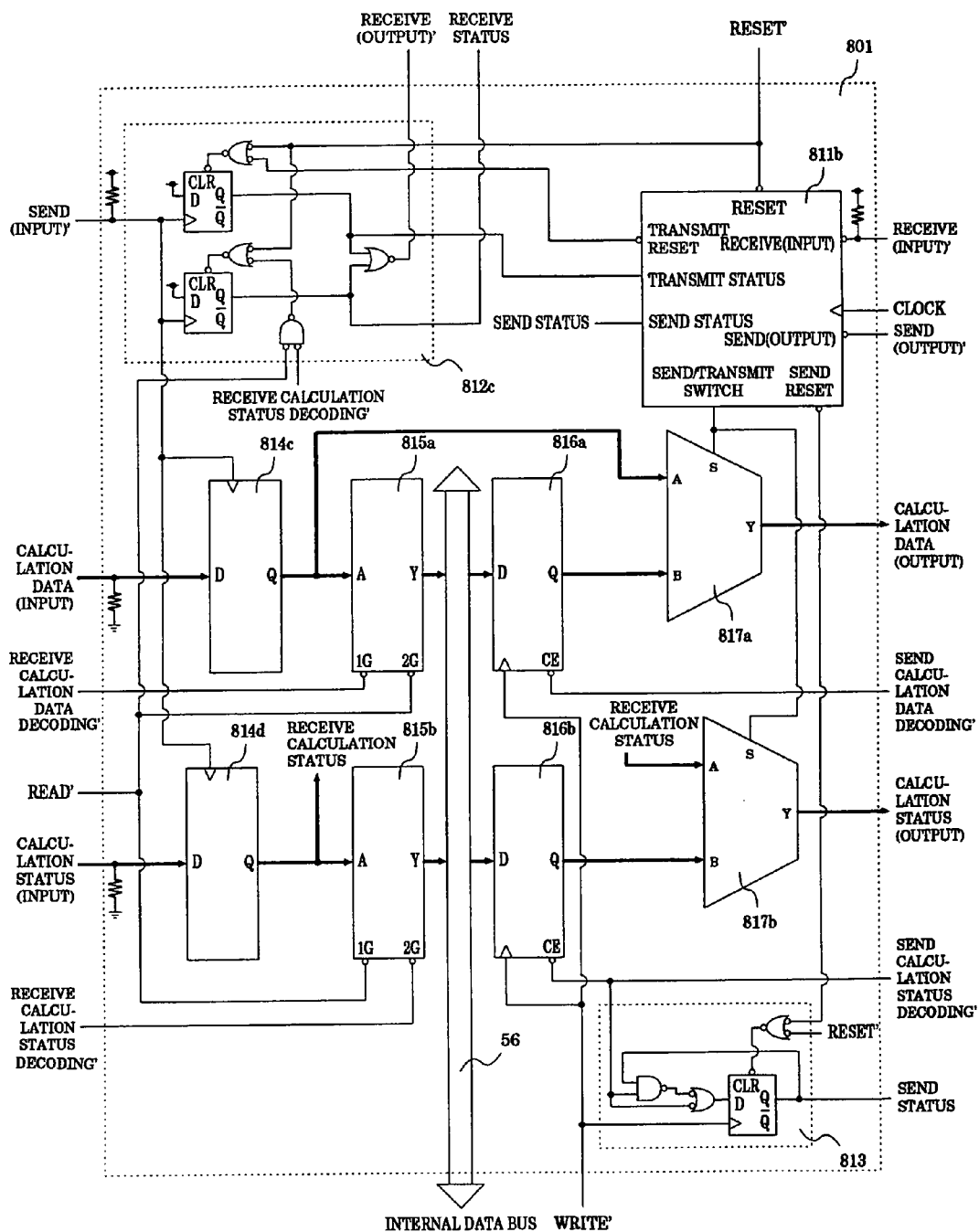
FIG. 93 is an explanation view for a transmit circuit communicating a negative-logical SEND and a negative-logical RECEIVE, and memorizing a calculation datum when the SEND rose.
Figure 94A:
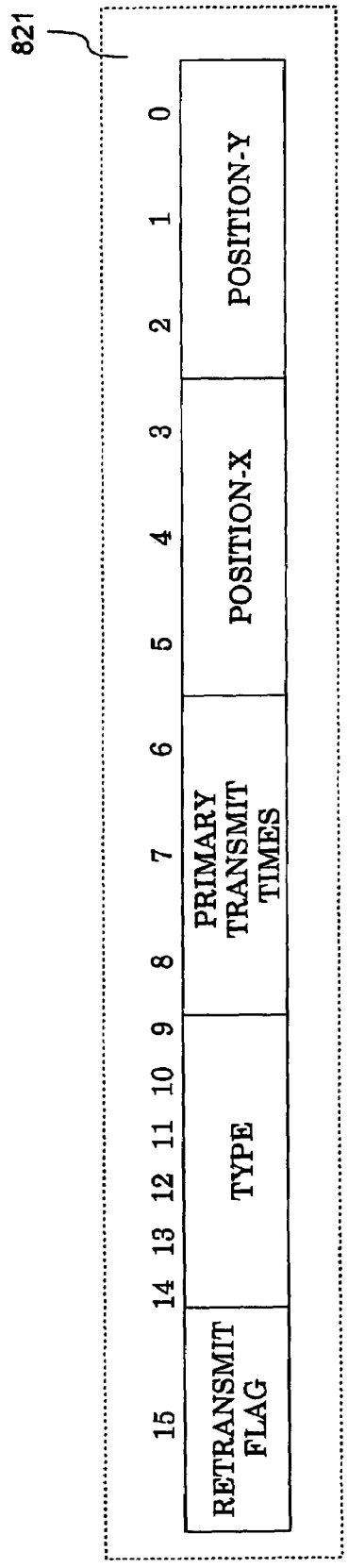
FIG. 94 is an explanation view for assignment of each bit in a calculation status.
Figure 94B:
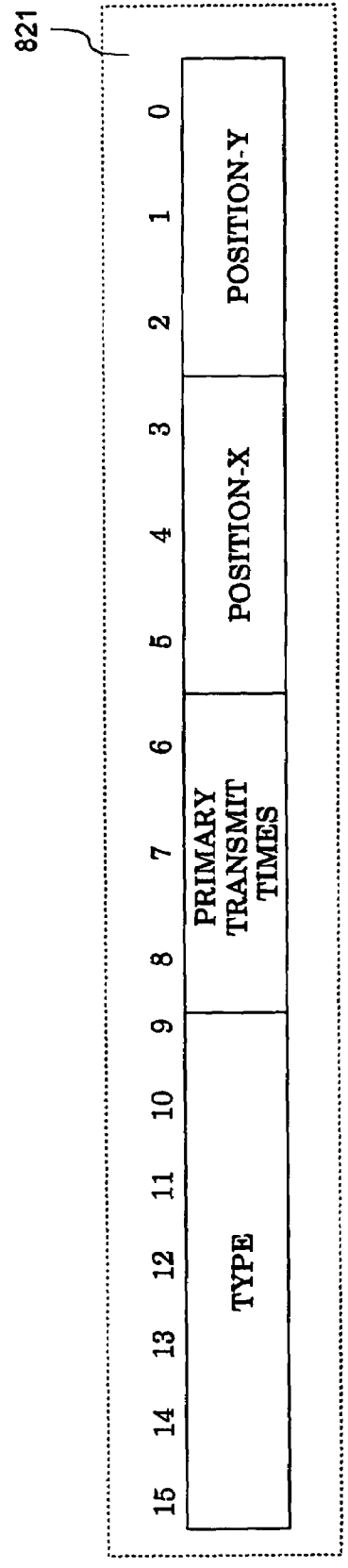
Figure 95:
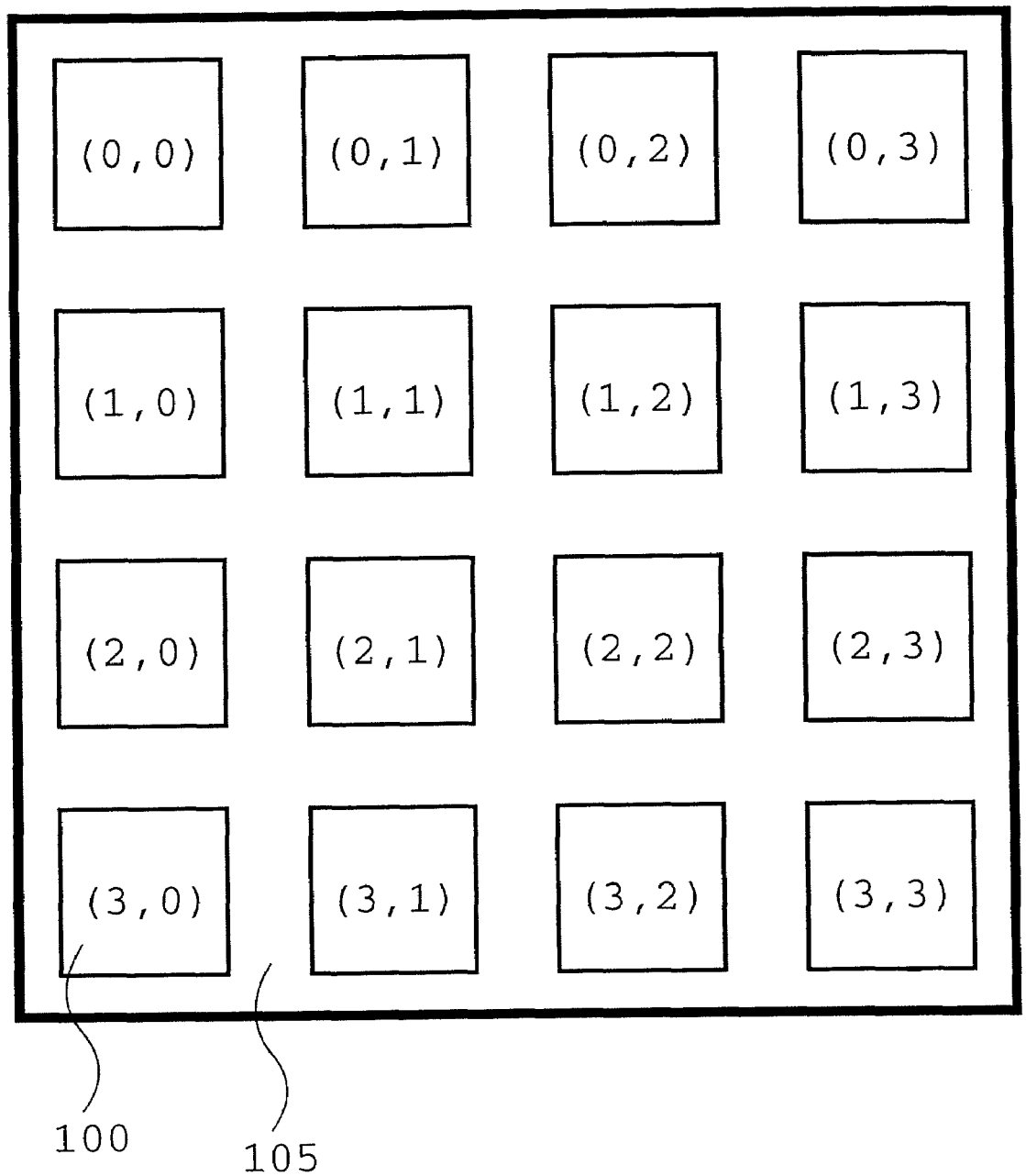
FIG. 95 is an explanation view for position of 4×4 array operation units included in a virtual array operation unit.

As shown in FIG. 93, furthermore, a register for negative-logical transmit 812*c*, a calculation-data receive register 814*c* and a calculation-status receive register 814*d* are used instead of the latch for negative-logical transmit 812*b*, the calculation-data receive latch 814*a* and the calculation-status receive latch 814*b*, respectively. In addition, when the SEND(INPUT)' rose, the RECEIVE(OUTPUT)' becomes active, while a calculation data and a calculation status received from a controller 103 in adjoining array operation units 100 are memorized by the calculation-data receive register 814*c* and the calculation-status receive register 814*d*, respectively.

Now, it has been described above about the visual device 2. It is explained here about the enforcement forms of inter-locked devices in the present invention, with reference to the drawings.

Figure 96:
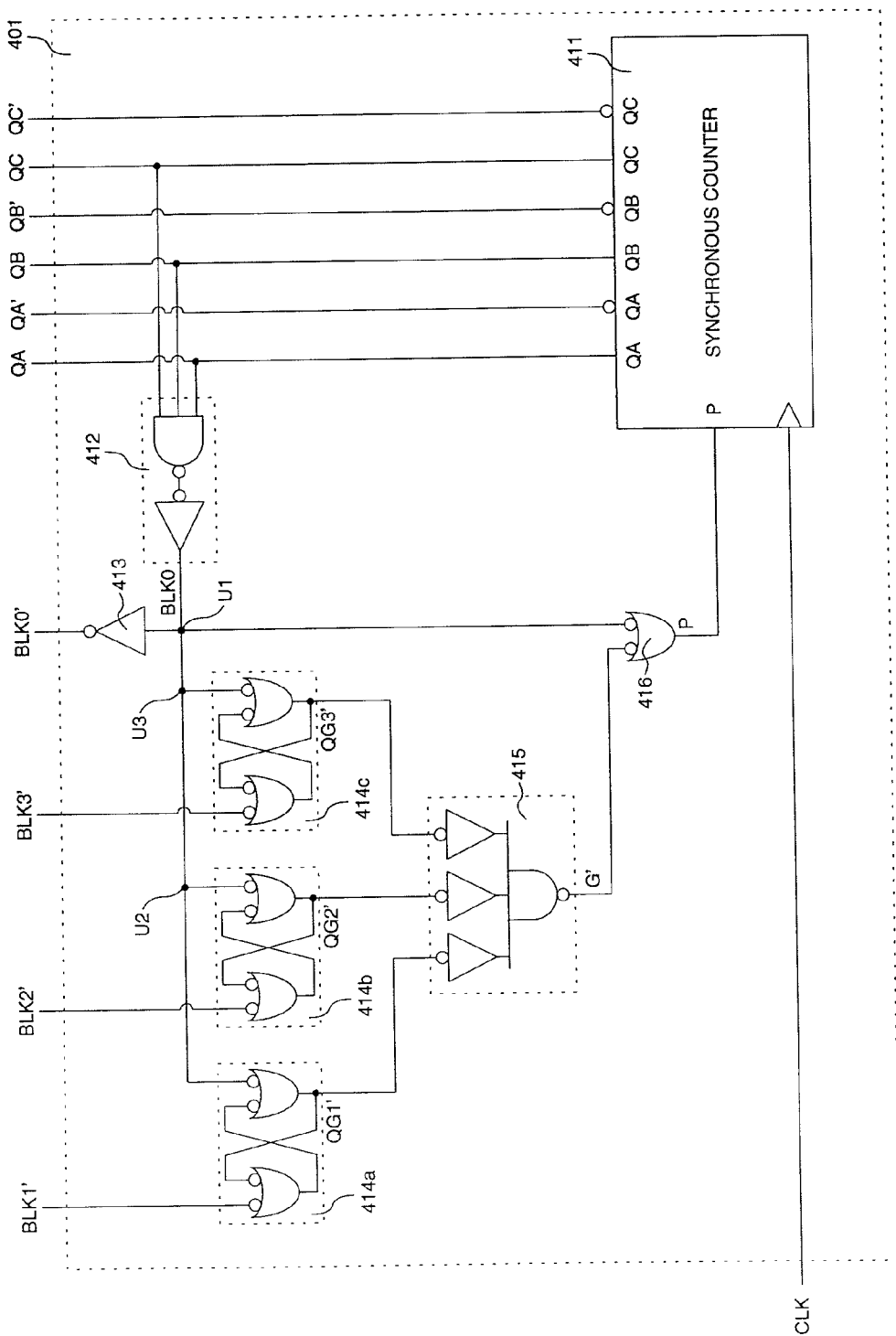
FIG. 96 is a circuit diagram of a basic interlocked counter.

As shown in FIG. 96, first, an enforcement form of an interlocked counter 401 corresponding to the invention described in claim 13 consists of a counter part and an interlocked part, where the counter part consists of a synchronous counter 411, a logic gate for judging end-value 412 and a logic gate for enable signal 416, and the interlocked part consists of a logic gate for amplifying interlocking signal 413, a latch circuit for interlocking signal 414 and a logic gate for interlocking signal 415. In FIG. 96, in addition, suppose that the interlocked counter 401 inputs three interlocked signals, BLK1', BLK2' and BLK3', from three other interlocked counters 401. Note that a signal x' denotes a negative-logic of a signal x. In FIG. 96, furthermore, an AND gate is used as the logic gate for judging end-value 412, two NAND gates are used as the logic gate for enable signal 416 and the latch circuit for interlocking signal 414, a NOT gate is used as the logic gate for amplifying interlocking signal 413, and an OR gate is used as the logic gate for interlocking signal 415. Of course, other logic gates can be used.

In the counter part, the synchronous counter 411, the logic gate for judging end-value 412 and the logic gate for enable signal 416 are connected circularly. That is, the synchronous counter 411 inputs an enable signal P, followed by outputting a count number. The logic gate for judging end-value 412 inputs the count number, followed by outputting an interlocking singal BLK0. The logic gate for enable signal 416 inputs the interlocking signal BLK0 via at least one input terminal, followed by outputting the enable signal P.

Figure 97:
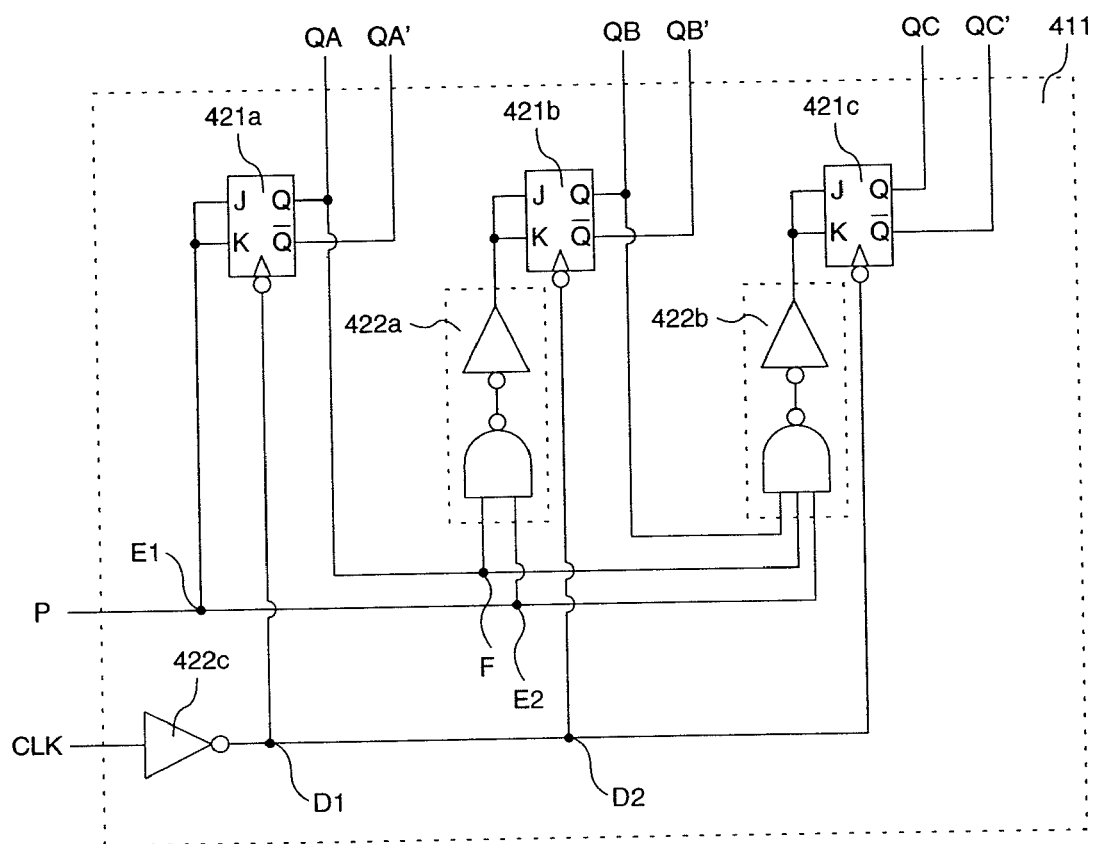
FIG. 97 is a circuit diagram of a synchronous counter using three flip-flops.

For example, in a case of FIG. 97, the synchronous counter 411 comprises three JK flip-flops, and outputs the count number from zero to seven, by using outputs of the JK flip-flops, QA, QB and QC. In addition, the JK flip-flops can also output negative-logic outputs, QA', QB' and QC', of the outputs, QA, QB and QC, respectively. After a clock signal was inverted by a logic gate for counter 422*c*, it is distributed to clock terminals of the three JK flip-flops, at two turning points, D1 and D2. The JK flip-flops works according to rising edge of the clock signal. An enable signal P is distributed to a J terminal and a K terminal of the left JK flip-flop, at a turning point E1. Therefore, when voltage of the enable signal P is High level, voltage at both the J terminal and the K terminal of the JK flip-flop becomes High level. Whenever the clock signal CLK rose, voltage of the outputs, QA and QA', of the JK flip-flop is inverted. Similarly, the enable signal P is distributed to at least one of input terminals of a logic gate for counter 422*a* and a logic gate for counter 422*b* at a turning point E2, respectively. In addition, the output signal QA is distributed to at least one of the input terminals of the logic gate for counter 422*a* and the logic gate for counter 422*b* at a turning point F, respectively. Moreover, the output signal QB is distributed to at least one of the input terminals of the logic gate for counter 422*b*. Output terminals of the logic gate for counter 422*a* and the logic gate for counter 422*b* are connected with a J terminal and a K terminal of the central and the right JK flip-flops, respectively. In a case that voltage of the enable signal P is High level, therefore, voltage at both a J terminal and a K terminal of the central JK flip-flop becomes High level, if voltage of the output signal QA is High level. Thus, whenever the clock signal CLK rose, voltage of the output signal, QB and QB', of the JK flip-flop is inverted. In a case that voltage of the enable signal P is High level, moreover, voltage at both a J terminal and a K terminal of the right JK flip-flop becomes High level, if voltage of both the output signals, QA and QB, is High level. Thus, whenever the clock signal CLK rose, voltage of the output signal, QC and QC', of the JK flip-flop is inverted. In short, in a case that voltage of the enable signal P is High level, whenever the clock signal CLK rose, the count number outputted by the synchronous counter 411 increases one by one.

In FIG. 96, now, in order for the logic gate for judging end-value 412 to output the interlocking signal BLK0, the output signals, QA, QB and QC are inputted at some (now three) input terminals of the logic gate for judging end-value 412. If the count number outputted by the synchronous counter 411 is seven, voltage of all the outputs, QA, QB and QC, becomes High level. Therefore, voltage of the interlocking signal BLK0 becomes High level. The interlocking signal BLK0 is inputted at least one of input terminals of the logic gate for enable signal 416, at a turning point U1. If the interlocking signal BLK0 is Low level, the enable signal P becomes High level. Therefore, the synchronous counter 411 increases the count number one by one until the count number arrives at seven. When the count number arrived at seven, the synchronous counter 411 stops. Note that FIG. 97 can be changed easily to an N-figure binary synchronous counter 411, by using N JK flip-flops, although it shows a 3-figure binary synchronous counter 411 consisting of three JK flip-flops synchronized with the clock signal CLK. In addition, the synchronous counter 411 can be changed to a down counter because the logic gate for counter 422a and the logic gate for counter 422b input the output signals, QA' and QB' instead of the output signals, QA and QB, respectively.

In the interlocked part, the logic gate for amplifying interlocking signal 413 outputs the interlocking signal BLK0' amplifying the interlocking signal BLK0, while the logic gate for interlocking signal 415 and the latch circuit for interlocking signal 414 control the logic gate for enable signal 416 according to the interlocking signals, BLK1', BLK2' and BLK3', inputted from an external part. In short, if voltage of the interlocking signal BLK0 is High level, the logic gate for amplifying interlocking signal 413 makes voltage of the interlocking signal BLK0' Low level. Otherwise, the voltage of the interlocking signal BLK0' is High level. In addition, the interlocking signals, BLK1', BLK2' and BLK3', are inputted at an input terminal of some (now three) latch circuits for interlocking signal 414a to 414c, respectively, while the interlocking signal BLK0 is distributed to another input terminal of the latch circuits for interlocking signal 414a to 414c at turning points, U2 and U3, respectively. Moreover, output signals, QG1', QG2' and QG3' of the latch circuits for interlocking signal 414a to 414c are inputted at some (now three) input terminals of the latch circuits for interlocking signal 414, and an output signal G' of the latch circuits for interlocking signal 414 is inputted at least one terminal of the logic gate for enable signal 416. Therefore, in a case that the interlocking signal BLK0 is High level, and the interlocking signals, BLK1', BLK2' and BLK3', are all Low level, in short, in a case that the interlocking signals, BLK0', BLK1', BLK2' and BLK3', are all Low level, all of the output signals, QG1', QG2' and QG3', of the latch circuits for interlocking signal 414a to 414c become Low level. Also, the enable signal can become Low level. In addition, in a case that the interlocking signal BLK0 is High level, even though either the interlocking signals, BLK1', BLK2' and BLK3', once becomes Low level, followed by that it returns to High level, the corresponding one of the output signals, QG1', QG2' and QG3', remains Low level. In short, if the interlocking signal BLK0 is High level, the enable signal can become Low level even though the interlocking signals, BLK1', BLK2' and BLK3', do not become Low level simultaneously. Note that all of the output signals, QG1', QG2' and QG3', of the latch circuits for interlocking signal 414a to 414c become Low level if the interlocking signal BLK0 becomes Low level. In addition, even though the interlocking signal BLK0 becomes High level again, the output signals, QG1', QG2' and QG3', of the latch circuits for interlocking signal 414a to 414c remain High level. The interlocked part, therefore, can coincide phase and a cycle of the interlocking signal BLK0' with phase and a cycle of one among the interlocking signals, BLK1', BLK2', BLK3' and BLK4', whose phase is the latest.

Although FIG. 96 shows a case that the interlocked counter 401 inputs interlocking signals from three interlocked counters 401, note that the number of input terminals of the logic gate for interlocking signal 415 can be varied, according to the number of the interlocked counters 401 connected. Otherwise, the unnecessary input terminals of the logic gate for interlocking signal 415 can be pulled down.

Figure 98:
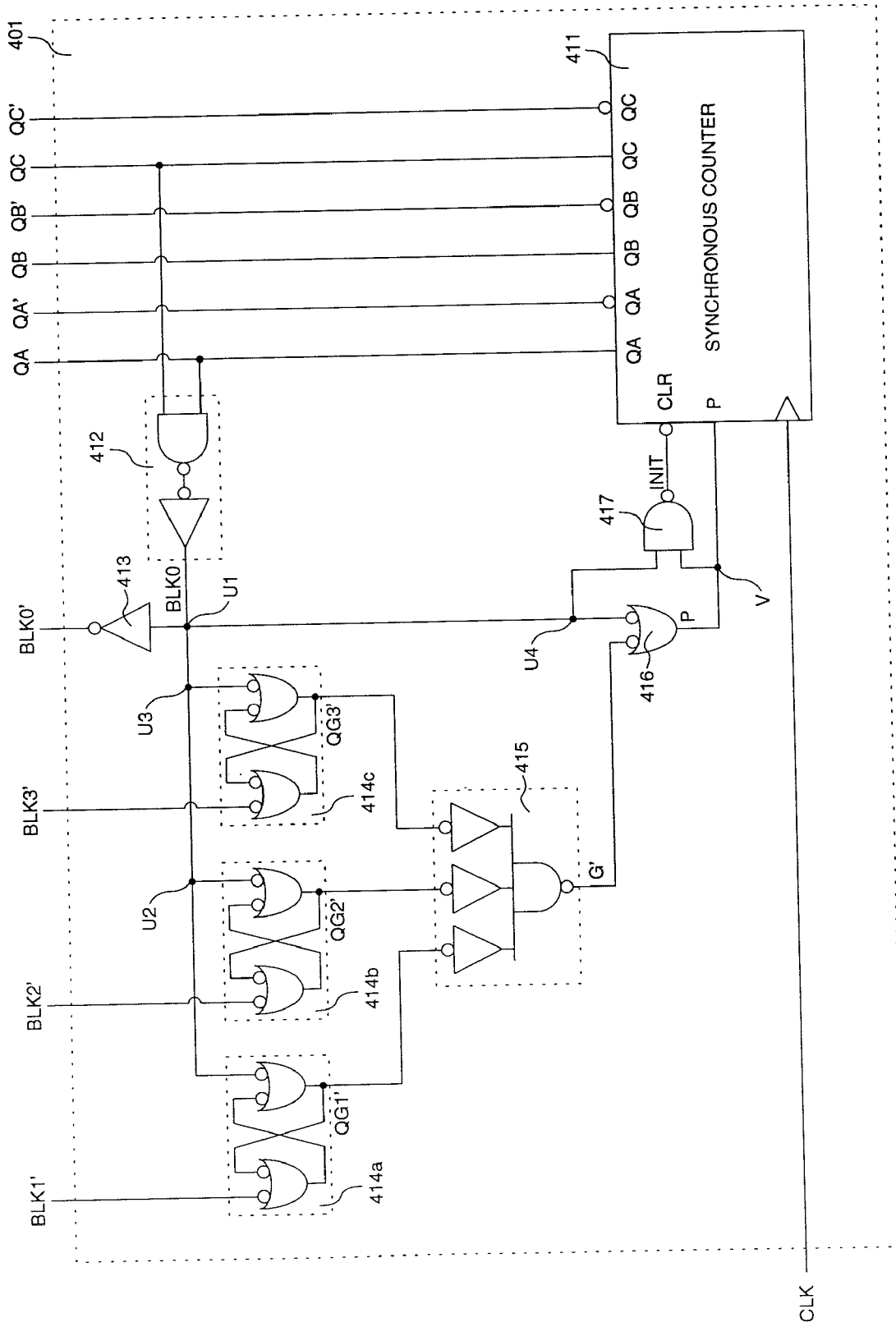
FIG. 98 is a circuit diagram of an interlocked counter in which a synchronous counter counts up to five.

In the synchronous counter 411 shown in FIG. 96, now, an initial value of the count number is fixed to zero, and an end value is fixed to seven. However, the initial value and the end value of the count number may be changed in terms of specification of LSIs. As shown in FIG. 98, then, an enforcement form of an interlocked counter 401 corresponding to the invention described in claim 14 can set any initial value and any end value, by using a synchronous counter 411 comprising a synchronous clear method and a synchronous load method like a commercial synchronous counter 411.

For example, as shown in FIG. 98, in a case that the synchronous counter 411 comprises the synchronous clear method, the synchronous counter 411, the logic gate for judging end-value 412 and the logic gate for enable signal 416 are wired circularly in the counter part, while an output terminal of a logic gate for initialization signal 417 is connected with a clear terminal of the synchronous counter 411. That is, the synchronous counter 411 inputs the enable signal P and an initialization signal INIT, followed by outputting the count number. The logic gate for enable signal 416 inputs the interlocking signal BLK0 at least one input terminal, followed by outputting the enable signal P. The logic gate for initialization signal 417 inputs the interlocking signal BLK0 and the enable signal P, followed by outputting the initialization signal INIT.

Figure 99:
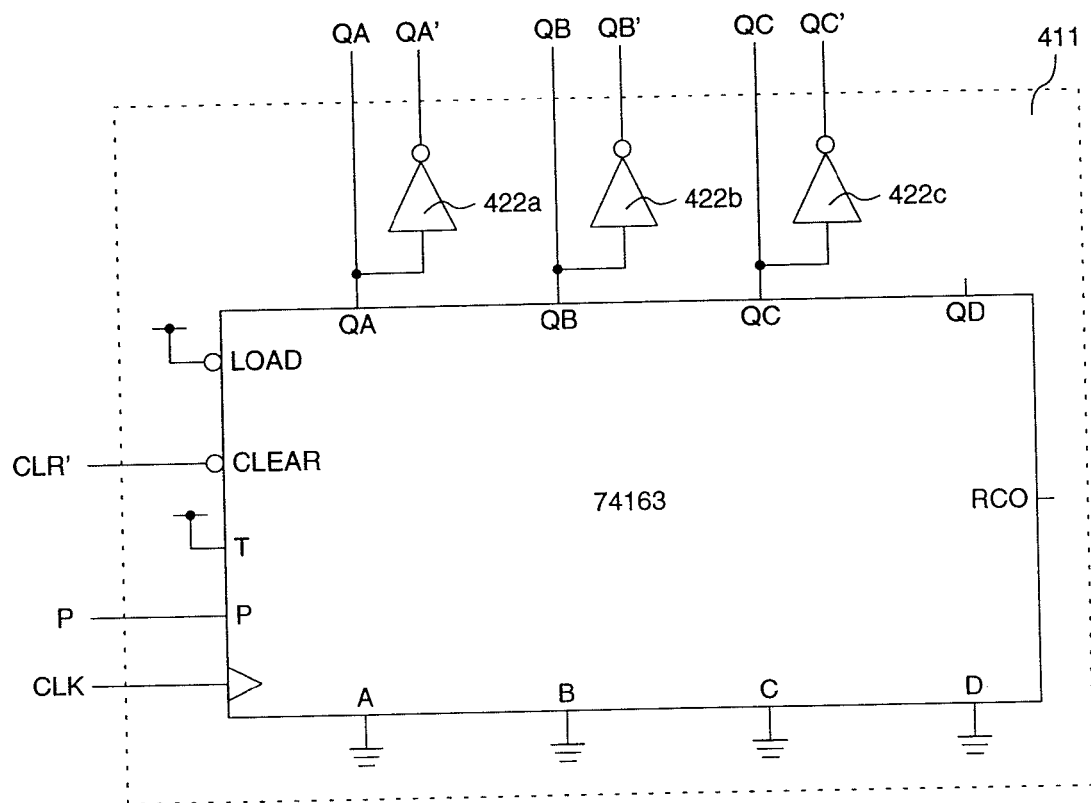
FIG. 99 is a circuit diagram of a synchronous counter using an IC number, 74163.

For example, in a case of FIG. 99, the synchronous counter 411 comprises a 74163 up counter, and outputs the count number from 0 to 15, by using the output signals, QA to QD. In addition, the logic gate for counter 422a to the logic gate for counter 422c output negative-logic outputs, QA' to QC', of the output signals, QA to QC, respectively. An enable terminal T is pulled up, a load terminal LOAD is pulled up, and a terminal for initial value, A to D, are pulled down. In a case that voltage of the enable signal P is High level, and a clear signal CLR is High level, whenever the clock signal CLK rises, the count number outputted by the synchronous counter 411 increases one by one. Moreover, in a case that the clear signal CLR is Low level, the count number outputted by the synchronous counter 411 becomes zero, if the clock signal CLK rises, regardless of voltage of the enable signal P. In other cases, the synchronous counter 411 does not work. In a case that the count number of the synchronous counter 411 is five, as shown in FIG. 98, then, the logic gate for judging end-value 412 makes voltage of the interlocking signal BLK0 High level. Otherwise, the voltage of the interlocking signal BLK0 is Low level. The interlocking signal BLK0 is inputted at least one of input terminals of the logic gate for enable signal 416, at the turning point U1. Therefore, if the interlocking signal BLK0 is Low level, the enable signal P becomes High level. The synchronous counter 411 thus increases the count number one by one until the count number arrives at five. When the count number arrived at five, the synchronous counter 411 stops. The interlocking signal BLK0 is inputted at least one of input terminals of the logic gate for initialization signal 417, at a turning point U4. Moreover, the enable signal P is inputted at least one of input terminals of the logic gate for initialization signal 417, at a turning point V. Therefore, if both the interlocking signal BLK0 and the enable signal P are High level, the initialization signal INIT of the logic gate for initialization signal 417 becomes Low level. Thus, the synchronous counter 411 stops. If the interlocking signals, BLK1', BLK2' and BLK1', once become Low level, the synchronous counter 411 sets the count number to zero, followed by restarting working.

It has been described above about a circuit composition of only a single interlocked counter 401. It is explained here how some interlocked counters 401 interlock each other in a case that they are connected, with reference to some timing charts.

Figure 100:
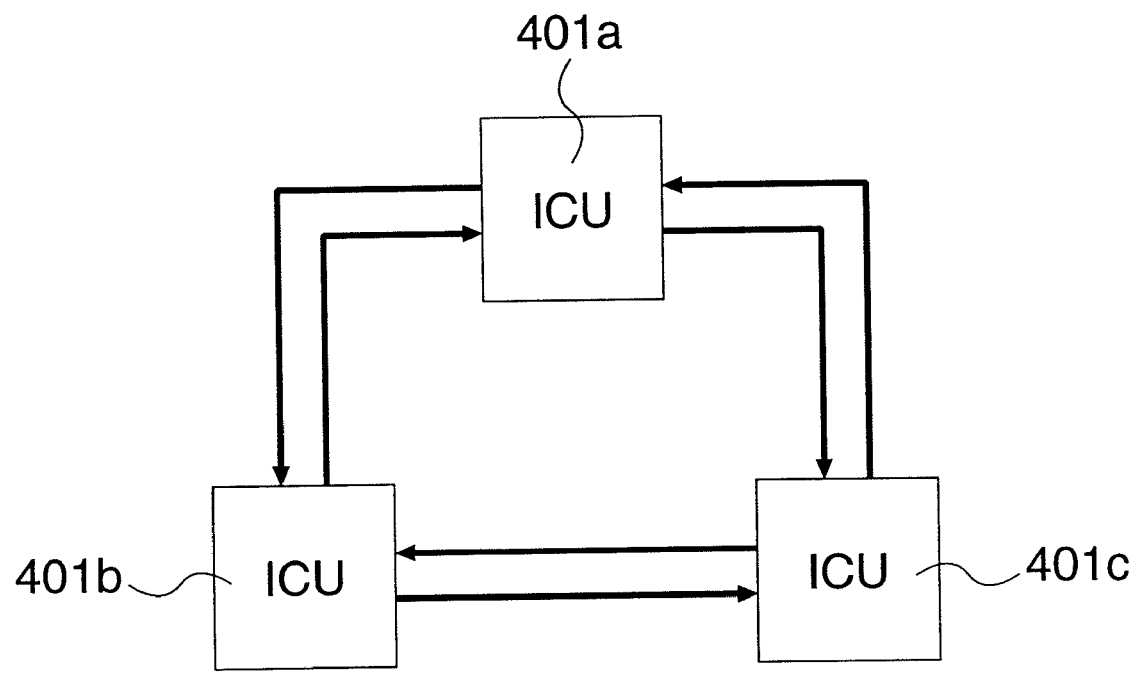
FIG. 100 is a block diagram of a network consisting of three interlocked counters.
Figure 101:
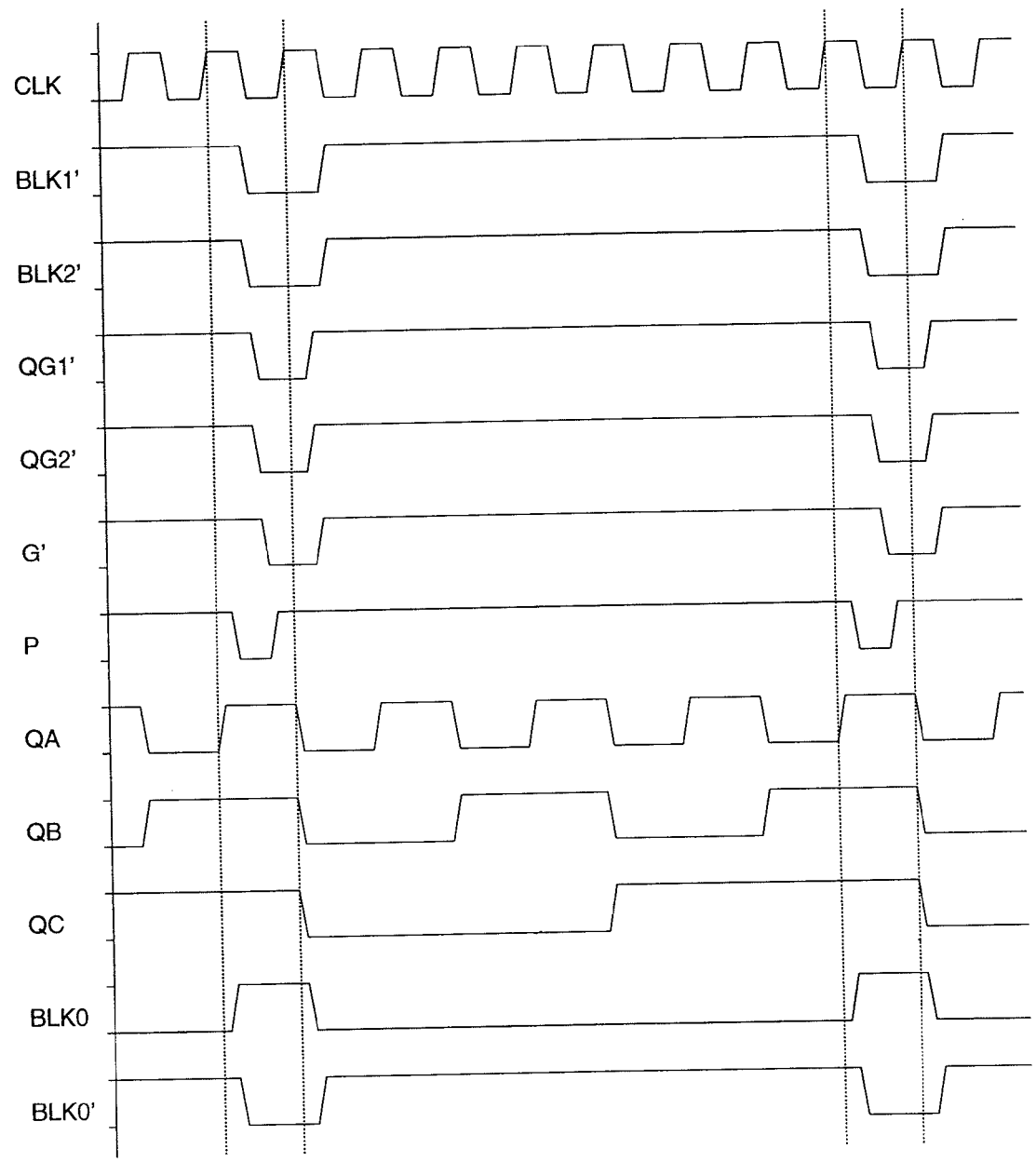
FIG. 101 is a timing chart in a case that three interlocked counters synchronize.

As shown in FIG. 100, first, suppose that three interlocked counters 401a to 401c are connected each other. Note that the interlocked counters 401a to 401c are denoted as ICU in FIG. 100. An interlocking signal BLK0' of each of interlocked counters 401a to 401c is inputted by a logic gate for interlocking signal 415 of the remaining interlocked counters 401a to 401c. Therefore, the logic gate for interlocking signal 415 has only to be a two-input logic gate. FIG. 101 shows a timing chart of either one of three interlocked counters 401a to 401c in a case that their operation is stabilized. Since all interlocked counters 401a to 401c are symmetrical, timing charts of the remaining interlocked counters 401b and 401c are similar to the above.

In a case that count numbers of all interlocked counters 401a to 401c coincide with each other, as is clear by FIG. 101, an output of a logic gate for enable signal 416 becomes High level for a moment. However, since the output returns to Low level soon, a synchronous counter 411 can count successively. All interlocked counters 401a to 401c, thus, can hold outputting the same count number.

Figure 102:
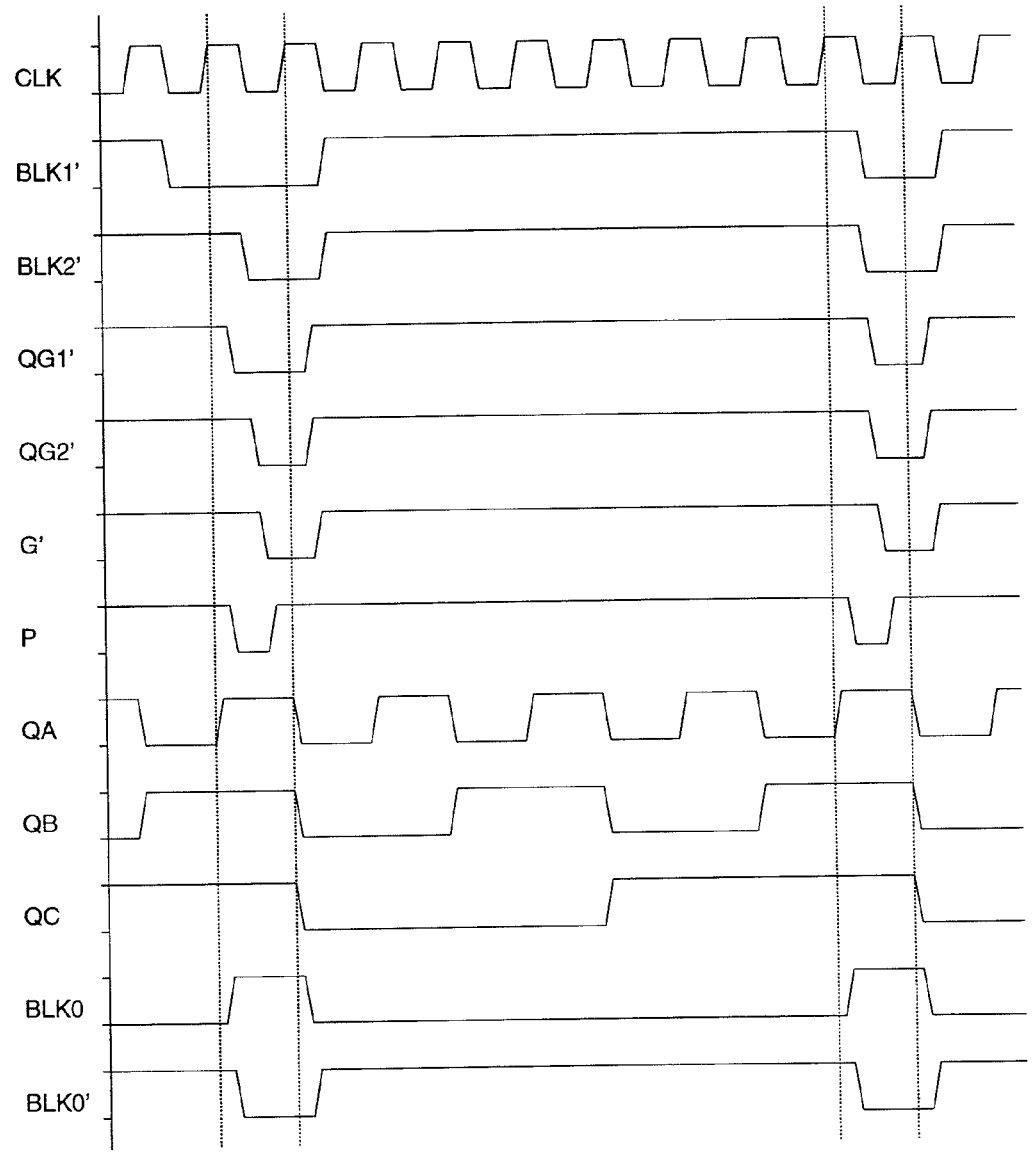
FIG. 102 is a timing chart in a case that a phase of one of three interlocked counters progresses.

When a waveform of the interlocking signal BLK1' becomes short for some reason, as shown in FIG. 102, the interlocked counter 401 operates regardless of the interlocking signal BLK1'. Therefore, the interlocking signal BLK1' does not influence the count number. Note that the interlocked counter 401 generating the interlocking signal BLK1' operates as phase of the interlocking signal BLK1' coincides with phases of the interlocking signals, BLK0' and BLK2'.

Figure 103:
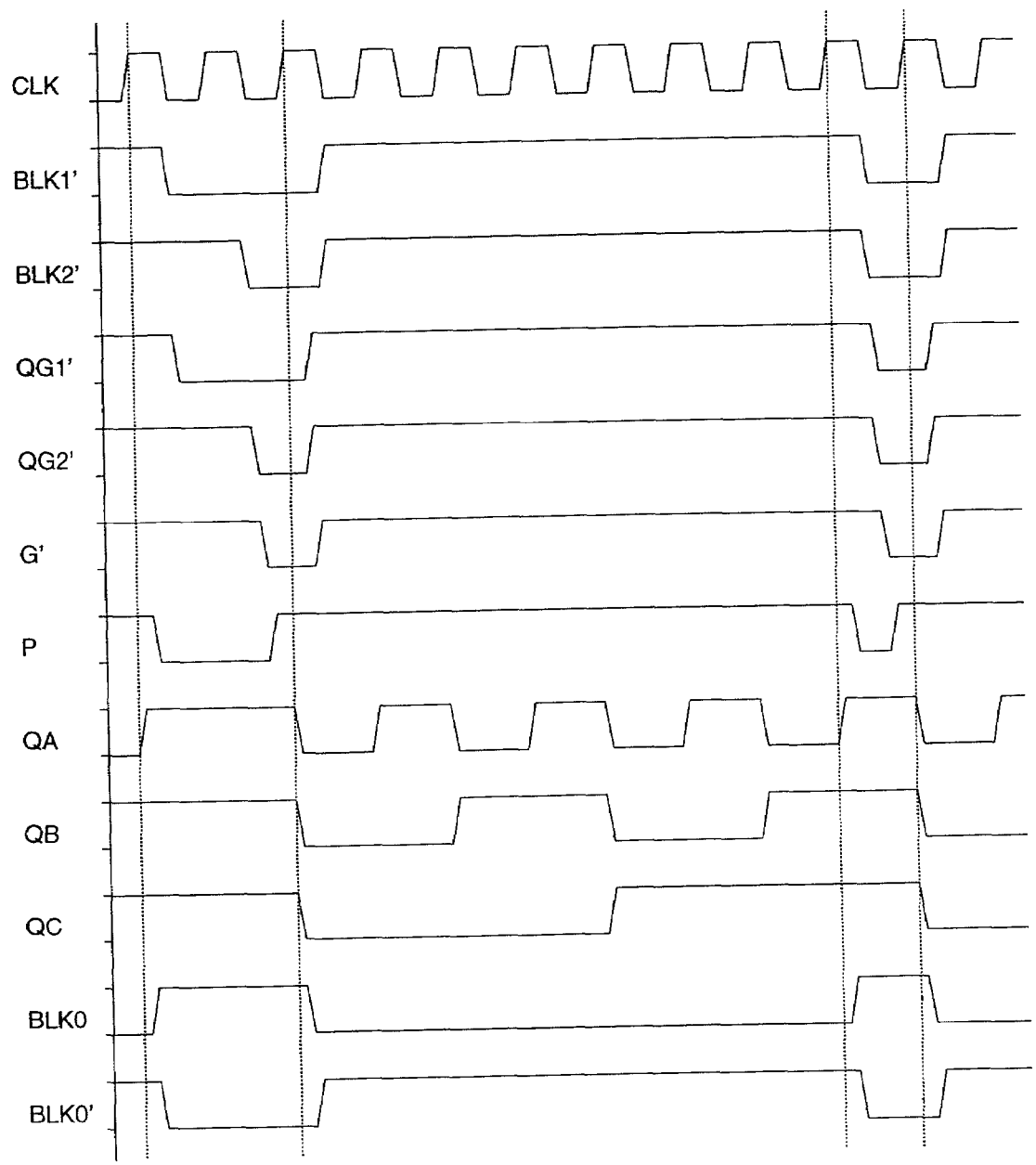
FIG. 103 is a timing chart in a case that a phase of one of three interlocked counters is overdue.
Figure 104:
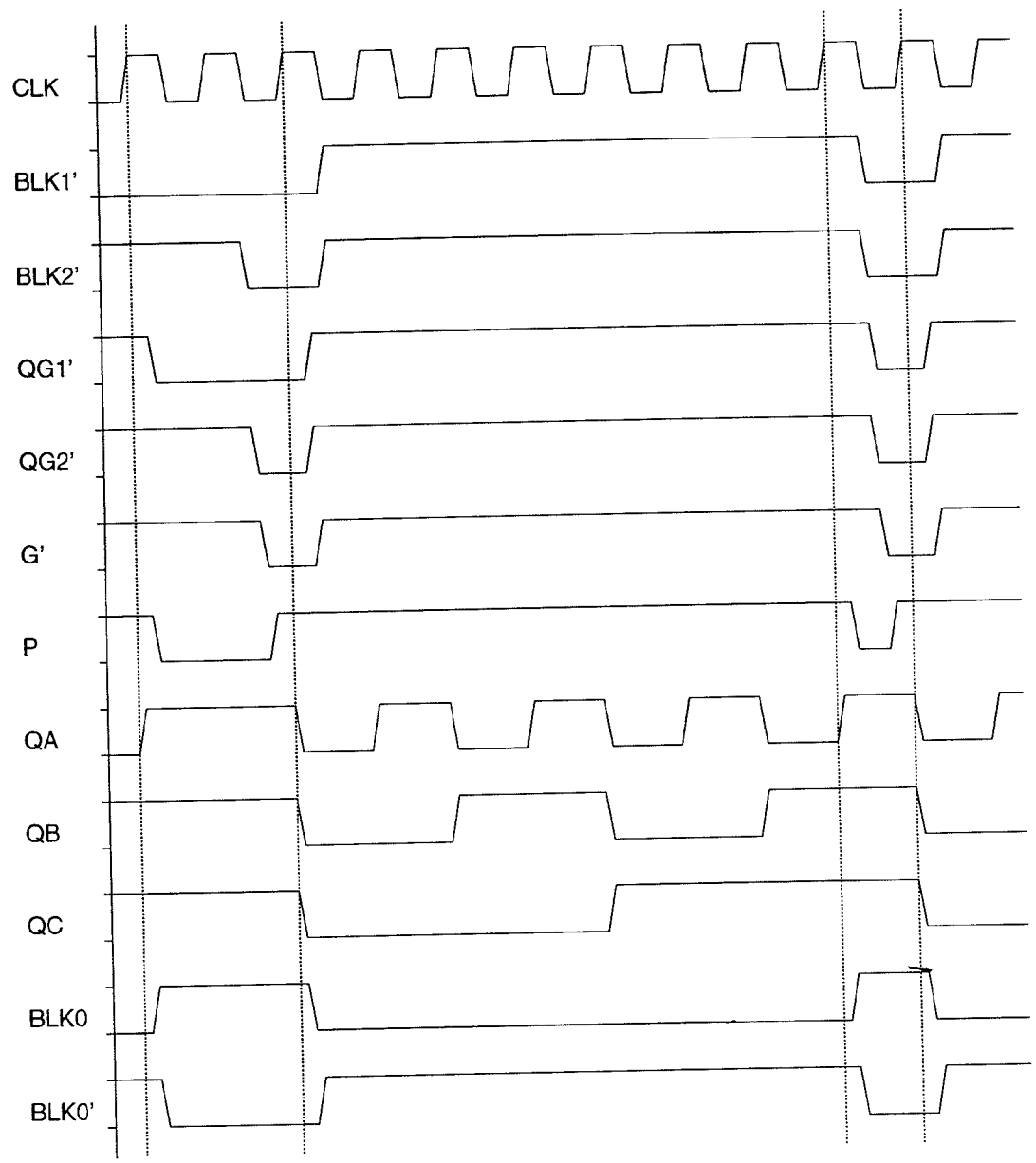
FIG. 104 is a timing chart in a case that three phases of three interlocked counters are different each other.

When a waveform of the interlocking signal BLK2' becomes long for some reason, as shown in FIG. 103, the interlocked counter 401 operates as the phase of the interlocking signal BLK0' coincides with the phase of the interlocking signal BLK2'. The interlocked counter 401, thus, can hold outputting an end value as the count number until the interlocking signal BLK2' becomes L-level.

When a waveform of the interlocking signal BLK1' becomes short for some reason, and a waveform of the interlocking signal BLK2' becomes long for some reason, as shown in FIG. 69, the interlocked counter 401 operates as the phase of the interlocking signal BLK0' coincides with the phase of the interlocking signal BLK2'. The interlocked counter 401, thus, can hold outputting an end value as the count number until the interlocking signal BLK2' becomes L-level.

It is clear by the above timing charts that count numbers of three interlocked counters 401a to 401c coincide with the latest count number of them. This fact is also realized in a case that some interlocked counters 401 whose end values are different form each other are connected. Thus, even though the count numbers of three interlocked counters 401a to 401c are different when a power is supplied, the count numbers of the three interlocked counters 401a to 401c coincide within a time which is a product of a cycle of a clock signal and the maximum of the end values.

As shown in FIG. 96 and FIG. 98, now, the clock signal CLK is supplied from an external part, in the enforcement forms of interlocked counter 401 corresponding to the inventions described in claim 13 and claim 14. As is clear from FIG. 100, therefore, since each interlocked counter 401 is separated from each other spatially, the clock signal CLK supplied to the interlocked counter 401 does not always rise simultaneously, because of propagation delay time. Especially, in a case that some interlocked counters 401 ara arranged on an LSI widely, phase of the clock signal CLK supplied to each interlocked counter 401 shifts certainly. It is explained here about a method regulating the phase of the clock signal CLK, because the interlocked counter 401 itself generates the clock signal CLK, instead of supplying the clock signal CLK from the external part.

Figure 105:
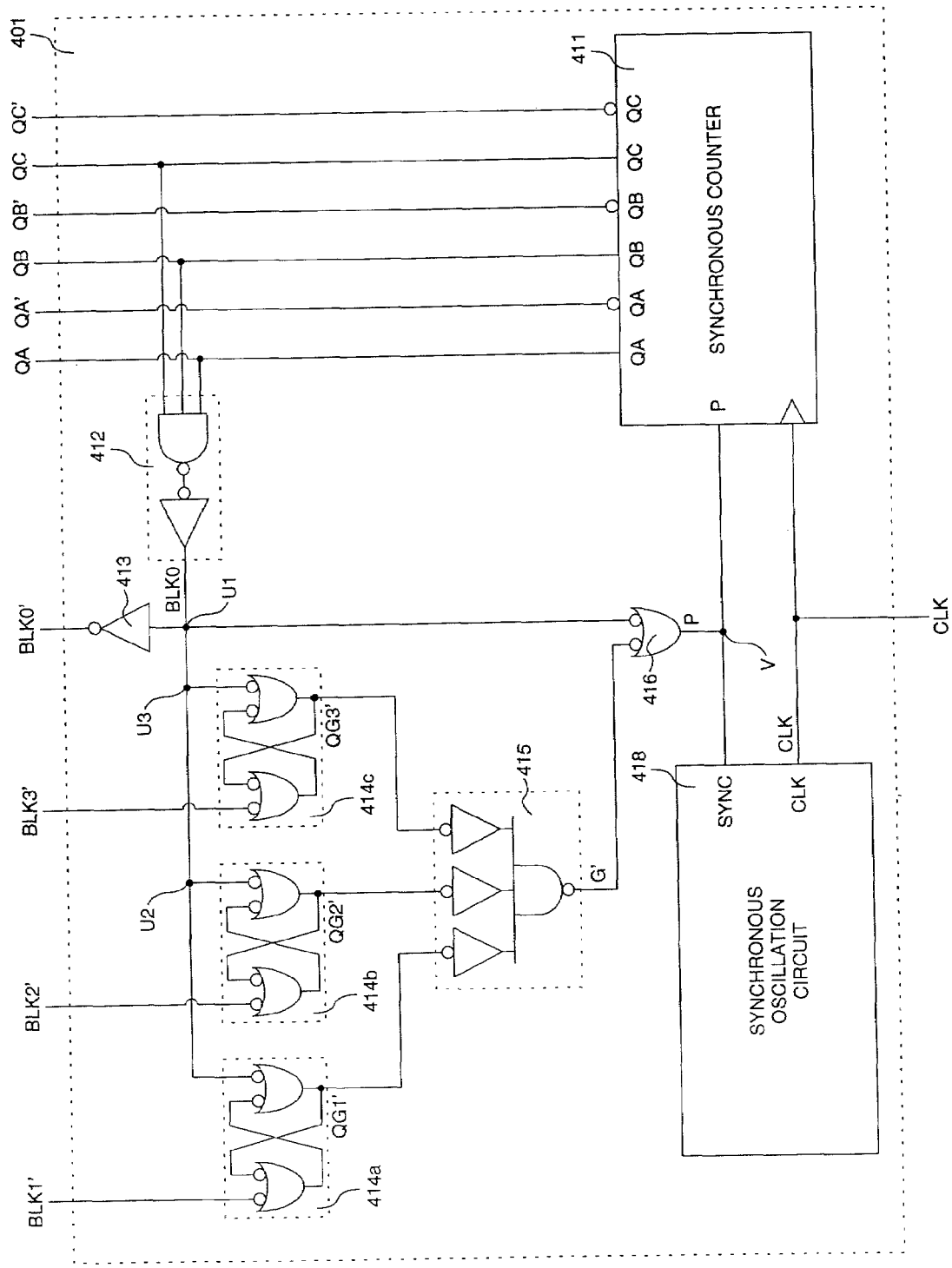
FIG. 105 is a circuit diagram of an interlocked counter comprising a synchronous oscillator.
Figure 106:
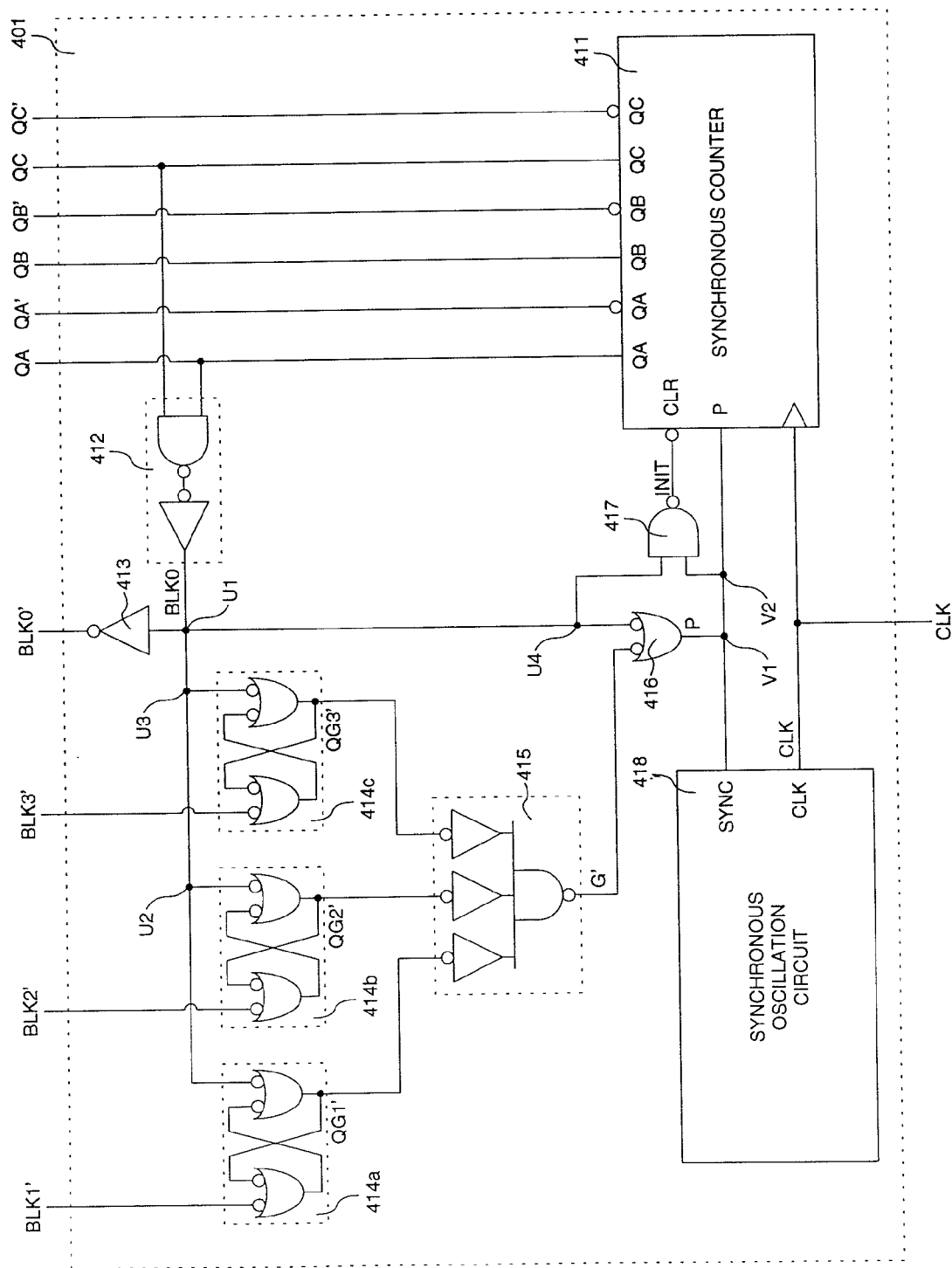
FIG. 106 is a circuit diagram of an interlocked counter comprising a synchronous oscillator, in which a synchronous counter counts up to five.

As shown in FIG. 105, an enforcement form of an interlocked counter 401 corresponding to the invention described in claim 15 consists of the enforcement form of the interlocked counter 401 corresponding to the invention described in claim 13 and a synchronous oscillator 418. Similarly, as shown in FIG. 106, an enforcement form of an interlocked counter 401 corresponding to the invention described in claim 16 consists of the enforcement form of the interlocked counter 401 corresponding to the invention described in claim 14 and the synchronous oscillator 418. In a case of FIG. 105, an enable signal P is distributed to a SYNC terminal of the synchronous oscillator 418, while a clock signal CLK generated by the synchronous oscillator 418 is supplied to a CLK terminal of a synchronous counter 411, at a turning pint V. In a case of FIG. 106, the enable signal P is distributed to the SYNC terminal of the synchronous oscillator 418, while the clock signal CLK generated by the synchronous oscillator 418 is supplied to the CLK terminal of the synchronous counter 411, at a turning pint V1. The synchronous oscillator 418 is one for changing phase of the clock signal CLK, according to voltage of the SYNC terminal. It is explained here about the synchronous oscillator 418 in detail.

Figure 107:
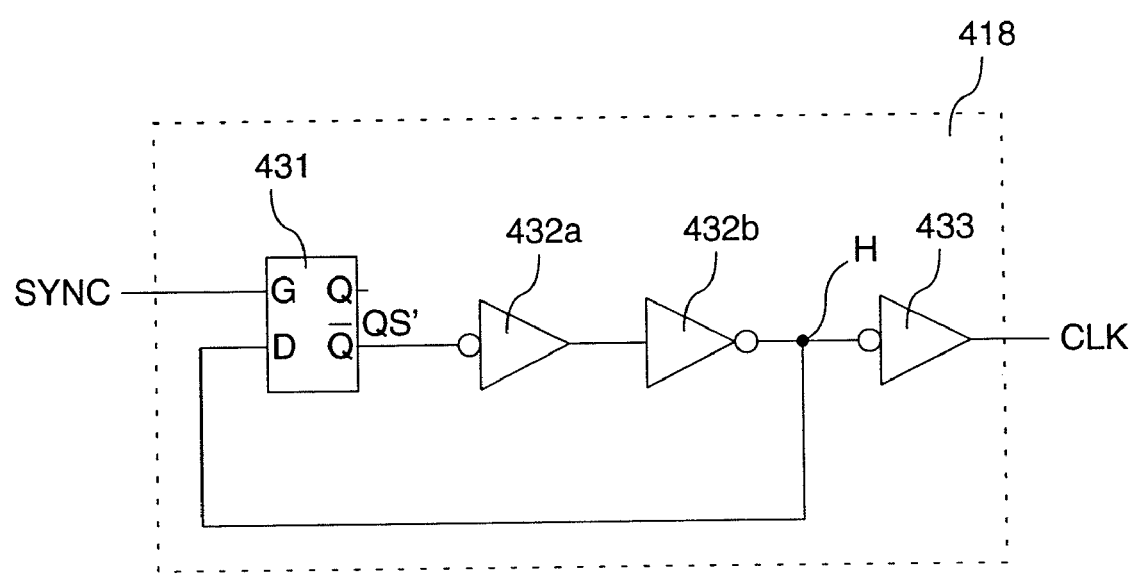
FIG. 107 is a circuit diagram of a synchronous oscillator, in a case of using a ring oscillator.
Figure 108:
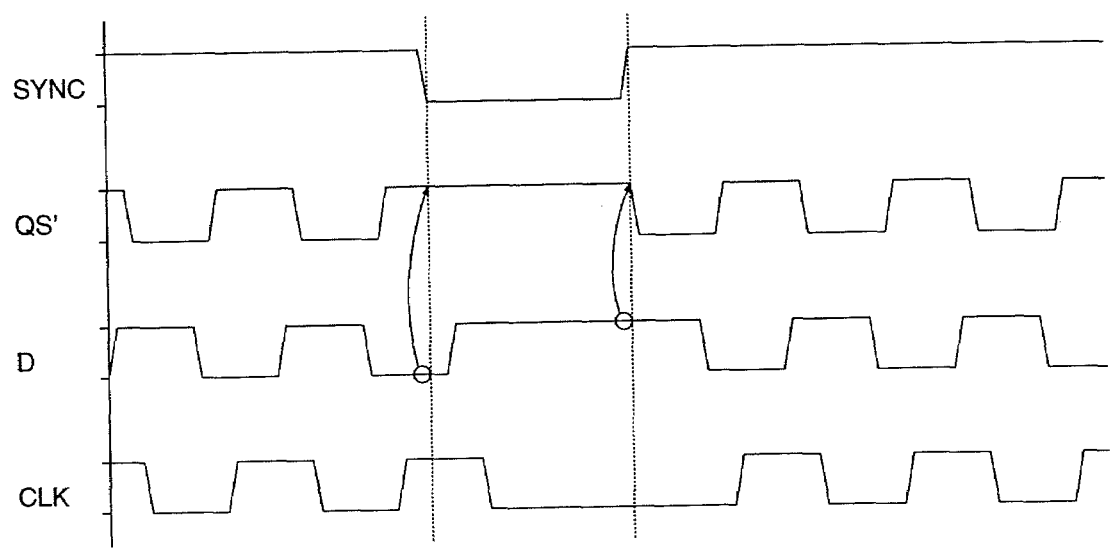
FIG. 108 is a timing chart of FIG. 107.

First, a synchronous oscillator 418 shown in FIG. 107 is a variation of a ring oscillator, and consists of a latch circuit for synchronous signal 431, two logic gates for oscillation 432a and 432b and a logic gate for amplifying clock signal 433. Note that the latch circuit for synchronous signal 431 is a D latch, and the logic gates for oscillation 432a and 432b and the logic gate for amplifying clock signal 433 are NOT gates. The latch circuit for synchronous signal 431 and the logic gates for oscillation 432a and 432b are wired circularly. That is, a Q' terminal of the latch circuit for synchronous signal 431 is connected with an input terminal of the logic gate for oscillation 432a, an output terminal of the logic gate for oscillation 432a is connected with an input terminal of the logic gate for oscillation 432b, and an output terminal of the logic gate for oscillation 432b is connected with a D terminal of the latch circuit for synchronous signal 431 via a turning pint H. A SYNC terminal of the synchronous oscillator 418 is connected with a G terminal of the latch circuit for synchronous signal 431. In addition, the output terminal of the logic gate for oscillation 432b is connected with an input terminal of the logic gate for amplifying clock signal 433 via the turning pint H, and the logic gate for amplifying clock signal 433 outputs a clock signal CLK. Note that the input terminal of the logic gate for amplifying clock signal 433 can be connected with an output terminal of either the latch circuit for synchronous signal 431, the logic gate for oscillation 432a or the logic gate for oscillation 432b. In addition, some logic gates for amplifying clock signal 433 can be used, if desired. If the SYNC terminal is High level, the D terminal and the Q' terminal of the latch circuit for synchronous signal 431 work as an input terminal and an output terminal of a NOT gate, respectively. In short, a signal QS' outputted by the Q' terminal of the latch circuit for synchronous signal 431 inverts the output signal of the logic gate for oscillation 432b. Otherwise, the Q' terminal of the latch circuit for synchronous signal 431 remains its present voltage in spite of voltage of the D terminal of the latch circuit for synchronous signal 431. The output signal of the logic gate for oscillation 432b is delayed by the signal QS'. Therefore, in a case that the SYNC terminal is High level, as shown in FIG. 108, the synchronous oscillator 418 self-oscillates. On the other hand, in a case that the SYNC terminal is Low level, the synchronous oscillator 418 stops self-oscillating.

Figure 109:
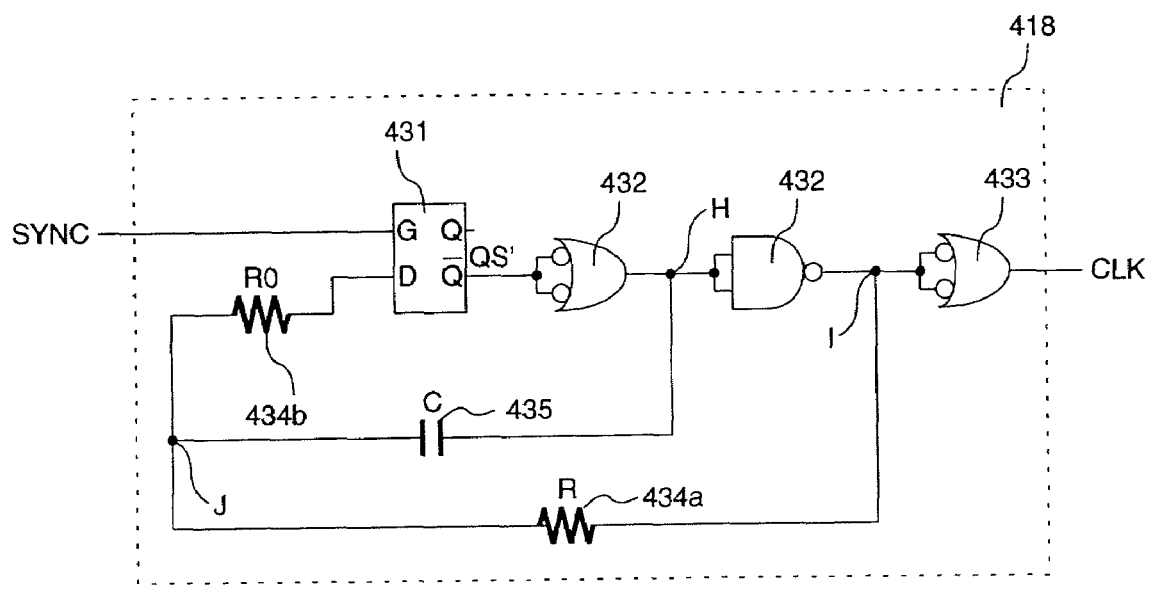
FIG. 109 is a circuit diagram of a synchronous oscillator, in a case of using a ring oscillator consisting of CMOS gates.

By the way, in a case of the synchronous oscillator 418 shown in FIG. 107, since a period of its self-oscillation depends on switching time of the latch circuit for synchronous signal 431, the logic gate for oscillation 432a and the logic gate for oscillation 432b, all periods of clock signals CLK generated by some synchronous oscillators 418 do not always coincide with each other. Suppose, therefore, that CMOS gates are used as the latch circuit for synchronous signal 431, the logic gate for oscillation 432a and the logic gate for oscillation 432b. The synchronous oscillator 418 can self-oscillate with a specific period because a resistor for oscillation 434a connects between turning points, I and J, and a capacitor for oscillation 435 connects between turning points, J and H, as shown in FIG. 109. Note that a resistance of the resistor for oscillation 434a denotes R ohms, and a capacitance of the capacitor for oscillation 435 denotes C farads. In addition, a resistor for oscillation 434b is a protection resistor, and a resistance of the resistor for oscillation 434b denotes R0 ohms.

Figure 110:
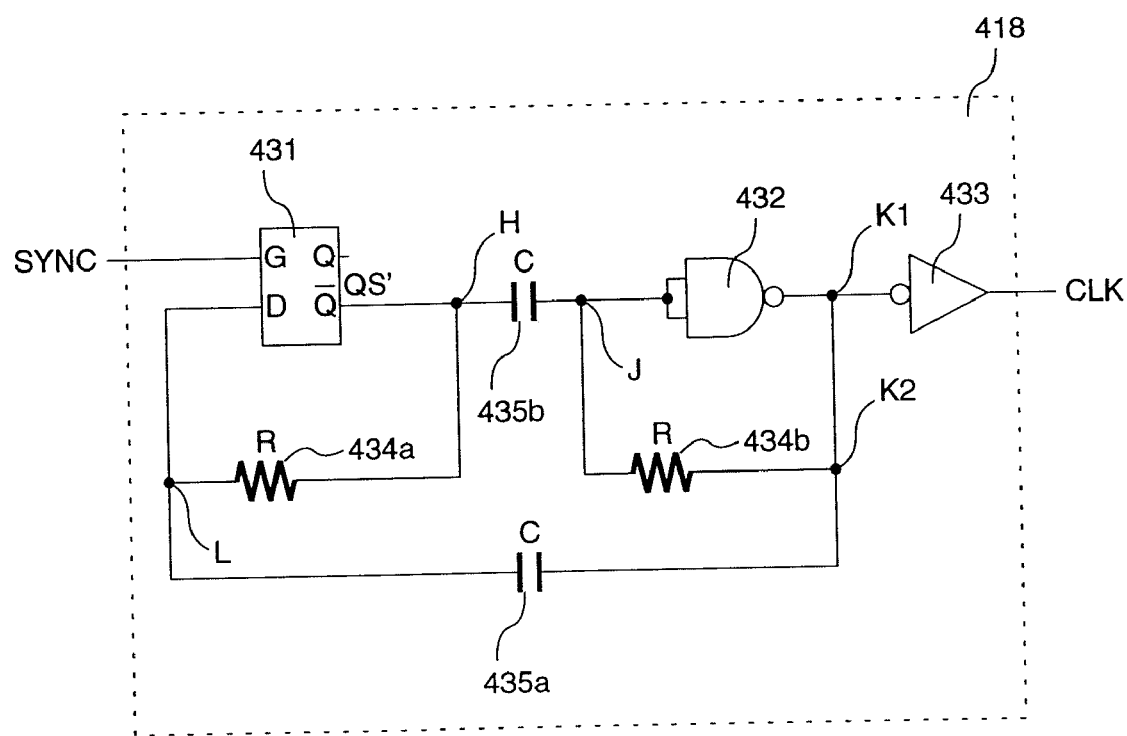
FIG. 110 is a circuit diagram of a synchronous oscillator, in a case of using an astable multi-vibrator consisting of TTL gates.

Next, a synchronous oscillator 418 shown in FIG. 110 is a variation of an astable multi-vibrator, and consists of a latch circuit for synchronous signal 431, a logic gate for oscillation 432, two resistors for oscillation 434a and 434b, two capacitors for oscillation 435a and 435b and a logic gate for amplifying clock signal 433. Note that the latch circuit for synchronous signal 431 is a D latch, and the logic gate for oscillation 432 is a NAND gate, and the logic gate for amplifying clock signal 433 is a NOT gate. The latch circuit for synchronous signal 431, the logic gate for oscillation 432 and the capacitors for oscillation 435a and 435b are wired circularly. That is, a Q' terminal of the latch circuit for synchronous signal 431 is connected with a terminal of the capacitor for oscillation 435b via a turning point H, another terminal of the capacitor for oscillation 435b is connected with all input terminals of the logic gate for oscillation 432 via a turning point J, an output terminal of the logic gate for oscillation 432 is connected with a terminal of the capacitor for oscillation 435a via turning points, K1 and K2, and another terminal of the capacitor for oscillation 435a is connected with a D terminal of the latch circuit for synchronous signal 431 via a turning pint L. Moreover, the resistor for oscillation 434a connects between the turning points, L and H, and the resistor for oscillation 434b connects between the turning points, J and K2. Note that resistances of both the resistor for oscillation 434a and the resistor for oscillation 434b denote R ohms, and capacitances of both the capacitor for oscillation 435a and the capacitor for oscillation 435b denote C farads. A SYNC terminal of the synchronous oscillator 418 is connected with a G terminal of the latch circuit for synchronous signal 431. In addition, the output terminal of the logic gate for oscillation 432 is connected with an input terminal of the logic gate for amplifying clock signal 433, and the logic gate for amplifying clock signal 433 outputs a clock signal CLK. Note that the input terminal of the logic gate for amplifying clock signal 433 can be connected with an output terminal of either the latch circuit for synchronous signal 431 or the logic gate for oscillation 432. In addition, some logic gates for amplifying clock signal 433 can be used, if desired. A timing chart of the synchronous oscillator 418 is similar with FIG. 108.

It has been described above about some synchronous oscillators 418 repeating self-oscillating and stopping, by changing voltage of the SYNC terminal. Since the synchronous oscillators 418 do not generate unnecessary pulses for the clock signal CLK, it is convenient for the interlocked counter 401 to control synchronous circuits. However, since there is a case that a period of the clock signal CLK becomes much longer than a period of self-oscillation of the synchronous oscillators 418, such a clock signal is not very convenient for an electronic circuit, in which a jitter of the clock signal CLK causes a trouble. Therefore, it is finally explained about a synchronous oscillator 418 such that it remains self-oscillating.

Figure 111:
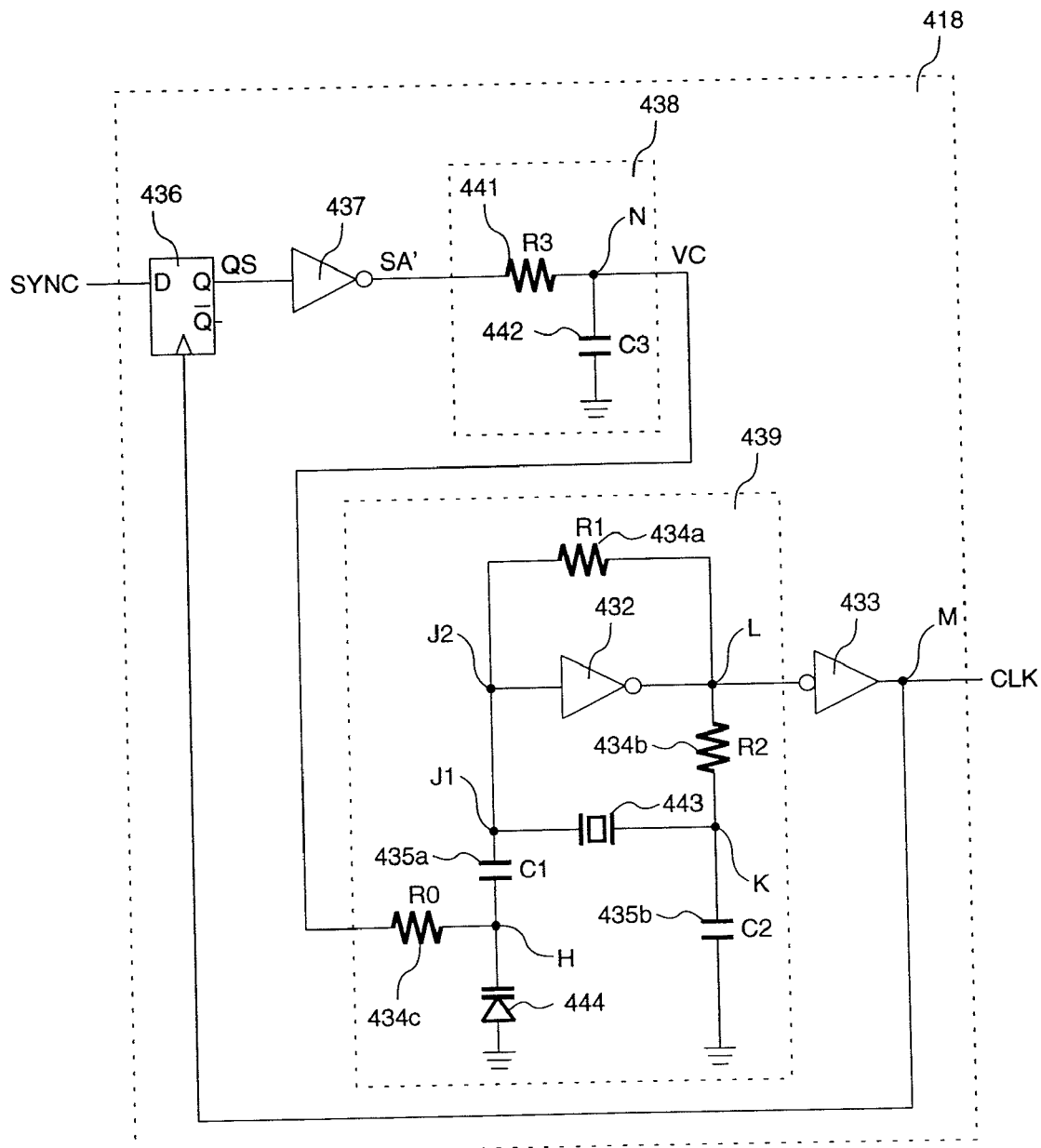
FIG. 111 is a circuit diagram of a synchronous oscillator, in a case of using a loop filter and a voltage controlled oscillator.

A synchronous oscillator 418 shown in FIG. 111 consists of a flip-flop circuit for synchronous signal 436, a synchronous signal amplifier 437, a loop filter 438, a voltage controlled oscillator 439 and a logic gates for amplifying clock signal 433. Note that the flip-flop circuit for synchronous signal 436 is a D latch, the synchronous signal amplifier 437, the logic gate for amplifying clock signal 433 are NOT gates, the loop filter 438 is a lag-type loop filter and the voltage controlled oscillator 439 is a variation of a Colpitz oscillator.

The flip-flop circuit for synchronous signal 436 memorizes voltage of a SYNC terminal of the synchronous oscillator 418 inputted at its D terminal, synchronizing with a clock signal CLK outputted by the logic gate for amplifying clock signal 433, followed by outputting the voltage as a signal QS. The synchronous signal amplifier 437 inverts the signal QS, followed by outputting a signal SA'.

The loop filter 438 consists of a resistor for loop filter 441 and a capacitor for loop filter 442. After a high-frequency noise included within the signal SA' was removed by the capacitor for loop filter 442, the loop filter 438 outputs a signal VC from a turning point N. Note that a resistance of the resistor for loop filter 441 denotes R3 and a apacitance of the capacitor for loop filter 442 denotes C3. In addition, a frequency band of the noise removed is decided by a time constant R3C3.

The voltage controlled oscillator 439 consists of the logic gate for oscillation 432, a crystal oscillator 443, a variable diode 444, three resistors for oscillation 434a to 434c and two capacitors for oscillation 435a and 435b. The crystal oscillator 443, the capacitors for oscillation 435a and 435b and the variable diode 444 are wired circularly. That is, an anode terminal of the variable diode 444 is connected with a ground, a cathode terminal of the variable diode 444 is connected with a terminal of the capacitor for oscillation 435a at a turning point H, another terminal of the capacitor for oscillation 435a is connected with a terminal of the crystal oscillator 443 at a turning point J1, another terminal of the crystal oscillator 443 is connected with a terminal of the capacitor for oscillation 435b at a turning point K, another terminal of the capacitor for oscillation 435b is connected with the ground. An LC circuit is formed by this fact. A terminal of the crystal oscillator 443 is connected with an input terminal of the logic gate for oscillation 432 at turning points, J1 and J2, and the resistor for oscillation 434b connects an output terminal of the logic gate for oscillation 432 and another terminal of the crystal oscillator 443 at turning points, L and K. Therefore, amplitude of the crystal oscillator 443 is amplified. The resistor for oscillation 434a connects an input terminal and an output terminal of the logic gate for oscillation 432 at turning points, L and J2. Therefore, an electric current is supplied to the input terminals of the logic gate for oscillation 432, the crystal oscillator 443 and the capacitor for oscillation 435a from the output terminal of the logic gate for oscillation 432. A terminal of the resistor for oscillation 434c inputs a signal VC, another terminal of the resistor for oscillation 434c is connected with the cathode terminal of the variable diode 444 at the turning point H. The resistor for oscillation 434c is a protection resistor, and can apply voltage of the signal VC to the cathode terminal of the variable diode 444. If the voltage of the signal VC is high, capacitance of the variable diode 444 becomes small. Therefore, frequency of self-oscillation of the voltage controlled oscillator 439 becomes high. On the other hand, if the voltage of the signal VC is near by zero volt, the capacitance of the variable diode 444 becomes large. Therefore, the frequency of self-oscillation of the voltage controlled oscillator 439 becomes low. Note that resistances of the resistors for oscillation 434a to 434c denote R1, R2, and R0 ohms, respectively, and capacitances of the capacitor for oscillation 435a and 435c denote C1 and C2 farads, respectively.

The logic gate for amplifying clock signal 433 inputs a waveform of self-oscillation outputted by the voltage controlled oscillator 439 from the turning point L, followed by outputting the clock signal CLK amplified in the shape of a rectangle wave. The clock signal CLK is distributed to a clock terminal the flip-flop circuit for synchronous signal 436 at a turning point M. Some logic gates for amplifying clock signal 433 can be used, if desired.

Figure 112:
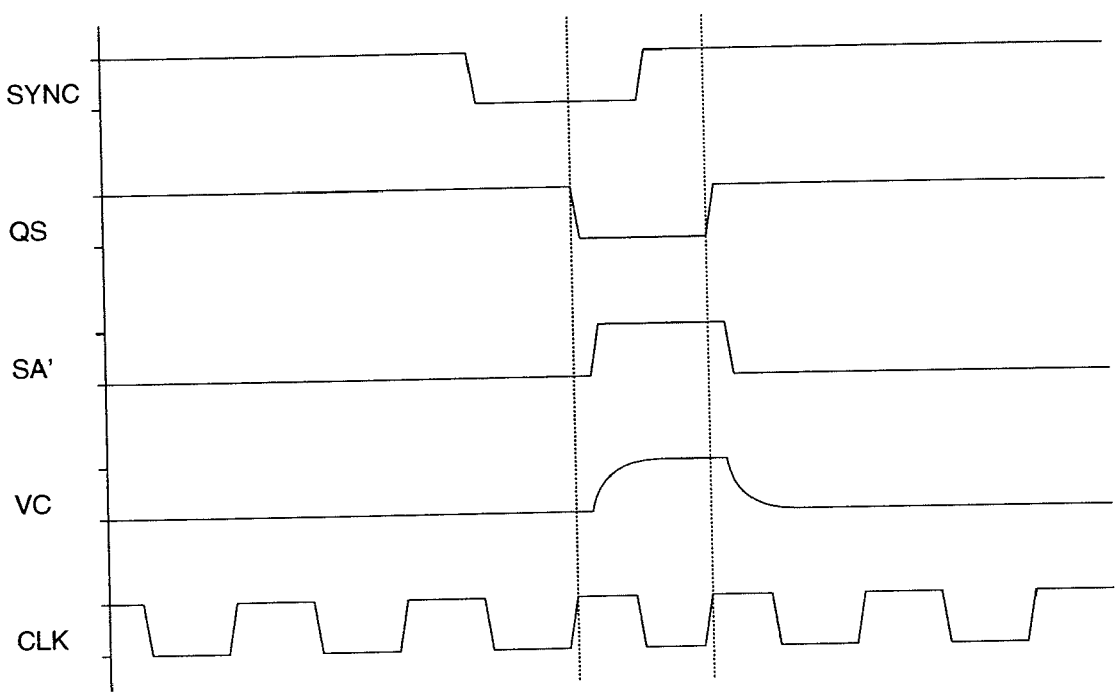
FIG. 112 is a timing chart of FIG. 111.

As shown in FIG. 112, then, the synchronous oscillator 418 in FIG. 111 can make a period of the clock signal CLK short when voltage of the SYNC terminal is high. Therefore, the synchronous oscillator 418 can regulate phase of the clock signal CLK finely. If the voltage controlled oscillator 439 can make its frequency twice, difference of phases of clock signals generated by adjoining interlocked counters 401 is put in π radian, that is, less than a half period of the clock signals. Note that a lag-lead-type loop filter and its variations can be used instead of the lag-type loop filter, although the lag-type loop filter is used as the loop filter 438 in FIG. 111. In addition, many voltage controlled oscillators 439 can be used instead of the voltage controlled oscillator 439 shown in FIG. 111. In this case, output voltage of the synchronous signal amplifier 437 must be changed, according to a range of voltage controlling the voltage controlled oscillator 439. Although a NOT gate is used as the synchronous signal amplifier 437 in FIG. 111, an operational amplifier is used, if desired.

Now, the enforcement forms of the interlocked counter 401 corresponding to the inventions described in claim 13 to claim 16 do not always have to be connected with all other interlocked counters 401. It is explained here about a case that the interlocked counters 401 are arranged regularly.

Figure 113:
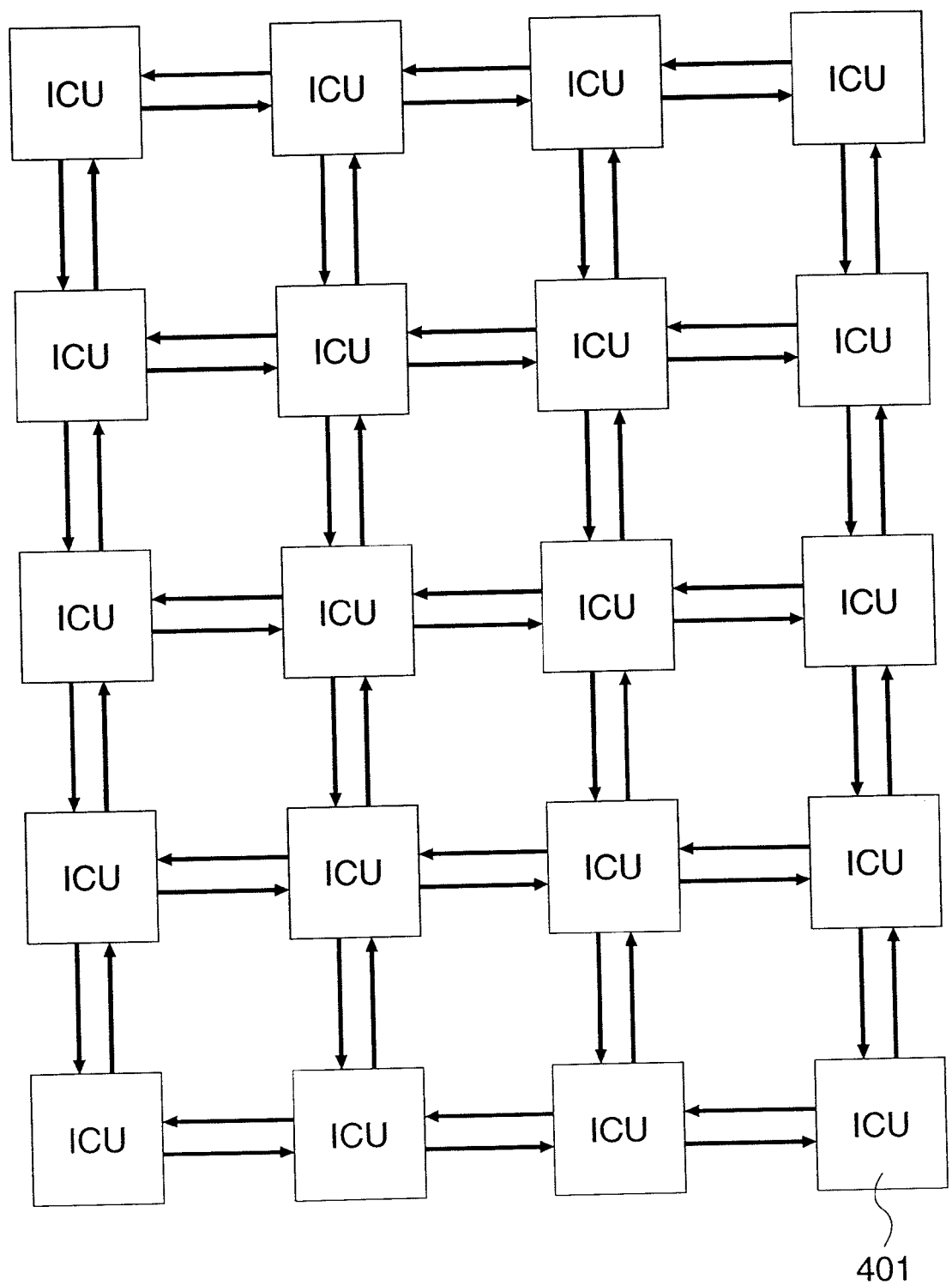
FIG. 113 is a block diagram of a network consisting of some interlocked counters arranged in the shape of a square lattice.
Figure 114:
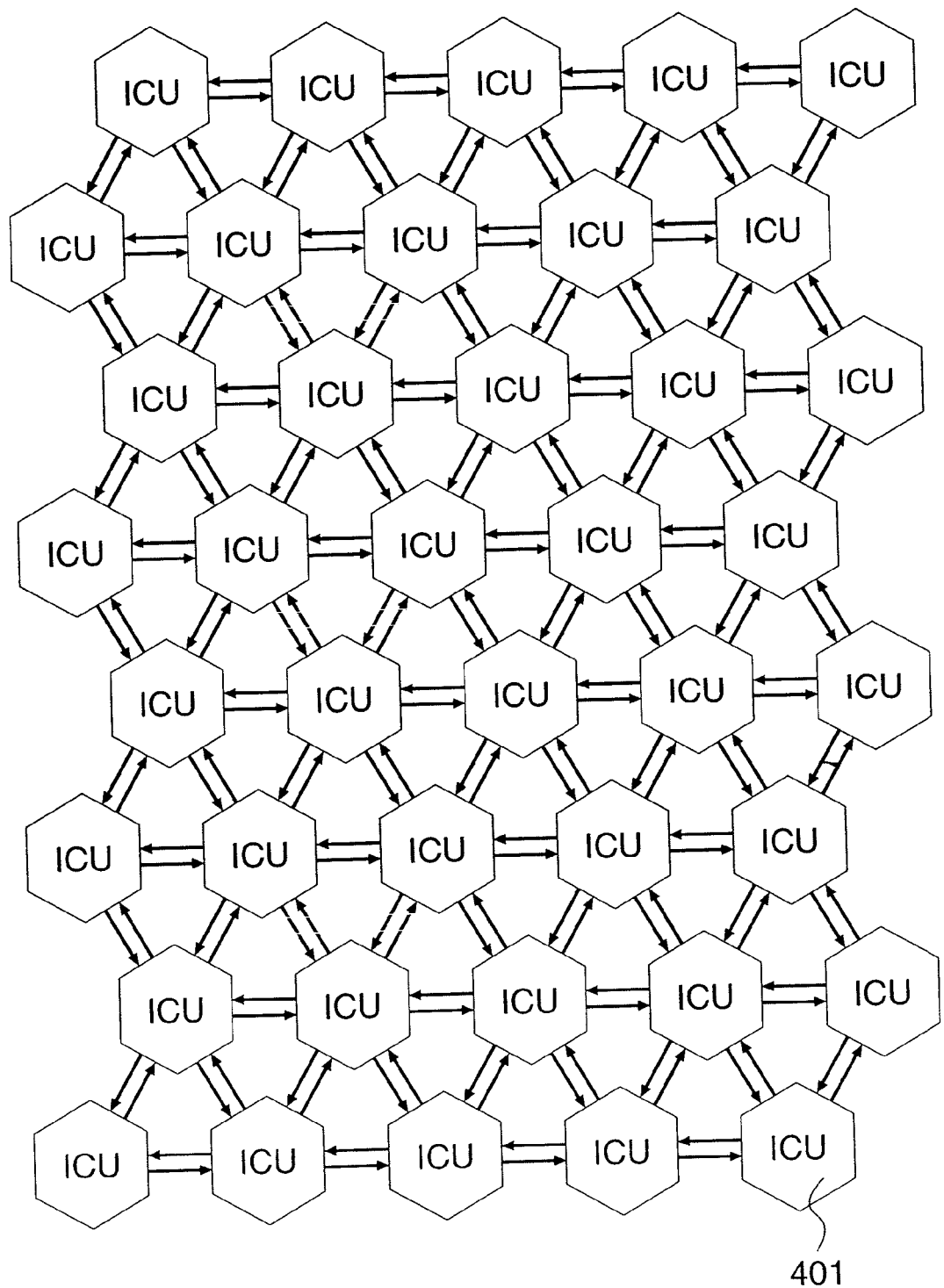
FIG. 114 is a block diagram of a network consisting of some interlocked counters arranged in the shape of a hexagonal lattice.
Figure 115:
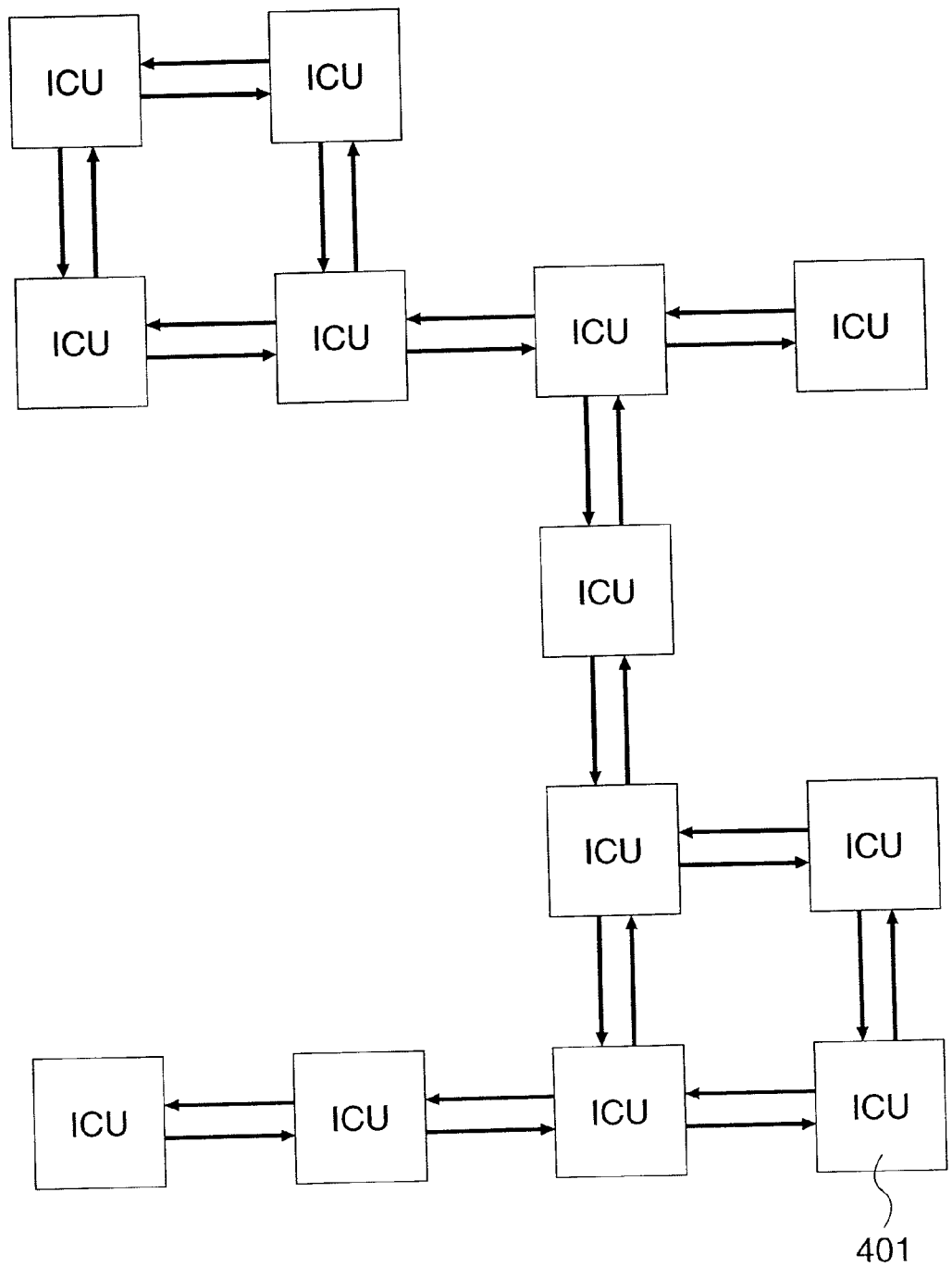
FIG. 115 is a block diagram of a network consisting of some interlocked counters arranged as distance between them is equal.

As shown in FIG. 113, an enforcement form of an interlocked counter 401 corresponding to the invention described in claim 17 is a network connecting adjoining interlocked counters 401 arranged in the shape of a square lattice with each other. In this case, the number of latch circuits for interlocking signal 414 is four. Note that some inputs of the latch circuits for interlocking signal 414 which are not connected are pulled down, in an interlocked counter 401 near an edge. As shown in FIG. 114, the interlocked counters 401 can be arranged in the shape of a hexagonal lattice and can be connected with each other, instead of arranging them in the shape of a square lattice. Since all lengths of signal lines for interlocking signals become almost same, by arranging the interlocked counters 401 like this, it becomes easy for the interlocked counters 401 to interlock with each other. For a large-scale and regular digital circuit 402 like a pipeline processing device, a DSP (Digital Signal Processor), a systric array, a data-flow processor and a parallel image processing device, these two-dimensional interlocked devices can supply easily the count number of the interlocked counter 401, that is, a divided signal of a clock signal.

Figure 116:
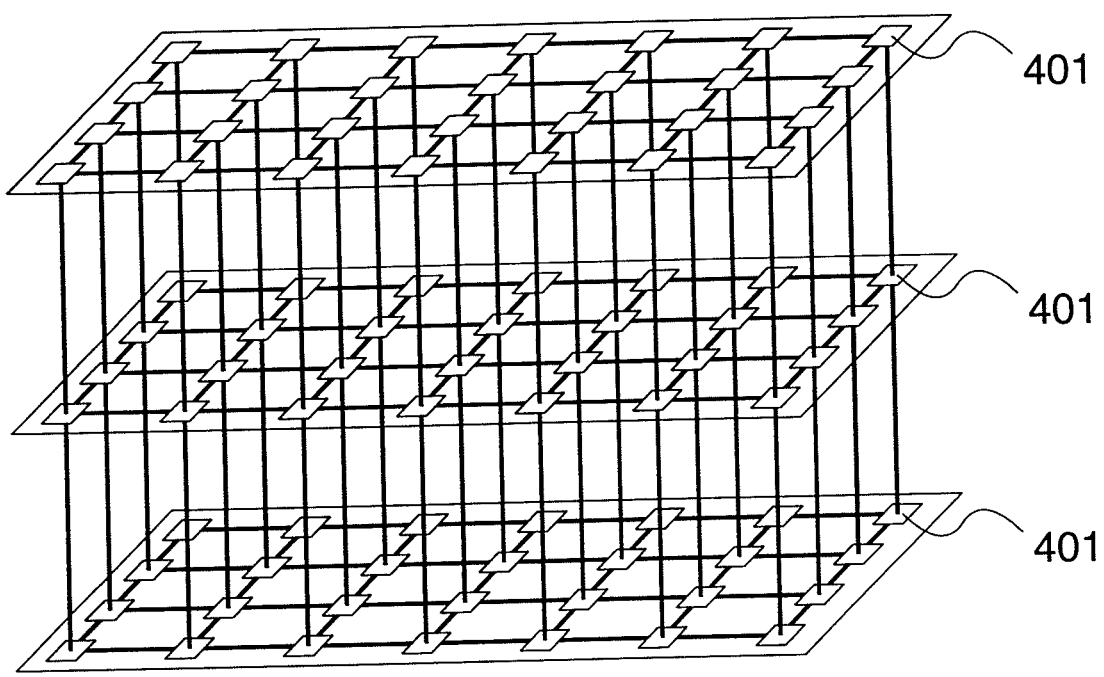
FIG. 116 is an explanation view for stacking interlocked counters as their lattices are overlapping.

As shown in FIG. 116, in addition, a three-dimensional interlocked device is a network piling up some interlocked counters 401 arranged in the shape of a square lattice and in the shape of a hexagonal lattice by 3D LSI technology. In a case of arranging the interlocked counters 401 in the shape of a square lattice, the number of the latch circuits for interlocking signal 414 is six. In a case of arranging them in the shape of a hexagonal lattice, the number of the latch circuits for interlocking signal 414 is eight. In a case of FIG. 116, three networks of the interlocked counters 401 arranged in the shape of a square lattice are stacked, and an interlocking signal of each interlocked counter 401 is represented by a real line. Note that some of input terminals of the latch circuit for interlocking signal 414 of each interlocked counter 401, which are not connected with adjoining interlocked counters 401, are pulled up or pulled down. As is clear from FIG. 116, length of signal lines for interlocking signals comes to be equal and the shortest, by uniting positions of interlocked counters 401 between layers each other. Therefore, propagation delay time of the interlocking signals across the layers can be regulated easily as it comes to be equal to propagation delay time of the interlocking signals within each layer, by changing a material of wires between the layers, or by using some delay lines. Thus, the interlocked counters 401 in different layers can be synchronized with each other.

Figure 117:
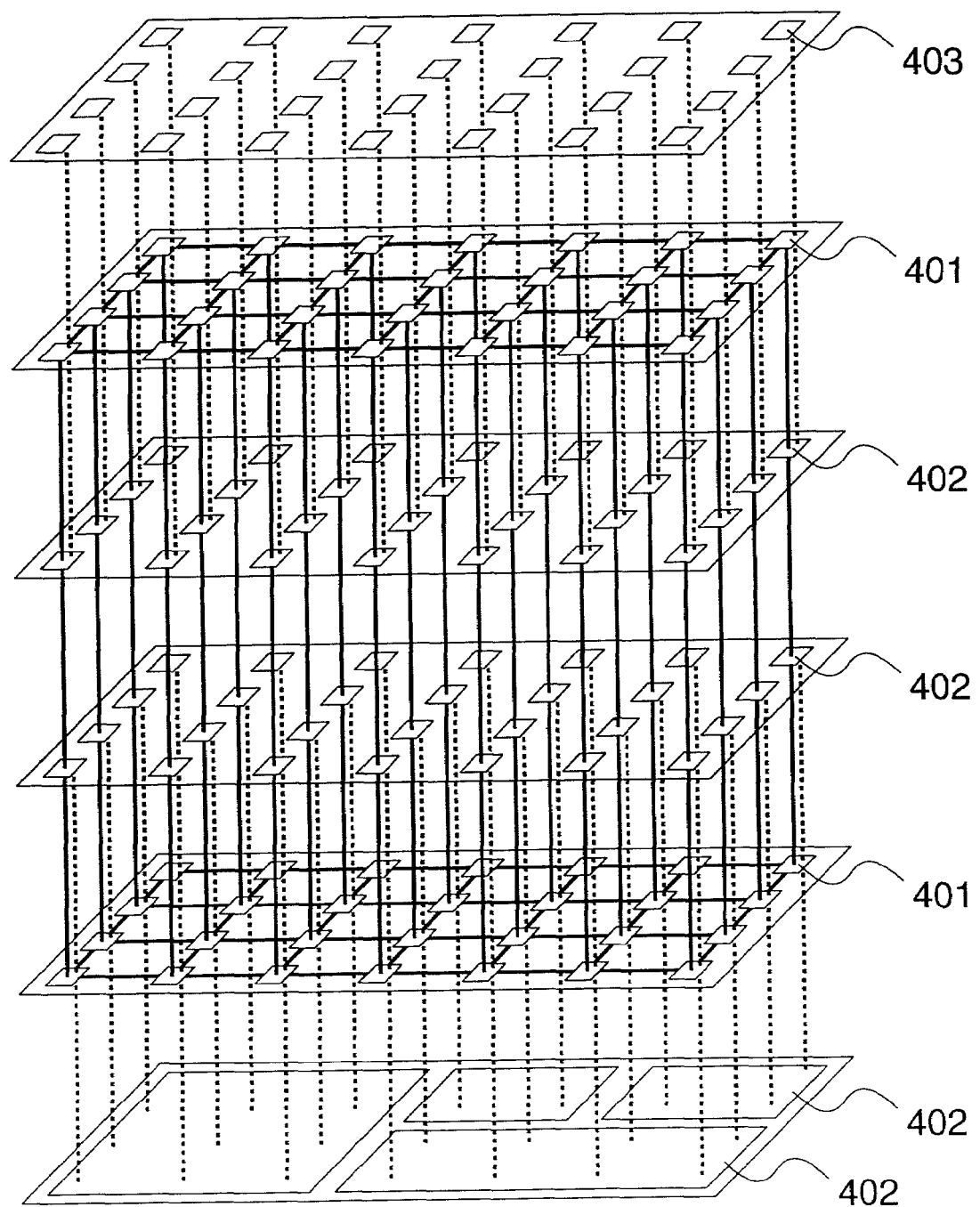
FIG. 117 is an explanation view for stacking interlocked counters, digital circuits and analog circuits.

As shown in FIG. 117, furthermore, an interlocked device for distributing the count number comprises a network of the interlocked counters 401 arranged in the shape of a square lattice and a hexagonal lattice, digital circuits 402 like a processor 101 and an operation circuit, and analog circuits 403 like a photo diode and an A/D convert 204 in some different layers of a 3D LSI, respectively. In a case of FIG. 117, some interlocked counters 401 arranged in the shape of a square lattice are implemented in a second layer and a fifth layer, digital circuits 402 are implemented in a first layer, a third layer and a fourth layer, and analog circuits 403 are implemented in a sixth layer. In FIG. 117, note that a real line denotes the interlocking signal, and a dashed line denotes the count number. In addition, signal lines except the interlocking signal and the count number are omitted. Since some of interlocked counters 401 implemented in the second layer and the fifth layer, which are overlapping each other, input mutual interlocking signals, all interlocked counters 401 in the second layer and the fifth layer can generate the same count number. Moreover, since the network of the interlocked counters 401 can be implemented in a layer different from layers of the digital circuits 402 and the analog circuits 403, arrangement of the interlocked counters 401 is not shifted because of arrangement of the digital circuits 402 and the analog circuits 403, The signal line of the interlocking signal does not also detour. In addition, the interlocked counters 401 are not influenced by noise of the digital circuits 402 and the analog circuits 403, by coping with the noise between layers of the three-dimensional LSI. Therefore, operation of the interlocked circuits 401 is stabilized. Similarly, the digital circuits 402 and the analog circuits 403 can input the count number from the nearest interlocked counter 401 regardless of their places. This fact means that an LSI designer does not have to draw signal lines of the count number around within an implementation layer. Therefore, even though the LSI designer arranges the digital circuits 402 and the analog circuits 403 at any places, he can pull propagation delay time of the count number within a specific range. Thus, the digital circuits 402 and the analog circuits 403 can be designed easily. In particular, the network of the interlocked counters 401 like FIG. 117 can supply efficiently the count number, that is, a divided signal of the clock signal CLK, to a systric array and a parallel image processing device, in which processors 101 arranged in the shape of a square lattice and a hexagonal lattice pass data processed simultaneously toward a vertical direction, in terms of pipeline processing.

By the way, all interlocked counters 401 can supply the same count number for a whole LSI, by using a claim 17, a three-dimensional interlocked device and an interlocked device for distributing the count number. In short, by using this count number, an interlocked signal distribution circuit can be designed as a suitable signal is distributed for a whole LSI simultaneously.

Figure 118:
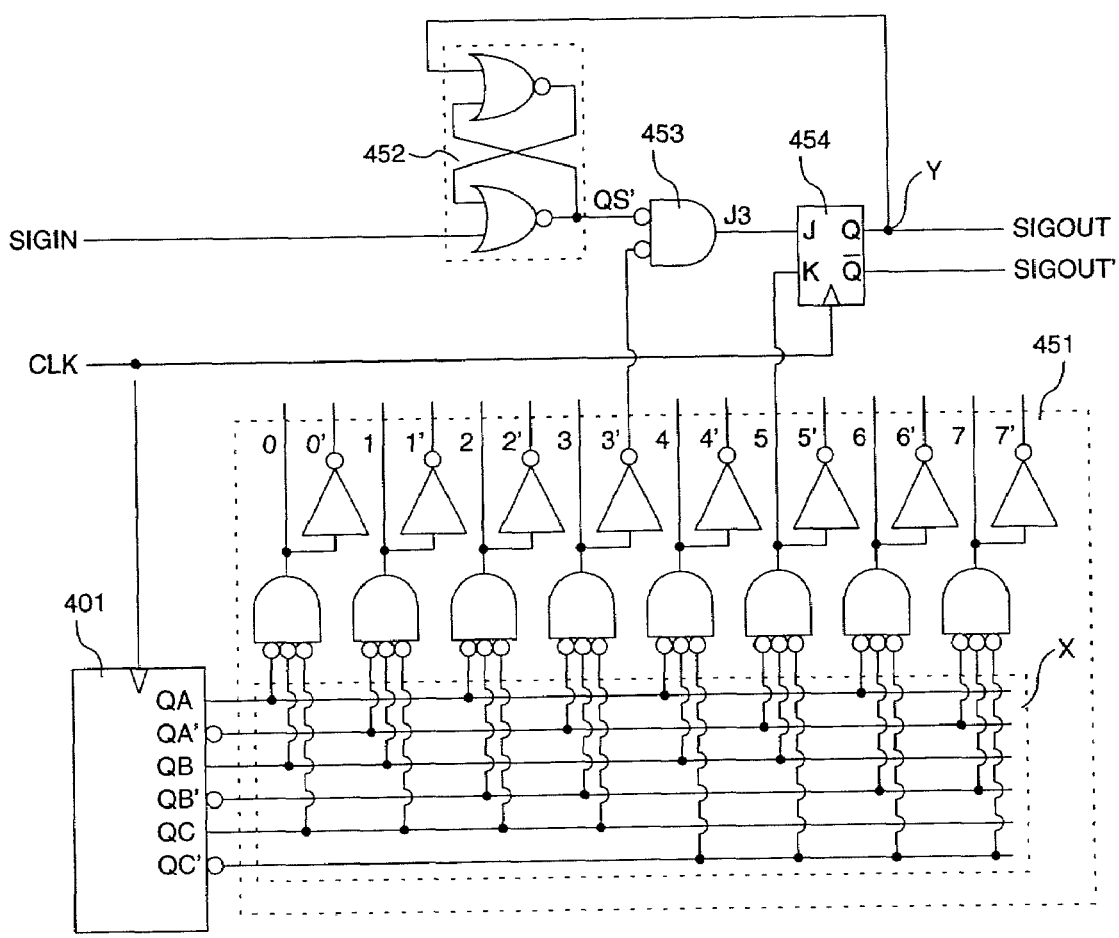
FIG. 118 is a circuit diagram of an interlocked signal distribution circuit generating an output signal, using third and fifth outputs of a decoder for signal distribution, in a case that a latch circuit for signal distribution is reset by an output of a flip-flop circuit for signal distribution.

As shown in FIG. 118, the interlocked device generates some decoded results, by decoding the count number of the interbocked counter 401 by a decoder for signal distribution 451. Suppose, moreover, that two of the decoded results represent a count start time and a count end time, respectively. In a case that a latch circuit for signal distribution 452 inputted a suitable signal SIGIN, the latch circuit for signal distribution 452 memorizes the signal SIGIN from an input time to the count end time, followed by that a logic gate for signal distribution 453 outputs the signal SIGIN memorized by the latch circuit for signal distribution 452 to a flip-flop circuit for signal distribution 454 only at the count start time. Moreover, the flip-flop circuit for signal distribution 454 outputs a signal SIGOUT and a signal SIGOUT' synchronized with a clock signal CLK. Therefore, the interlocked signal distribution circuit generates the signal SIGOUT from the signal SIGIN delayed any time. Note that the signal SIGOUT is synchronized with the clock signal CLK and is active for an integral multiple of a period of the clock signal CLK.

For example, in a case of FIG. 118, the decoder for signal distribution 451 inputs three outputs of the interlocked counter 401, QA to QC, representing the count numbers, 0 to 7, and their negative-logic outputs, QA' to QC', followed by generating eight decoded results from the count numbers, 0 to 7, respectively, by using eight NOR gates. That is, eight NOR gates comprise some (now three) input terminals, respectively. The outputs, QA, QB and QC, are distributed to the NOR gate outputting the decoded result 0, the outputs, QA', QB and QC, are distributed to the NOR gate outputting the decoded result 1, the outputs, QA, QB' and QC, are distributed to the NOR gate outputting the decoded result 2, the outputs, QA', QB' and QC, are distributed to the NOR gate outputting the decoded result 3, the outputs, QA, QB and QC', are distributed to the NOR gate outputting the decoded result 4, the outputs, QA', QB and QC', are distributed to the NOR gate outputting the decoded result 5, the outputs, QA, QB' and QC', are distributed to the NOR gate outputting the decoded result 6, and the outputs, QA', QB' and QC', are distributed to the NOR gate outputting the decoded result 7. Suppose here that any two selected from the decoded results 0 to 7 denote the count start time and the count end time, respectively. A time from when the count start time became High level to when the count end time becomes High level is either zero to seven times of a period of the clock signal CLK. Moreover, eight NOT gates inputs the decoded result 0 to the decoded result 7, respectively, followed by outputting negative-logic decoded results, 0' to 7', respectively. Therefore, the count start time and the count end time can be represented in negative logic, by using the negative-logic decoded results, 0' to 7'.

Figure 119:
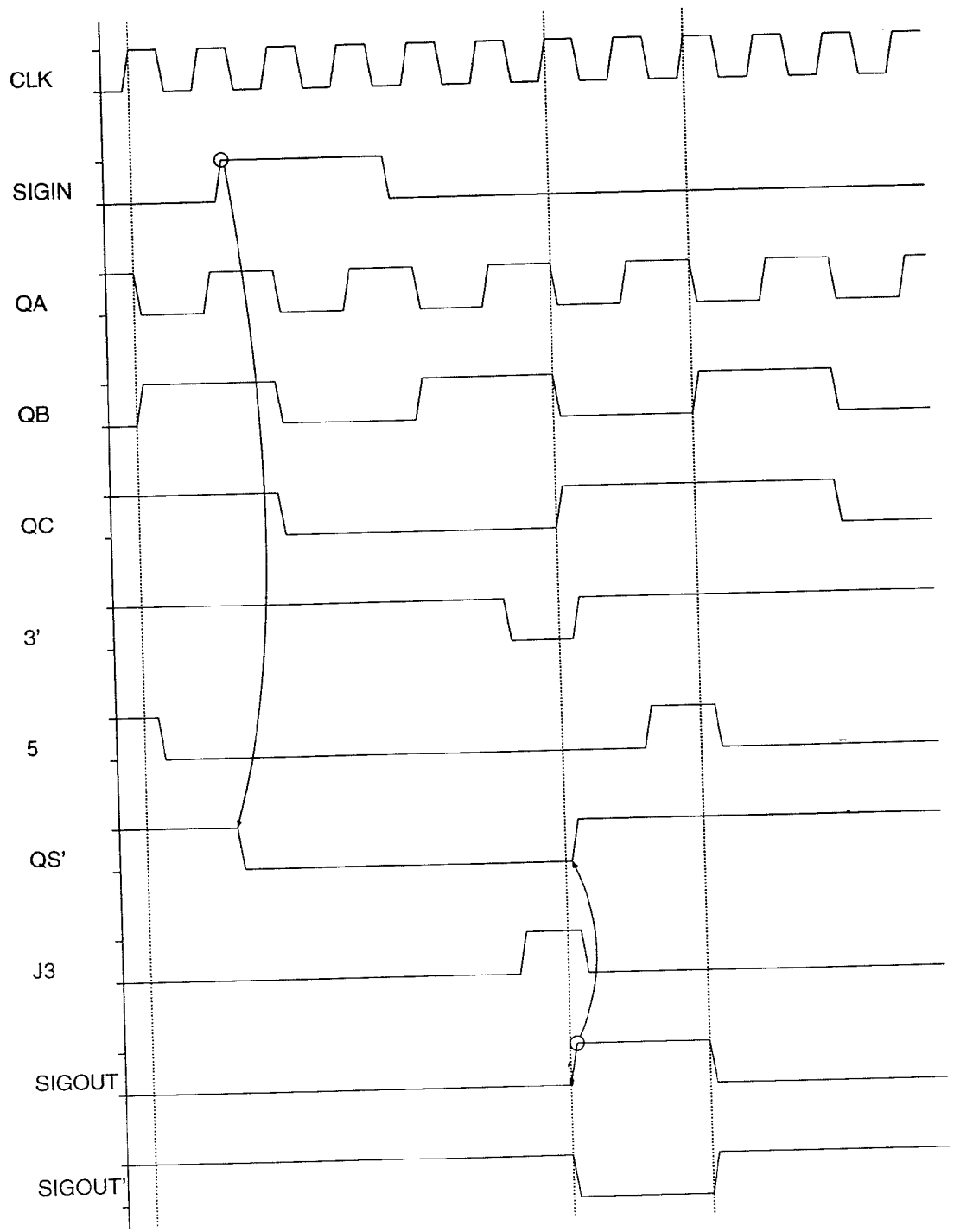
FIG. 119 is a timing chart of an interlocked signal distribution circuit generating an output signal, using third and fifth outputs of a decoder for signal distribution.

In a case of FIG. 118, now, the count start time is the negative-logic decoded result 3', and the count end time is the negative-logic decoded result 5'. In order for the interlocked signal distribution circuit to generate the signal SIGOUT from the signal SIGIN delayed any time, by using the negative-logic decoded result 3' and the negative-logic decoded result 5', the latch circuit for signal distribution 452 first inputs the signal SIGIN at one of two input terminals, followed by outputting a signal QS'. The logic gate for signal distribution 453 inputs the signal QS' and the negative-logic decoded result 5' at two input terminals, followed by outputting a signal J3. The flip-flop circuit for signal distribution 454 inputs the signal J3 at a J terminal and the decoded result 5 at a K terminal. In addition, since the clock signal CLK is inputted at a clock terminal of the flip-flop circuit for signal distribution 454, the flip-flop circuit for signal distribution 454 outputs the signal SIGOUT from a Q terminal, synchronizing with falling of the clock signal CLK, followed by outputting the signal SIGOUT' from a Q' terminal. Finally the signal SIGOUT is distributed to another of two input terminals of the latch circuit for signal distribution 452 at a turning point Y. It is explained here about the interlocked signal distribution circuit shown in FIG. 118, with reference to a timing chart of FIG. 119.

First, when the signal SIGIN became High level, the latch circuit for signal distribution 452 makes the signal QS' Low level. After this, even though the signal SIGIN became Low level, the signal QS' remains Low level until the signal SIGOUT becomes Low level. After the signal QS' became Low level, the logic gate for signal distribution 453 makes the signal J3 High level, only if the negative-logic decoded result 3' is Low level. In short, after the signal SIGOUT became High level, the signal J3 becomes High level if the count number of the interlocked counter 401 arrived at three. Since the J terminal of the flip-flop circuit for signal distribution 454 becomes High level, the signal SIGOUT becomes High level in falling of the clock signal CLK. In addition, since the signal SIGOUT is inputted by the latch circuit for signal distribution 452, the latch circuit for signal distribution 452 is resetted, and the signal QS' becomes High level. Even though the count number of the interlocked counter 401 arrived at four in this state, both the J terminal and the K terminal of the flip-flop circuit for signal distribution 454 become Low level. Therefore, the signal SIGOUT remains High level. However, when the count number of the interlocked counter 401 arrived at five, the decoded result 5 becomes High level, and the K terminal of the flip-flop circuit for signal distribution 454 also becomes High level. In short, the signal SIGOUT becomes Low level in falling of the clock signal CLK. As is clear from FIG. 119, when the signal SIGIN was inputted, the signal SIGOUT has been outputted from a time that the clock signal CLK fell during the decoded result 3' is Low level, to a time that the clock signal CLK fell during the decoded result 5 is High level. Even though digital circuits 402 are arranged anywhere in an LSI, the digital circuits 402 can input the signal SIGOUT certainly in rising of the decoded result 5. Such function is necessary to implement a reset signal, an interrupt signal and some input-output signals into a system LSI, with seldom changing the digital circuits 402 already designed.

Figure 120:
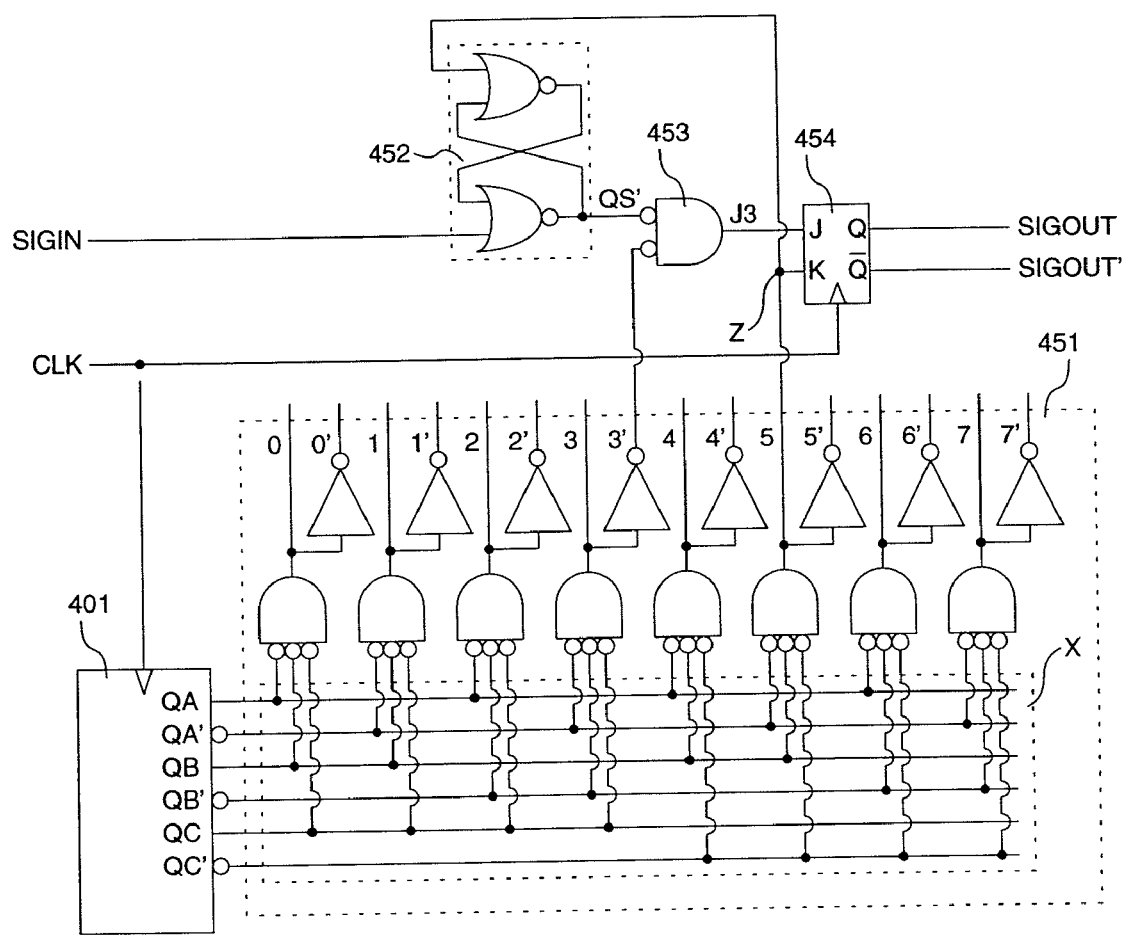

Besides this, as shown in FIG. 120, the decoded result 5 can be also distributed to another terminal of two input terminals of the latch circuit for signal distribution 452 in the interlocked signal distribution circuit at a turning point Z. In a case of the interlocked signal distribution circuit shown in FIG. 118, the latch circuit for signal distribution 452 is resetted by the signal SIGOUT. When the signal SIGOUT is High level, therefore, the latch circuit for signal distribution 452 can not memorize the signal SIGIN even though the signal SIGIN became High level. On the other hand, in a case of the interlocked signal distribution circuit shown in FIG. 120, the latch circuit for signal distribution 452 is resetted by the decoded result 5. When the signal SIGOUT is High level, therefore, the latch circuit for signal distribution 452 can memorize the signal SIGIN if the decoded result 5 is not High level, even though the signal SIGIN became High level. In short, if the signal SIGIN became High level immediately after the decoded result 5 changed from High level to Low level, the latch circuit for signal distribution 452 can memorize the signal SIGIN. Therefore, if the decoded result 4 is inputted at another terminal of two input terminals of the latch circuit for signal distribution 452 instead of the decoded result 5, the latch circuit for signal distribution 452 can come to memorize the signal SIGIN even though the signal SIGOUT is High level.

Note that NAND gates can be also used although NOR gates are used as the decoder for signal distribution 451, the latch circuit for signal distribution 452 and the logic gate for signal distribution 453 in FIG. 118 and FIG. 120. Furthermore, the negative-logic decoded result 3' and the negative-logic decoded result 5' are used in FIG. 118 and FIG. 120, in order to represent the count start time and the count end time, respectively. Of course, however, other decoded results and negative-logic decoded results can be also used. Suppose that a suitable signal SIGIN is inputted from an external part. After the latch circuit for signal distribution 452 once memorized this signal, the signal is inputted by the flip-flop circuit for signal distribution 454 at the count start time, according to the logic gate for signal distribution 453. The flip-flop circuit for signal distribution 454 memorizes an input signal, synchronizing with the clock signal, followed by being resetted at the count end time. Therefore, the interlocked signal distribution circuit can output the input signal arrived before the count start time, from the count start time to the count end time, in spite of propagation delay time of the input signal. In a case that logic of the input signal is inverting, note that the interlocked signal distribution circuit can work normally, by adding a logic gate in front of the latch circuit for signal distribution 452.

It has been described above about the interlocked device. It is explained here about an enforcement form of an image sensor 251 in the present invention, with reference to the drawings.

Figure 121:
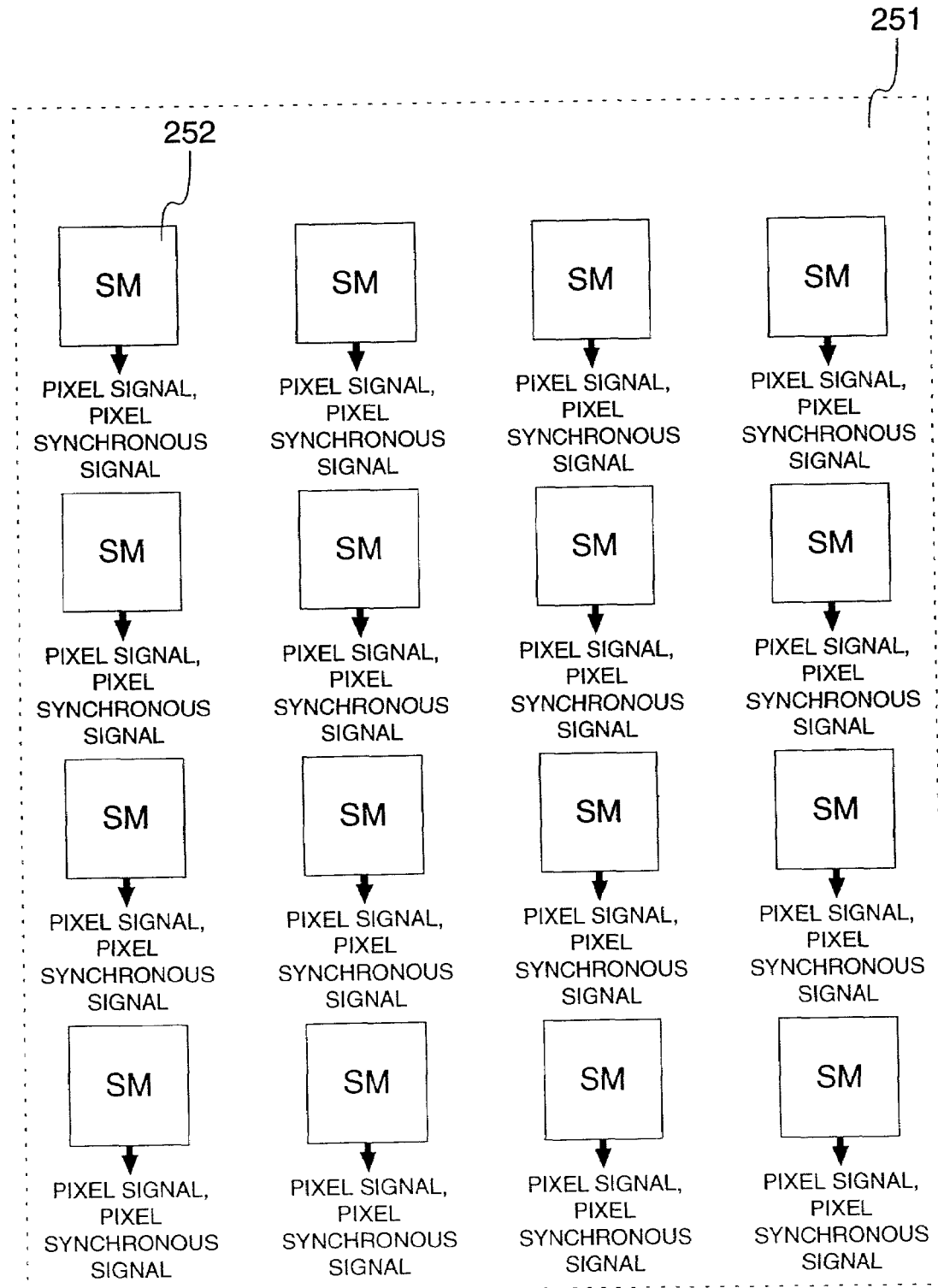
Figure 122:
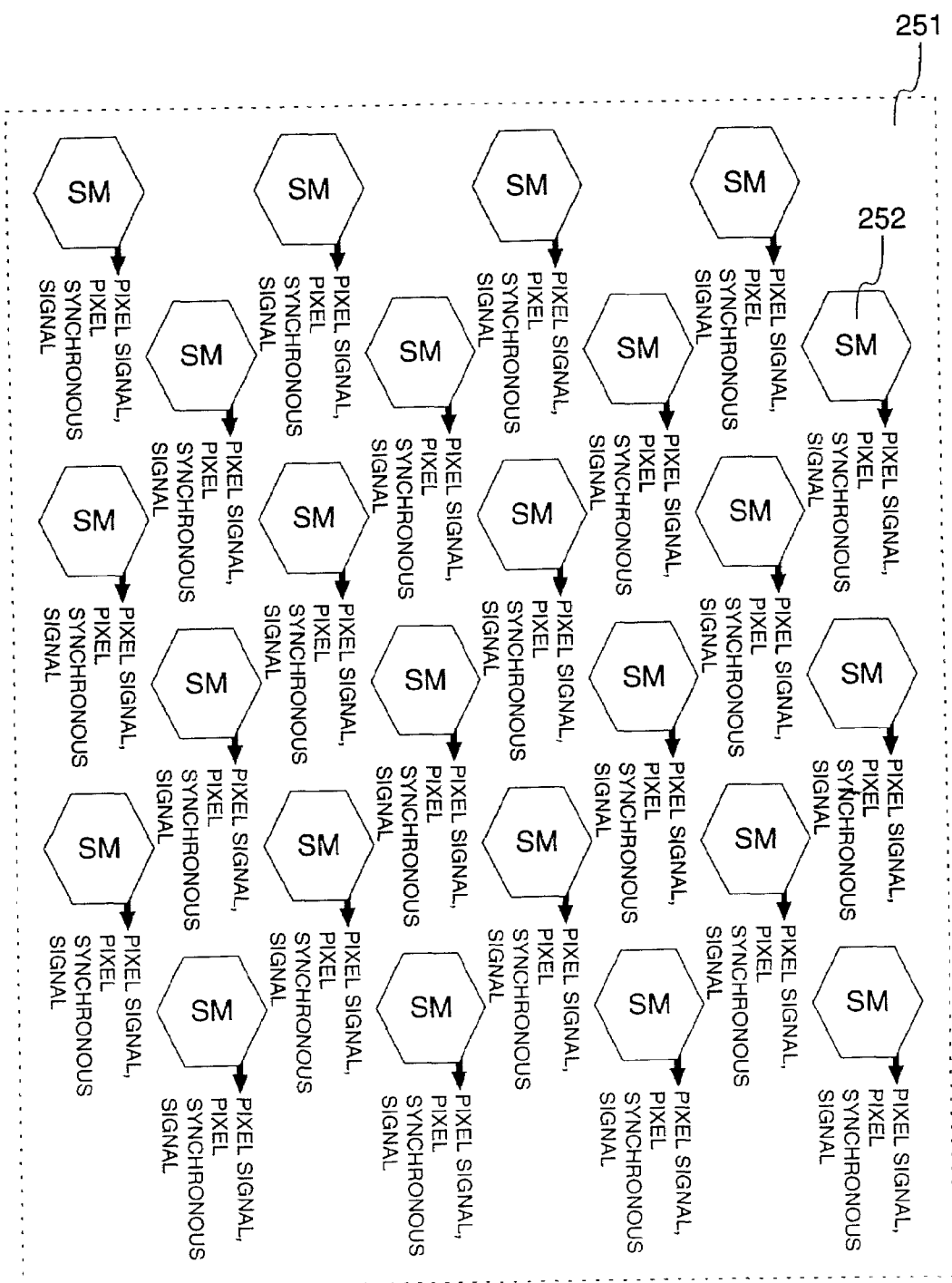
Figure 123:
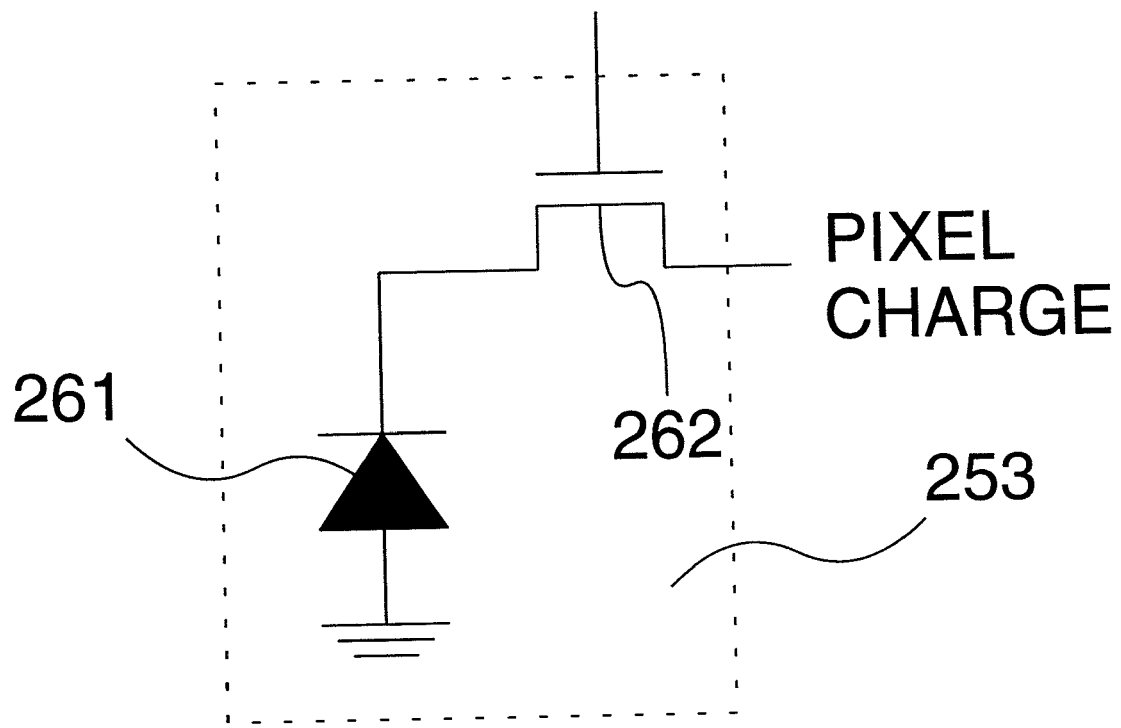

As shown in FIG. 121 and FIG. 122, the image sensor 251 in the present invention comprises some sensor modules 252, and each of the sensor modules 252 outputs a pixel signal. In short, the image sensor 252 can output the same number of pixel signals as the number of the sensor modules 252 in parallel. If each of the sensor modules 252 outputs only a pixel signal, the image sensor 251 is equivalent to the past pixel-parallel type. Note that a sensor module 252 is denoted as SM in FIG. 121 and FIG. 122, and an interval between adjoining sensor modules 252 is stretched for making the figures legible. In addition, some sensor modules 252 are arranged in the shape of a lattice in FIG. 121, while some sensor modules 252 are arranged in the shape of a hexagonal lattice in FIG. 122. Besides this, some sensor modules 252 can be arranged in the shape of a line and a circle. Moreover, some sensor modules 252 can be arranged at any places. It is explained here about a method that a sensor module 252 outputs some pixel signals in order, in both cases that the image sensor 251 uses charge coupled device 263 and the image sensor 251 is manufactured by using only CMOS technology.

Figure 124:
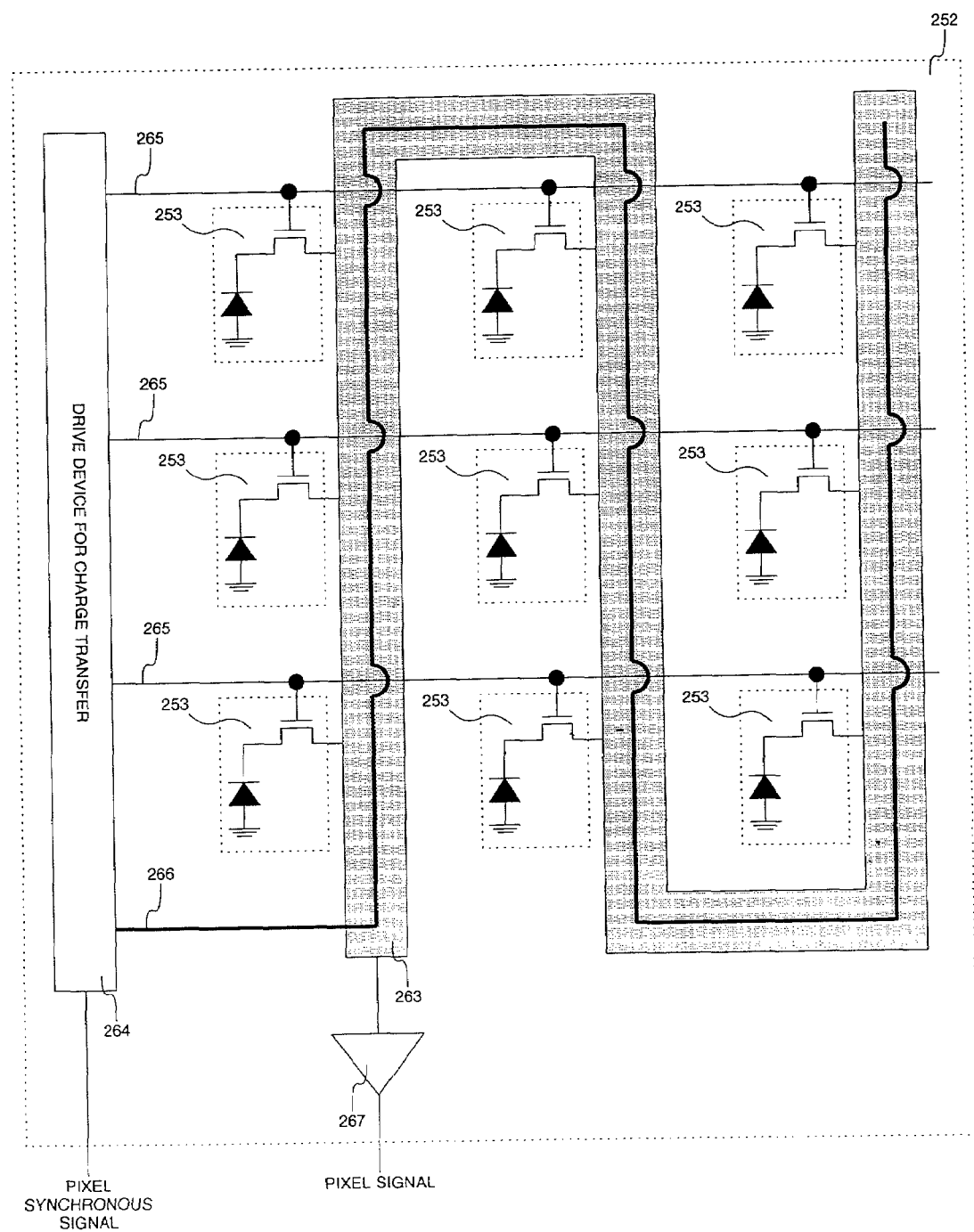

First, in a case that the image sensor 251 uses the charge coupled device 263, a pixel cell 253 taking a pixel consists of a photo-receptor element 261 and a charge transfer gate 262 at least. A photodiode, a phototransistor and a HARP (High-gain Avalanche Rushing amorphous Photoconductor) film are used as the photo-receptor element 261, and a capacitor storing charges and a semiconductor switch are added to the photo-receptor element 261, if desired. The charge transfer gate 262 is a semiconductor switch, and the charge transfer gate 262 is conductive when a column selection signal is inputted by the pixel cell 253. Therefore, the charges stored by the photo-receptor element 261 are taken out from the pixel cell 253. As shown in FIG. 124, then, in an enforcement form of the image sensor 251 corresponding to the invention described in claim 18, some pixel cells 253 are arranged in the shape of a lattice in the sensor module 252. The charge coupled device 263 is arranged sigmoidly as all pixel cells 253 are traced with one stroke in FIG. 124, and an output terminal of the charge transfer gate 262 in each of the pixel cells 253 is connected with the charge coupled device 263. In addition, a drive device for charge transfer 264 supplies column selection signals to the charge transfer gates 262 of all pixel cells 253 via at least one column selection signal line 265. Moreover, the drive device for charge transfer 264 supplies charge transfer signals to the charge coupled device 263 via at least one charge transfer signal line 266. The drive device for charge transfer 264, then, makes charges transferred from at least one photo-receptor element 261 to the charge coupled device 263 transfer to either terminal, in a form of a bucket relay. The charges transferred by the charge coupled device 263 are inputted by an output amplifier 267 in order. The output amplifier 267 converted the charges inputted into voltage, followed by outputting it as the pixel signal. Note that the drive device for charge transfer 264 can make only one column selection signal active at once, according to applications of the image sensor 251, but now the drive device for charge transfer 264 can mainly make all column selection signals active simultaneously. Therefore, since the charge coupled device 263 can transfer the charges stored by all photo-receptor elements 261 in order, in a form of a bucket relay, the sensor module 252 can take out easily the charges from all photo-receptor elements 261 in a short time, followed by outputting them as the pixel signal. Moreover, after the drive device for charge transfer 264 supplied the charge transfer signals to the charge coupled device 263 via at least one charge transfer signal line 266, the drive device for charge transfer 264 outputs pixel synchronization signals. From an external part of all sensor modules 252, therefore, it can be distinguished that each sensor module 252 outputs its pixel signal.

Figure 125:
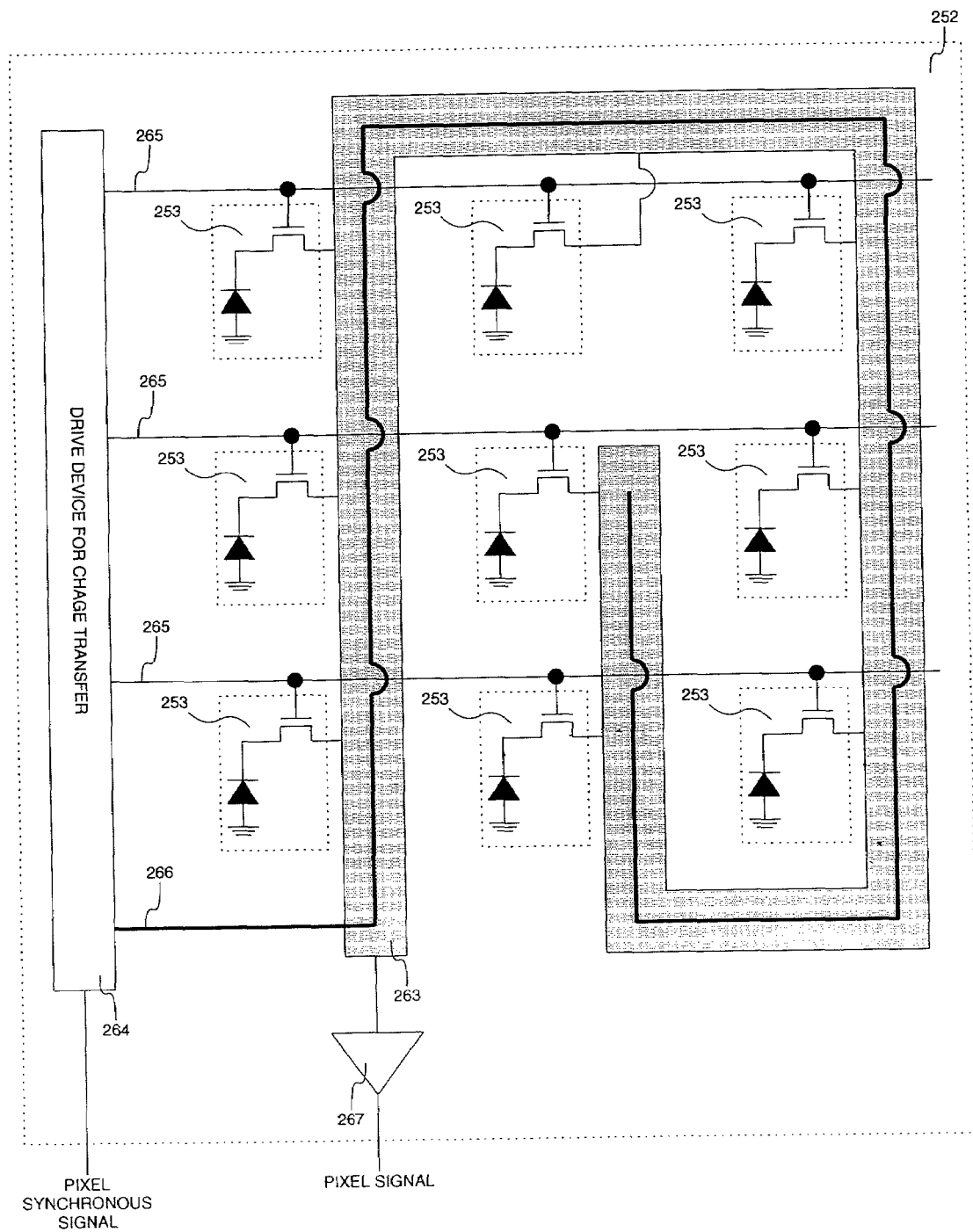
Figure 126:
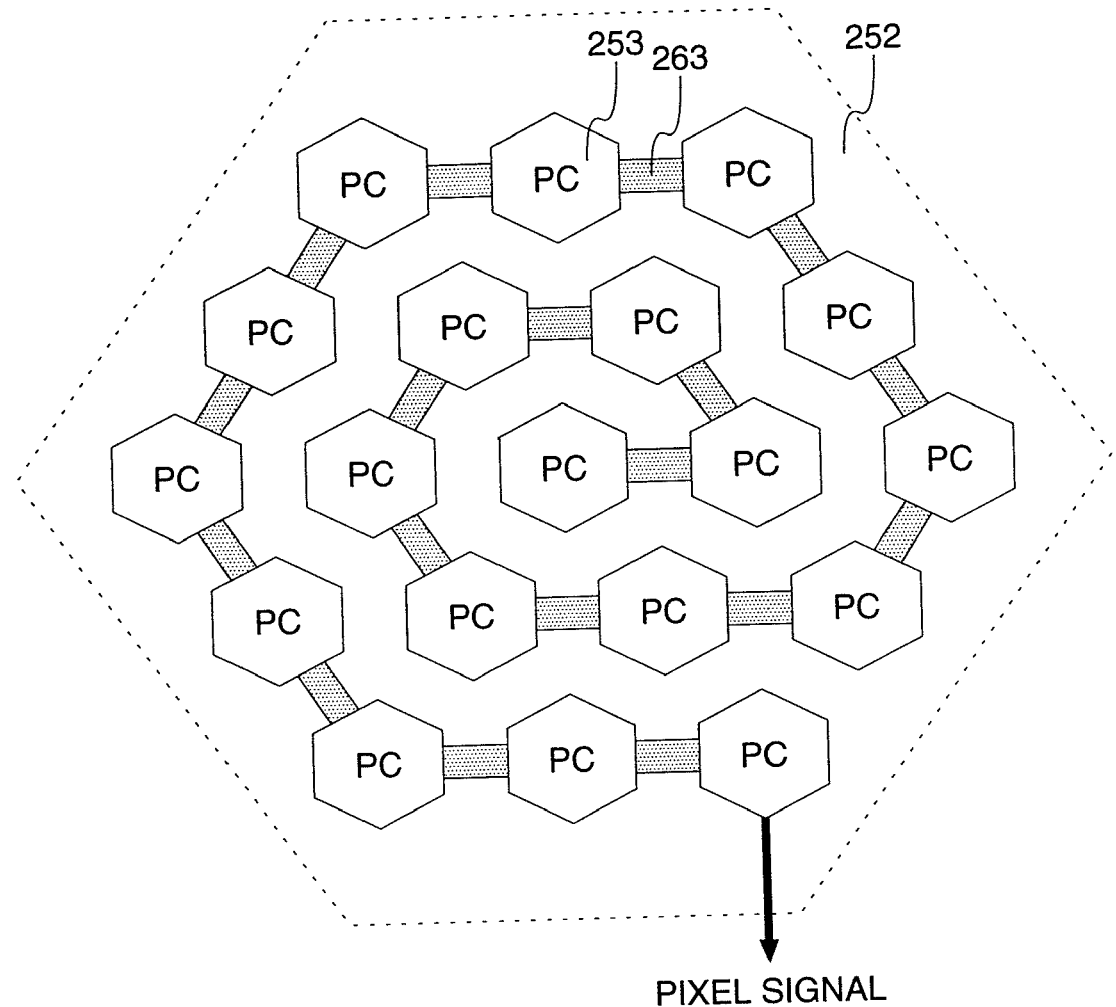
Figure 127:
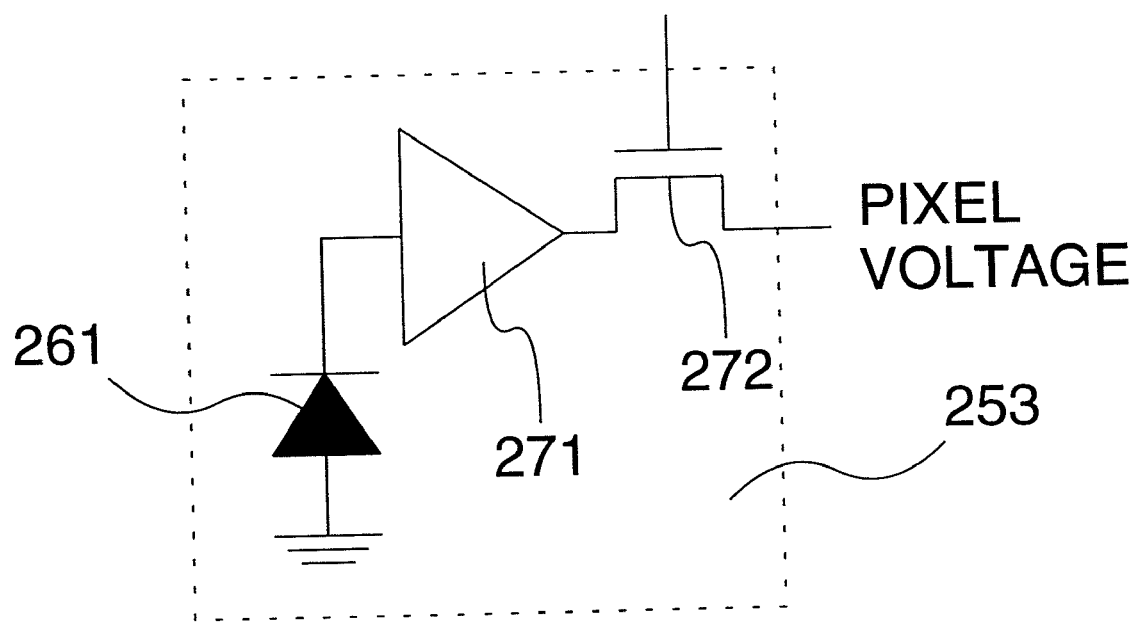

By the way, although the charge coupled device 263 is arranged sigmoidly in FIG. 124, the charge coupled device 263 can be arranged in the shape of a spiral, as shown in FIG. 125. Moreover, in a case that some pixel cells 253 are arranged in the shape of a hexagonal lattice, the charge coupled device 263 can be arranged in the shape of a spiral, as shown in FIG. 126. Note that a pixel cell 253 is denotes PC in FIG. 126. In the sensor modules 252, since the charge coupled device 263 can take out charges in order, from a photo-receptor element 261 of a pixel cell 253 at an edge or a photo-receptor element 261 of a pixel cell 253 at a center, the image sensor 251 can change its resolution easily, only by limiting the number of pixel signals received by an electronic circuit receiving some pixel signals from the sensor modules 252.

Figure 128:
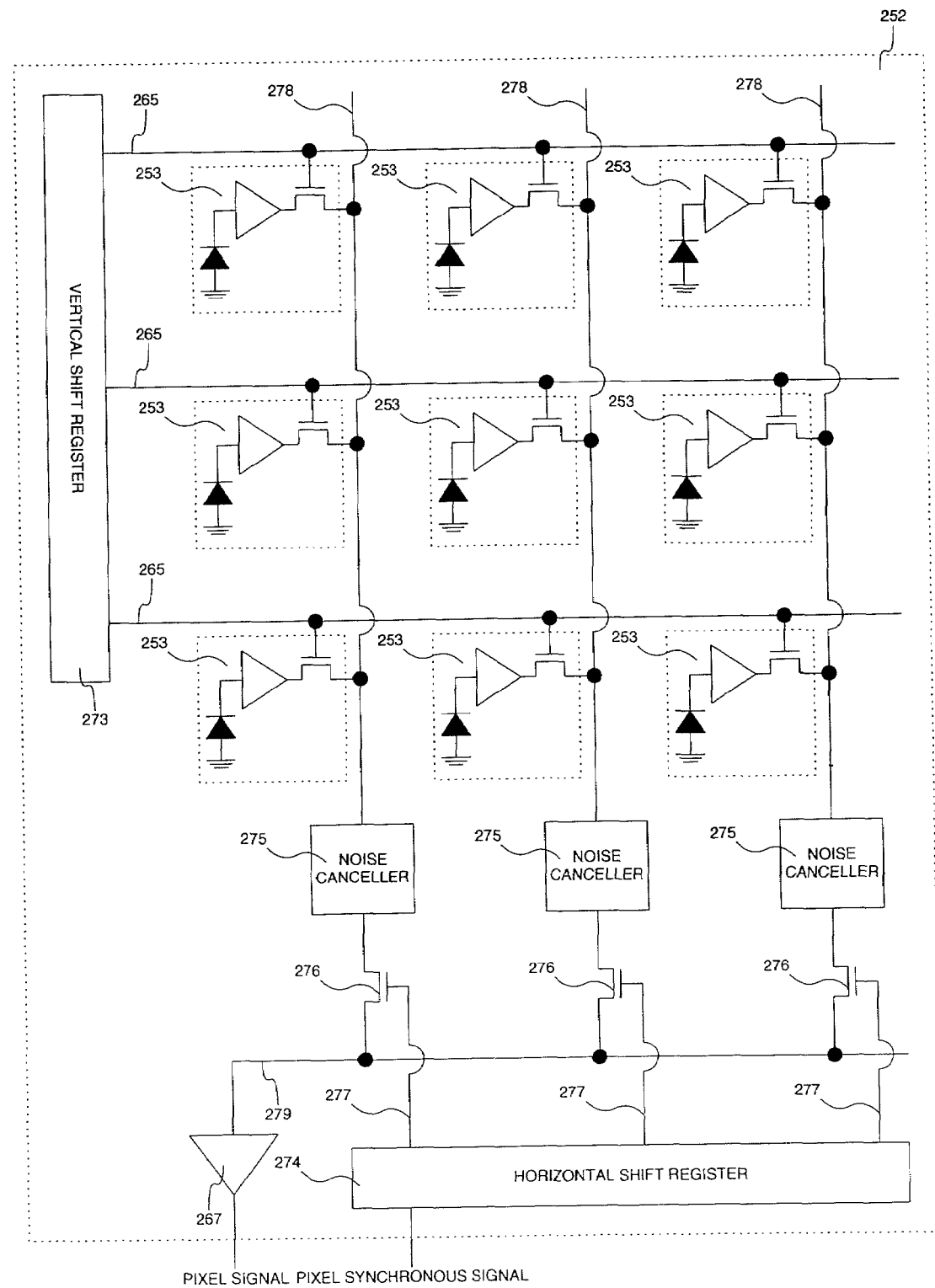

Next, in a case that the image sensor 251 is manufactured by using only CMOS technology, a pixel cell 253 taking a pixel consists of a photo-receptor element 261, a charge amplifier 271 and a column selection gate 272 at least. A photodiode, a phototransistor and a HARP film are used as the photo-receptor element 261, and a capacitor storing charges and a semiconductor switch are added to the photo-receptor element 261, if desired. The column selection gate 272 is a semiconductor switch, and the column selection gate 272 is conductive when a column selection signal is inputted by the pixel cell 253. Therefore, the charges stored by the photo-receptor element 261 are taken out from the pixel cell 253. As shown in FIG. 128, then, in an enforcement form of the image sensor 251 corresponding to the invention described in claim 19, some pixel cells 253 are arranged in the shape of a lattice in the sensor module 252. As is clear from FIG. 128, construction of the sensor module 252 is equivalent to construction of an image sensor 251 using a general CMOS technology. Nine pixel cells 253 are arranged on a 3×3 matrix in FIG. 128. In addition, a 3-stage 1-bit cyclic shift register is used as a vertical shift register 273 and a horizontal shift register 274, only one of whose outputs is active, respectively. Moreover, when the horizontal shift register 274 did the round, the vertical shift register 273 shifts one time. Therefore, one of nine pixel cells 253 can be selected by combining the vertical shift register 273 and the horizontal shift register 274. Details are as below.

First, in a case that the vertical shift register 273 made a column selection signal on a first column active, the column selection gates 272 in three pixel cells 253 on the first column are conductive. Therefore, after charges stored by the photo-receptor element 261 in each of the three pixel cells 253 are converted into voltage by the charge amplifier 271, the voltage is outputted from an output terminal of the column selection gate 272. In short, only the voltage outputted by the three pixel cells 253 on the first column is inputted by three noise cancellers 275 via three vertical signal lines 278, respectively. On the other hand, in each of six pixel cells 253 on a second column and a third column, the photo-receptor elements 261 are storing their charges. CDS(Correlation Double Sampling) is used as a noise canceller 275 on each row, in order to reduce noise generated by the charge amplifier 271 and the column selection gate 272 in the three pixel cells 253 on the same column. In a case that the horizontal shift register 274 made a row selection signal on a first row active, voltage outputted by the noise canceller 275 on the first row is inputted by the output amplifier 267. After the output amplifier 267 amplifies the voltage, the output amplifier 267 outputs a pixel signal corresponding to the pixel cell 253 on the first column and the first row. Similarly, in a case that the horizontal shift register 274 made row selection signals on a second row and a third row active, the output amplifier 267 outputs pixel signals corresponding to the pixel cells 253 on the first column and the second row, and on the first column and the third row, respectively. Note that the horizontal shift register 274 outputs a pixel synchronization signal after selecting a row. From an external part of the sensor module 252, therefore, it can be distinguished that the output amplifier 267 outputs the pixel signals. Next, if outputs of the horizontal shift register 274 did the round, the vertical shift register 273 makes a column selection signal on the second column active. Finally, the vertical shift register 273 makes a column selection signal on the third column active. After that, the vertical shift register 273 makes the column selection signal on the first column active if the outputs of the horizontal shift register 274 did the round. Therefore, since the vertical shift register 273 and the horizontal shift register 274 can select all pixel cells 253 in order, the sensor module 252 can output all pixel signals.

Although nine pixel cells 253 are arranged in the shape of a lattice in FIG. 128, some pixel cells 253, of course, can be arranged in the shape of a hexagonal lattice. In this case, the column selection signal lines 265 and row selection signal lines 277, and vertical signal lines 278 and horizontal signal lines 279 are wired zigzag, respectively, or they are wired as they intersect in an angle of 120 degrees.

Finally, columns and rows of a sensor module 252 change places, by rotating the sensor module 252 90 degrees. Of course, the vertical shift register 273 and the horizontal shift register 274 also changes places similarly. Therefore, an image sensor 251 whose columns and rows change places is included in the enforcement forms of the image sensor 251 corresponding to the inventions described in claim 18 and claim 19.

It has been described above about a case that some sensor modules 252 are implemented on an implementation surface of an LSI. With a natural thing, signal lines for pixel signal and signal lines for pixel synchronization signal outputted from each of the sensor modules 252 are also wired on the same implementation surface. In this case, however, wire length of the signal lines for pixel signal and wire length of the signal lines for pixel synchronization signal are different from each other, according to a place of the sensor modules 252 implemented in the image sensor 251. In addition, quantity of openings of all photo-receptor elements 261 is dropped. It is explained here about an image sensor 251, in which all pixel signals and pixel synchronization signals are outputted toward a back surface of the image sensor 251.

Figure 129:
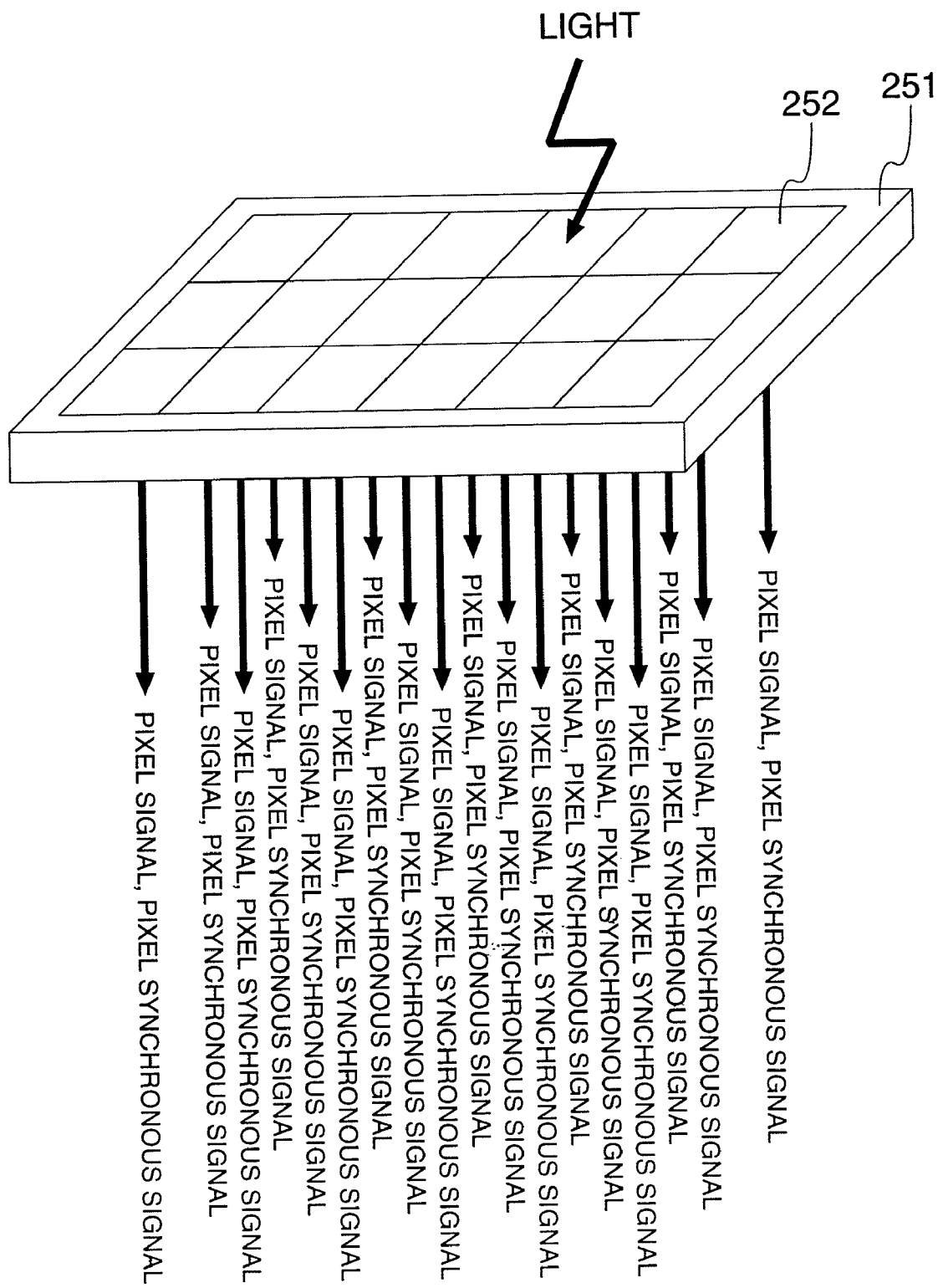
Figure 130:
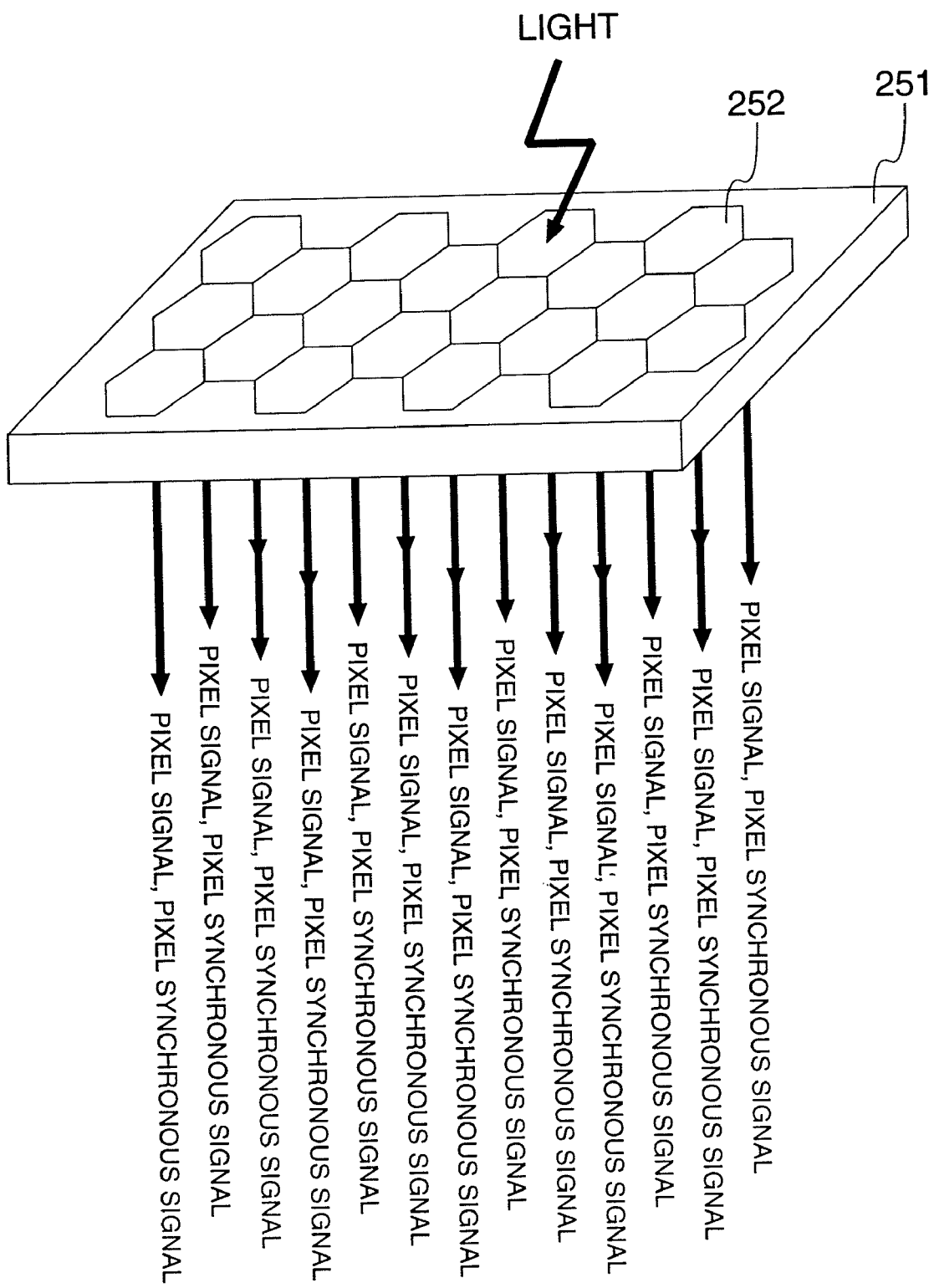

As shown in FIG. 129 and FIG. 130, first, each of all sensor modules 252 outputs the pixel signal and the pixel synchronization signal from the back of the image sensor 251. Lines for the pixel signal and lines for the pixel synchronization signal are realized in terms of three-dimensional LSI technology, where holes are made in a substrate of the image sensor 251 and metals like cupper are filled in the holes. As is clear from FIG. 129 and FIG. 130, a designer of the image sensor 251 can make the wire length of the signal lines for all pixel signals and the wire length of the signal lines for all pixel synchronization signals outputted from all sensor modules 252 equal. In addition, since the designer does not have to wire the signal lines for the pixel signals and the signal lines for the pixel synchronization signals on the implementation surface of the sensor modules 252, the designer can make an implementation area of the sensor module 252 small. Moreover, he can make an interval between adjoining sensor modules 252 narrow. Therefore, the designer can arrange many sensor modules 252 in the image sensor 251.

Figure 131:
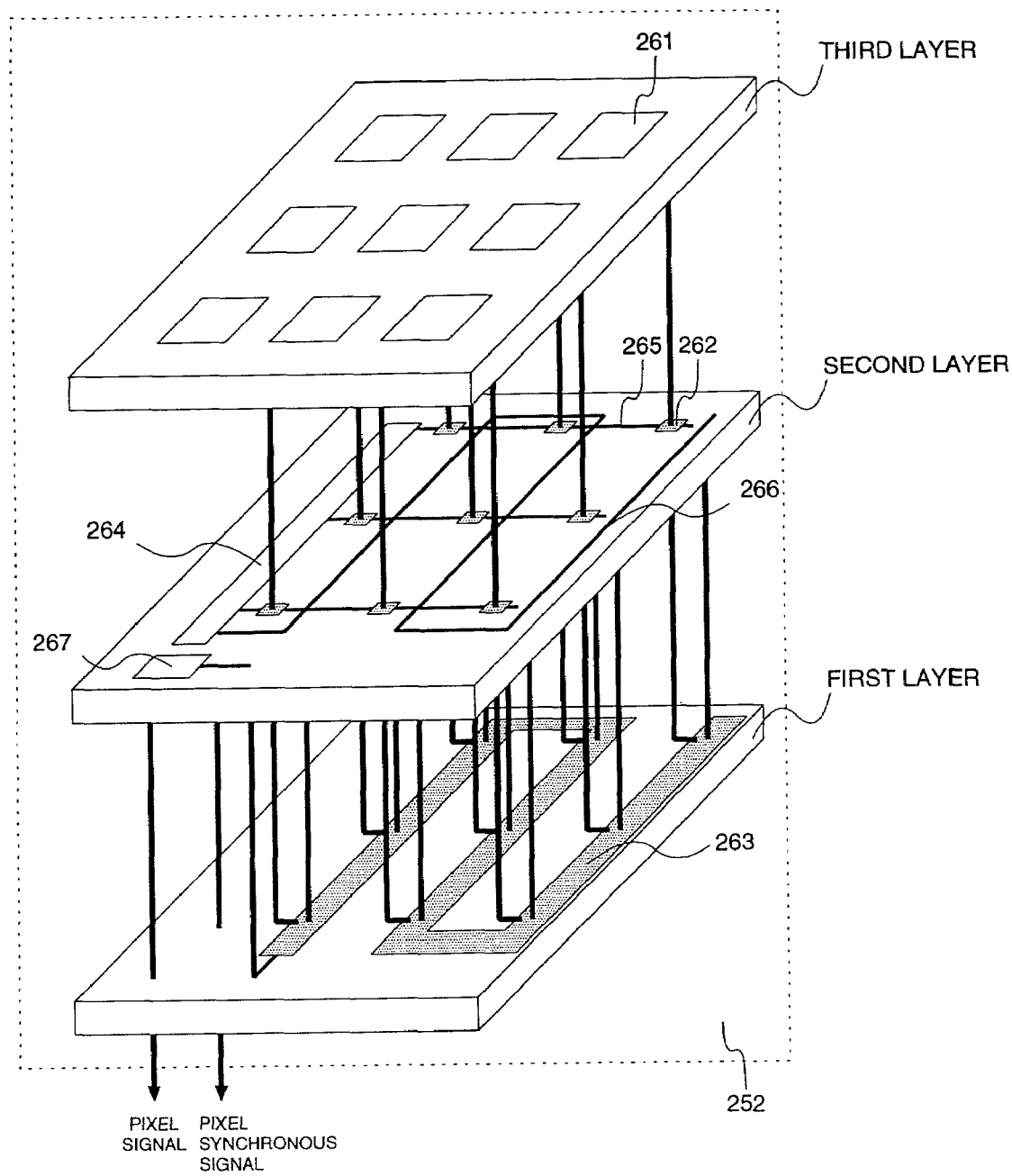

By the way, a sensor module 252 itself consists of some layers, by using the three-dimensional LSI technology. For example, as shown in FIG. 131, a sensor module 252 consists of a first layer, a second layer and a third layer. In the first layer, a charge coupled device 263 is arranged sigmoidly. In the second layer, some (now nine) charge transfer gates 262 arranged in the shape of a lattice, a drive device for charge transfer 264 and a output amplifier 267 are implemented. In the third layer, some (now nine) photo-receptor elements 261 are arranged in the shape of a lattice. Some signal lines are wired as below, in the sensor module 252. Note that a power line, a ground line, a clock signal line, a reset signal line and so on are omitted in FIG. 131.

First, in the second layer, some (now three) column selection signal lines 265 are wired as they penetrate some (now three) charge transfer gates 262 on each column, respectively. Moreover, at least one charge transfer signal line 266 is wired sigmoidly along all charge transfer gates 262. Next, in the first layer, the charge coupled device 263 is arranged sigmoidly along the charge transfer gates 262. Here, the second layer is stacked on the first layer as the charge transfer signal line 266 overlaps with the charge coupled device 263, and some signal lines are wired toward a top surface of the charge coupled device 263 from the charge transfer signal line 266. Moreover, some signal lines are wired toward a side surface of the charge coupled device 263 from each of the charge transfer gates 262. Next, a signal line is wired from a terminal of the charge coupled device 263 in the first layer toward the output amplifier 267 in the second layer, and the output amplifier 267 outputs it. Similarly, a signal line for the pixel synchronization signal outputted by the drive device for charge transfer 264 penetrates the first layer. Finally, the third layer is stacked on the second layer as each of all photo-receptor elements 261 overlaps with the corresponding charge transfer gates 262, and a signal line is wired from each of all photo-receptor elements 261 toward the corresponding charge transfer gates 262. Therefore, in a sensor module 252, not only total wire length of the signals become short, but also quantity of openings of the photo-receptor elements 261 becomes high. In addition, all photo-receptor elements 261 can be arranged even in the image sensor 251.

Note that the designer of the image sensor 251 can combine some kinds of LSI manufacturing technology easily because the charge coupled device 263 is implemented in a layer which is different from a layer which implemented the photo-receptor elements 261, the drive device for charge transfer 264 and so on, as shown in FIG. 131. In addition, the designer can increase a yield of the image sensor 251, by stacking some sensor modules 252 already checked on the substrate of the image sensor 251, in the shape of a lattice. Suppose, moreover, that some delay lines are used as all charge transfer signal lines 266, and that the drive device for charge transfer 264 supplies with a pulse signal from a terminal of the charge coupled device 263 connected with the output amplifier 267. Since a charge transfer signal is propagated in order from the terminal of the charge coupled device 263 connected with the output amplifier 267 toward another terminal, charges stored by the charge coupled device 263 are transmitted toward the terminal of the charge coupled device 263 connected with the output amplifier 267, in a form of a bucket relay.

As shown in FIG. 132, in addition, a sensor module 252 consists of a first layer, a second layer and a third layer. In the first layer, some (now nine) column selection gates 272 arranged in the shape of a lattice, a vertical shift register 273, a horizontal shift register 274, some (now three) noise cancellers 275, some (now three) row selection gates 276 and an output amplifier 267 are implemented. In the second layer, some (now nine) charge amplifiers 271 are arranged in the shape of a lattice. In the third layer, some (now nine) photo-receptor elements 261 are arranged in the shape of a lattice. In the sensor module 252, some signal lines are wired as below. Note that a power line, a ground line, a clock signal line, a reset signal line and so on are omitted in FIG. 132.

First, in the first layer, some (now three) column selection signal lines 265 are wired as they penetrate some (now three) column selection gates 272 on each column, respectively, from the vertical shift register 273. Moreover, some (now three) vertical signal lines 278 are wired toward some noise cancellers 275, respectively, as they penetrate some (now three) column selection gates 272 on each row, respectively. Next, some signal lines are wired from the noise cancellers 275 toward some row selection gates 276 on each row, respectively. Moreover, some (now three) row selection signal lines 277 are wired from the horizontal shift register 274 toward the row selection gates 276. In addition, a horizontal signal line 279 is wired as it penetrates the row selection gates 276 toward the output amplifier 267. Here, the second layer is stacked on the first layer as each of all charge amplifiers 271 overlaps with the corresponding column selection gate 272. A signal line is wired from each of the charge amplifiers 271 toward a top surface of the corresponding column selection gate 272. Next, a signal line for a pixel signal outputted by the output amplifier 267 arrives at a back of the first layer. Similarly, a signal line for a pixel synchronization signal outputted by the horizontal shift register 274 arrives at a back of the first layer. Finally, the third layer is stacked on the second layer as each of all photo-receptor elements 261 overlaps with the corresponding charge amplifier 271. A signal line is wired from each of all photoreceptor elements 261 toward the corresponding charge amplifier 271. In a sensor module 252, therefore, not only total wire length of the signals become short, but also quantity of openings of the photo-receptor elements 261 becomes high. In addition, all photo-receptor elements 261 can be arranged even in the image sensor 251.

Now, it has been described above about the image sensor 251, in which all sensor modules 252 output some pixel signals and some pixel synchronization signals from a back, by using the three-dimensional LSI technology. It is explained here about an image sensor 251, in which some digital circuits 402 convert pixel signals outputted by all sensor modules 252 into some pixel data after the digital circuits 402 process the pixel data in parallel.

As shown in FIG. 133, an enforcement form of an image sensor 251 corresponding to the invention described in claim 20 consists of a first layer, a second layer and a third layer. In the first layer, some digital circuits 402 arranged in the shape of a two-dimensional lattice are implemented. In the second layer, some A/D converters 204 are arranged in the shape of a two-dimensional lattice. In the third layer, some sensor modules 252 are arranged in the shape of a two-dimensional lattice. All of the A/D converters 204 are stacked on the corresponding digital circuits 402, respectively. Moreover, all of the sensor modules 252 are stacked on the corresponding A/D converters 204, respectively. In addition, a signal line for a pixel signal is wired from each of all sensor modules 252 toward the corresponding A/D converter 204, and n lines sending a n-bit pixel datum are wired from each of all A/D converters 204 toward the corresponding digital circuit 402. Moreover, a signal line for a pixel synchronization signal is wired from each of all sensor modules 252 toward the corresponding digital circuit 402. Therefore, all these lines do not cross each other, and all A/D converters 204 always convert the pixel signal into the n-bit pixel datum independently. In FIG. 133, All digital circuits 402, all A/D converters 204 and all sensor modules 252 are arranged in the shape of a lattice, respectively. Of course, however, note that these are arranged in the shape of a hexagonal lattice. Moreover, note that a power line, a ground line, a clock signal line, a reset signal line, an interrupt signal line and so on are omitted in FIG. 133.

Now, in a case that a clock signal is supplied to a whole image sensor 251, each of all digital circuits 402 can receive all pixel signals outputted by the corresponding sensor modules 252 in order as the pixel data, synchronizing with the pixel synchronization signals, by using shift registers and serial/parallel converters and so on. Finally, the digital circuit 402 can output a result of image processing carried out as a result datum. Here, the digital circuit 402 can carry out complex image processing if the digital circuit 402 communicates at least one pixel datum with its adjoining digital circuits 402.

By the way, if each of all sensor modules 252 comprises many photo-receptor elements 261, an implementation area of the corresponding digital circuit 402 becomes large. Therefore, the digital circuit 402 can comprise a processor 101 and a set of large memories 102. In each of all digital circuits 402, thus, the set of memories 102 can memorize all pixel data generated by the corresponding sensor modules 252 as the pixel data. Moreover, the processor 101 can carry out image processing, referring to the pixel data. In this case, if the processor 101 can generate a synchronization signal for memory rewriting, a memory datum and a memory address, the processor 101 can also change the memory datum in the set of memories 102 easily. If light including the synchronization signal for memory rewriting, the memory datum and the memory address is applied to all sensor modules 252 in the image sensor 251, the memory datum in the set of memories 102 can be rewritten simultaneously, in all digital circuits 402. It is explained here about a method that the processor 101 changes the memory datum in the set of memories 102 in at least one digital circuit 402, in a case that the light including the synchronization signal for memory rewriting, the memory datum and the memory address is applied to at least one sensor modules 252.

As shown in FIG. 134, first, suppose that each of all digital circuits 402 in the image sensor 251 comprises a processor 101, a set of memories 102 and a controller 103 for communicating with an external part. The processor 101 selects the set of memories 102 and the controller 103 via address bus 51. Moreover, the processor 101 communicates with the set of memories 102 and the controller 103 via data bus 52. A clock signal is, here, supplied to the processor 101 and the controller 103. Moreover, the processor 101 sends some control signals like a READ signal and a WRITE signal to the set of memories 102 and the controller 103. Note that general parts can be used as the processor 101 and the set of memories 102. Of course, the set of memories 102 can consist of many memory elements stacked by the three-dimensional LSI technology. In particular, in a case that a non-volatile memory like a Flash memory and an MRAM (Magnetic Random Access Memory) is used as at least one part of the memories 102, the part of the memories 102 can always memorize a program.

On the other hand, as shown in FIG. 135, a controller 103 comprises an address buffer 53, an address decoder 54, a data buffer 55, a flag encoder 59, a status register 60, a front input data register 61, a result data register 62, a front input shift register 68 and a front input counter 69. The address buffer 53 receives an address from the processor 101 via the address bus 51. The address decoder 54 selects the front input data register 61 and the status register 60, by decoding the address. The data buffer 55 communicates a datum with the processor 101 via the data bus 52. Only when the processor 101 outputted the READ signal, the data buffer 55 outputs the datum from internal data bus 56 to the data bus 52. In a case that the controller 103 inputted some pixel data, the front input shift register 68 stores the pixel data in order, synchronizing with a pixel synchronization signal, while the front input counter 69 counts the number of the pixel synchronization signal. Note that the front input counter 69 can be either an up counter or a down counter. When the front input shift register 68 stored all (now nine) pixel data, the front input counter 69 sets a FRONT INPUT SEND to one, followed by outputting it to the flag encoder 59. The flag encoder 59 always generates a STATUS signal including the FRONT INPUT SEND. Moreover, the flag encoder 59 outputs it to the status register 60, while it outputs a trigger signal to the front input data register 61 and the status register 60, synchronizing with the clock signal. Therefore, all (now nine) registers in the front input data register 61 stores nine pixel data, respectively, synchronizing with the trigger signal, while the status register 60 stores the STATUS signal, synchronizing with the trigger signal. When the address decoder 54 received the address from the processor 101, the address decoder 54 can select one of all registers in the front input data register 61 and the status register 60, followed by outputting a pixel datum or a STATUS from the selected register toward the internal data bus 56. Therefore, the processor 101 can read the pixel datum or the STATUS. In a case that the address decoder 54 selected the status register 60, note that the flag encoder 59 once sets the FRONT INPUT SEND in the STATUS to zero. Therefore, since the processor 101 only checks the FRONT INPUT SEND in the STATUS, the processor 101 can distinguish whether the controller 103 inputs all pixel data or not. Finally, in a case that the processor 101 writes a result datum to the controller 103, the processor 101 outputs an address of the result data register 62 to the address bus 51, followed by outputting the result datum to the data bus 52. Since the address decoder 54 decodes the address, followed by selecting the result data register 62, the result data register 62 can input the result datum from the internal data bus 56. Here, since the processor 101 outputs the WRITE signal, the flag encoder 59 inputs the WRITE signal, followed by generating the trigger signal, the result data register 62 can remain the result datum inputted. The result datum remained is outputted from the result data register 62 to the external part. Note that the flag encoder 59 can output a RESULT SEND after generating the trigger signal, if desired. The RESULT SEND denotes that the result datum is outputted, similarly with the pixel synchronization signal.

As shown in FIG. 136, now, a light source 291 like a display and a laser device applies light to the surface of the image sensor 251, on which all sensor modules 252 are implemented. In each of all digital circuits 402, therefore, the controller 103 inputs the light received by all photo-receptor elements 261 in the corresponding sensor module 252 as some pixel data in order, according to the pixel synchronization signal. In at least one digital circuit 402, moreover, after the processor 101 memorized the pixel data in the set of memories 102, the processor 101 generates the synchronization signal for memory rewriting, the memory datum and the memory address from the pixel data, followed by storing the memory datum at the memory address, according to the synchronization signal for memory rewriting. A memory rewriting routine for the processor 101 to rewrite a memory datum in the set of memories 102 is like FIG. 137. It is explained here about the memory rewriting routine.

At step 8001, the processor 101 evacuates data in its registers to the set of memories 102, followed by initializing the registers.

At step 8002, the processor 101 inputs a STATUS from the controller 103.

At step 8003, the processor 101 judges the FRONT INPUT SEND in the STATUS. If the FRONT INPUT SEND is one (step 8003: YES), it goes to step 8004. Otherwise (step 8003: NO), it goes to step 8010.

At step 8004, the processor 101 reads all pixel data from the controller 103 one by one, followed by storing them in the set of memories 102 in order.

At step 8005, the processor 101 generates the synchronization signal for memory rewriting, the number of whose bits is at least one, from some pixel data stored in the set of memories 102.

At step 8006, the processor 101 judges the synchronization signal for memory rewriting. If the synchronization signal for memory rewriting is one (step 8006: YES), it goes to step 8007. Otherwise (step 8006: NO), it goes to step 8010.

At step 8007, the processor 101 generates the memory datum, the number of whose bits is at least one, from some pixel data stored in the set of memories 102.

At step 8008, the processor 101 generates the memory address, the number of whose bits is at least one, from some pixel data stored in the set of memories 102.

At step 8009, the processor 101 stores the memory datum generated to the memory address. Here, a suitable offset address can be added to the memory address.

At step 8010, the processor 101 restores the data evacuated in the set of memories 102 to its registers, followed by ending the memory rewriting routine.

In a case that the processor 101 can generate two or more bits of a synchronization signal for memory rewriting, at step 8005, suppose that a suitable identification number is assigned to each of digital circuits 402. Since the digital circuits 402 compare the synchronization signal for memory rewriting with its identification number at step 8006, respectively, the digital circuits 402 can judge whether the light applied now includes a memory datum for itself. Therefore, even though the same light is applied from the light source 291 to the photo-receptor elements 261 in all sensor modules 252, only the memory datum memorized in the set of memories 102 in a specific digital circuit 402 can be changed.

Besides this, some sensor modules 252 arranged in the shape of a lattice, some A/D converters 204 arranged in the shape of a lattice, and some digital circuits 402 arranged in the shape of a lattice are stacked in FIG. 136. Of course, however, a sensor module 252, an A/D converter 204 and a digital circuit 402 can be arranged at any place in the LSI. Moreover, these can be arranged on an implementation surface of the LSI.

By the way, in a case of the memory rewriting routine shown in FIG. 137, the processor 101 must observe the controller 103 periodically, in at least one digital circuit 402. Therefore, the memory rewriting routine is suitable for the image sensor 251, which is used as such a receiver as a light signal, is always inputted. However, for a general application of the image sensor 251 which does not always have to rewrite a program in the memory 102, not only overhead of the memory rewriting routine becomes big, but also a memory rewriting signal may be able to be generated by an inputted image, without leave. However, if the processor 101 can input at least one memory rewriting signal, the overhead of the memory rewriting routine becomes small. Moreover, the memory rewriting signal is never generated by the inputted image, without leave. When at least one memory rewriting signal is inputted by the image sensor 251, the light source 291 like a display and a laser device applies light to the surface of the image sensor 251, on which all sensor modules 252 are implemented. Note that a memory rewriting signal can be inputted by the processors 101 of all digital circuits 402, or either one of image rewriting signals can be inputted by the processors 101 of some digital circuits 402. The memory rewriting signal is a kind of interrupt signals. When the memory rewriting signal is inputted by the processor 101, the processor 101 rewrites memory data like a program in a set of memories 102, according to the memory rewriting routine memorized in the set of memories 102. Therefore, in a digital circuit 402 which inputted at least one memory rewriting signal, the processor 101 generates the synchronization signal for memory rewriting, the memory datum and the memory address from the pixel data, followed by storing the memory datum at the memory address, according to the synchronization signal for memory rewriting. In a case that the memory rewriting signal is inputted by the processor 101, a memory rewriting routine for the processor 101 to rewrite at least one memory datum in the set of memories 102 is like FIG. 138. It is explained here about the memory rewriting routine.

At step 8101, the processor 101 evacuates data in its registers to the set of memories 102, followed by initializing the registers.

At step 8102, the processor 101 inputs a STATUS from the controller 103.

At step 8103, the processor 101 judges the FRONT INPUT SEND in the STATUS. If the FRONT INPUT SEND is one (step 8103: YES), it goes to step 8104. Otherwise (step 8103: NO), it goes to step 8102.

At step 8104, the processor 101 reads all pixel data from the controller 103 one by one, followed by storing them in the set of memories 102 in order.

At step 8105, the processor 101 generates the synchronization signal for memory rewriting, the number of whose bits is at least one, from some pixel data stored in the set of memories 102.

At step 8106, the processor 101 judges the synchronization signal for memory rewriting. If the synchronization signal for memory rewriting is one (step 8106: YES), it goes to step 8107. Otherwise (step 8106: NO), it goes to step 8102.

At step 8107, the processor 101 generates the memory datum, the number of whose bits is at least one, from some pixel data stored in the set of memories 102.

At step 8108, the processor 101 generates the memory address, the number of whose bits is at least one, from some pixel data stored in the set of memories 102.

At step 8109, the processor 101 stores the memory datum generated to the memory address. Here, a suitable offset address can be added to the memory address.

At step 8110, the processor 101 judges the synchronization signal for memory rewriting. If the synchronization signal for memory rewriting is one (step 8110: YES), it goes to step 8102. Otherwise (step 8110: NO), it goes to step 8111.

At step 8111, the processor 101 restores the data evacuated in the set of memories 102 to its registers, followed by ending the memory rewriting routine.

Now, it has been described above about the memory rewriting routine for the processor 101 to rewrite at least one memory datum in the set of memories 102. As shown above, at steps 8005, 8007 and 8008 of the memory rewriting routine, the processor 101 must generate the synchronization signal for memory rewriting, the memory datum and the memory address from some pixel data in the set of memories 102, respectively. In a case that a sensor module 252 comprises 3×3 photo-receptor elements 261, it is explained here about a method that the processor 101 in the corresponding digital circuit 402 generates two bits of digital information from some pixel data in the set of memories 102.

Suppose first that the processor 101 deals with light applied to the sensor module 252 from the light source 291 as a binary image datum. Therefore, the number of combinations of nine pixel data stored in the set of memories 102 in the corresponding digital circuit 402 is ninth power of two, that is, 512 patterns. Suppose next that the light source 291 and the sensor module 252 are arranged as the light source 291 can apply different strength of light to nine photo-receptor elements 261 in the sensor module 252, respectively. Therefore, 512 patterns of pixel data can be really stored in the set of memories 102 in the corresponding digital circuit 402. Finally, suppose that the light applied to the sensor module 252 by the light source 291 is a striped pattern. That is, width of the stripes received by the sensor module 252 is equal to either zero to three pixels. Even though the sensor module 252 receives the light applied by the light source 291, falling sideways or to the vertical contrary, and moreover, one of nine pixel data stored in the set of memories 102 is an error, the processor 101 must generate correct digital information. Since the processor 101 compares nine pixel data stored in the set of memories 102 with 74 patterns of pixel data shown in FIG. 139 and FIG. 140, the processor 101 can select correctly one from four groups, a rate of whose pixel data representing one is 0, 1/3, 2/3 and 1, respectively. In short, the processor 101 can generate two bits of digital information. Note that a black rectangle denotes zero, and a white rectangle denotes one, in FIG. 139 and FIG. 140. In addition, FIG. 139(a) shows a pattern of pixel data. where a rate of them representing one is 0. FIG. 139(b) to (i) shows 36 patterns of pixel data, where a rate of them representing one is 1/3. FIG. 140(a) to (h) shows 36 patterns of pixel data, where a rate of them representing one is 2/3. Finally, FIG. 140(i) shows a pattern of pixel data, where a rate of them representing one is 1.

It has been described above about the case that the processor 101 deals with the light applied from the light source 291 as binary pixel data. Of course, the processor 101 can generate two or more bits of digital information if the light source 291 and the sensor module 252 are arranged as the processor 101 can deal with the light as plural bits of pixel data. Moreover, the processor 101 can generate two or more bits of digital information if the light source 291 outputs more complex patterns than striped patterns like a square, a triangle and a cross. In particular, if the sensor module 252 comprises many photo-receptor elements 261, the processor 101 can generate two or more bits of digital information, preventing its operation from working incorrectly by position gap and noise.

By the way, the sensor module 252 can detect red, green and blue, by using primary color filters. Moreover, it can also detect cyan, magenta, yellow and green, by using complementary color filters. Besides this, the sensor module 252 can detect infrared rays, by using pyroelectric elements. If the light source 291 applies light including some bands like a color image to the sensor module 252, the set of memories 102 in the corresponding digital circuit 402 can store pixel data whose number is a product of the number of photo-receptor elements 261 and the number of the bands. For example, in a case that a primary color filter was attached to the sensor module 252 comprising 3×3 photo-receptor elements 261, the processor 101 can generate six bits of digital information, according to the above method. Of course, the processor 101 can also generate a two-bit synchronization signal for memory rewriting, a two-bit memory datum and a two-bit memory address if three bands of red, green and blue are assigned to the synchronization signal for memory rewriting, the memory datum and the memory address, respectively.

Now, in a case of using the light source 291 like a display, as shown in FIG. 136, the light source 291 must display a high-resolution image in order to apply the light like FIG. 139 and FIG. 140 to all sensor modules 252 in the image sensor 251. However, if the light source 291 can generate interference fringes, the light source 291 can easily apply the light like FIG. 139 and FIG. 140 to all sensor modules 252 in the image sensor 251. For example, in a case of using a transparent grating 293, as shown in FIG. 141, since the single-wavelength light applied by the light source 291 is converted into a parallel wave by a lens 292, followed by being applied to the grating 293, the grating 293 can generate the interference fringes, width of each of whose stripes is extremely thin. Therefore, all sensor modules 252 in the image sensor 251 can receive the light whose stripes have the same width. Note that the width of each stripe of the interference fringes is changed if wave length of the light is changed, if the degree of incidence angle of the light is changed, or if width of slits of the grating 293 is changed. Even in a case that a reflecting grating 293 was used, as shown in FIG. 142, all sensor modules 252 in the image sensor 251 can receive the light whose stripes have the same width. As shown in FIG. 143, furthermore, suppose that the grating 293 was formed in an optical waveguide, by using a half mirror and so on. The grating 293 can generate the interference fringes, width of each of whose stripes is extremely thin, if coherent light like a laser ray generated by the light source 291 is applied to the optical waveguide 294. Therefore, all sensor modules 252 in the image sensor 251 can receive the light whose stripes have the same width.

Next, it is explained about some technical ideas besides claims possible to understand from the above enforcement forms in the present inventions, with their effects.

A first invention is a visual device according to claim 3 or claim 4, wherein each of at least one said array operation unit in said position/size/inclination detection means communicates with only eight neighbors of said array operation units. Since said position/size/inclination detection means carries out only eight-neighbor processing, a said visual device can generate a transfer-source redundant-information image quickly. Note that, in said position/size/inclination detection means inputs a formed edge-information image as a said binary image, inclination angles outputted by said position/size/inclination detection means becomes normal directions against contours of a said object. Therefore, since the present invention can derive said normal directions of said contours efficiently, many problems on detection of said form of said objects are solved very well.

A second invention is an image sensor according to claim 20, comprising at least one said digital circuit, a processor, a set of memories and a controller, wherein a said processor make at least one of all said pixel data remained by a said controller memorize in a set of said memories, in at least one said digital circuit, by that a said controller comprises; a means for inputting all said pixel data from a corresponding said A/D converter, according to a said pixel synchronization signal; a means for outputting a judgment result of judging whether all said pixel data are inputted or not; a means for remaining a said judgment result; a means for remaining all said pixel data; a means for selecting one data of all said pixel data and a said judgment result, by an address outputted by a said processor; and a means for outputting a said data selected. Since at least one said digital circuit comprises a said processor, a set of said memories and a said controller, a said processor can carries out a program memorized in a set of said memories. In the present invention, since plurality of said digital circuits comprise a said processor, a set of said memories and a said controller, plurality of said processors can make all said pixel data memorize in a corresponding set of said memories independently, respectively, and moreover can carry out image processing in parallel. Therefore, many problems on image processing are solved very well.

A third invention is an image sensor according to a said second invention, wherein at least one said processor carries out a memory rewriting routine periodically, and a said processor make a memory datum memorize at a memory address of a set of said memories, according to a synchronization signal for memory rewriting, in at least one said digital circuit, by that a said memory rewriting routine comprises: a means for memorizing all said pixel data inputted by a said controller in a set of said memories; a means for converting at least one said pixel datum memorized by a set of said memories into a said synchronization signal for memory rewriting; a means for converting at least one said pixel datum memorized by a set of said memories into a said memory datum; a means for converting at least one said pixel datum memorized by a set of said memories into a said memory address; and a means for memorizing a said memory datum at a said memory address of a set of said memories. The present invention is an enforcement form of an algorithm for memorizing a said memory datum at a said memory address of a set of said memories, according to a said synchronization signal for memory rewriting. Suppose that a said sensor module comprises many said photo-receptor elements. Patterns of said light can represent a said synchronization signal for memory rewriting, a said memory datum and a said memory address as following cases; for example, said light is seldom applied to all said photo-receptor elements, strong said light is applied to all said photo-receptor elements, said light is seldom applied to a half of said photo-receptor elements and strong said light is applied to remaining said photo-receptor elements, or strong said light and weak said light are applied to all said photo-receptor elements, by turns.

A fourth invention is an image sensor according to a said second invention, wherein at least one said processor carries out a memory rewriting routine in inputting at least one memory rewriting signal, and a said processor make a memory datum memorize at a memory address of a set of said memories, according to a synchronization signal for memory rewriting, in inputting at least one said memory rewriting signal, in at least one said digital circuit, by that a said memory rewriting routine comprises: a means for memorizing all said pixel data inputted by a said controller in a set of said memories; a means for converting at least one said pixel datum memorized by a set of said memories into a said synchronization signal for memory rewriting; a means for converting at least one said pixel datum memorized by a set of said memories into a said memory datum; a means for converting at least one said pixel datum memorized by a set of said memories into a said memory address; and a means for memorizing a said memory datum at a said memory address of a set of said memories. The present invention is an enforcement form of an algorithm for a said processor comprising an interrupt function to memorize a said memory datum at a said memory address of a set of said memories, according to a said synchronization signal for memory rewriting. Suppose that a said sensor module comprises many said photo-receptor elements. Patterns of said light can represent a said synchronization signal for memory rewriting, a said memory datum and a said memory address as following cases; for example, said light is seldom applied to all said photoreceptor elements, strong said light is applied to all said photo-receptor elements, said light is seldom applied to a half of said photo-receptor elements and strong said light is applied to remaining said photo-receptor elements, or strong said light and weak said light are applied to all said photo-receptor elements, by turns.

While the invention has been shown by example, it should be understood, however, that the description herein of specific embodiments is not intended to limit the invention to the particular forms disclosed, but on the contrary, the invention is to cover all modifications equivalents, and alternative falling within the spirit and scope of the invention as defined by the appended claims.

INDUSTRIAL APPLICABILITY

As suggested by claim 1 and claim 2, all means except image recognition means 29 and environmental understanding means 31 are realized by local processing. Therefore, a manufacturer of the image sensor 251 can realize the image sensor 251 detecting easily and quickly position, size, form, color and texture of at least one object in an animation image, by making an LSI (Large Scale Integrated Circuit) realizing the data processing device 110 consisting of some array operation units 100 arranged in the shape of a lattice, followed by stacking only the required number of LSIs. In addition, the designer can implement a general-purpose processor realizing the image recognition means 29 and the environmental understanding means 31 in the image sensor 251, by using system LSI technology. Therefore, since the image sensor 251 can output only an environmental map, if desired, a computer system receiving the environmental map can reduces its load. Note that the present invention is very useful for clarifying visual functions of a human brain because it is extremely similar with the visual functions of the human brain.

As suggested by claim 3, the present invention can detect form of an object having been detected by global processing like Fourier transform and Hough transform, only by carrying out local and parallel image processing. Therefore, the present invention can make such image processing which desires enormous computational complexity as image compression and pattern recognition fast.

As suggested by claim 3 and claim 4, the present invention comprising the position/size/inclination detection means 44 and the position/size/form detection means 45 can detect either form or texture, for at least one object in a binary image, by changing neighbor size. Therefore, a user of the present invention can detect the form and the texture of objects, whose size is within a specific range, in the binary image, by preparing some combinations consisting of some position/size/inclination detection means 44 whose neighbor size is different from each other and some position/size/form detection means 45 whose neighbor size is different from each other.

As suggested by claim 5, the present invention can detect position and size of objects from a formed edge-information image 115, by carrying out processing every pixel, in parallel. In addition, the present invention can derive form of the objects even though it does not know the size and inclination of the objects beforehand. Since the visual device 2 is also used for preprocessing for recognizing some objects from a frame image of an animation image taken by a video camera, or from a still image taken by a digital camera or captured by a scanner, the visual device 2 can realize a pattern recognition device for the animation image and the still image quickly and cheaply. By outputting 36 or more of transfer-source inclination-redundant information 187, a system inputting a transfer-source inclination-redundant-information image 188 from the present invention can extract size of objects from the transfer-source inclination-redundant-information image 188, if desired.

As suggested by claim 6, the present invention can detect position and size of objects from a formed edge-information image 115, by carrying out processing every pixel, in parallel. In addition, the present invention can derive form of the objects even though it does not know the size and inclination of the objects beforehand. Since the visual device 2 is also used for preprocessing for recognizing some objects from a frame image of an animation image taken by a video camera, or from a still image taken by a digital camera or captured by a scanner, the visual device 2 can realize a pattern recognition device for the animation image and the still image quickly and cheaply. Since the array operation unit 100 outputs only a detection result, a system inputting the detection result from the present invention can make its communication mechanism simple.

As suggested by claim 7, the present invention can separate at least one object area 141 segmented by a binary image from a background area more quickly than separation of the past visual device 2 because each nonlinear oscillator inputs redundant-information 131 as an external noise. Therefore, a designer of an image sensor 251 can design a fast image sensor 251.

As suggested by claim 8 and claim 9, the array operation unit 100 transmits calculation data received in only at most two directions. Moreover, many of the calculation data have only to be transmitted in one direction. In short, when the processor 101 writes the calculation datum to the controller 103, a probability that the processor 101 is waited by the controller 103 becomes low. In addition, since the array operation unit 100 can distribute transmission load of the calculation data, the array operation unit 100 can transmit the calculation data efficiently.

As suggested by claim 10 and claim 11, the virtual array operation unit 105 transmits calculation data received in only at most two directions. Moreover, many of the calculation data have only to be transmitted in one direction. In short, when the processor 101 writes the calculation datum to the controller 103, a probability that the processor 101 is waited by the controller 103 becomes low. Moreover, the more the number of the array operation units 100 included in the virtual array operation unit 105 becomes, the more times the processor 101 does not write the calculation data to the controller 103. Therefore, the virtual array operation unit 105 can transmit the calculation data efficiently.

As suggested by claim 12, when some controllers 103 transmit the calculation datum in a direction, the processor 101 has only to write the calculation datum once. The processor 101 does not have to increase transmission times one by one. Moreover, the controller 103 does not have to comprise an adder. Therefore, the visual device 2 can transmit the calculation datum efficiently.

As suggested by claim 13 to claim 16, even though the interlocked counter 401 inputted some interlocking signals whose phase is different from each other, the interlocked counter 401 selects the latest phase of the signal from the signals, followed by generating its interlocking signal. Moreover, it can also output the count number synchronized with the phase of the interlocking signal. Therefore, even though some interlocked counters 401 were distributed in a whole of an LSI (Large Scale Integrated Circuit), the phases of interlocking signals of all interlocked counters 401 coincide with the latest one if all interlocked counters 401 communicate their interlocking signals with each other. Moreover, the count numbers of the interlocked counters 401 coincide with each other. Since the count numbers become divided signals of the clock signal, the interlocked counters 401 can supply the same divided signal to a whole of the LSI. On the other hand, since the LSI becomes large and the clock signal becomes fast, recently, reduction of power consumption of the LSI is desired. Therefore, an LSI designer must control the clock finely every part of the LSI. However, because of appearance of propagation delay time caused by long wiring and a problem of clock skew, it has been difficult for the LSI designer to carry out timing design even though he divided the clock signal. By using the present invention, then, the LSI designer can design an LSI corresponding to a high-frequency clock signal easily.

As suggested by claim 17, an interlocked device can supply a divided signal and a timer signal synchronized with a clock signal to a whole of a parallel system like a pipeline processing device, a DSP (Digital Signal Processor), a systric array, a data-flow processor and a parallel image processing device. In such a parallel system, note that the more its size becomes, the more its performance becomes, reducing wiring complexity of interlocking signals. Therefore, an LSI designer can design a large-scale parallel system, avoiding a problem of propagation delay time. In particular, in a case that the interlocked counter 401 according to claim 15 and claim 16 was used, the LSI designer does not have to make a clock signal supply from an external part of an LSI because the interlocked counter 401 generates the clock signal. In addition, phase difference between a clock signal generated by the interlocked counter 401 and a clock signal generated by an interlocked counter 401 adjoining to the interlocked counter 401 is $2\pi$ radian, that is, within one period of the clock signal. In a case that the interlocked counter 401 divided the clock signal every N periods, followed by generating an N-division signal, the phase difference for the N-division signal generated by the adjoining interlocked counter 401 is $2\pi/N$ or less radian, that is, within one period of the clock signal. In short, suppose that the interlocked counter 401 generates a high-frequency clock signal, the larger the N becomes, the nearer the phase difference for the N-division signal approaches to zero radian. Therefore, the LSI designer can design an LSI using the high-frequency signal clock easily.

As suggested by claim 18 and claim 19, the higher the resolution of the image sensor 251 becomes, the much less than the number of pixels of the image sensor 251 the number of pixels in a sensor module 252 becomes, by increasing the number of the sensor modules 252. Therefore, a designer of the image sensor 251 can design the sensor module 252 easily. In addition, the manufacturer of the image sensor 251 can make the image sensor 251 in a high yield, in a short time, by arranging only sensor modules 252 already checked on a substrate, using LSI stacking technology. Therefore, an LSI designer can make an image sensor 251, the number of whose pixels is 100 million or more, that is, the number is equal to a human retina. In addition, an enforcement form of the image sensor 251 corresponding to the present invention can take out all pixel signals in a shorter time than a time of a general image sensor 251. Moreover, the enforcement form desires the less number of signal lines than the number of lines in a pixel-parallel image sensor 251. In the visual device 2, therefore, some virtual array operation units 105 arranged in the shape of a lattice can receive the necessary number of pixel signals in a short time, respectively, by using an enforcement form of the image sensor 251 corresponding to the present invention.

As suggested by claim 20, influence of noise on the image sensor 251 can be reduced because wiring length of signal lines between a sensor module 252 and the corresponding A/D converter 204 becomes short. In particular, in a case of the invention according to claim 20, total wiring length of signal lines between a sensor module 252 and the corresponding A/D converter 204, and signal lines between a A/D converter 204 and the corresponding digital circuit 402 becomes short. Moreover, they do not cross each other. Therefore, the maximum influence of noise on the image sensor 251 can be reduced. In addition, the number of A/D converters 204 is equal to the number of sensor modules 252. Therefore, even though the number of pixels of the image sensor 251 became big, a designer of the image sensor 251 can reduce the number of the A/D converters 204, by increasing the number of photoreceptor elements 261 in the sensor module 252. The designer of the image sensor 251, thus, can design a high-resolution image sensor 251, by increasing the number of bits of a digital signal outputted by the A/D converter 204. In addition, an LSI manufacturer can make an image sensor 251, the number of whose pixels is 100 million or more, which can stimulate human optic nerve directly, in parallel.

What is claimed is:

1. An interlocked counter comprising a synchronous counter, a logic gate for judging end-value, a logic gate for amplifying an interlocking signal, at least one latch circuit for interlocking signal, a logic gate for interlocking signal, and a logic gate for enable signal, wherein
    behavior of said synchronous counter is stopped when a count number arrived at an end value, by that
    said synchronous counter counts a number of pulses of a clock signal when said synchronous counter inputted an enable signal,
    said logic gate for judging end-value generates an interlocking signal when said count number outputted by a synchronous counter coincided with said end value,
    said logic gate for amplifying interlocking signal amplifies said interlocking signal in order to output to an external part, and
    said logic gate for enable signal generates said enable signal when said interlocking signal is not generated, and
    said behavior of said synchronous counter is restarted, by that
    each of said latch circuits for interlocking signal memorizes one of said interlocking signals inputted from an external part when said interlocking signal outputted by said logic gate for judging end-value is not generated,
    said logic gate for interlocking signal judges whether all of said latch circuits for interlocking signal memorize said interlocking signals, and
    said logic gate for enable signal generates said enable signal when all of said latch circuits for interlocking signal memorize said interlocking signals.

2. An interlocked counter comprising a synchronous counter comprises, a logic gate for judging end-value, a logic gate for amplifying interlocking signal, at least one latch circuit for interlocking signal, a logic gate for interlocking signal, a logic gate for enable signal, and a logic gate for initialization, wherein
    behavior of said synchronous counter is stopped when a count number arrived at an end value, by that
    said synchronous counter counts a number of pulses of a clock signal when said synchronous counter inputted an enable signal,
    said logic gate for judging end-value generates an interlocking signal when said count number outputted by a synchronous counter coincided with said end value,
    said logic gate for amplifying interlocking signal amplifies said interlocking signal in order to output to an external part, and
    said logic gate for enable signal generates said enable signal when said interlocking signal is not generated,
    said behavior of said synchronous counter is restarted, by that
    each of said latch circuits for interlocking signal memorizes one of said interlocking signals inputted from an external part when said interlocking signal outputted by said logic gate for judging end-value is not generated,
    said logic gate for interlocking signal judges whether all of said latch circuits for interlocking signal memorize said interlocking signals, and
    said logic gate for enable signal generates said enable signal when all of said latch circuits for interlocking signal memorize said interlocking signals, and
    said logic gate for initialization set an initial value to said synchronous counter by using an initialization signal, by that said logic gate for initialization signal inputs said interlocking signal outputted by said logic gate for judging end-value and said enable signal, and generates said initialization signal.

3. An interlocked counter according to claim 1, which comprises a synchronous oscillator comprising a self-oscillation circuit generating said clock signal, which comprises a latch circuit for synchronous signal, and at least one logic gate for amplifying clock signal, wherein
    said latch circuit for synchronous signal inputs said enable signal,
    an output of said latch circuit for synchronous signal changes phase of said clock signal, and
    at least one said logic gate for clock signal amplifies said clock signal.

4. An interlocked counter according to claim 1, which comprises a synchronous oscillator comprising:
    a flip-flop circuit for synchronous signal,
    a synchronous signal amplifier,
    a loop filter,
    a voltage controlled oscillator, and
    at least one logic gate for amplifying clock signal, wherein
    said flip-flop circuit for synchronous signal memorizes said enable signal,
    said synchronous signal amplifier amplifies an output of said flip-flop circuit for synchronous signal,
    said loop filter reduces a noise included in an output of said synchronous signal amplifier,
    said voltage controlled oscillator generates said clock signal,
    said voltage controlled oscillator changes phase of said clock signal according to voltage outputted by said loop filter, and
    at least one said logic gate for clock signal amplifies said clock signal.

5. An interlocked device comprising plurality of interlocked counters according to claim 1,
    wherein said count numbers of said synchronous counters in said interlocked counters are even, by that
    said plurality of interlocked counters are arranged on a plane; all distance between adjoining said interlocked counters is equal;
    adjoining said interlocked counters communicate said interlocking signals each other;
    each of said interlocked counters memorizes all said interlocking signals outputted by at least one adjoining said interlocked counter; and
    said synchronous counter in each of said interlocked counters stops said behavior until each of said interlocked counters memorizes all said interlocking signals.

* * * * *